United States Patent
Uno et al.

(10) Patent No.: US 7,737,023 B2
(45) Date of Patent: *Jun. 15, 2010

(54) METHOD OF MANUFACTURE OF SEMICONDUCTOR INTEGRATED CIRCUIT DEVICE AND SEMICONDUCTOR INTEGRATED CIRCUIT DEVICE

(75) Inventors: Shouochi Uno, Ome (JP); Atsushi Maekawa, Akishima (JP); Takashi Yunogami, Niiza (JP); Kazutami Tago, Hitachinaka (JP); Kazuo Nojiri, Higashimurayama (JP); Shuntaro Machida, Kokubunji (JP); Takafumi Tokunaga, Iruma (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/194,044

(22) Filed: Aug. 19, 2008

(65) Prior Publication Data

US 2009/0011592 A1  Jan. 8, 2009

Related U.S. Application Data

(63) Continuation of application No. 11/104,441, filed on Apr. 13, 2005, now Pat. No. 7,419,902, which is a continuation of application No. 09/646,671, filed as application No. PCT/JP00/04046 on Jun. 21, 2000, now abandoned.

(30) Foreign Application Priority Data

Jun. 24, 1999  (JP) .................................. 11-178080

(51) Int. Cl.
  *H01L 21/4763*  (2006.01)

(52) U.S. Cl. ...................... 438/623; 438/627; 438/638; 438/707; 438/725; 257/E21.256

(58) Field of Classification Search ................. 438/623, 438/627, 638, 707, 725
See application file for complete search history.

(56) References Cited

U.S. PATENT DOCUMENTS 5,047,367 A  9/1991  Wei et al.

(Continued)

FOREIGN PATENT DOCUMENTS

JP  11-87502  7/1989

(Continued)

OTHER PUBLICATIONS

Process Focus Semiconductor World 1998 pp. 74-76 and translation (Improving Resistance to Heat and O2 Plasma is the Key to Successfully Applying Films to the CU-Damascene Process, By Kawane, Editor of Semiconductor World pp. 1-7.

(Continued)

*Primary Examiner*—Alexander G Ghyka
(74) *Attorney, Agent, or Firm*—Antonelli, Terry, Stout & Kraus, LLP.

(57) ABSTRACT

In a process for the manufacture of a semiconductor integrated circuit device having an inlaid interconnect structure by embedding a conductor film in a recess, such as a trench or hole, formed in an organic insulating film which constitutes an interlevel dielectric film and includes an organosiloxane as a main component, the recess, such as a trench or hole, is formed by subjecting the organic insulating film to plasma dry etching in a CF-based gas/$N_2$/Ar gas in order to suppress the formation of an abnormal shape on the bottom of the recess, upon formation of a photoresist film over the organic insulating film, followed by formation of the recess therein with the photoresist film as an etching mask.

27 Claims, 85 Drawing Sheets

U.S. PATENT DOCUMENTS

| | | |
|---|---|---|
| 5,268,590 A | 12/1993 | Pfiester et al. |
| 5,269,879 A | 12/1993 | Rhoades et al. |
| 5,316,977 A | 5/1994 | Kunishima et al. |
| 5,376,435 A | 12/1994 | Morozumi |
| 5,418,389 A | 5/1995 | Watanabe |
| 5,549,786 A | 8/1996 | Jones et al. |
| 5,635,426 A | 6/1997 | Hayashi et al. |
| 5,652,176 A | 7/1997 | Maniar et al. |
| 5,691,225 A | 11/1997 | Abiko |
| 5,721,175 A | 2/1998 | Kunishima et al. |
| 5,736,461 A | 4/1998 | Berti et al. |
| 5,780,361 A | 7/1998 | Inoue |
| 5,843,841 A | 12/1998 | Izawa et al. |
| 6,040,248 A | 3/2000 | Chen et al. |
| 6,051,508 A | 4/2000 | Takase et al. |
| 6,117,786 A | 9/2000 | Khajehnouri et al. |
| 6,207,583 B1 | 3/2001 | Dunne et al. |
| 6,211,093 B1 | 4/2001 | Sandhu et al. |
| 6,333,256 B2 | 12/2001 | Sandhu et al. |
| 6,348,402 B1 | 2/2002 | Kawanoue et al. |
| 6,521,532 B1 | 2/2003 | Cunningham |
| 6,541,367 B1 | 4/2003 | Mandal |
| 6,596,627 B2 | 7/2003 | Mandal |
| 6,660,663 B1 | 12/2003 | Cheung et al. |
| 6,669,858 B2 | 12/2003 | Bjorkman |
| 6,844,267 B1 | 1/2005 | Vanhaelemeersch et al. |
| 7,419,902 B2 * | 9/2008 | Uno et al. ............... 438/623 |

FOREIGN PATENT DOCUMENTS

| | | |
|---|---|---|
| JP | 5-90293 | 4/1993 |
| JP | 5-102078 | 4/1993 |
| JP | 5-182982 | 7/1993 |
| JP | 5-343632 | 12/1993 |
| JP | 6-192874 | 7/1994 |
| JP | 08-316209 | 11/1996 |
| JP | 9-266196 | 10/1997 |
| JP | 09-293780 | 11/1997 |
| JP | 09-306988 | 11/1997 |
| JP | 10-209273 | 8/1998 |
| JP | 11-067909 | 3/1999 |

OTHER PUBLICATIONS

D.L. Kwong, et al, silicided shallow junctio formation by ion implantation of impurity ions into silicide layers and subsequent drive-in, Jun. 1, 1997, pp. 5084-5088, J. Appl. Phys. 61 (11).

R. Liu et al, Formation of Shallow p+/n and n+/p Junctions with $CoSi_2$, pp. 446-462.

Chih-Yuan Lu et al, A Folded Extended Window MOSFET for ULSI Applications, Aug. 1988, pp. 388-390, IEEE Electron Device Letters, vol. 9, No. 8.

Japanese Official Action issued Apr. 30, 2008, for Application No. 2001-505055.

* cited by examiner

FIG. 2
(a) 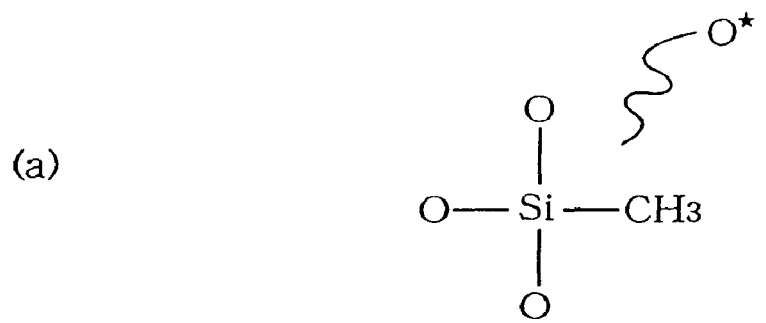
(b) 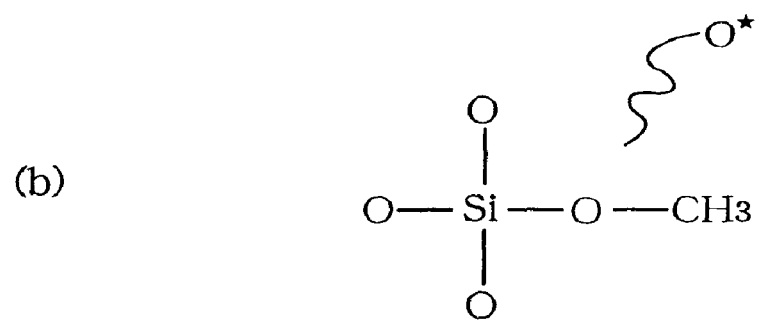
(c) 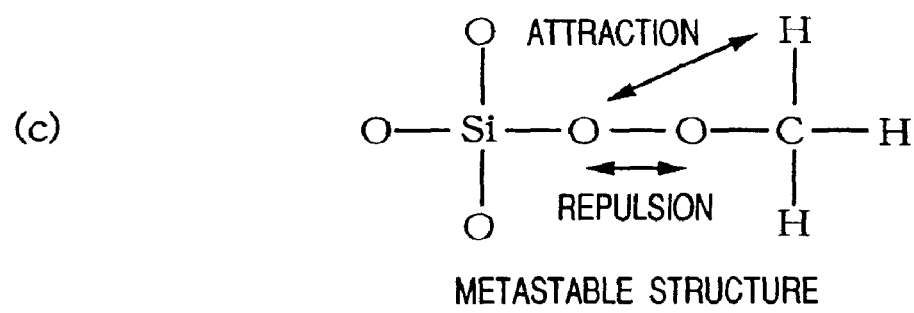
(d) 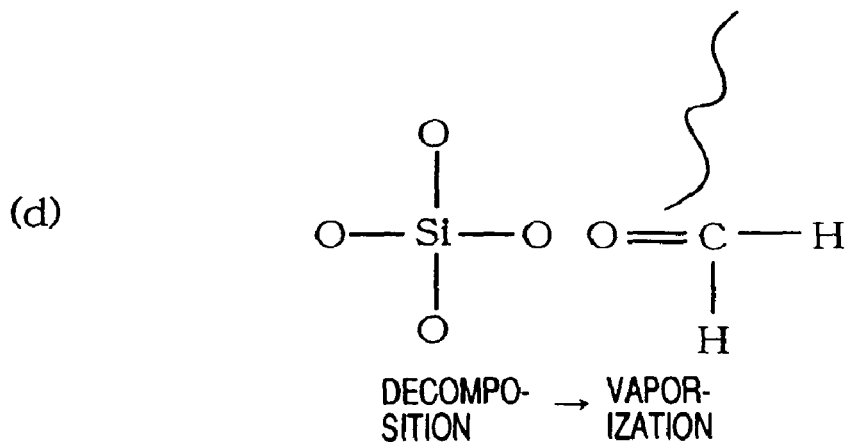

FIG. 3
(a) 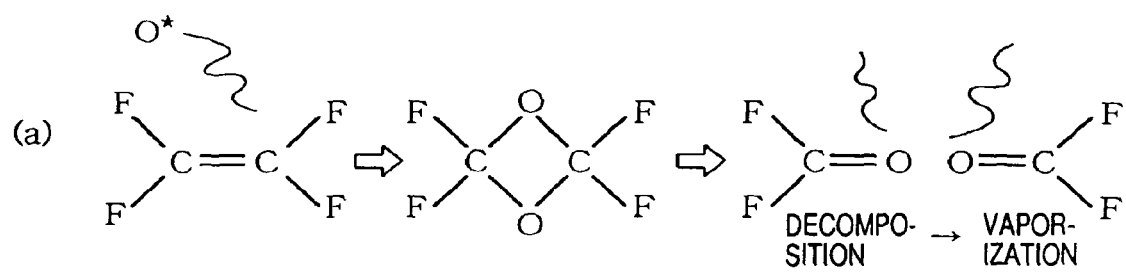
(b) 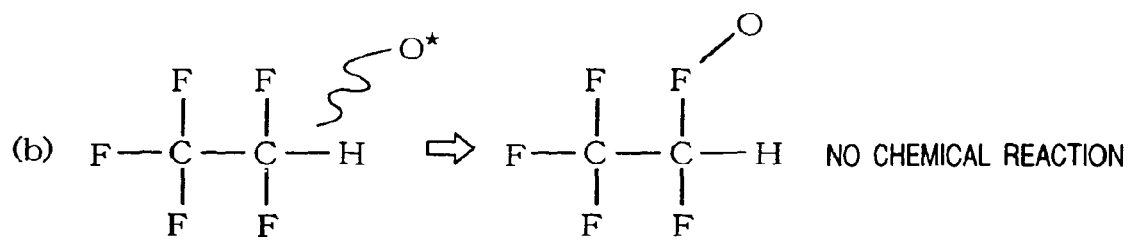
(c) 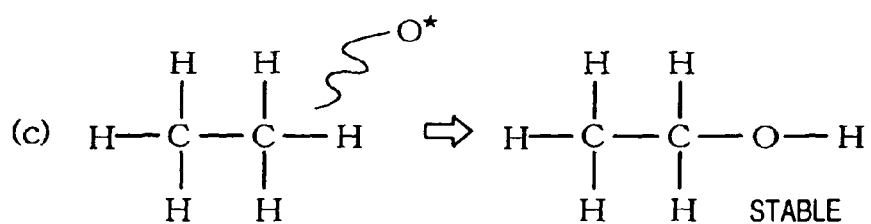

FIG. 5
(a) 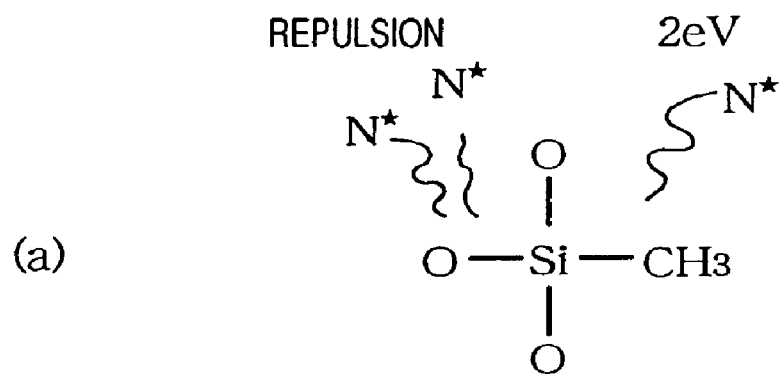
(b) 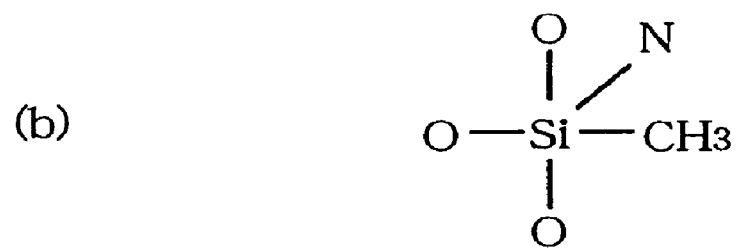
(c) 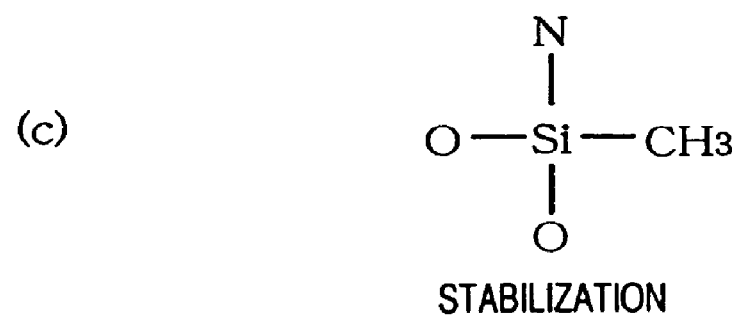

1: INSULATING FILM
2: ORGANIC INSULATING FILM
3: PHOTORESIST FILM
4: RECESS

FIG. 10

| | CF GAS ALONE | CF GAS / O2 | CF GAS / N2 |
|---|---|---|---|
| ETCHING RATE | × | ○ | ○ |
| SELECTIVITY | × | ○ / × | ○ |
| FORM | △ | × / ○ | ○ |
| ELIMINATION PROPERTY | × | ○ | ○ |
| SYNTHETIC EVALUATION | × | △ | ○ |

FIG. 19
(a)
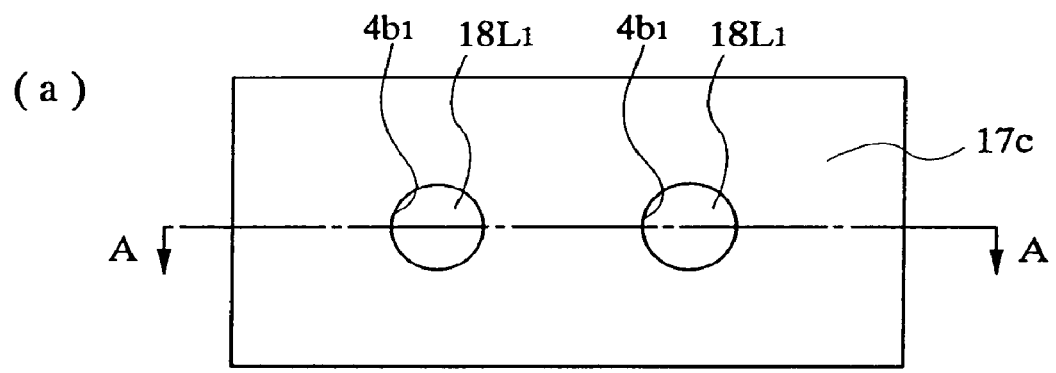
(b)
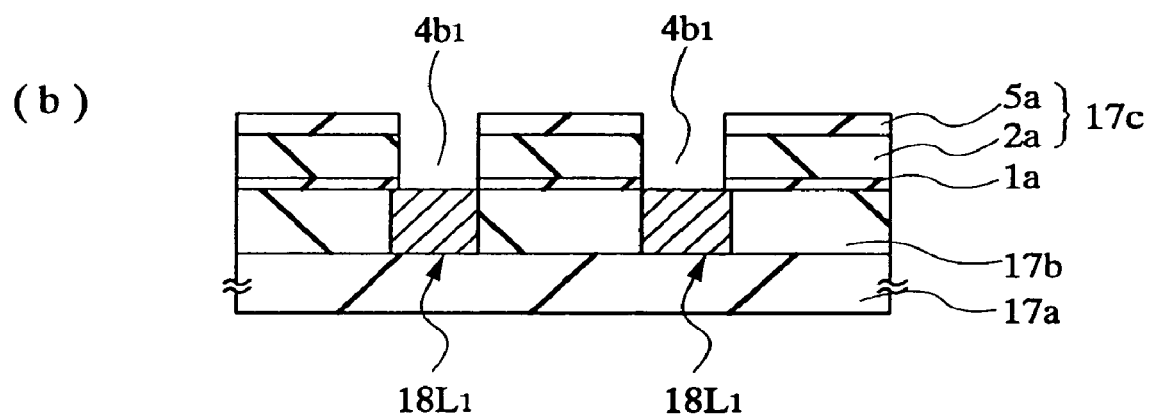

FIG. 23
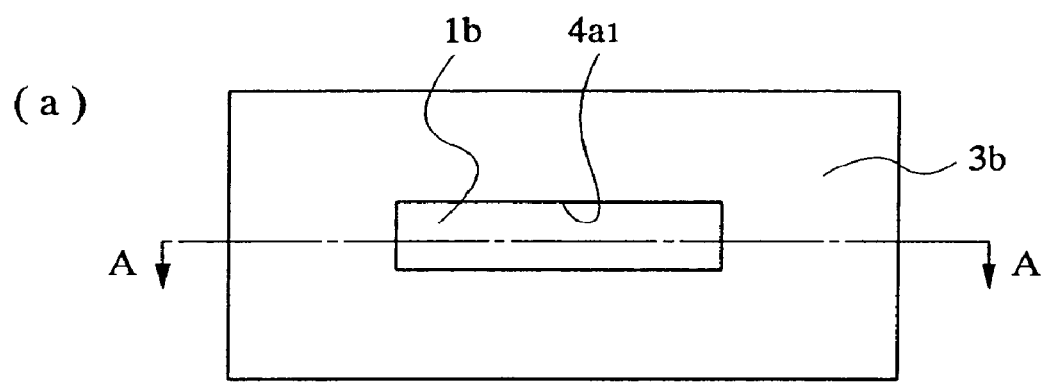
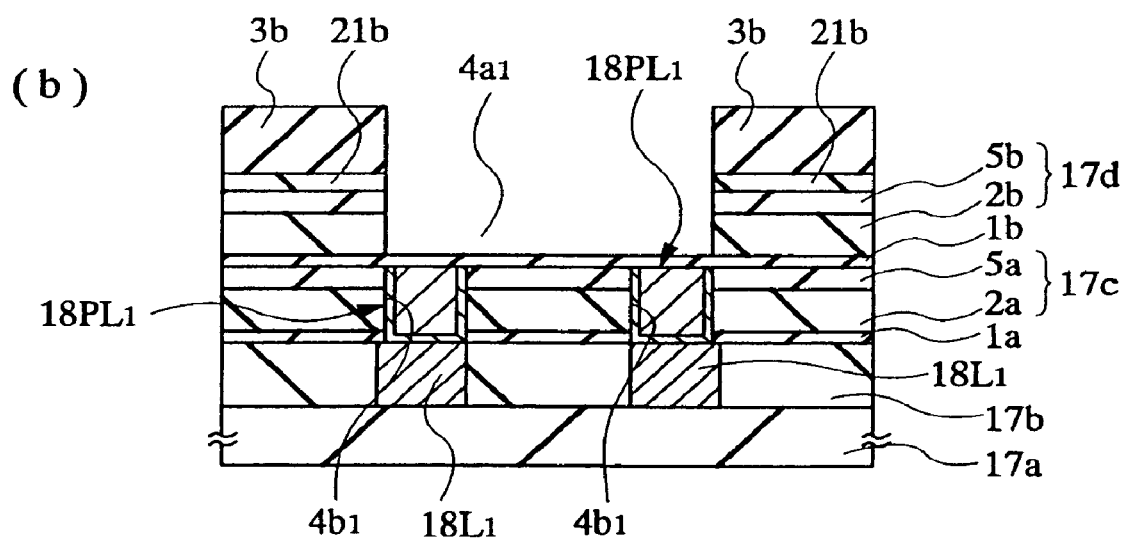

FIG. 24
(a)
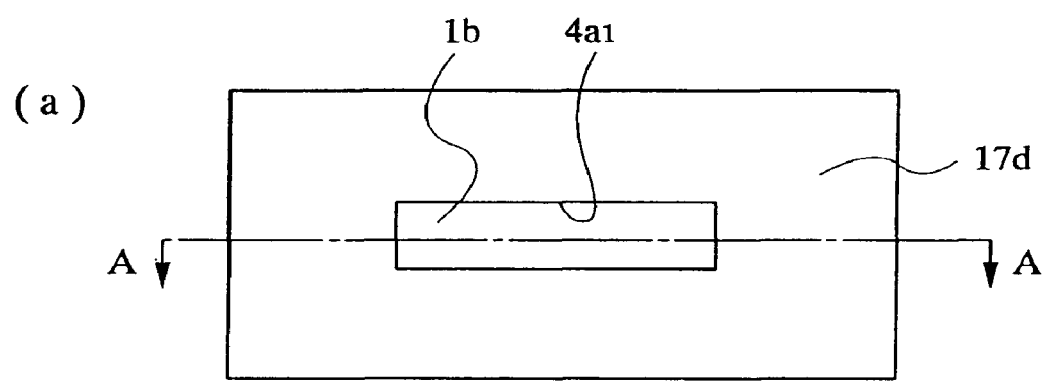
(b)
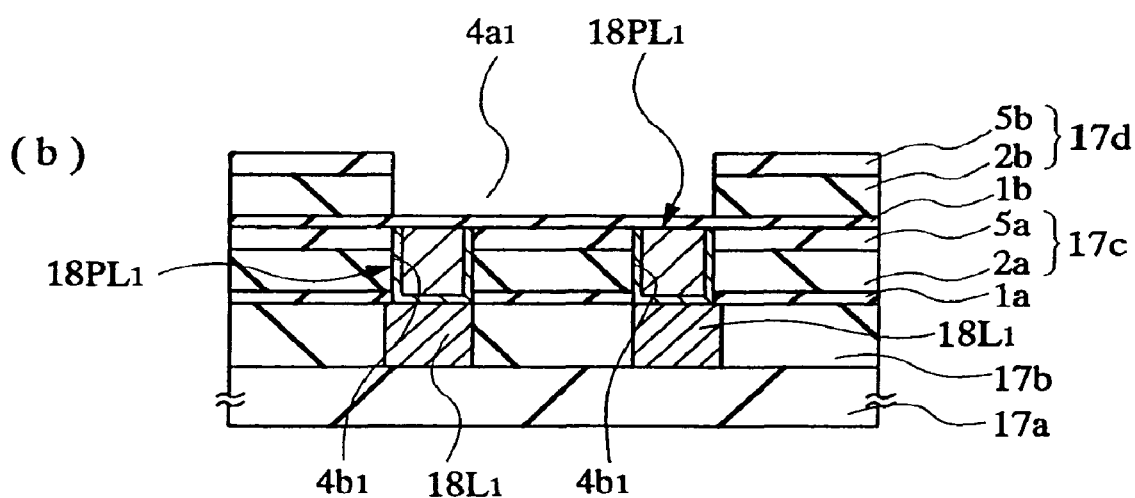

FIG. 25
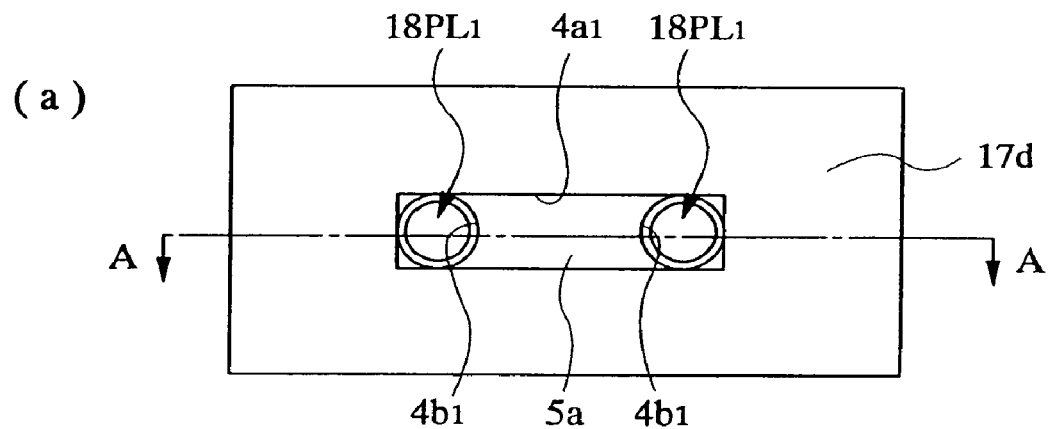
(a)
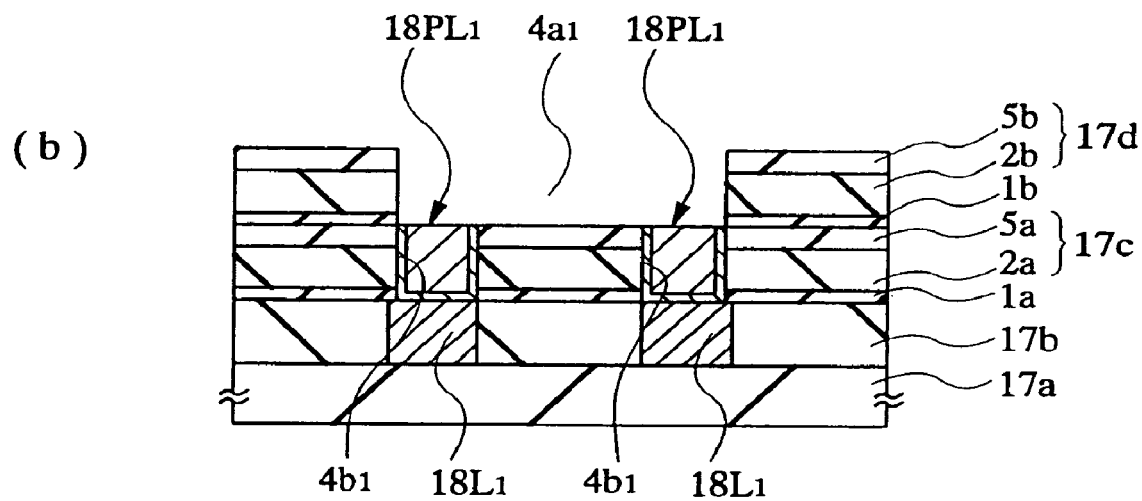
(b)

FIG. 35
(a)
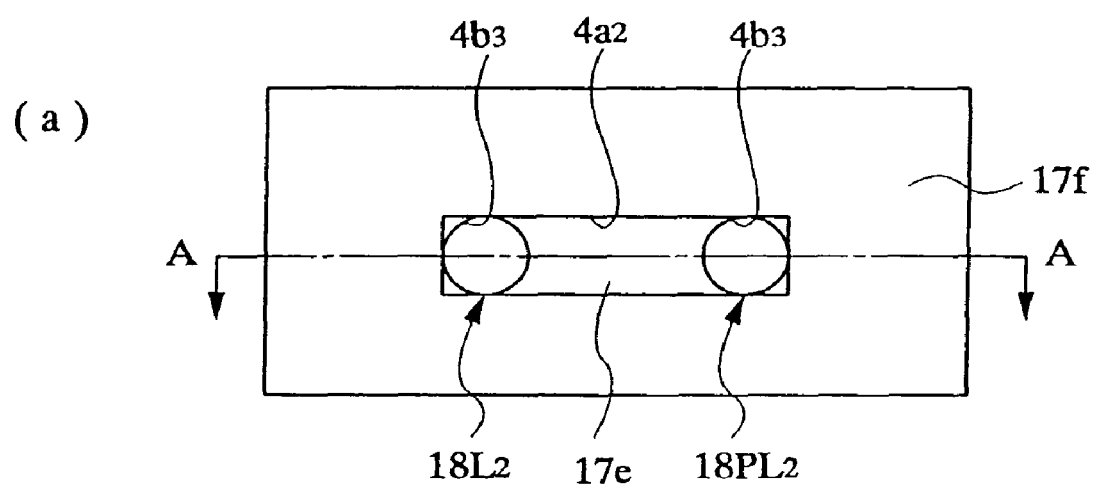
(b)
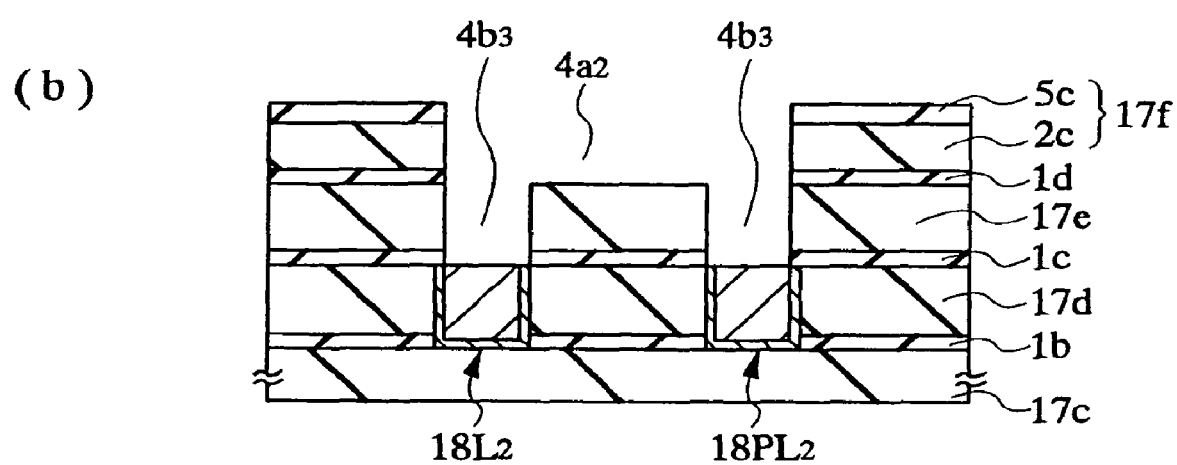

FIG. 36
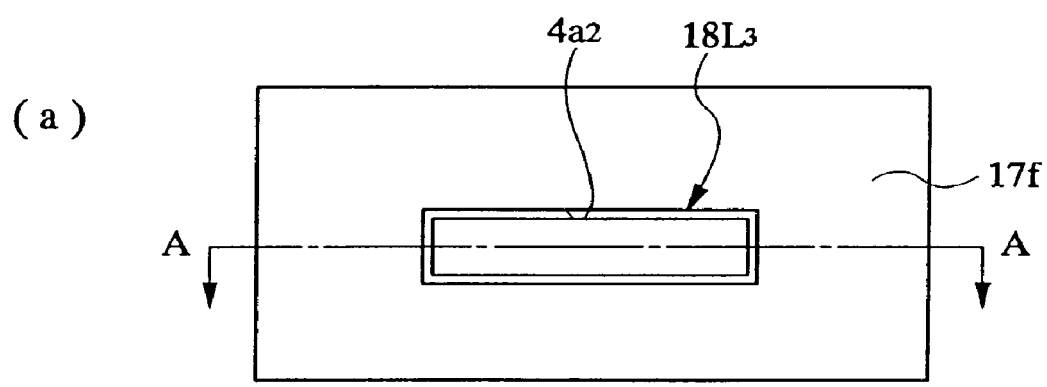
(a)
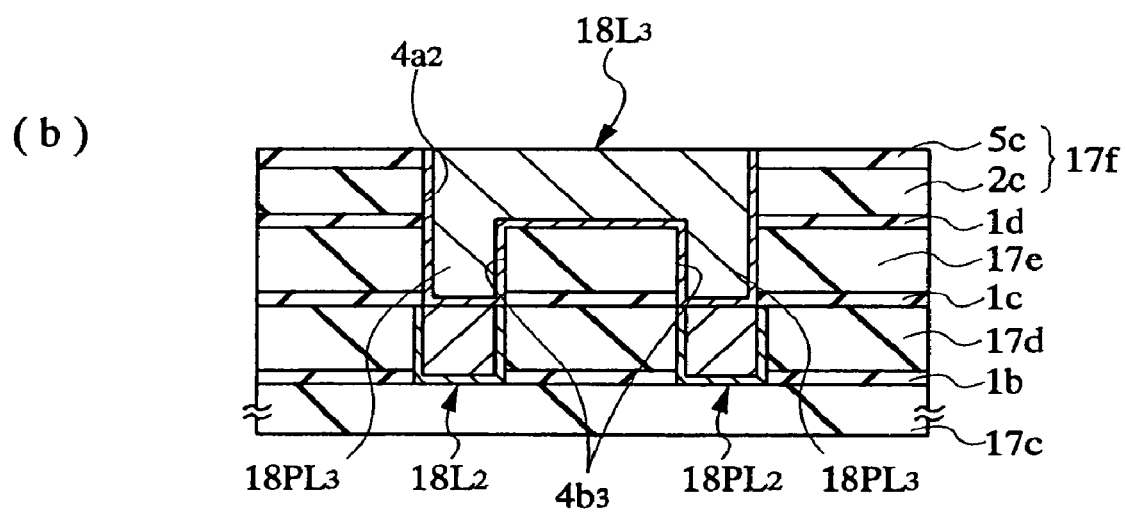
(b)

FIG. 37
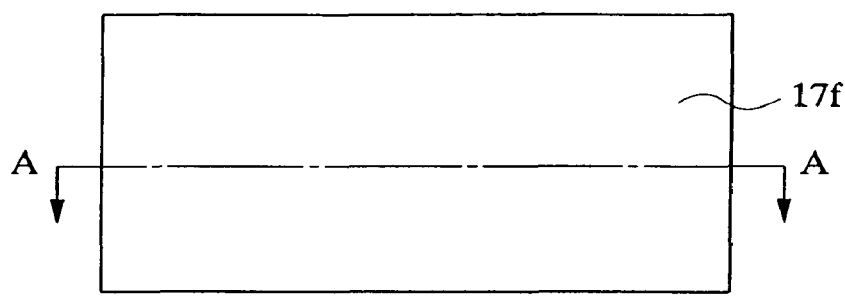
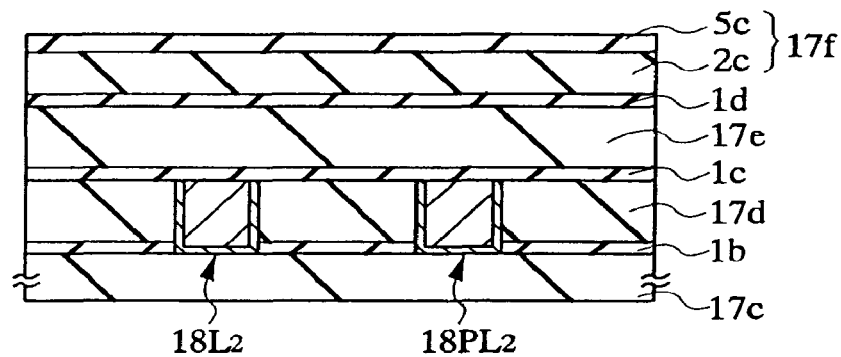
FIG. 38
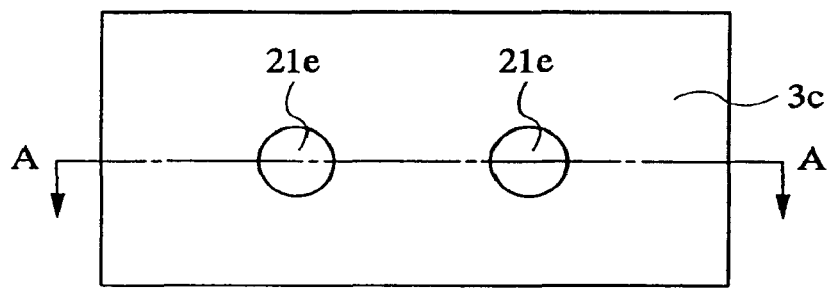
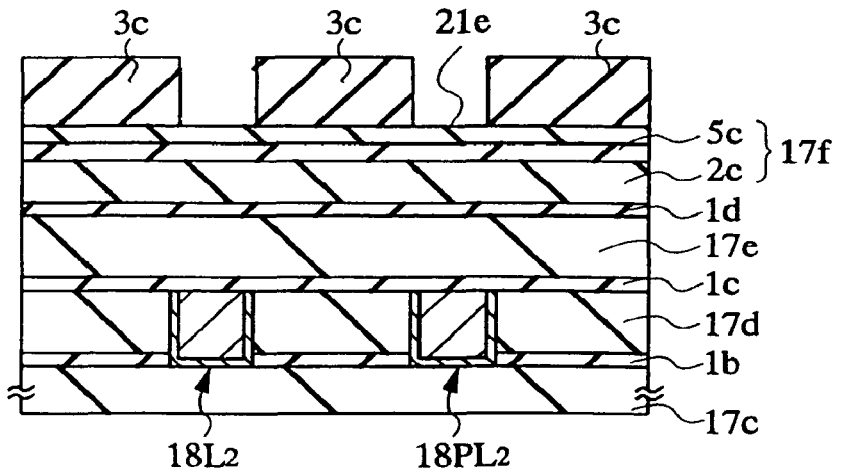

FIG. 40
(a)
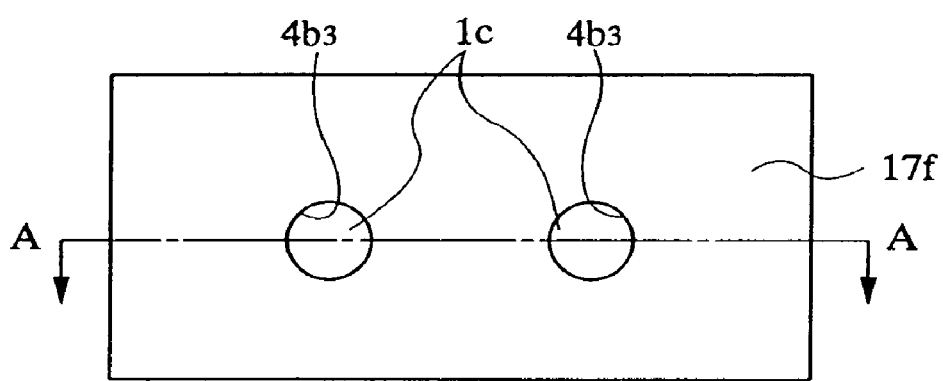
(b)
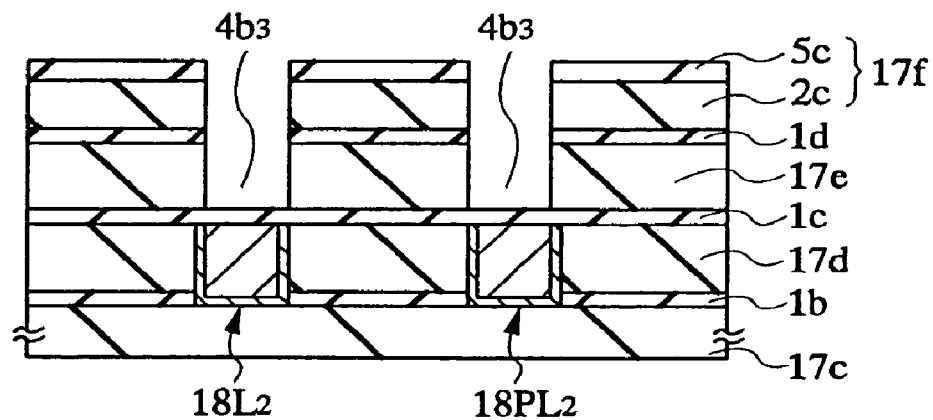

FIG. 43
(a)
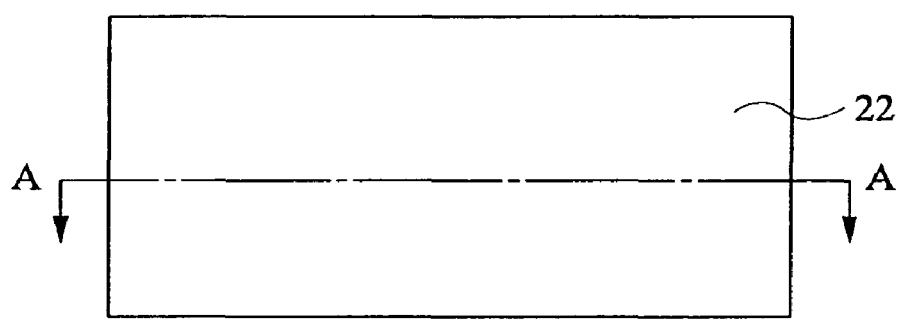
(b)
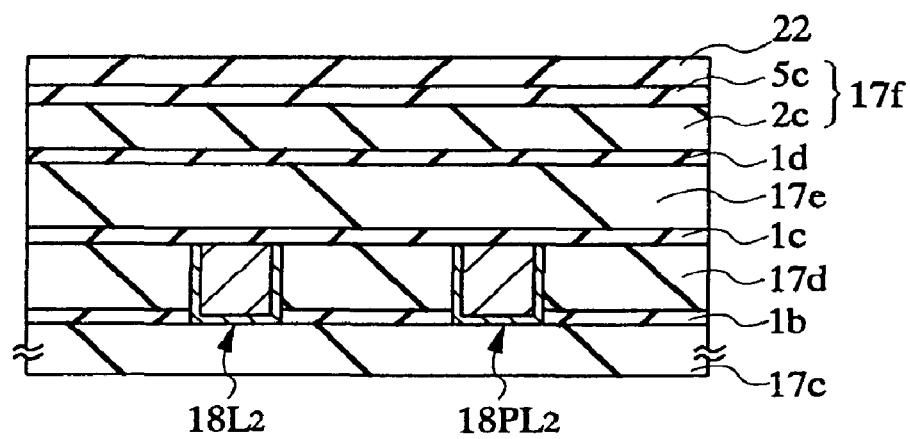

FIG. 44
(a) 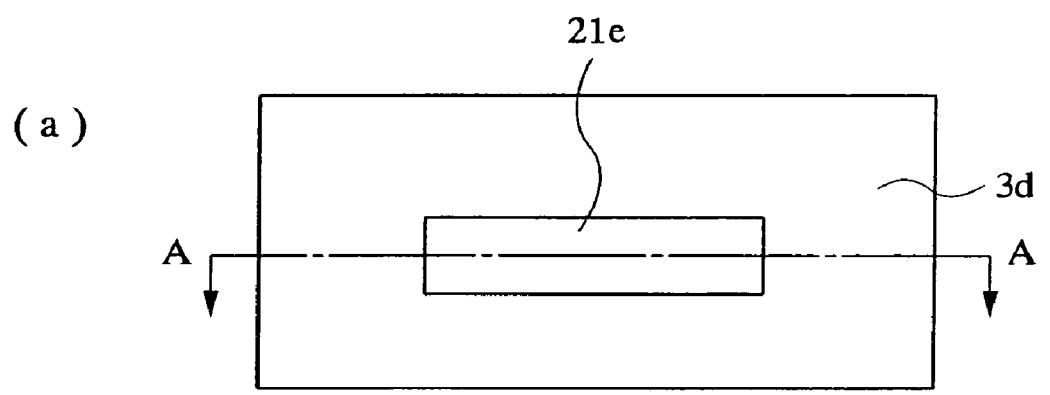
(b) 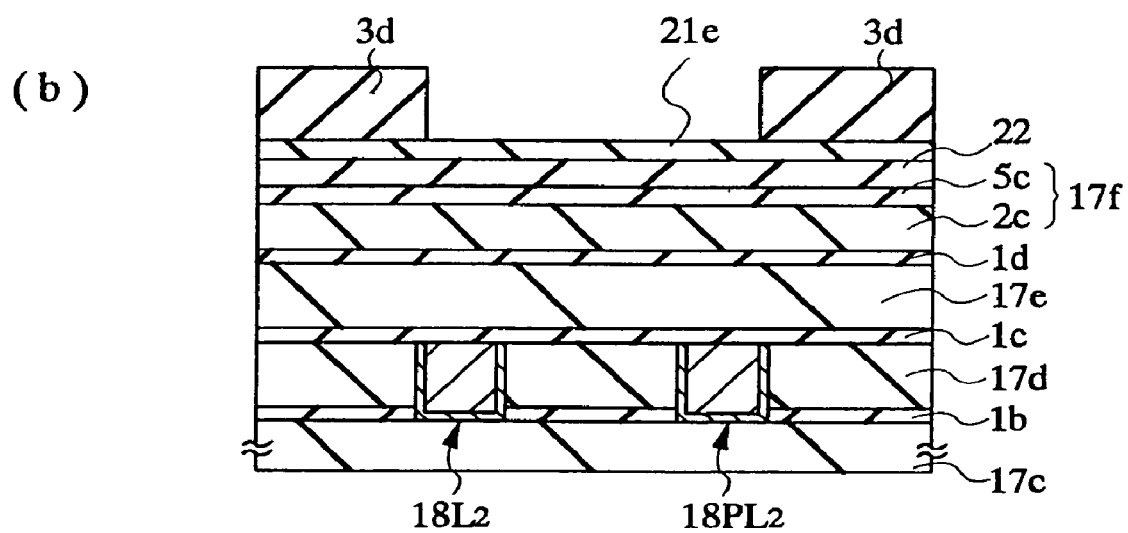

FIG. 45
(a)
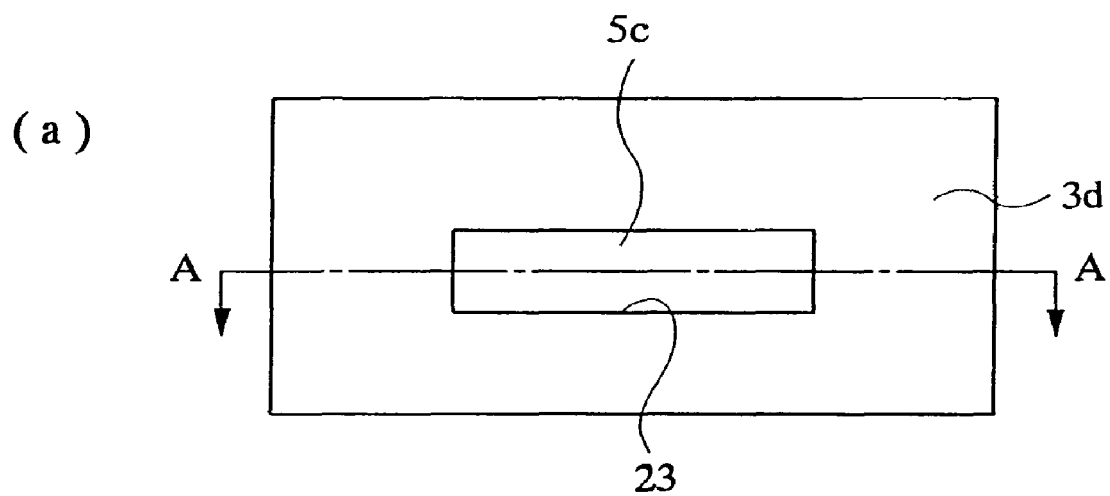
(b)
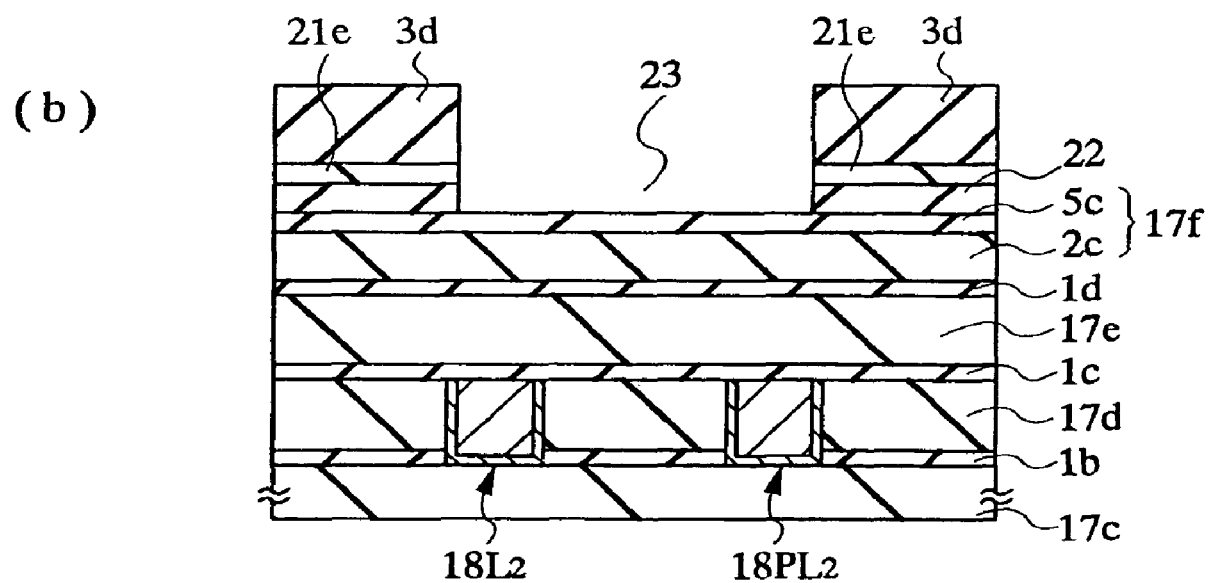

FIG. 46
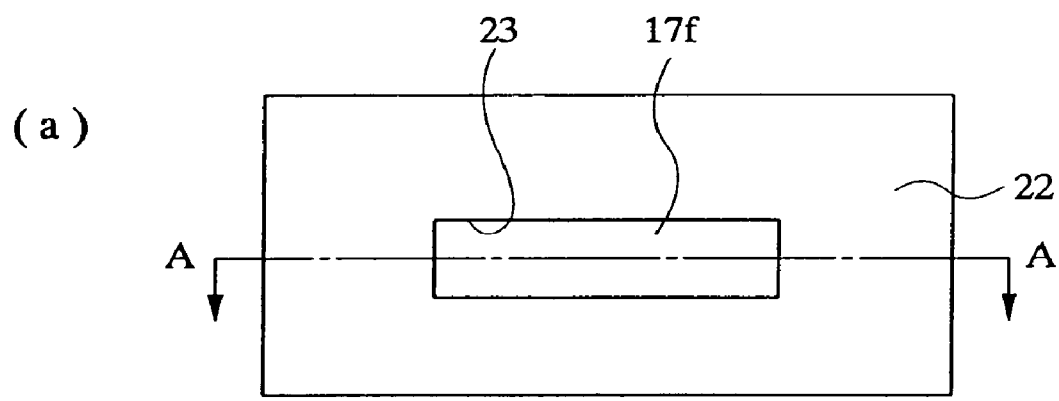
(a)
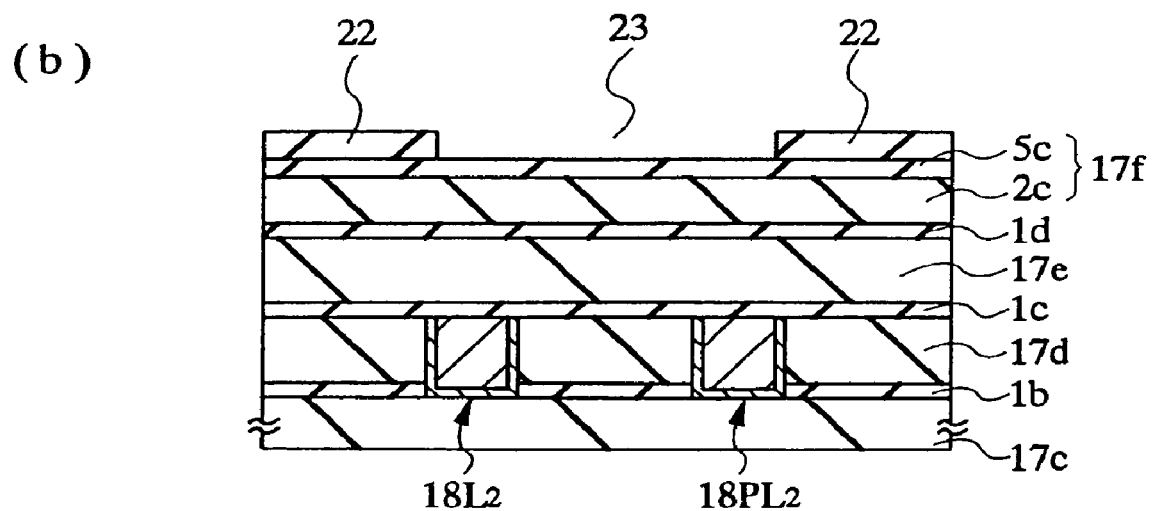
(b)

FIG. 47
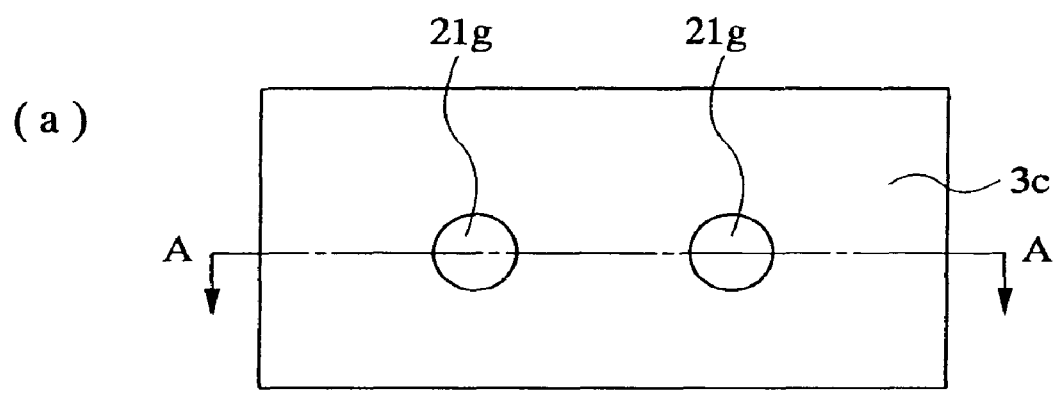
(a)
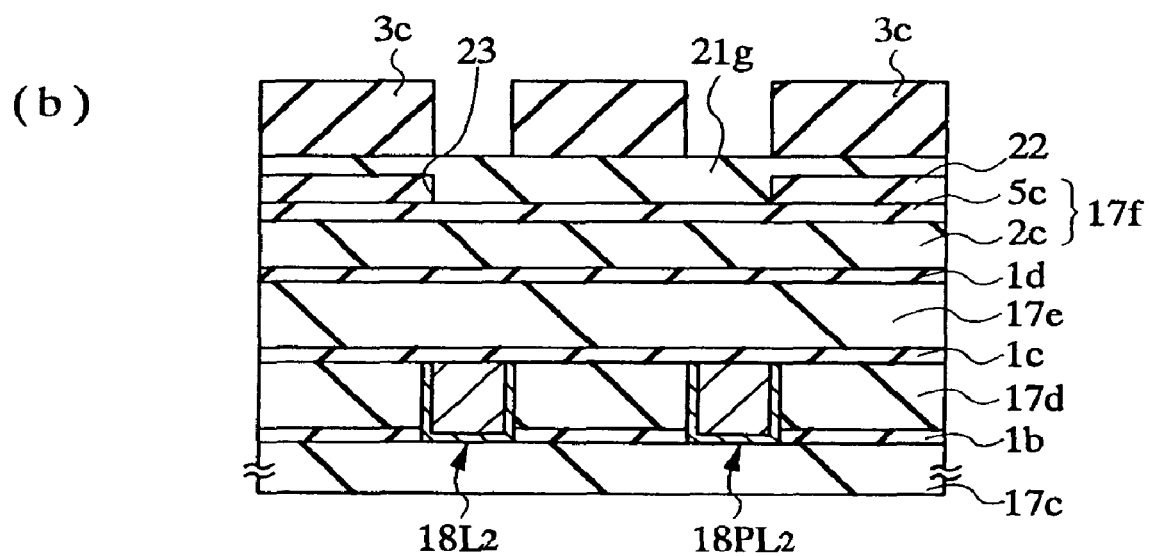
(b)

FIG. 60

| | C4F8 FLOW RATE > O2 FLOW RATE | C4F8 FLOW RATE ≦ O2 FLOW RATE |
|---|---|---|
| SCHEMATIC CROSS-SECTIONAL VIEW | (4, 3, 2) | (4, 55, 55, 3, 2) |
| FORM | ○ | × (HAVING A SIDE TRENCH) |
| SELECTIVITY TO SiN | × (NOT GREATER THAN 2) | ○ (NOT GREATER THAN 5) |
| ETCHING APPARATUS | TOKYO ELECTRON IEM | |
| ETCHING GAS | C4F8/O2/Ar | |
| PRESSURE | 2 5 mTorr | 3 0 mTorr |
| HIGH-FREQUENCY POWER | 5 0 0 / 2 0 0 W | 2 2 0 0 / 1 4 0 0 W |
| STAGE TEMPERATURE | −2 0 ℃ | |

FIG. 61
(a)
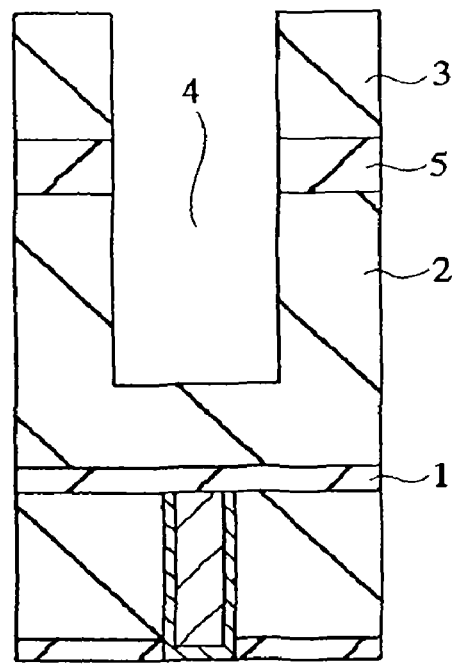
(b)
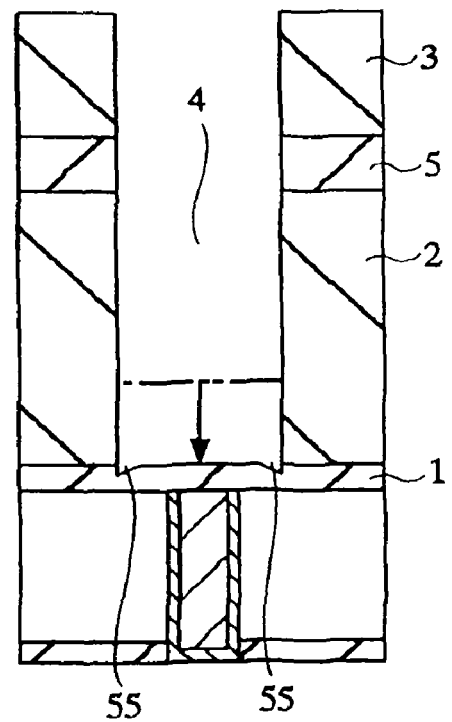

FIG. 62
(a)
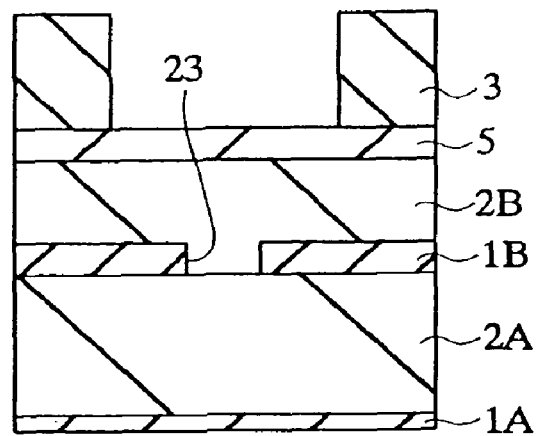
(b)
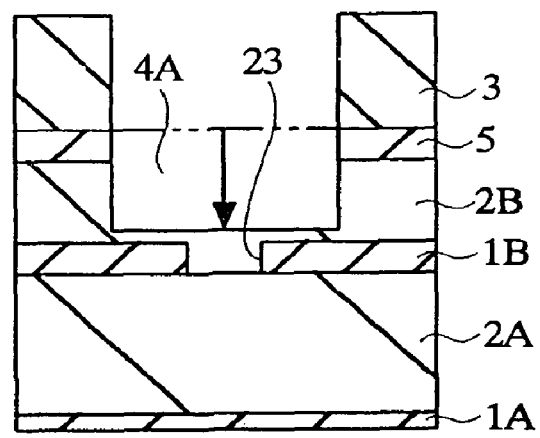
(c)
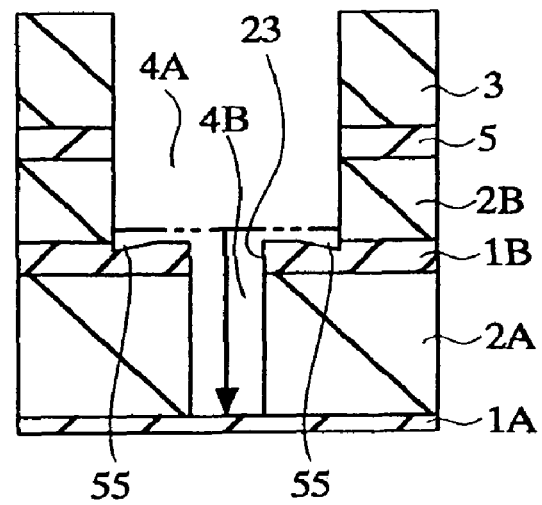

FIG. 91
(a)
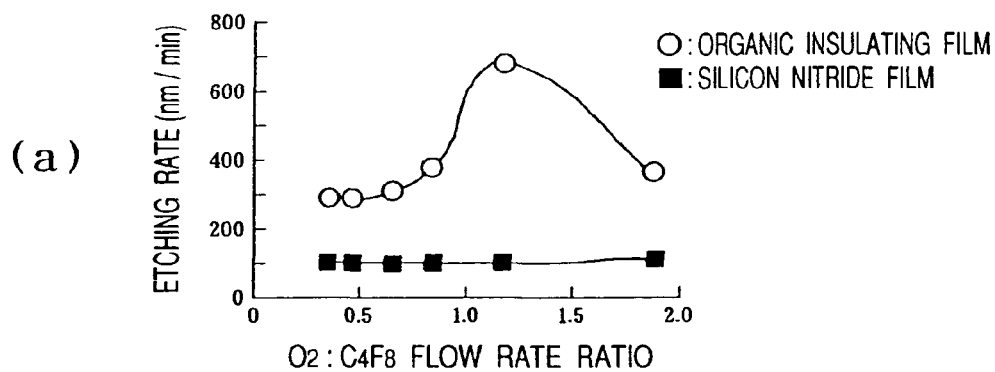
(b)
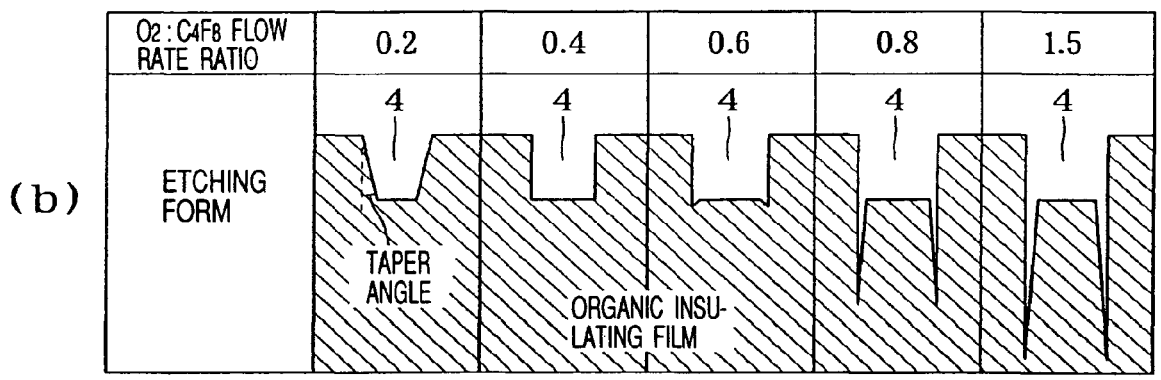
(c)
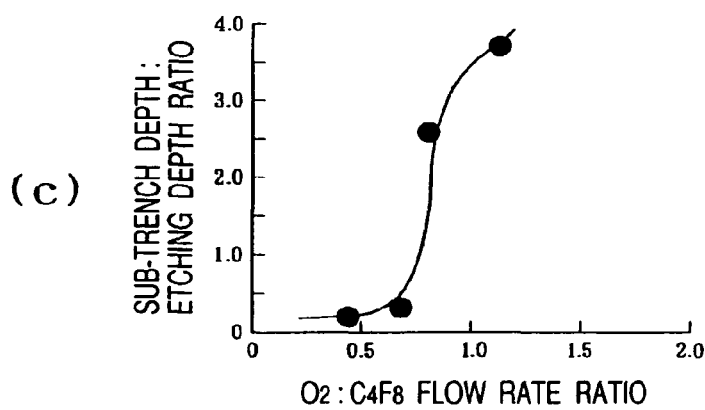

FIG. 92
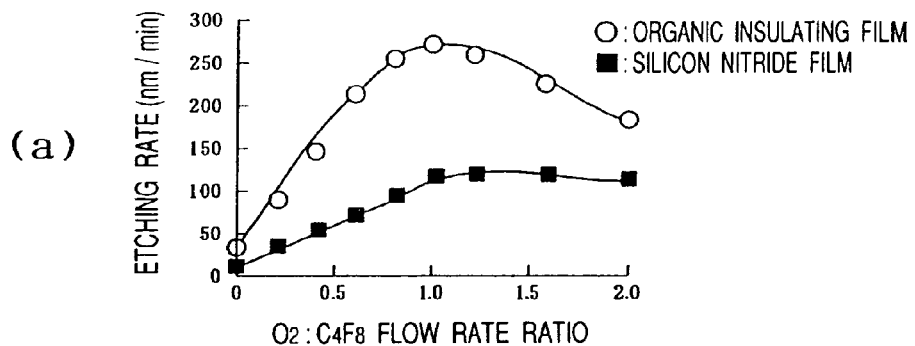
(a)
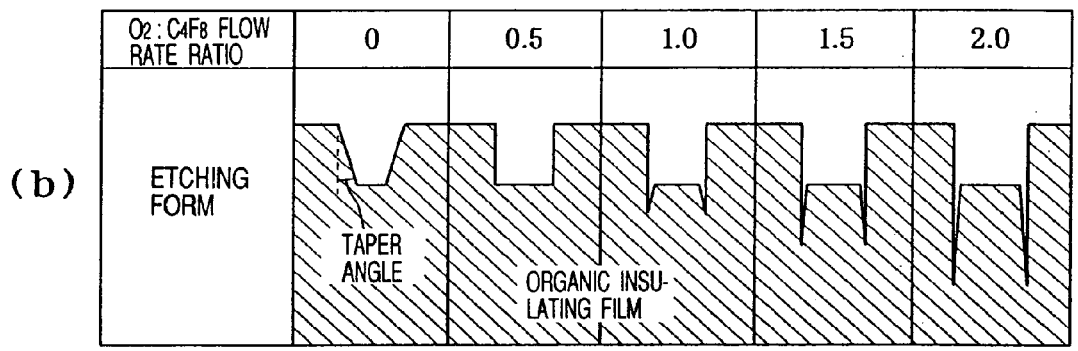
(b)
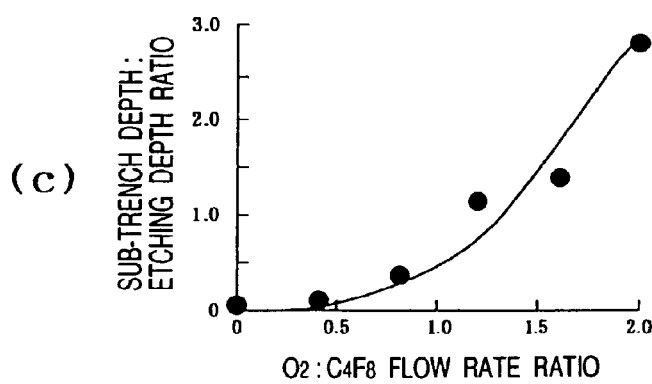
(c)

FIG. 103
(a)
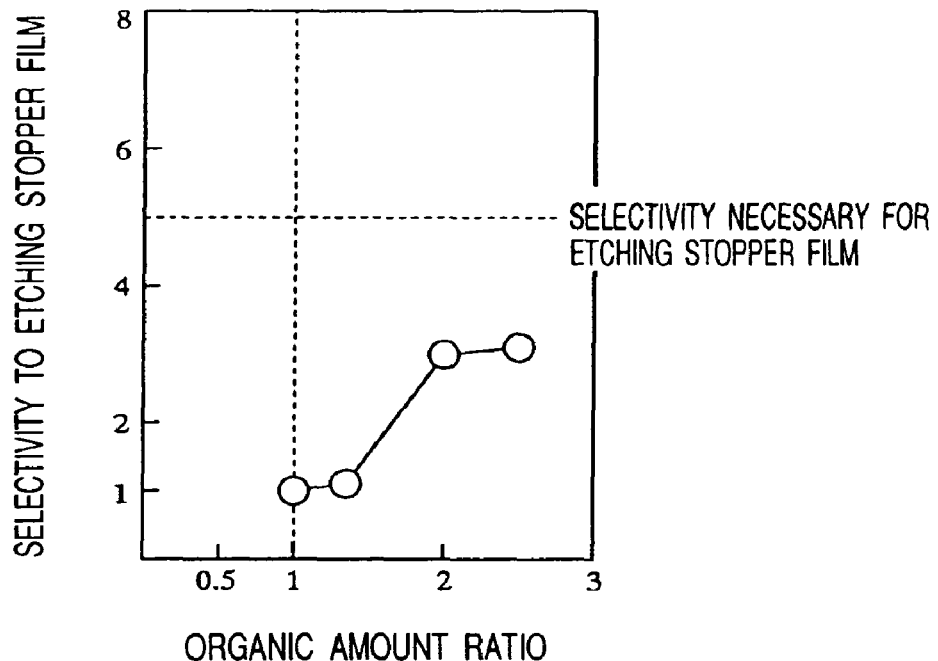
(b)
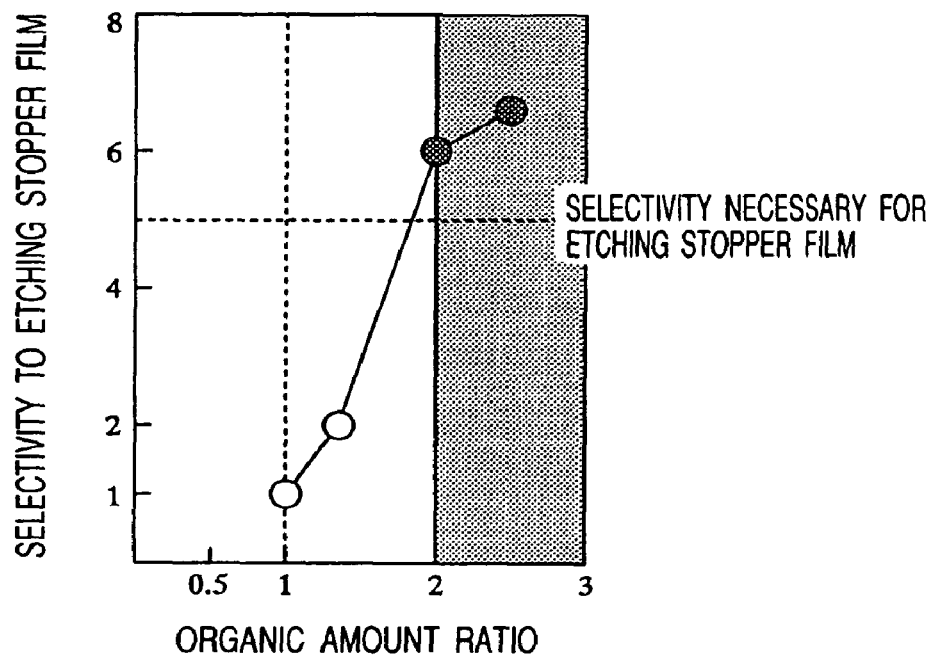

FIG. 104
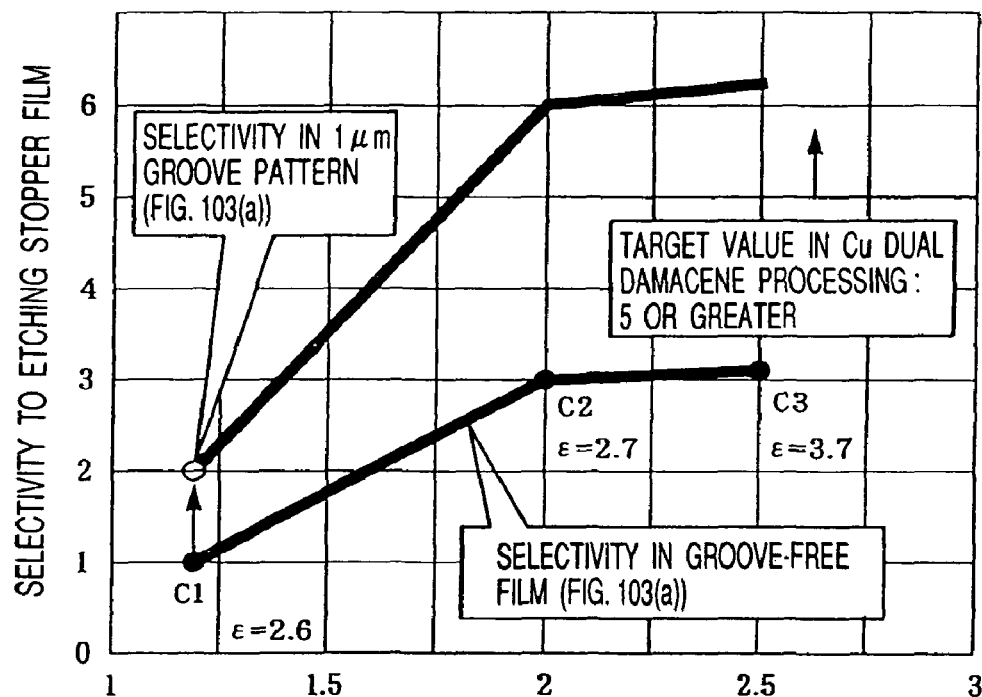
(a)
(b) STRUCTURE OF C1    STRUCTURE OF C2, c3
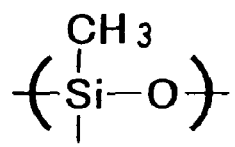 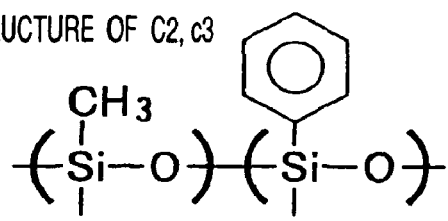

FIG. 107

| | ADHESION | SELECTIVITY (TO ORGANIC SOG) | Cu DIFFUSION-PREVENTIVE LEAK PROPERTY | DIELECTRIC CONSTANT |
|---|---|---|---|---|
| SiN | ○ | 5~10 | ○ | 7.0 |
| PTEOS | ○ | 2~3 | × | 4.2 |
| Blok | △ | 5~10 | △ | 5.0 |
| NOVEL ETCHING STOPPER FILM | ○ | 5~10 | △ | 2.5~4.0 |

(a)  (b)

(a)  (b)

FIG. 116
(a) 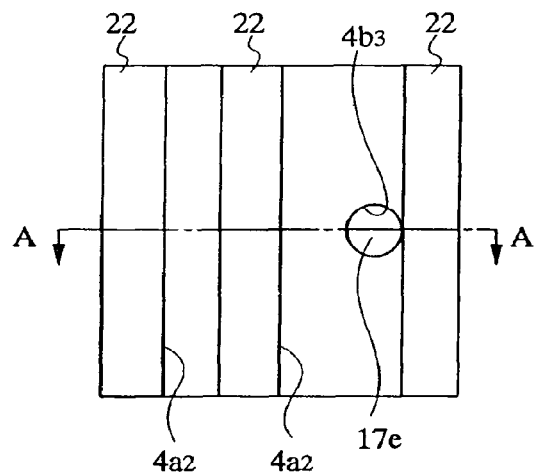
(b) 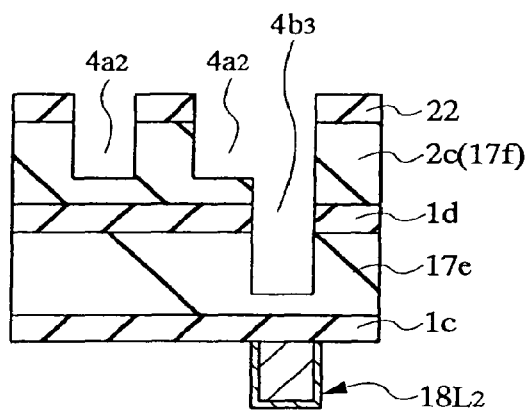
FIG. 117
(a) 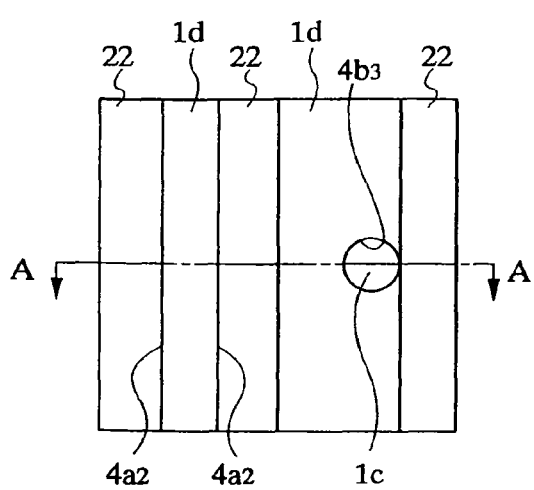
(b) 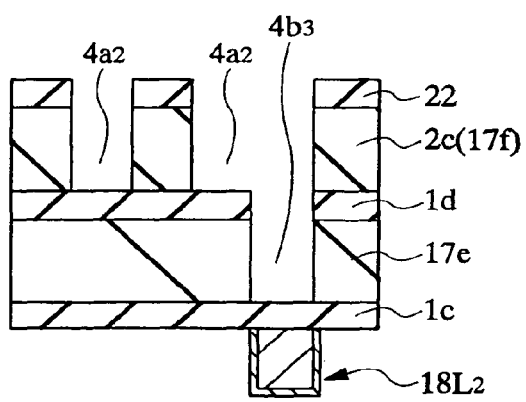

METHOD OF MANUFACTURE OF SEMICONDUCTOR INTEGRATED CIRCUIT DEVICE AND SEMICONDUCTOR INTEGRATED CIRCUIT DEVICE

CROSS REFERENCE TO RELATED APPLICATION

This application is a continuation of U.S. application Ser. No. 11/104,441, filed Apr. 13, 2005 now U.S. Pat. No. 7,419, 902, which is a continuation of U.S. application Ser. No. 09/646,671, filed Sep. 20, 2000 now abandoned, the contents of which are incorporated herein by reference in their entirety. Application Ser. No. 09/646,671 is a National Stage application filed under 35 USC 371 of International (PCT) Application No. PCT/JP00/04046, filed Jun. 21, 2000.

TECHNICAL FIELD

This invention relates to a process and technique for the manufacture of a semiconductor integrated circuit device, particularly, to a technique which is effective when adapted to a multilevel metallization process in the manufacture of a semiconductor integrated circuit device.

BACKGROUND OF THE INVENTION

In line with improvements in the degree of element integration or in the reduction in the size of a semiconductor chip in a semiconductor integrated circuit device, miniaturization and multilevel fabrication of interconnects constituting the semiconductor integrated circuit device have been carried out. Particularly, in a logic type semiconductor integrated circuit device having a multilevel interconnect structure, wiring delay is one of the factors which strongly influence the signal delay of the whole semiconductor integrated circuit device. The velocity of a signal which passes through an interconnect strongly depends on the wiring resistance and wiring capacitance, so that a reduction in each of the wiring resistance and the wiring capacitance is important for obtaining an improvement in the wiring delay.

In order to reduce the wiring resistance, a damascene process using a copper-based material (copper or copper alloy) as a wiring material has been employed. In the damascene process, an inlaid interconnect is formed by forming an interconnect-forming trench in an insulating film, adhering an interconnect-forming conductor film both on the insulating film and inside of the interconnect-forming trench, and then removing the unnecessary portion of the conductor film by chemical mechanical polishing (CMP) or the like to leave the conductor film only inside of the trench. This method makes it possible to fabricate an interconnect from a copper-based material which cannot be miniaturized easily by etching.

A dual-damascene process, which is an application of the above-described damascene process, is a method of forming, in an insulating film, an interconnect-forming trench and a hole, such as a contact hole or a through-hole, which extends from the bottom of the trench toward the underlying connecting portion, adhering an interconnect-forming conductor film on the insulating film and inside of the interconnect-forming trench and hole, and removing the unnecessary portion of the conductor film by CMP or the like to leave the conductor film only in the trench and hole, thereby forming an inlaid interconnect in the interconnect-forming trench and a plug in the hole.

An example of such a dual-damascene process is disclosed in Japanese Patent Application Laid-Open No. Hei 9(1997)-306988, wherein an insulating film, which has an opening portion formed for the perforation of a hole and serves as an etching stopper, is disposed between a first interlevel dielectric film and a second interlevel dielectric film laid thereover, and upon formation of a trench in the second interlevel dielectric film by using a photoresist film, the first interlevel dielectric film exposed from the opening portion of the insulating film is perforated with the insulating film as an etching stopper. Another example is disclosed in Japanese Patent Application Laid-Open No. Hei 10(1998)-209273, wherein a trench is formed in an interlevel dielectric film, followed by perforation of a hole extending downwards from the bottom of the trench.

In order to reduce the wiring capacitance, the technique employing as an insulating film, as described above, an organic SOG (Spin On Glass) film, having a methyl group incorporated in a silicon oxide film, can be employed. Owing to a low dielectric constant, this organic SOG film permits lowering of the total dielectric constant of the interconnects of a semiconductor integrated circuit device. A technique using an insulating film having a low dielectric constant as an interlevel dielectric film is described, for example, on pages 74 to 76, "Monthly Semiconductor World, November issue", published on Oct. 20, 1998 by Press Journal Co., Ltd. This publication discloses various inorganic or organic interlevel dielectric films to be used as an interlevel dielectric film for metallization employing a damascene or dual-damascene process.

Japanese Patent Application Laid-Open No. Hei 9(1997)-293780 discloses a semiconductor integrated circuit devise technique using an organic SOG film as an interlevel dielectric film of the ordinary interconnect structure.

Japanese Patent Application Laid-Open No. Hei 11(1999)-67909 discloses a problem of isotropic etching, in the plane direction, of the side surfaces of a trench or hole upon formation of a trench or hole in an organic low-dielectric-constant film by etching; and a technique is proposed, as a solution of the problem, of employing a foaming gas upon over-etching treatment.

Japanese Patent Application Laid-Open No. Hei 8(1996)-316209 discloses a problem of lowering of the etching rate or deterioration of a processed shape upon etching treatment of an organic polymeric insulating film, which is due to carbon deposits formed on the bottom surface or side surface of a trench or hole made in the organic polymeric insulating film as a result of plasma etching treatment using a CF-based or CHF-based gas similar to that used for etching treatment of a silicon oxide film; and techniques are proposed, as solutions therefor, for conducting plasma etching treatment using an oxygen-based gas upon etching of the organic polymeric insulating film or for conducting plasma etching treatment under the conditions of a lowered C/F ratio in the plasma.

In the above-described damascene or dual-damascene process, an insulating film serving as an etching stopper is formed under the interlevel dielectric film upon formation of an interconnect-forming trench or a hole in the interlevel dielectric film in order to avoid damage to the underlying film by excessive perforation or a deterioration in the processing size accuracy. In the technique for constituting an interlevel dielectric film from silicon oxide or the like, a silicon nitride film is employed as an insulating film serving as an etching stopper. The silicon nitride film has, however, a high dielectric constant (about 7) so that it is necessary to form it as thin as possible from the viewpoint of lowering the total dielectric constant of the interconnects. Upon formation of a trench or hole in an interlevel dielectric film made of silicon oxide or the like, therefore, a technique is employed wherein a $C_xF_y$- based gas and oxygen gas are used, thereby carrying out etching under conditions permitting a high etching selectivity to the interlevel dielectric film relative to the insulating film serving as an etching stopper.

The present inventors, however, have found that the formation of a trench or hole by highly-selective etching treatment using, as an etching gas, a $C_xF_y$-based gas and $O_2$ gas, is inevitably accompanied by the problem that a trench (sub-trench) relatively deeper than the depth at the bottom center of the trench or hole is formed at the outer periphery of the bottom of the trench or hole. Use of an etching gas having low selectivity to avoid such a problem, however, requires an increase in the thickness of the insulating film serving as an etching stopper, resulting in the problem of an increase in the total dielectric constant of the interconnects of a semiconductor integrated circuit device.

An object of the present invention is, therefore, to provide a technique which is capable of suppressing, upon formation of a recess in an insulating film including an organosiloxane as a main component by etching, the formation of an abnormal shape at the bottom of the recess.

Another object of the present invention is to provide a technique which is capable of suppressing, upon formation of a recess in an insulating film including an organosiloxane as a main component by etching, the formation of an abnormal shape at the bottom of the recess while maintaining a high etching selectivity to the insulating film relative to the etching stopper film.

A further object of the present invention is to provide a technique which is capable of forming a minute recess in an insulating film including an organosiloxane as a main component.

A still further object of the present invention is to provide a technique which is capable of reducing the total dielectric constant of the interconnects of a semiconductor integrated circuit device.

The above-described and the other objects and novel features of the present invention will be apparent from the description herein and the accompanying drawings.

SUMMARY OF THE INVENTION

Among the features disclosed by the present application, a summary of typical aspects will hereinafter be described briefly.

The present invention comprises subjecting an insulating film, including an organosiloxane as a main component, to plasma etching treatment in a gas atmosphere containing a fluorocarbon gas and a nitrogen gas, thereby forming a recess, such as an interconnect-forming trench or hole in the organic insulating film.

In addition, the present invention comprises, upon formation of a recess, such as interconnect-forming trench or hole in an organic insulating film, including an organosiloxane as a main component, by subjecting the insulating film to plasma etching treatment in a gas atmosphere containing a fluorocarbon gas and an oxygen gas, carrying out the etching treatment in plural stages while changing etching conditions.

Moreover, the present invention comprises, upon formation of a recess, such as interconnect-forming trench or hole in an organic insulating film, including an organosiloxane as a main component, by subjecting the insulating film to plasma etching treatment in a gas atmosphere containing a fluorocarbon gas and an oxygen gas, and forming the recess while setting a flow rate ratio of the fluorocarbon gas to the oxygen gas at a predetermined value.

Furthermore, the present invention comprises constituting an insulating film—used as an etching stopper upon formation of a recess, such as trench or hole in an insulating film, which constitutes an interlevel dielectric film and includes an organosiloxane as a main component—to have a larger organic content than the insulating film which constitutes an interlevel dielectric film and includes an organosiloxane as a main component.

Among the embodiments disclosed by the present application, a summary of features other than the above-described ones will next be described briefly.

1. A manufacturing process of a semiconductor integrated circuit device, which comprises:

(a) forming a first insulating film including an organosiloxane as a main component over the first main surface of a semiconductor integrated circuit substrate;

(b) forming a patterned masking layer over the first insulating film; and (c) subjecting the first insulating film, with the masking layer thereover, to plasma etching treatment in a gas atmosphere containing a fluorocarbon-gas-containing etching gas and a nitrogen gas, thereby forming a first recess in the first insulating film.

2. A manufacturing process of a semiconductor integrated circuit device according to the above-described item 1, wherein the largest gas component in the gas atmosphere is an argon gas.

3. A manufacturing process of a semiconductor integrated circuit device according to the above-described item 1 or 2, wherein the gas atmosphere contains an oxygen gas.

4. A manufacturing process of a semiconductor integrated circuit device according to the above-described item 1 or 2, wherein the gas atmosphere is substantially free of an oxygen gas.

5. A manufacturing process of a semiconductor integrated circuit device, which comprises:

(a) forming, over the first main surface of a semiconductor integrated circuit substrate, a first insulating film including a first organosiloxane as a main component; and (b) forming, over the first insulating film, a second insulating film including a second organosiloxane which has a smaller carbon content than the first organosiloxane as a main component.

6. A manufacturing process of a semiconductor integrated circuit device according to the above-described item 5, wherein the second insulating film is thicker than the first insulating film.

7. A manufacturing process of a semiconductor integrated circuit device according to the above-described item 5 or 6, wherein the first insulating film has a greater carbon content than the second insulating film by at least 50%.

8. A manufacturing process of a semiconductor integrated circuit device according to the above-described item 5 or 6, wherein the first insulating film has a greater carbon content than the second insulating film by least 100%.

9. A manufacturing process of a semiconductor integrated circuit device, which comprises:

(a) forming, over the first main surface of a semiconductor integrated circuit substrate, a first insulating film including an organosiloxane as a main component;

(b) forming a patterned masking layer over the first insulating film;

(c) subjecting the first insulating film, with the masking layer thereover, to plasma etching treatment in a gas atmosphere containing a fluorocarbon-gas-containing etching gas and an oxygen gas in an amount not permitting substantial formation of an abnormal shape, thereby forming a first recess in the first insulating film.

10. A manufacturing process of a semiconductor integrated circuit device according to the above-described item 9, wherein a ratio of the oxygen gas to the fluorocarbon gas is set at 1.0 or less.

11. A manufacturing process of a semiconductor integrated circuit device according to the above-described item 9, wherein a ratio of the oxygen gas to the fluorocarbon gas is set at 0.9 or less.

12. A manufacturing process of a semiconductor integrated circuit device according to the above-described item 9, wherein a ratio of the oxygen gas to the fluorocarbon gas is set at 0.8 or less.

13. A manufacturing process of a semiconductor integrated circuit device having an inlaid interconnect, which comprises:
(a) forming, over the first main surface of a semiconductor integrated circuit substrate, a first insulating film for the formation of the inlaid interconnect;
(b) forming, over the first insulating film, a second insulating film for the formation of the inlaid interconnect, which film includes an organosiloxane as a main component;
(c) forming a patterned masking layer over the second insulating film;
(d) subjecting the second insulating film, with the masking layer thereover, to first plasma etching treatment in a first gas atmosphere, thereby forming a first recess in the second insulating film; and
(e) subjecting the second insulating film, with the first recess formed therein, to second plasma etching treatment in a second gas atmosphere by using the first insulating film as an etching stopper under the conditions permitting a higher etching selectivity to the second insulating film relative to the first insulating film compared with the first plasma etching treatment, thereby exposing the first insulating film.

14. A manufacturing process of a semiconductor integrated circuit device according to the above-described item 13, wherein upon completion of the step (d), the thickness of the second insulating film on the bottom surface of the recess is 30% or less of the initial thickness of the second insulating film.

15. A manufacturing process of a semiconductor integrated circuit device according to the above-described item 13, wherein upon completion of the step (d), the thickness of the second insulating film on the bottom surface of the recess is 20% or less of the initial thickness of the second insulating film.

16. A manufacturing process of a semiconductor integrated circuit device according to the above-described item 13, wherein upon completion of the step (d), the thickness of the second insulating film on the bottom surface of the recess is 15% or less of the initial thickness of the second insulating film.

17. A manufacturing process of a semiconductor integrated circuit device according to any one of the above-described items 13, 14, 15 and 16, wherein the first insulating film includes silicon nitride as a main component.

18. A semiconductor integrated circuit device, which comprises:
(a) a first insulating film which is disposed over the first main surface of a semiconductor integrated circuit chip and includes a first organosiloxane as a main component; and
(b) a second insulating film which is disposed over the first insulating film and includes a second organosiloxane having a smaller carbon content than the first organosiloxane as a main component.

19. A semiconductor integrated circuit device according to the above-described item 18, wherein the second insulating film is thicker than the first insulating film.

20. A semiconductor integrated circuit device according to the above-described item 18 or 19, wherein the first insulating film has a greater carbon content than the second insulating film by at least 50%.

21. A semiconductor integrated circuit device according to the above-described item 18 or 19, wherein the first insulating film has a greater carbon content than the second insulating film by at least 100%.

22. A semiconductor integrated circuit device comprising:
(a) a first silicon nitride film, which is disposed over the first main surface of a semiconductor integrated circuit chip, is made of a silicon nitride or a silicon oxynitride and has a first opening;
(b) a second insulating film which is disposed over the first silicon nitride film, includes a first organosiloxane having a smaller dielectric constant than the first silicon nitride film as a main component, and has a second opening connected with the first opening;
(c) a first interlevel dielectric film which is disposed over the second insulating film, includes an insulating film having a lower dielectric constant than the first silicon nitride film as a main component, has a third opening which is connected with the second opening and constitutes, together with the first opening, a first through-hole, and a first interconnect-embedding trench connected with the third opening, and is thicker than the second insulating film;
(d) a first conductive barrier layer disposed to over the bottom surface and inside surface of the first through hole and the bottom surface and inside surface of the first interconnect-embedding trench; and
(e) a first interconnect region which is embedded in the first through-hole and the first interconnect-embedding trench, each having the first conductive barrier layer disposed therein, and including copper as a main component.

23. A semiconductor integrated circuit device according to the above-described item 22, wherein the second insulating film is thicker than the first silicon nitride film.

24. A semiconductor integrates circuit device according to the above-described item 23, wherein the first interlevel dielectric film includes a second organosiloxane smaller in the number of carbon atoms than the first organosiloxane as a main component.

25. A manufacturing process of a semiconductor integrated circuit device having an inlaid interconnect, which comprises:
(a) forming, over the first main surface of a semiconductor integrated circuit substrate, a first insulating film constituting the inlaid interconnect;
(b) forming, over the first insulating film, a second insulating film including an organosiloxane as a main component and is used for the formation of the inlaid interconnect;
(c) forming a patterned masking layer over the second insulating film; and
(d) subjecting the second insulating film, with the masking layer thereon, to first plasma etching treatment in a first gas atmosphere containing a fluorocarbon-gas-containing etching gas and a nitrogen gas, thereby forming a first recess in the second insulating film and exposing the first insulating film from the first recess.

26. A manufacturing process of a semiconductor integrated circuit device according to the above-described item 25, wherein the first insulating film includes a silicon nitride as a main component.

27. A manufacturing process of a semiconductor integrated circuit device according to the above-described item 25 or 26, wherein the first gas atmosphere contains an argon gas as the largest gas component.

28. A manufacturing process of a semiconductor integrated circuit device according to any one of the above-described items 25, 26 and 27, wherein the first gas atmosphere contains an oxygen gas.

29. A manufacturing process of a semiconductor integrated circuit device according to any one of the above-described items 25, 26 and 27, wherein the first gas atmosphere is substantially free of an oxygen gas.

30. A manufacturing process of a semiconductor integrated circuit device having an inlaid interconnect, which comprises:

(a) forming, over the first main surface of a semiconductor integrated circuit substrate, forming a first insulating film which constitutes an interlevel dielectric film of the inlaid interconnect and includes a first organosiloxane as a main component;

(b) forming, over the first insulating film, a second insulating film which constitutes the inlaid interconnect, is thinner than the first insulating film and includes a second organosiloxane different in components from the first organosiloxane as a main component;

(c) forming a patterned masking layer over the second insulating film; and (d) subjecting the second insulating film, with the masking layer formed thereover, to first plasma etching treatment in a first gas atmosphere containing a fluoro-carbon-containing etching gas by using the first insulating film as an etching stopper, thereby forming a first recess in the insulating film and exposing the first insulating film from the first recess.

31. A manufacturing process of a semiconductor integrated circuit device according to the above-described item 30, wherein the second insulating film is thicker than the first insulating film.

32. A manufacturing process of a semiconductor integrated circuit device according to the above-described item 30 or 31, wherein the first insulating film has a greater carbon content than the second insulating film by at least 50%.

33. A manufacturing process of a semiconductor integrated circuit device according to the above-described item 30 or 31, wherein the first insulating film has a greater carbon content than the second insulating film by at least 100%.

34. A manufacturing process of a semiconductor integrated circuit device according to the above-described item 30 or 31, wherein an etching selectivity to the second insulating film relative to the first insulating film in the step (d) is at least 4.

35. A manufacturing process of a semiconductor integrated circuit device according to the above-described item 30 or 31, wherein an etching selectivity to the second insulating film relative to the first insulating film in the step (d) is at least 5.

36. A manufacturing process of a semiconductor integrated circuit device having a dual-damascene type inlaid interconnect structure wherein a metal is embedded simultaneously to form a plug region for mutual connection between interconnect layers and an inlaid interconnect, which comprises:

(a) forming, over the first main surface of a semiconductor integrated circuit substrate, a first insulating film for the formation of the inlaid interconnect;

(b) forming, over the first insulating film, a second insulating film for the formation of the inlaid interconnect, which film includes an organosiloxane as a main component;

(c) forming a patterned masking layer over the second insulating film;

(d) subjecting the second insulating film, with the masking layer formed thereover, to first plasma etching treatment in a first gas atmosphere, thereby forming a first recess in the second insulating film; and (e) subjecting the second insulating film, with the first recess formed therein, to second plasma etching treatment in a second gas atmosphere under the conditions permitting a large etching selectivity to the second insulating film relative to the first insulating film compared with the first plasma etching treatment, thereby exposing the first insulating film.

37. A manufacturing process of a semiconductor integrated circuit device according to the above-described item 26, wherein the first insulating film includes silicon nitride as a main component.

38. A manufacturing process of a semiconductor integrated circuit device having a dual-damascene type inlaid interconnect structure wherein a metal is embedded simultaneously to form a plug region for mutual connection between interconnect layers and an inlaid interconnect, which comprises:

(a) forming, over the first main surface of a semiconductor integrated circuit substrate, a first insulating film for the formation of the inlaid interconnect;

(b) forming, over the first insulating film, a second insulating film for the formation of the inlaid interconnect, which film includes an organosiloxane as a main component;

(c) forming a patterned masking layer over the second insulating film; and (d) subjecting the second insulating film, with the masking layer formed thereover, to first plasma etching treatment in a first gas atmosphere containing a fluorocarbon-gas-containing etching gas and a nitrogen gas by using the first insulating film as an etching stopper, thereby forming a first recess in the second insulating film and exposing the first insulating film from the first recess.

39. A manufacturing process of a semiconductor integrated circuit device according to the above-described item 38, wherein the first insulating film includes silicon nitride as a main component.

40. A manufacturing process of a semiconductor integrated circuit device having a dual-damascene type inlaid interconnect structure wherein a conductor film is embedded simultaneously to form a plug region for mutual connection between interconnect layers and an inlaid interconnect, which comprises:

(a) forming, over the first main surface of a semiconductor integrated circuit substrate, a first insulating film which constitutes an interlevel dielectric film of the inlaid interconnect and includes a first organosiloxane as a main component;

(b) forming, over the first insulating film, a second insulating film which is thinner than the first insulating film and includes a second organosiloxane different in components from the first organosiloxane as a main component;

(c) forming a patterned masking layer over the second insulating film; and (d) subjecting the second insulating film, with the masking layer formed thereover, to first plasma etching treatment in a first gas atmosphere containing a fluorocarbon-gas-containing etching gas by using the first insulating film as an etching stopper, thereby forming a first recess in the second insulating film and exposing the first insulating film from the first recess.

Among the inventions disclosed by the present application, summaries of the inventions other than the above-described ones will next be described briefly.

41. The present invention comprises:

(a) depositing a first insulating film having an etching stopper function;

(b) depositing, over the first insulating film, a first organic insulating film including an organosiloxane as a main component;

(c) forming, over the first insulating film, a masking layer;

(d) subjecting the first organic insulating film to plasma etching treatment in a gas atmosphere containing a fluorocarbon gas and a nitrogen gas by using the masking layer as an etching mask and the first insulating film as an etching stopper, thereby forming a recess;

(e) removing the first insulating film exposed from the recess; and (f) embedding a conductor film inside of the recess.

42. The present invention comprises:

(a) depositing a first insulating film having an etching stopper function;

(b) depositing, over the first insulating film, a first organic insulating film including an organosiloxane as a main component;

(c) forming, over the first organic insulating film, a second initiating film having an etching stopper function;

(d) forming, in the second insulating film, an opening portion for the formation of a recess;

(e) depositing, over the second insulating film and the first organic insulating film exposed from the opening portion after the step (d), a second organic insulating film including an organosiloxane as a main component, (f) forming a masking layer over the second insulating film;

(g) subjecting the first and second organic insulating films to plasma etching treatment in a gas atmosphere containing a fluorocarbon gas and a nitrogen gas by using the masking layer as an etching mask and the first insulating film and the second insulating film having the opening portion as an etching stopper, thereby forming a recess;

(h) removing the first insulating film exposed from the recess; and (i) embedding a conductor film inside of the recess.

43. The present invention comprises:

(a) depositing a first insulating film having an etching stopper function;

(b) depositing, over the first insulating film, a first organic insulating film including an organosiloxane as a main component;

(c) forming, over the first organic insulating film, a second insulating film having an etching stopper function;

(d) depositing, over the second insulating film, a second organic insulating film including an organosiloxane as a main component;

(e) forming, over the second organic insulating film, a first masking layer;

(f) subjecting the first insulating film and first and second organic insulating films to plasma etching treatment in a gas atmosphere containing a fluorocarbon gas and a nitrogen gas by using the first masking layer as an etching mask and the first insulating film as an etching stopper, thereby forming a first recess;

(g) removing the first masking layer and then forming a second masking layer over the second organic insulating film;

(h) subjecting the second organic insulating film to plasma etching treatment in a gas atmosphere containing a fluorocarbon gas and a nitrogen gas by using the second masking layer as an etching mask and the second insulating film as an etching stopper, thereby forming a second recess;

(i) removing the first and second insulating films exposed from the first and second recesses;

(j) embedding inside of the first and second recesses with a conductor film.

44. The present invention comprises:

(a) depositing a first insulating film having an etching stopper function;

(b) depositing, over the first insulating film, a first organic insulating film including an organosiloxane as a main component;

(c) forming a first masking layer over the first organic insulating film;

(d) subjecting the first organic insulating film to plasma dry etching treatment in a gas atmosphere containing a fluorocarbon gas and a nitrogen gas by using the first masking layer as an etching mask and the first insulating film as an etching stopper, thereby forming a first recess;

(e) removing the first masking layer and then forming over the first organic insulating film a second masking layer;

(f) subjecting the first organic insulating film to plasma dry etching treatment in a gas atmosphere containing a fluorocarbon gas and a nitrogen gas by using the second masking layer as an etching mask, thereby forming a second recess;

(g) removing the first insulating film exposed from the first and second recesses; and (h) embedding inside of the first and second recesses with a conductor film.

45. The present invention comprises:

(a) depositing a first insulating film having an etching stopper function;

(b) depositing, over the first insulating film, a first organic insulating film including an organosiloxane as a main component;

(c) depositing over the first organic insulating film a second insulating film having an etching stopper function;

(d) depositing over the second insulating film a second organic insulating film including an organosiloxane as a main component;

(e) depositing over the second organic insulating film a third insulating film having an etching stopper function;

(f) forming in the third insulating film an opening portion for the formation of a recess;

(g) forming a first masking layer over the third insulating film and second organic insulating film after the step (f);

(h) subjecting the second organic insulating film to plasma dry etching treatment in a gas atmosphere containing a fluorocarbon gas and a nitrogen gas by using the first masking layer as an etching mask and the second organic insulating film as an etching stopper, thereby forming a first recess;

(i) removing the first masking layer and then subjecting the first and second organic insulating films to plasma dry etching treatment in a gas atmosphere containing a fluorocarbon gas and a nitrogen gas by using the third insulating film as an etching mask and the first and second insulating films as an etching stopper, thereby forming a second recess;

(j) removing the first and second insulating films exposed from the first and second recesses; and (k) embedding inside of the first and second recesses with a conductor film.

46. The present invention comprises:

(a) depositing a first insulating film having an etching stopper function;

(b) depositing, over the first insulating film, a first organic insulating film including an organosiloxane as a main component;

(c) forming a masking layer over the first organic insulating film;

(d) subjecting the first organic insulating film to plasma dry etching treatment in a gas atmosphere containing a fluorocarbon gas and an oxygen gas in about an amount not permitting the formation of an abnormal shape by using the first masking layer as an etching mask and the first insulating film as an etching stopper, thereby forming a recess;

(e) removing the first insulating film exposed from the recess; and (f) embedding a conductor film inside of the recess.

47. The present invention comprises:

(a) depositing a first insulating film having an etching stopper function;

(b) depositing, over the first insulating film, a first organic insulating film including an organosiloxane as a main component;

(c) depositing over the first organic insulating film a second insulating film having an etching stopper function;

(d) forming in the second insulating film an opening portion for the formation of a recess;

(e) depositing, over the second insulating film and the first organic insulating film exposed from the opening portion after the step (d), a second organic insulating film including an organosiloxane as a main component;

(f) forming a masking layer over the second organic insulating film;

(g) subjecting the first and second organic insulating films to plasma dry etching treatment in a gas atmosphere containing a fluorocarbon gas and an oxygen gas in about an amount not permitting formation of an abnormal shape by using the masking layer as an etching mask and the first insulating film and the second insulating film having the opening portion as an etching stopper, thereby forming a recess;

(h) removing the first insulating film exposed from the recess; and (i) embedding a conductor film inside of the recess.

48. The present invention comprises:

(a) depositing a first insulating film having an etching stopper function;

(b) depositing, over the first insulating film, a first organic insulating film including an organosiloxane as a main component;

(c) depositing over the first organic insulating film a second insulating film having an etching stopper function;

(d) depositing, over the second insulating film, a second organic insulating film including an organosiloxane as a main component;

(e) forming a first masking layer over the second organic insulating film;

(f) subjecting the first insulating film and the first and second organic insulating films to plasma dry etching treatment in a gas atmosphere containing a fluorocarbon gas and an oxygen gas in about an amount not permitting the formation of an abnormal shape by using the first masking layer as an etching mask and the first insulating film as an etching stopper, thereby forming a first recess;

(g) removing the first masking layer and then forming a second masking layer over the second organic insulating film;

(h) subjecting the second organic insulating film to plasma dry etching treatment in a gas atmosphere containing a fluorocarbon gas and an oxygen gas in about an amount not permitting the formation of an abnormal shape by using the second masking layer as an etching mask and the second insulating film as an etching stopper, thereby forming a second recess;

(i) removing the first and second insulating films exposed from the first and second recesses; and (j) embedding a conductor film inside of each of the first and second recesses.

49. The present invention comprises:

(a) depositing a first insulating film having an etching stopper function;

(b) depositing, over the first insulating film, a first organic insulating film including an organosiloxane as a main component;

(c) forming a first masking layer over the first organic insulating film;

(d) subjecting the first insulating film to plasma dry etching treatment in a gas atmosphere containing a fluorocarbon gas and an oxygen gas in about an amount not permitting the formation of an abnormal shape by using the first masking layer as an etching mask and the first insulating film as an etching stopper, thereby forming a first recess;

(e) removing the first masking layer and then forming a second masking layer over the first organic insulating film;

(f) subjecting the first organic insulating film to plasma dry etching treatment in a gas atmosphere containing a fluorocarbon gas and an oxygen gas in about an amount not permitting the formation of an abnormal shape by using the second masking layer as an etching mask, thereby forming a second recess;

(g) removing the first insulating film exposed from the first and second recesses; and (h) embedding a conductor film inside of each of the first and second recesses.

50. The present invention comprises:

(a) depositing a first insulating film having an etching stopper function;

(b) depositing, over the first insulating film, a first organic insulating film including an organosiloxane as a main component;

(c) depositing over the first organic insulating film a second insulating film having an etching stopper function;

(d) depositing, over the second insulating film, a second organic insulating film including an organosiloxane as a main component;

(e) depositing, over the second organic insulating film, a third insulating film having an etching stopper function;

(f) forming, in the third insulating film, an opening portion for the formation of a recess;

(g) forming, over the third insulating film and the second organic insulating film after the step (f), a first masking layer;

(h) subjecting the second organic insulating film to plasma dry etching treatment in a gas atmosphere containing a fluorocarbon gas and an oxygen gas in about an amount not permitting the formation of an abnormal shape by using the first masking layer as an etching mask and the second insulating film as an etching stopper, thereby forming a first recess;

(i) removing the first masking layer and then subjecting the first and second organic insulating films to plasma dry etching treatment in a gas atmosphere containing a fluorocarbon gas and an oxygen gas in about an amount not permitting the formation of an abnormal shape by using the third insulating film as an etching mask and the first and second insulating films as an etching stopper, thereby forming a second recess;

(j) removing the first and second insulating films exposed from the first and second recesses;

(k) embedding a conductor film inside of each of the first and second recesses.

51. The present invention comprises:

(a) depositing a first organic insulating film including an organosiloxane as a main component;

(b) depositing, over the first organic insulating film, a second organic insulating film which has a relatively smaller carbon content than the first organic insulating film and includes an organosiloxane as a main component;

(c) forming a masking layer over the second organic insulating film;

(d) subjecting the second organic insulating film to plasma dry etching treatment in a gas atmosphere containing—a fluorocarbon gas and at least one of oxygen and nitrogen gases by using the masking layer as an etching mask and the first organic insulating film as an etching stopper, thereby forming a recess;

(e) removing the first organic insulating film exposed from the recess; and (f) embedding a conductor film inside of the recess.

52. The present invention comprises:

(a) depositing a first organic insulating film including an organosiloxane as a main component;

(b) depositing, over the first organic insulating film, a second organic insulating film which has a relatively smaller carbon content than the first organic insulating film and includes an organosiloxane as a main component;

(c) depositing, over the second inorganic insulating film, a third inorganic insulating film having a higher carbon content than the second organic insulating film;

(d) forming, in the third insulating film, an opening portion for the formation of a recess;

(e) depositing, over the third organic insulating film and the second organic insulating film exposed from the opening portion after the step (d), a fourth organic insulating film having a smaller carbon content than the third organic insulating film and includes an organosiloxane;

(f) forming a masking layer over the fourth organic insulating film;

(g) subjecting the second and fourth organic insulating films to plasma dry etching treatment in a gas atmosphere containing a fluorocarbon gas and at least one of oxygen and nitrogen gases by using the masking layer as an etching mask and the first organic insulating film and the third organic insulating film having the opening portion as an etching stopper, thereby forming a recess;

(h) removing the first organic insulating film exposed from the recess; and (i) embedding a conductor film inside of the recess.

53. The present invention comprises:

(a) depositing a first organic insulating film including an organosiloxane as a main component;

(b) depositing, over the first organic insulating film, a second organic insulating film having a smaller carbon content than the first organic insulating film and including an organosiloxane as a main component;

(c) depositing, over the second inorganic insulating film, a third inorganic insulating film having a higher carbon content than the second organic insulating film;

(d) depositing, over the third inorganic insulating film, a fourth inorganic insulating film having a smaller carbon content than the third organic insulating film and including an organosiloxane as a main component;

(e) forming a first masking layer over the fourth organic insulating film;

(f) subjecting the second, third and fourth organic insulating films to plasma dry etching treatment in a gas atmosphere containing a fluorocarbon gas and at least one of oxygen and nitrogen gases by using the first masking layer as an etching mask and the first organic insulating film as an etching stopper, thereby forming a first recess;

(g) removing the first masking layer and then forming a second masking layer over the fourth organic insulating film;

(h) subjecting the fourth organic insulating film to plasma dry etching treatment in a gas atmosphere containing a fluorocarbon gas and at least one of oxygen and nitrogen gases by using the second masking layer as an etching mask and the third organic insulating film as an etching stopper, thereby forming a second recess;

(i) removing the first organic insulating film exposed from the first and second recesses; and (j) embedding a conductor film inside of each of the first and second recesses.

54. The present invention comprises:

(a) depositing a first organic insulating film including an organosiloxane as a main component;

(b) depositing, over the first organic insulating film, a second organic insulating film which has a smaller carbon content than the first organic insulating film and includes an organosiloxane as a main component;

(c) forming a first masking layer over the second organic insulating film;

(d) subjecting the second organic insulating film to plasma dry etching treatment in a gas atmosphere containing a fluorocarbon gas and at least one of oxygen and nitrogen gases by using the first masking layer as an etching mask and the first organic insulating film as an etching stopper, thereby forming a first recess;

(e) removing the first masking layer and then forming a second masking layer over the second organic insulating film;

(f) subjecting the second organic insulating film to plasma dry etching treatment in a gas atmosphere containing a fluorocarbon gas and at least one of oxygen and nitrogen gases by using the second masking layer as an etching mask, thereby forming a second recess;

(g) removing the first organic insulating film exposed from the first and second recesses; and (h) embedding a conductor film inside of each of the first and second recesses.

55. The present invention comprises:

(a) depositing a first organic insulating film including an organosiloxane as a main component;

(b) depositing, over the first organic insulating film, a second organic insulating film which has a smaller carbon content than the first organic insulating film and includes an organosiloxane as a main component;

(c) depositing, over the second inorganic insulating film, a third organic insulating film having a higher carbon content than the second organic insulating film;

(d) depositing, over the third organic insulating film, a fourth organic insulating film having a smaller carbon content than the third organic insulating film and including an organosiloxane as a main component;

(e) depositing, over the fourth organic insulating film, a fifth organic insulating film having a higher carbon content than the fourth organic insulating film and including an organosiloxane as a main component;

(f) forming, in the fifth organic insulating film, an opening portion for the formation of a recess;

(g) forming a first masking layer over the fourth and fifth organic insulating films after the step (f);

(h) subjecting the fourth organic insulating film to plasma dry etching treatment in a gas atmosphere containing a fluorocarbon gas and at least one of oxygen and nitrogen gases by using the first masking layer as an etching mask and the third organic insulating film as an etching stopper, thereby forming a first recess;

(i) removing the first masking layer and then subjecting the second and fourth organic insulating films to plasma dry etching treatment in a gas atmosphere containing a fluorocarbon gas and at least one of oxygen and nitrogen gases by using the fifth insulating film as an etching mask and the first and third organic insulating films as an etching stopper, thereby forming a second recess;

(j) removing the first organic insulating film exposed from the first and second recesses; and (k) embedding a conductor film inside of each of the first and second recesses.

56. The present invention comprises:

(a) depositing a first insulating film having an etching stopper function;

(b) depositing, over the first insulating film, a first organic insulating film including an organosiloxane as a main component;

(c) forming a masking layer over the first organic insulating film;

(d) subjecting the first organic insulating film to plasma dry etching treatment in a gas atmosphere containing a fluorocarbon gas and an oxygen gas by using the masking layer as an etching mask, thereby forming a first recess from which the first insulating film is exposed;

(e) removing the first insulating film exposed from the recess; and (f) embedding a conductor film inside of the recess, wherein upon the step (d), the recess is formed by removing the first organic insulating film to a certain depth by etching under shape-preferential conditions and then removing a remaining portion of the first organic insulating film by etching with the first insulating film as an etching stopper under selectivity-heightening conditions wherein the etching selectivity to the first inorganic insulating film relative to the first insulating film is set high compared with the shape-preferential conditions.

57. The present invention comprises:

(a) depositing a first insulating film having an etching stopper function;

(b) depositing, over the first insulating film, a first organic insulating film including an organosiloxane as a main component;

(c) depositing, over the first inorganic insulating film, a second insulating film having an etching stopper function;

(d) forming, in the second insulating film, an opening portion for the formation of a recess;

(e) depositing, over the second insulating film and the first-organic insulating film exposed from the opening portion after the step (d), a second insulating film including an organosiloxane as a main component;

(f) forming a masking layer over the second organic insulating film;

(g) subjecting the first and second organic insulating films to plasma dry etching treatment in a gas atmosphere containing a fluorocarbon gas and an oxygen gas by using the masking layer as an etching mask, thereby forming a recess from which the first insulating film is exposed;

(h) removing the first insulating film exposed from the recess; and (i) embedding a conductor film inside of the recess, wherein upon the step (g), the recess is formed by removing the second insulating film to a certain depth by etching under shape-preferential conditions and then removing the first and second organic insulating films by etching, with the first and second insulating films as an etching stopper, under selectivity-heightening conditions wherein an etching selectivity to the first and second inorganic insulating films relative to the first and second insulating films is set high compared with the shape-preferential conditions.

58. The present invention comprises:

(a) depositing a first insulating film having an etching stopper function;

(b) depositing, over the first insulating film, a first organic insulating film including an organosiloxane as a main component;

(c) depositing, over the first inorganic insulating film, a second insulating film having an etching stopper function;

(d) depositing, over the second insulating film, a second organic insulating film including an organosiloxane as a main component;

(e) forming a first masking layer over the second organic insulating film;

(f) subjecting the first insulating film and the first and second organic insulating films to plasma dry etching treatment in a gas atmosphere containing a fluorocarbon gas and an oxygen gas by using the first masking layer as an etching mask, thereby forming a first recess from which the first insulating film is exposed;

(g) removing the first masking layer and then forming a second masking layer over the second organic insulating film;

(h) subjecting the second organic insulating film to plasma dry etching treatment in a gas atmosphere containing a fluorocarbon gas and an oxygen gas by using the second masking layer as an etching mask, thereby forming a second recess from which the first and second insulating films are exposed;

(i) removing the first and second insulating films exposed from the first and second recesses; and (j) embedding a conductor film inside of each of the first and second recesses with a conductor film, wherein upon the step (f), the first recess is formed by removing the first organic insulating film to a certain depth by etching under shape preferential conditions and then removing the remaining portion of the first organic insulating film by etching with the first and second insulating films as an etching stopper under selectivity-heightening conditions permitting a higher selectivity to the first and second inorganic insulating films relative to the first and second insulating films compared with the shape preferential conditions; and upon the step (h), the second recess is formed by removing the second organic insulating film to a certain depth by etching under shape-preferential conditions and then removing the remaining portion of the second inorganic insulating film by etching with the first and second insulating films as an etching stopper under selectivity-heightening conditions permitting a higher selectivity to the first and second inorganic insulating films relative to the first and second insulating films compared with the shape-preferential conditions.

59. The present invention comprises:

(a) depositing a first insulating film having an etching stopper function;

(b) depositing, over the first insulating film, a first organic insulating film including an organosiloxane as a main component;

(c) depositing, over the first organic insulating film, a first masking layer;

(d) subjecting the first organic insulating film to plasma dry etching treatment in a gas atmosphere containing a fluorocarbon gas and an oxygen gas by using the first masking layer as an etching mask, thereby forming a first recess from which the first insulating film is exposed;

(e) removing the first masking layer and then forming a second masking layer over the first inorganic insulating film;

(f) subjecting the first organic insulating film to plasma dry etching treatment in a gas atmosphere containing a fluorocarbon gas and an oxygen gas by using the second masking layer as an etching mask, thereby forming a second recess from which the first organic insulating film is exposed;

(g) removing the first insulating film exposed from the first and second recesses; and (h) embedding a conductor film inside of each of the first and second recesses, wherein upon the step (d), the first recess is formed by removing the first organic insulating film to a certain depth by etching under shape-preferential conditions and then removing the remaining portion of the first organic insulating film by etching with the first insulating film as an etching stopper under selectivity-heightening conditions wherein an etching selectivity to the first organic insulating film relative to the first insulating film is set high compared with the shape-preferential conditions; and upon the step (f), the second recess is formed by etching under shape-preferential conditions.

60. The present invention comprises:

(a) depositing a first insulating film having an etching stopper function;

(b) depositing, over the first insulating film, a first organic insulating film including an organosiloxane as a main component;

(c) depositing, over the first inorganic insulating film, a second insulating film having an etching stopper function;

(d) depositing, over the second insulating film, a second organic insulating film including an organosiloxane as a main component;

(e) depositing, over the second organic insulating film, a third insulating film having an etching stopper function;

(f) forming in the third insulating film an opening portion for the formation of a recess;

(g) forming, over the third insulating film and the second organic insulating film after the step (f), a first masking layer;

(h) subjecting the second organic insulating film to plasma dry etching treatment in a gas atmosphere containing a fluorocarbon gas and an oxygen gas by using the first masking layer as an etching mask, thereby forming a first recess from which the second insulating film is exposed;

(i) removing the first masking layer and then subjecting the first and second organic insulating films to plasma dry etching treatment in a gas atmosphere containing a fluorocarbon gas and a nitrogen gas by using the third insulating film as an etching mask, thereby forming a second recess from which the second insulating film is exposed;

(j) removing the first and second insulating films exposed from the first and second recesses; and (k) embedding a conductor film inside of each of the first and second recesses, wherein upon the step (h), the first recess is formed by removing the second organic insulating film to a certain depth by etching under shape-preferential conditions and then removing the remaining portion of the second organic insulating film by etching with the second insulating film as an etching stopper under selectivity-heightening conditions wherein an etching selectivity to the second inorganic insulating film relative to the second insulating film is set high compared with the shape-preferential conditions.

61. The present invention according to any one of the above-described items 41 to 50 and 56 to 60, wherein the first insulating film is made of silicon nitride.

BRIEF DESCRIPTION OF THE DRAWINGS

FIGS. 2(*a*) to 2(*d*) are schematic views illustrating the etching principle when an insulating film including an organosiloxane as a main component is subjected to plasma dry etching treatment in an oxygen-containing gas atmosphere;

FIGS. 3(*a*) to 3(*c*) are views illustrating the state of chemical reaction when an insulating film including an organosiloxane as a main component is subjected to plasma dry etching treatment in an oxygen-containing gas atmosphere;

FIGS. 5(*a*) to 5(*c*) schematically illustrate the calculation results of the molecular orbit permitting stabilization of the configuration of nitrogen atoms when they are disposed near the molecule of an organic insulating film represented by $(HO)_3SiCH_3$;

FIG. 10 is a table which illustrates the results of etching of an organic insulating film depending on the nature of a gas;

FIG. 19(a) is a plan view and FIG. 19(b) is a fragmentary cross-sectional view taken along line A-A in FIG. 19(a) illustrating the semiconductor integrated circuit device during a manufacturing step subsequent to that illustrated in FIG. 18(b);

FIG. 23(a) is a plan view and FIG. 23(b) is a fragmentary cross-sectional view taken along line A-A in FIG. 23(a) illustrating the semiconductor integrated circuit device during a manufacturing step subsequent to that illustrated in FIG. 22(b);

FIG. 24(a) is a plan view and FIG. 24(b) is a fragmentary cross-sectional view taken along line A-A in FIG. 24(a) illustrating the semiconductor integrated circuit device during a manufacturing step subsequent to that illustrated in FIG. 23(b);

FIG. 25(a) is a plan view and FIG. 25(b) is a fragmentary cross-sectional view taken along line A-A in FIG. 25(b) illustrating the semiconductor integrated circuit device during a manufacturing step subsequent to that illustrated in FIG. 24(b);

FIG. 35(a) is a plan view and FIG. 35(b) is a fragmentary cross-sectional view taken alone line A-A in FIG. 35(a) illustrating the semiconductor integrated circuit device during a manufacturing step subsequent to that illustrated in FIG. 34(b);

FIG. 36(a) is a plan view and FIG. 36(b) is a fragmentary cross-sectional view taken alone line A-A in FIG. 36(a) illustrating the semiconductor integrated circuit device during a manufacturing step subsequent to that illustrated in FIG. 35(b);

FIG. 37(a) is a plan view and FIG. 37(b) is a fragmentary cross-sectional view taken along line A-A in FIG. 37(a) illustrating the semiconductor integrated circuit device of FIG. 14 during a manufacturing step according to a further embodiment of the present invention;

FIG. 38(a) is a plan view and FIG. 38(b) is a fragmentary cross-sectional view taken alone line A-A in FIG. 38(a) illustrating the semiconductor integrated circuit device during a manufacturing step subsequent to that illustrated in FIG. 37(b);

FIG. 40(a) is a plan view and FIG. 40(b) is a fragmentary cross-sectional view taken alone line A-A in FIG. 40(a) illustrating the semiconductor integrated circuit device during a manufacturing step subsequent to that illustrated in FIG. 39(b);

FIG. 43(a) is a plan view and FIG. 43(b) is a fragmentary cross-sectional view taken along line A-A in FIG. 42(a) illustrating the semiconductor integrated circuit device of FIG. 14 during a manufacturing step according to a still further embodiment of the present invention;

FIG. 44(a) is a plan view and FIG. 44(b) is a fragmentary cross-sectional view taken alone line A-A in FIG. 44(a) illustrating the semiconductor integrated circuit device during a manufacturing step subsequent to that illustrated in FIG. 43(b);

FIG. 45(a) is a plan view and FIG. 45(b) is a fragmentary cross-sectional view taken alone line A-A in FIG. 45(a) illustrating the semiconductor integrated circuit device during a manufacturing step subsequent to that illustrated in FIG. 44(b);

FIG. 46(a) is a plan view and FIG. 46(b) is a fragmentary cross-sectional view taken alone line A-A in FIG. 46(a) illustrating the semiconductor integrated circuit device during a manufacturing step subsequent to that illustrated in FIG. 45(b);

FIG. 47(a) is a plan view and FIG. 47(b) is a fragmentary cross-sectional view taken alone line A-A in FIG. 47(a) illustrating the semiconductor integrated circuit device during a manufacturing step subsequent to that illustrated in FIG. 46(b);

FIG. 60 is a table which illustrates the investigation results, upon etching treatment for the formation of a recess, such as a trench or hole, in an insulating film, including an organosiloxane as a main component, of the relation among the amount of oxygen in the etching gas, a sub-trench and an etching selectivity relative to a silicon nitride film;

FIGS. 61(a) and 61(b) are fragmentary cross-sectional views illustrating a semiconductor integrated circuit device during a manufacturing step according to one embodiment of the present invention;

FIGS. 62(a) to 62(c) are fragmentary cross-sectional views illustrating a semiconductor integrated circuit device during a manufacturing step according to one embodiment of the present invention;

FIG. 91(a) is a graph illustrating the relation between a flow rate ratio of oxygen to a CF gas in an etching gas and an etching rate of each of an insulating film including an organosiloxane as a main component and a silicon nitride film when they are removed by etching by a parallel-plate narrow-electrode type RIE apparatus;

FIG. 91(b) is a table which schematically illustrates the observation results of an etched shape of an organic insulating film when the film is subjected to pattern processing through a trench pattern under the above-described etching conditions;

FIG. 91(c) is a graph illustrating the relation between a ratio of oxygen to a CF gas and a ratio of the depth of a sub-trench to an etching depth;

FIG. 92(a) is a graph illustrating the relation between a flow rate ratio of oxygen to a CF gas in an etching gas and an etching rate of the above-described organic insulating film and silicon nitride film when the range of a high-frequency power density of a parallel-plate narrow-electrode type RIE apparatus is narrowed;

FIG. 92(b) schematically illustrates the observation results of an etched shape of an organic insulating film when the film is subjected to pattern processing through a trench pattern under the above-described etching conditions;

FIG. 92(c) is a graph illustrating the relation, in the case of (a), between a ratio of oxygen to a CF gas and a ratio of the depth of a sub-trench to an etching depth;

FIGS. 103(a) and 103(b) are graphs each illustrating the relation between an organic amount ratio in an organic insulating film and etching selectivity;

FIG. 104(a) is a graph in which both the results of FIGS. 103(a) and 103(b) are illustrated, and FIG. 104(b) schematically illustrates the chemical structure of an inorganic insulating film at each organic amount ratio;

FIG. 107 is a table showing the properties of various insulating films measured or evaluated by the present inventors;

FIG. 116(a) is a plan view and FIG. 116(b) is a fragmentary cross-sectional view taken alone line A-A in FIG. 116(a) illustrating the semiconductor integrated circuit device during a manufacturing step subsequent to that illustrated in FIG. 115(b);

FIG. 117(a) is a plan view and FIG. 117(b) is a fragmentary cross-sectional view taken alone line A-A in FIG. 117(a) illustrating the semiconductor integrated circuit device during a manufacturing step subsequent to that illustrated in FIG. 116(b).

BEST MODE FOR CARRYING OUT THE INVENTION

Figure 1:
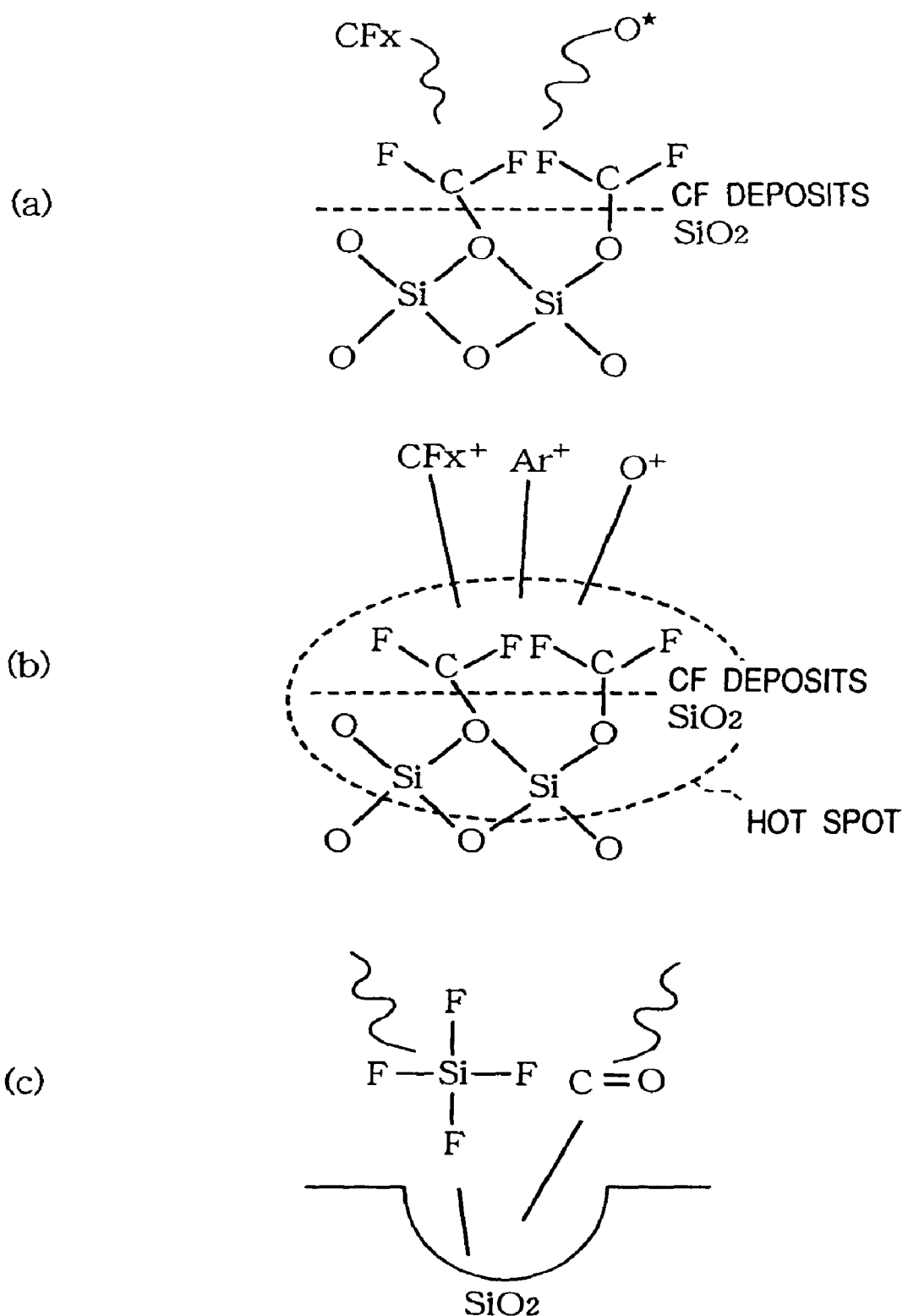
FIGS. 1(*a*) to 1(*c*) are schematic views illustrating the etching principle used when a silicon oxide film ordinarily employed as an interlevel dielectric film material of a semiconductor integrated circuit device is subjected to plasma dry etching treatment in an atmosphere containing a fluorocarbon gas, oxygen gas and argon gas.

Prior to a detailed description of the present invention, the meaning of various terms used in this specification will be described.

1. The term "chemical mechanical polishing" means polishing a surface by causing a relative movement, in a plane direction, of a polishing pad made of a relatively soft cloth-like sheet material in a form contiguous to the surface while feeding a slurry onto the surface. In this application, it embraces CML (chemical mechanical lapping) which moves a surface to be polished relative to the surface of a fixed grindstone.

2. The term "device surface" refers to the main surface of a semiconductor wafer on which device patterns corresponding to a plurality of chip regions are to be formed by photolithography.

3. The term "inlaid interconnect" means a patterned interconnect obtained by a metallization technique such as single damascene or dual damascene process, more specifically, by forming a trench in an insulating film, embedding the trench with a conductor film and then removing the unnecessary portion of the conductor film. The term "single damascene process" usually means an inlaid interconnect forming process performed by embedding a plug metal and a wiring metal in two stages, while the term "dual damascene process" usually means an inlaid interconnect forming process performed by embedding a plug metal and a wiring metal simultaneously.

4. The term "semiconductor integrated circuit wafer" (semiconductor integrated circuit substrate) or "semiconductor wafer" (semiconductor substrate) refers to an insulating, anti-insulating or semiconductor substrate, such as silicon single-crystal substrate (usually in the form of a substantially plane disc), sapphire substrate, glass substrate, or composite thereof, employed for the fabrication of a semiconductor integrated circuit.

5. The term "organosiloxane" usually means an organic compound which is a siloxane-bond-containing silicon compound having an organic functional group such as alkyl or allyl bonded thereto, a polymer thereof and a copolymer containing the compound or polymer. In the field of a resin, it is also called a silicone resin. In this specification, it is also called an "organic insulating film".

6. The term "organic SOG" (spin on glass) refers to a material for an interlevel dielectric film which is prepared by dissolving a high-molecular resin, which is a siloxane polymer or a copolymer thereof, with another monomer each having an organic functional group bonded thereto, in a solvent, and then spin-coating the resulting solution onto a semiconductor wafer. It has the feature that, compared with inorganic SOG, it can be formed into a thicker film because a cured film does not crack easily. Some organosiloxane-based materials for an interlevel dielectric film are processed by CVD (chemical mechanical polishing).

7. The term "silicon nitride" embraces not only $Si_3N_4$ but also insulating films made of nitrides of silicon having a similar composition.

8. Concerning the term "etching stopper", a film to be etched must, in principle, have an etching selectivity of 1 or greater relative to an etching stopper film (when the etching selectivity to A relative to B is X, it means that the etching rate of A is X, while that of B is 1). In other words, the etching stopper is, in principle, not etched earlier than the film to be etched and it is laid under the film to be etched. After completion of the etching of the film to be etched, etching is usually terminated at the etching stopper having a smaller etching rate. In order to satisfy the object of the present invention, the etching selectivity of about 1.5 or greater is sufficient, but an etching selectivity of about 4 or greater is advantageous in satisfactorily conducting the process.

9. The term "masking layer" usually refers to a resist film, but in this specification, it also embraces an inorganic mask and non-photosensitive organic mask.

10. The term "abnormal shape (sub-trench)" as used herein means an unexpected shape formed, upon formation of a recess, such as a trench or hole, by dry etching, owing to an increase in the etching rate of a film to be etched at the position directly under the inside surface of the recess, not at a position spaced from the inside surface of the recess.

11. The term "through-hole" means a hole for electrically connecting different metallization layers, which is formed in an insulating film between these metallization layers. In this specification, it also embraces a contact hole made in an insulating film between a metallization layer and a semiconductor integrated circuit substrate for electrically connecting the metallization layer and the semiconductor integrated circuit substrate.

In the embodiments described herein, a description will be made after an embodiment is divided into plural sections or in plural embodiments, if necessary for convenience's sake. These plural sections or embodiments are not independent of each other, but are in a relation such that one is a modification example, details or complementary description of a part or the whole of the other one unless otherwise specifically indicated.

In addition, in the examples described herein, when a reference is made to a number of elements (including the number, value, amount and range), the number of elements is not limited to a specific number, but can be greater than or less than the specific number, unless otherwise specifically indicated or in the case it is principally apparent that the number is limited to the specific number.

Moreover, in the embodiments described herein, it is needless to say that the constituting elements (including element steps) are not always essential unless otherwise specifically indicated or in the case where it is principally apparent that they are essential.

Likewise, in the embodiments described herein, when a reference is made to the shape or positional relationship of the constituting elements, a shape or positional relationship substantially analogous or similar thereto is also embraced. This also applies to the above-described value and range.

The term "semiconductor integrated circuit device" as used herein means not only a device formed on a semiconductor or insulator substrate, such as a silicon wafer or sapphire substrate, but also to that formed on another insulating substrate, for example, glass, such as a TFT (thin-film-transistor) or STN (super-twisted nematic) liquid crystals or the like, unless otherwise specifically indicated.

The embodiments of the present invention will be described specifically based on the accompanying drawings. In all the drawings illustrating the embodiments, members of like function will be identified by like reference numerals and overlapping descriptions will be omitted. In the description of the embodiments, a p-channel type MISFET (Metal Insulator Semiconductor Field Effect Transistor) will be abbreviated as pMIS, while a n-channel type MISFET, will be abbreviated as nMIS.

Embodiment 1

This Embodiment 1 specifically describes one of the technical concepts of the present invention, which comprises subjecting an insulating film, including an organosiloxane as a main component (the insulating film may hereinafter be called "organic insulating film"), to plasma etching in a gas atmosphere containing a fluorocarbon gas and a nitrogen gas, thereby forming, in the insulating film, a recess, such as an interconnect-forming trench or hole.

Prior to the description of this embodiment, various techniques and their problems which the present inventors have studied upon completion of this invention will be described first. FIGS. 1(a) to 1(c) schematically illustrate the etching principle, based on which a silicon oxide film (ex. $SiO_2$) ordinarily employed as an interlevel dielectric film material of a semiconductor integrated circuit device is subjected to plasma dry etching in a gas atmosphere containing a fluorocarbon ($C_xF_y$) gas, oxygen ($O_2$) gas and an argon (Ar) gas.

As illustrated in FIG. 1(a), when plasma is generated in an etching chamber, CF radicals in the plasma adsorb to the surface of the silicon oxide film, whereby CF deposits are, formed. O* represents an oxygen radical. Under this state, when energy having ions, such as $CF_x^+$, $Ar^+$, $O^+$ or the like, are incident on the surface of the silicon oxide film, as illustrated in FIG. 1(b), a hot spot where a chemical reaction tends to occur is formed on the surface or in the vicinity of the silicon oxide film. Receiving energy from such ions, a reaction between fluorine (F) in the CF-based deposits and silicon (Si) in the silicon oxide film occurs, whereby silicon tetrafluoride ($SiF_4$) is formed, as illustrated in FIG. 1(c). In addition, carbon (C) in the CF-based deposits and oxygen in the silicon oxide film or the like react each other, leading to the formation of carbon monoxide (CO), carbon dioxide ($CO_2$) or the like. Since $SiF_4$, Co and $CO_2$ are highly volatile, they are all exhausted. In this manner, the silicon oxide film is etched. In this case, etching of the silicon oxide film is caused to proceed by ion assist etching, not by chemical etching.

FIGS. 2(a) to 2(d) schematically illustrate the etching principle, based on which an organic insulating film, such as organic SOG (spin on glass), which is used as the above-described interlevel dielectric film material, is subjected to plasma dry etching in an oxygen-containing gas atmosphere, as described above. FIG. 2(a) schematically illustrates the atomic structure of the organic insulating film. Among four binding hands of Si, each of the three hands has oxygen bonded thereto, while the remaining one hand has a methyl group ($CH_3$) bonded thereto. In this structure, O* or the like in the plasma most easily enters into the bond between $CH_3$ and Si. As a result, when O* or the like in the plasma approaches the organic insulating film, oxygen is interposed between $CH_3$ and Si, as illustrated in FIG. 2(b). When O* further approaches the organic insulating film under such a state, a metastable structure as illustrated in FIG. 2(c) appears. In this case, a repulsing force acts between an oxygen-oxygen bond, while an attracting force acts between the oxygen in the silicon oxide film and the hydrogen of $CH_3$. As a result, as illustrated in FIG. 2(d), highly volatile $COH_2$ is formed and $CH_3$ is removed from the organic insulating film. In short, upon plasma dry etching of an organic insulating film in an oxygen-added gas atmosphere, O* pulls $CH_3$ from the organic insulating film, which makes the film porous. According to the calculation made by the present inventors, based on the molecular orbital method, it has been established that plasma dry etching of an organic insulating film in an oxygen-added gas atmosphere will proceed not only by ion assist etching, but also chemical etching by O*.

$C_2F_4$ in the CF-based deposit is chemically etched by O*. As illustrated in FIG. 3(a), for example, when O* approaches $C_2F_4$, $C_2F_4$ is decomposed into highly volatile $COF_2$ in the end. By O*, however, $C_2F5_H$, $C_2H_6$ or the like in the CF-based deposit is not chemically etched (ion assist etching occurs). As illustrated in FIG. 3(b), for example, even if O* approaches $C_2F_5H$, oxygen bonds to the fluorine and a chemical reaction does not occur. As illustrated in FIG. 3(c), for example, when O* approaches $C_2H_6$, oxygen is interposed between its carbon and hydrogen and a stable product is formed. Accordingly, it is presumed that an oxygen atom cannot attack a portion of an organic insulating film having a thick CF-based deposit thereon, disturbed by the CF-based deposit, while it can attack another portion of the organic insulating film having a thin CF-based deposit thereon.

Figure 4:
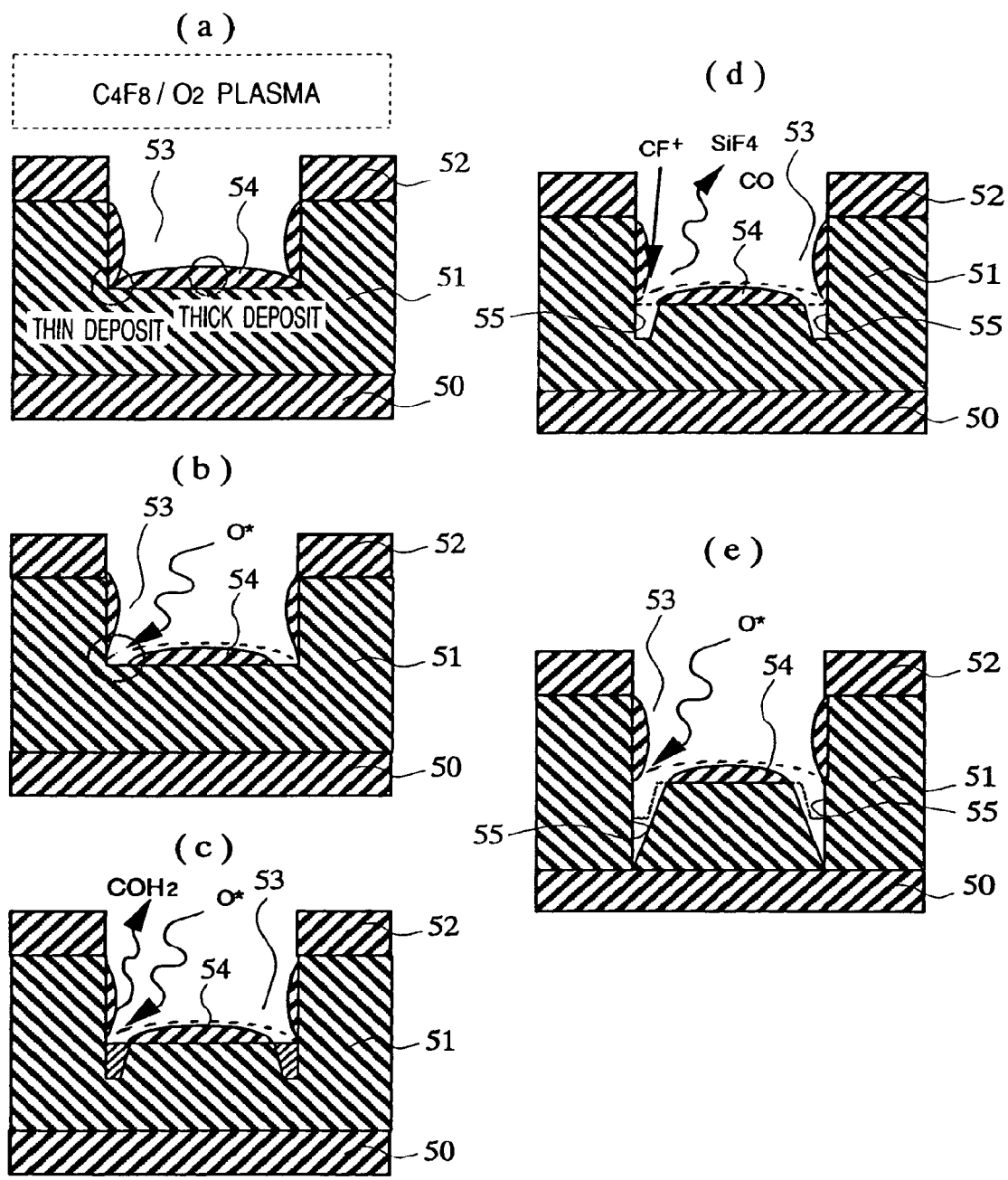
FIGS. 4(*a*) to 4(*e*) are schematic cross-sectional views during a step of subjecting an insulating film including an organosiloxane as a main component to plasma dry etching treatment in an oxygen-containing gas atmosphere, thereby forming a recess such as trench or hole in the insulating film.

FIGS. 4(a) to 4(e) are schematic cross-sectional views illustrating the step of subjecting an organic insulating film to plasma dry etching, for example, in a $C_4F_8/O_2$ gas, at an etching selectivity relative to a silicon nitride film set at high, thereby forming, in the organic insulating film, a recess, such as trench or hole. As illustrated in FIG. 4(a), an insulating film 50 is, for example, made of silicon nitride, on which an organic insulating film 51 is laid. Over the organic insulating film 51, a recess 53 is formed with a photoresist film 52 being used as an etching mask. At the bottom of this recess 53, a CF-based deposit 54 is unevenly formed. In other words, the CF deposit 54 is relatively thick at the bottom center of the recess 53, while it is relatively thin at the periphery of the bottom. Owing to chemical etching of the CF deposit 54 by O* at the bottom periphery of the recess 53, as illustrated in FIG. 4(b), the upper surface of the underlying organic insulating film 51 is exposed, whereby $CH_3$ is pulled out and the organic insulating film 51 at the bottom periphery of the recess 53 becomes porous. Then, the organic insulating film 51 is chemically etched by O* at the bottom periphery of the recess 53. When energy-having ions such as $CF^+$ are incident on the bottom periphery of the recess 53 under such a state as illustrated in FIG. 4(d), ion assist etching of the organic insulating film 51, which has become porous, occurs readily. As a result, a trench (which will hereinafter be called a sub-trench") 55, which is deeper than the bottom center, is inevitably formed at the bottom periphery of the recess 53. Once the sub-trench 55 is formed, the CF deposit 54 is not formed easily on the slope of the sub-trench 55 and the slope is attacked by O*, as illustrated in FIG. 4(e), resulting in widening and deepening of the sub-trench 55. The greater the aspect ratio of the hole or trench, the less uniform will be the thickness of the CF-based deposit 54 deposited on the bottom of the hole or trench and the more prominent the problem of the sub-trench 55 becomes.

When a silicon nitride film is subjected to plasma dry etching in an oxygen-containing gas atmosphere, only ion assist etching proceeds. By the plasma dry etching in an oxygen-containing gas atmosphere, both chemical etching and ion assist etching act on an organic insulating film as described above, while only ion assist etching acts on the silicon nitride film and the etching selectivity increases. In other words, an increase in the amount of oxygen makes it possible to increase the etching selectivity to the organic insulating film relative to the silicon nitride film, but increases the size of the sub-trench. A decrease in the amount of oxygen, on the other hand, suppresses the formation of a sub-trench, but decreases the etching selectivity to the organic insulating film relative to the silicon nitride film.

As a result of investigation, the present inventors have found that, when plasma dry etching in an oxygen containing gas atmosphere, which has ordinarily been employed for the etching of a silicon oxide film, is simply applied to the etching of an organic insulating film used as an interlevel dielectric film material, the above-described problem of a sub-trench occurs, while a reduction in the amount of oxygen for suppressing the formation of a sub-trench is accompanied with the problem that the above-described etching selectivity cannot be attained.

As a result of an experiment, the present inventors have found that the formation of a sub-trench can be suppress ed and a sufficient etching selectivity can be maintained by the introduction of nitrogen instead of oxygen upon plasma etching treatment. FIGS. 5(a) to 5(c) schematically illustrate the calculation results of the molecular orbit permitting stabilization of the configuration of nitrogen atoms when they are disposed near the molecule of an organic insulating film represented by $(HO)_3SiCH_3$. As illustrated in FIG. 5(a), it has been found that a nitrogen atom has low reactivity because repulsion from the $(HO)_3SiCH_3$ molecule prevents its adsorption thereto. The nitrogen atom adsorbs to the molecule as illustrated in FIG. 5(b) when it exceeds the barrier of about 2 eV, and, as illustrated in FIG. 5(c), no chemical etching occurs under such a stabilized state. The etching of the organic insulating film proceeds only by ion assistance in a nitrogen-added gas atmosphere. The results of similar molecular orbit calculation have revealed that nitrogen radicals cannot be adsorbed to a CF deposit, such as $C_2F_5H$, thus showing low reactivity, while they have a barrier in reaction with $C_2H_6$ or $C_2F_4$ because of negative stabilizing energy. Accordingly, it is presumed that not chemical etching, but ion assist etching of the CF deposit occurs when nitrogen atoms are added. From the above-described findings, it is presumed that when nitrogen is added, a pulling-out phenomenon of $CH_3$ from the organic insulating film does not occur, and, therefore, no sub-trench is formed.

Figure 6:
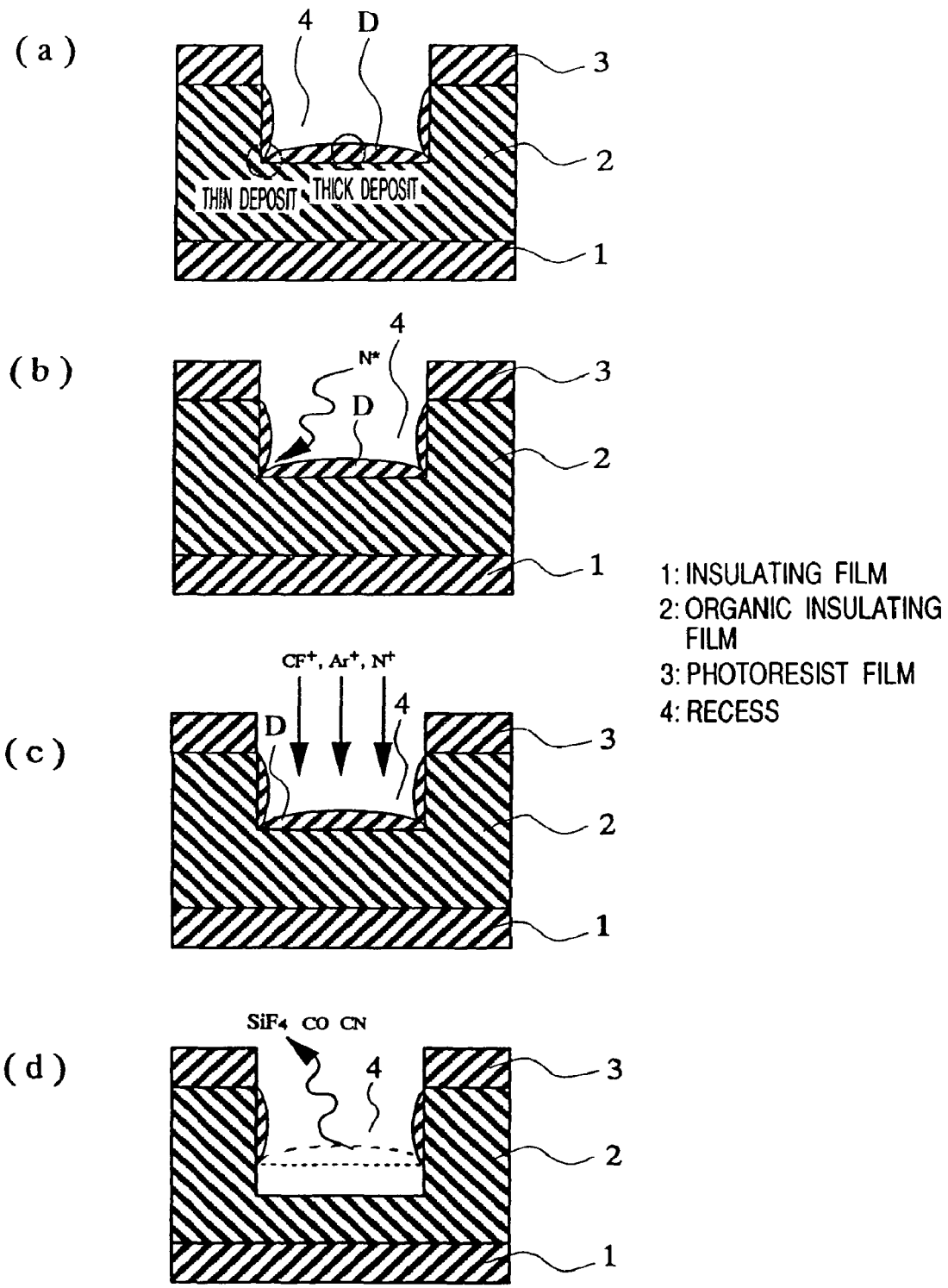
FIGS. 6(*a*) to 6(*d*) are schematic cross-sectional views upon plasma dry etching of an insulating film including an organosiloxane as a main component in a nitrogen-gas-containing gas atmosphere as illustrated in FIG. 5.

FIGS. 6(a) to 6(d) are schematic cross-sectional views of an organic insulating film subjected to plasma dry etching in a nitrogen-gas-containing gas atmosphere as illustrated in FIGS. 5(a) to 5(c). As illustrated in FIG. 6(a), an organic insulating film 2 is deposited over an insulating film 1 made of silicon nitride or the like, and, over the organic insulating film, a patterned photoresist film 3 serving as an etching mask is formed. A CF deposit D is adsorbed to the bottom of a recess 4 formed in the organic insulating film 2. The thickness of the deposit is not uniform within the bottom surface of the recess 4. In other words, the CF deposit D is relatively thick at the bottom center of the recess 4, while it is relatively thin at the bottom periphery. In this case, as illustrated in FIG. 6(b), even if N* (nitrogen radical) approaches the thin portion of the CF deposit, no chemical etching occurs as described above, whereby the organic insulating film 2 at the bottom periphery of the recess 4 neither becomes porous, nor is it removed by etching. Energy-having ions such as $CF^+$, $Ar^+$, $N^+$ or the like are incident on the bottom of the recess 4 under such a state as illustrated in FIG. 6(c), whereby ion assist etching proceeds. In this case, etching proceeds almost uniformly within the bottom surface of the recess 4 so that no sub-trench as described above is formed at the bottom of the recess 4, as illustrated in FIG. 6(d).

Next, the present inventors performed plasma dry etching of an organic insulating film in a similar manner to the above, except for the use of a different gas. The observation results are schematically shown in FIGS. 7 and 8.

Figure 7:
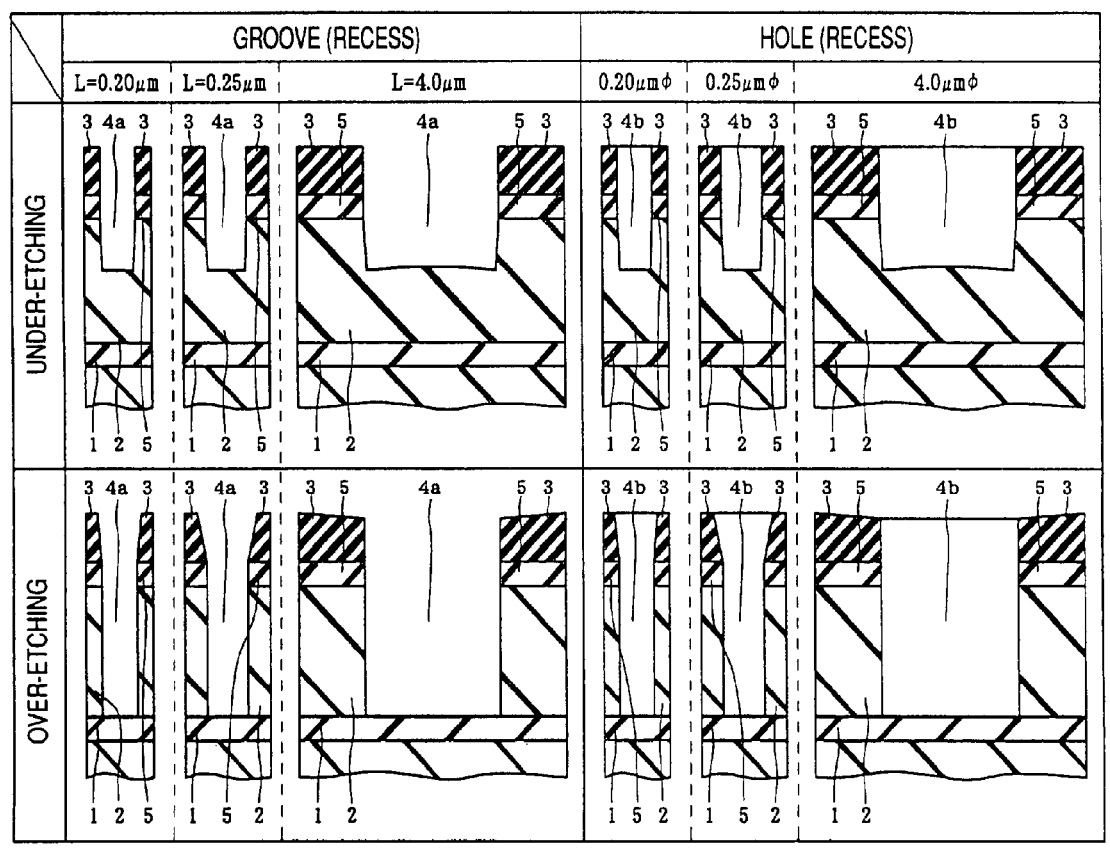
FIG. 7 is a schematic fragmentary cross-sectional view of a trench and a hole at the time of under-etching and over-etching when an insulating film including an organosiloxane as a main component is subjected to plasma dry etching treatment, for example, with a $C_4F_8/N_2/Ar$ gas.
Figure 8:
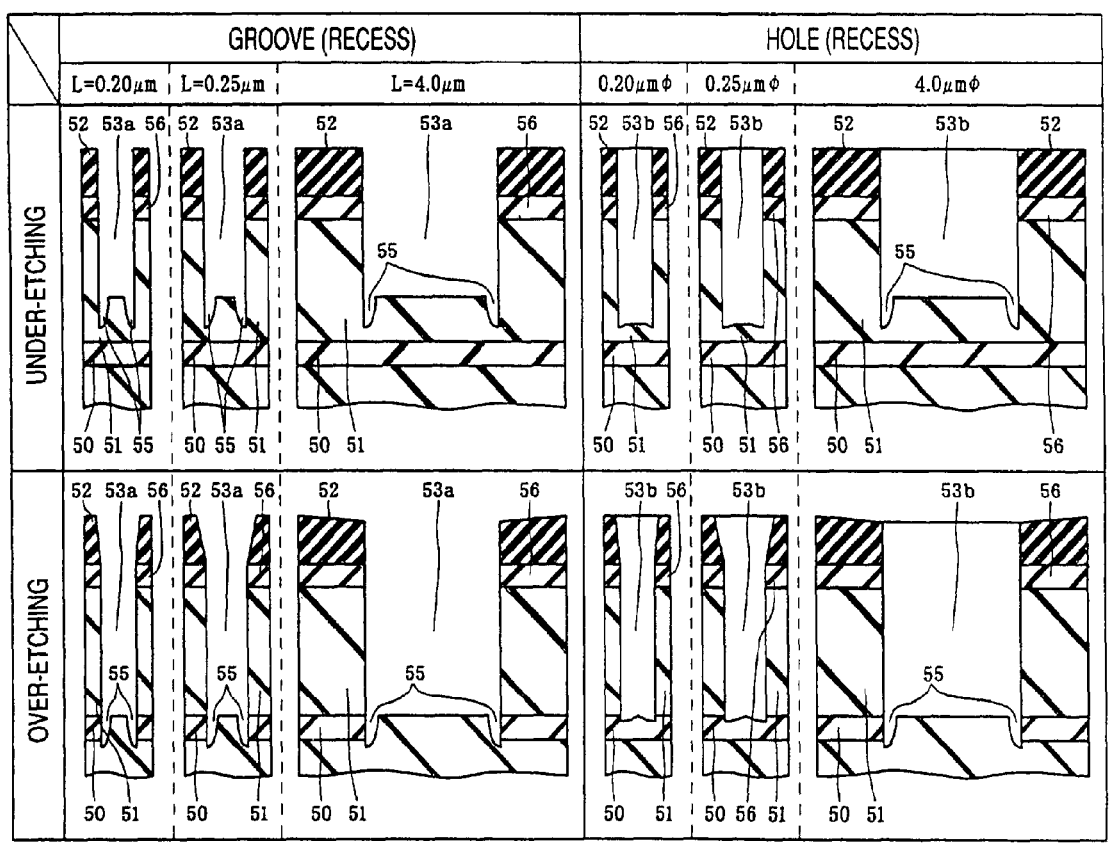
FIG. 8 is a schematic fragmentary cross-sectional view of a trench and a hole at the time of under-etching and over-etching when an insulating film including an organosiloxane as a main component is subjected to plasma dry etching treatment, for example, with a $C_4F_8/O_2/Ar$ gas.

FIG. 7 schematically illustrates the cross-sectional shapes of a trench (recess) 4a and a hole (recess) 4b formed by under-etching and over-etching during plasma dry etching treatment, for example, in a $C_4F_8/N_2/Ar$ gas atmosphere. The term "under-etching" means etching terminated at a certain depth of the organic insulating film 2 before the bottom surface of the trench 4a or hole 4b reaches the insulating film 1, while the term "over-etching" means etching conducted until the bottom surface of the trench 41 or hole 4b reaches the insulating film 1.

The insulating film 1 is made of silicon nitride formed, for example, by plasma CVD, and it has a thickness of about 100 nm. This insulating film 1 serves as an etching stopper. The organic insulating film 2 laid thereover is made of, for example, an organic SOG film, and its thickness is about 400 nm. The overlying insulating film 5 is made of a silicon oxide film formed, for example, by plasma CVD using a TEOS (tetraethoxysilane) gas, and its thickness is about 100 nm. This insulating film 5 maintains, as its main function, the mechanical strength of the organic insulating film 2, so it is not an essential film. As the trench 4a, three trenches are shown, having, for example, a length L of 0.20 µm, 0.25 µm and 4.0 µm, respectively. As the hole 4b, on the other hand, three holes having, for example, a diameter of 0.20 µm, 0.25 µm and 4.0 µm, respectively.

As an etching apparatus, a parallel-plate narrow-electrode type RIE (reactive ion etching) apparatus was employed by way of example. Etching was conducted under the following conditions. For example, the pressure in the etching chamber upon etching was about 20 mT; high-frequency power was about 1000/600 W; a flow rate ratio of a $C_4F_8/N_2/Ar$ gas was about 12/200/300 sccm; and the temperature of a lower electrode upon etching was about 20° C.

In such a nitrogen-gas-containing plasma etching process, as illustrated in FIG. 7, no sub-trench as described above was formed on the bottom of the trench 4a or hole 4b, and, at the same time, etching selectivity to the organic insulating film relative to the silicon nitride film was as high as 7.4.

FIG. 8 schematically illustrates the cross-sections of a trench 53a and a hole 53b upon under-etching and over-etching using $O_2$ instead of the above-described $N_2$.

An insulating film 50 is made of silicon nitride formed, for example, by plasma CVD using a TEOS gas, and its thickness is about 100 nm. An organic insulating film lying thereover is made of, for example, an organic SOG, and its thickness is about 400 nm. An insulating film 56 lying thereover is made of silicon oxide formed, for example, by plasma CVD using a TEOS gas, and its thickness is about 100 nm. As the trench 53a, three trenches are shown, having, for example, a length L of 0.20 µm, 0.25 µm and 4.0 µm, respectively. As the hole 53b, on the other hand, three holes are shown, having, for example, a diameter of 0.20 µm, 0.25 µm and 4.0 µm, respectively.

As an etching apparatus, a parallel-plate narrow-electrode type RIE apparatus was employed by way of example. Etching was conducted under the following conditions. For example, the pressure in the etching chamber upon treatment was about 30 mT; high-frequency power was about 2200/1400 W; a flow rate ratio of a $C_4F_8/N_2/Ar$ gas was about 13/15/420 sccm; and the temperature of a lower electrode upon etching was about −20° C.

In such an oxygen-gas-containing plasma etching process, a sub-trench (abnormal shape) was observed upon under-etching from the above-described holes other than small ones having a diameter of about 0.25 µm or less. In the small holes 53b, sub-trenches 54 are joined to each other so that no sub-trench 55 is observed apparently. In this process, the etching selectivity to the organic insulating film relative to the silicon nitride film is as low as 5.0 or less, and the sub-trench 55 so as extends to exceed the insulating film 50 made of a silicon nitride by over-etching. In short, its function as an etching stopper is not ensured.

Figure 9:
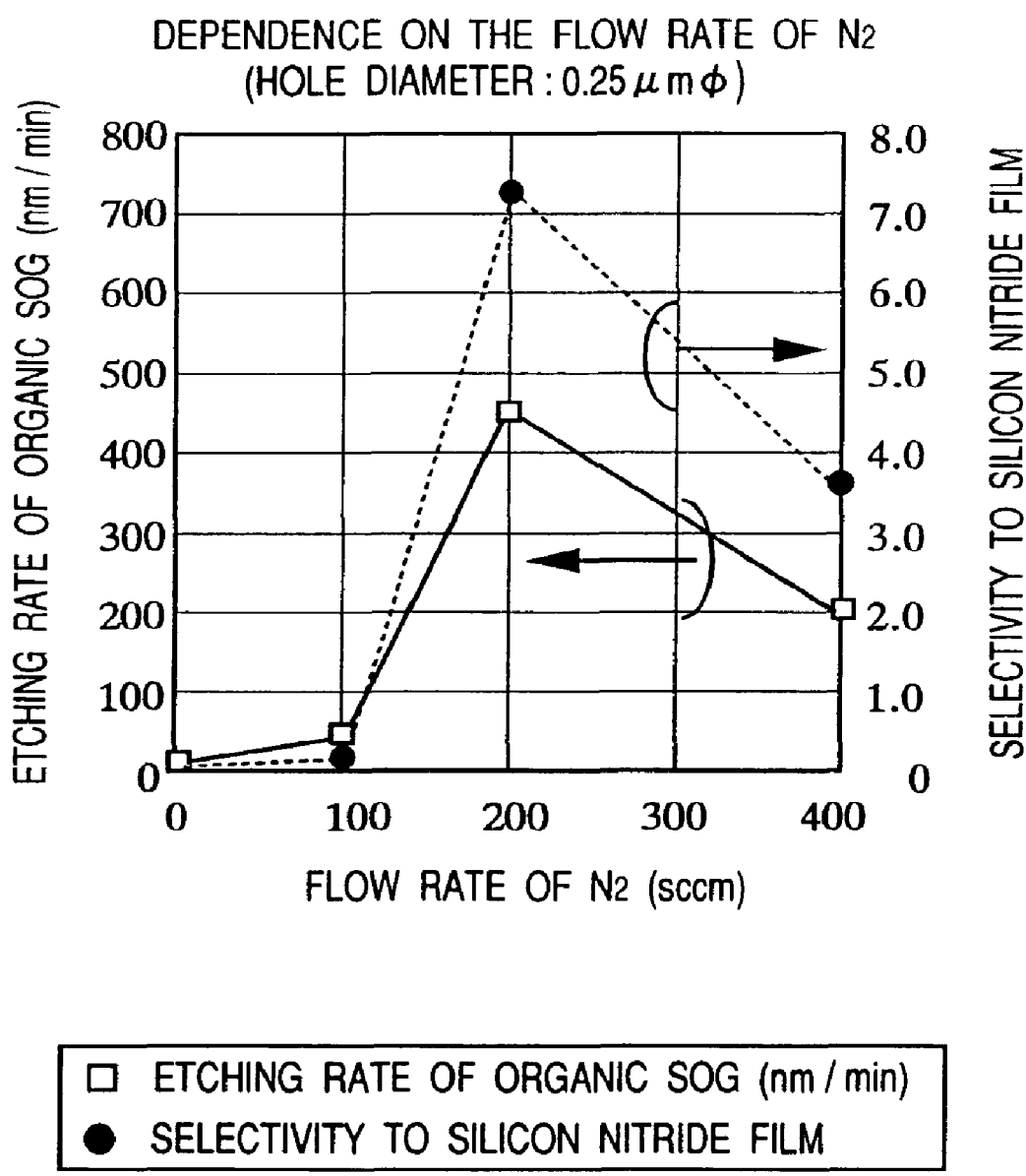
FIG. 9 is a graph which illustrates dependence, on a flow rate of a nitrogen gas, of an etching rate of an insulating film including an organosiloxane as a main component and an etching selectivity relative to a silicon nitride film in plasma dry etching treatment in a nitrogen-gas-containing gas atmosphere.

FIG. 9 illustrates the dependence on the nitrogen gas flow rate of an etching rate of an organic insulating film and an etching selectivity thereto relative to a silicon nitride film during plasma dry etching in the above-described nitrogen-gas-containing gas atmosphere.

At a Nitrogen gas flow rate of 0 (zero), etching of the organic insulating film does not proceed, suggesting that nitrogen is essential for the etching of the organic insulating film. The etching rate of the organic insulating film and the etching selectivity thereof relative to a silicon nitride film, upon formation of a hole having, for example, a diameter of about 0.25 µm in the organic insulating film, each shows the maximum value at a nitrogen gas flow rate of about 200 sccm (a carbon (C)/nitrogen (N) ratio: 0.12). Practically usable etching selectivity and etching rate are available at a nitrogen gas flow rate ranging from 150 sccm (C/N ratio: 0.16) to 300 sccm (C/N ratio: 0.08), which may be widened to a range of from 50 sccm (C/N ratio: 0.48) to 500 sccm (C/N ratio: 0.48).

FIG. 10 illustrates results of etching of an organic insulating film, depending on the nature of the gas. Etching only in a CF gas results in a low etching rate, a low etching selectivity and an inferior elimination property (removed state by etching). In etching in an oxygen-added CF gas, the etching rate and etching selectivity are in a trade-off-relation with the abnormal shape (particularly, sub-trench). Etching in a nitrogen-added CF gas according to the present invention provides an etching rate of about 400 nm/min and an etching selectivity, relative to the silicon nitride film, of 7.4 or greater, without forming a sub-trench. From the synthetic viewpoint, etching results in a nitrogen-added CF gas are superior to those only in a CF gas or those in oxygen-added CF etching.

Figure 11:
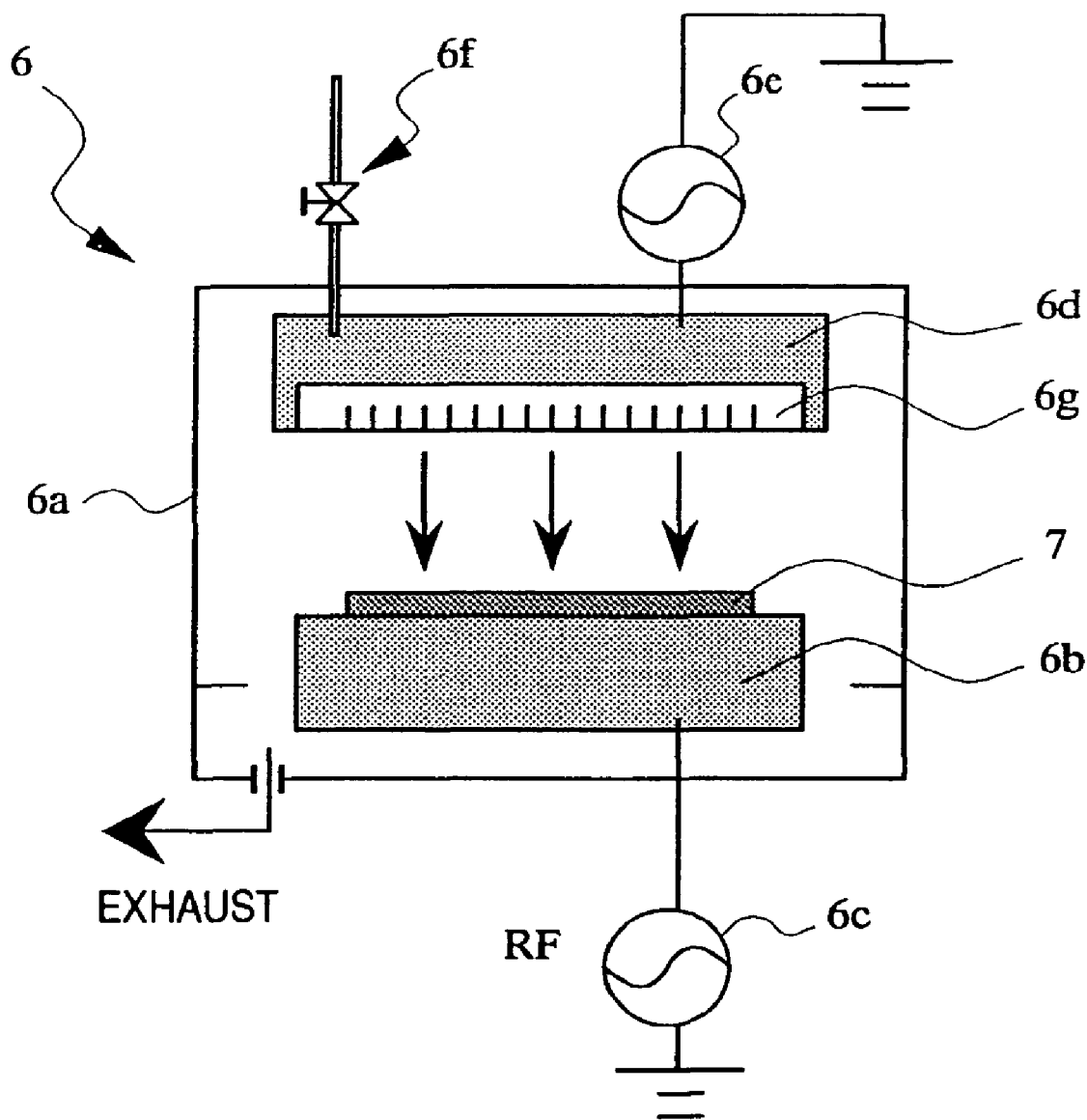
FIG. 11 is a table which illustrates a parallel plate type RIE apparatus.

FIG. 11 illustrates a parallel-plate type RIE apparatus 6 which is employed for the above-described plasma dry etching. This RIE apparatus 6 has, for example, a double-channel excited capacitance-coupled type plasma source, and, in addition, it has an etching chamber 6a, a lower electrode 6b disposed therein, a first high-frequency power source 6c electrically connected thereto, an upper electrode 6d disposed opposite to the lower electrode 6b in the etching chamber 6a, a second high-frequency electrode 6e electrically connected thereto, a gas introducing system 6f for introducing a gas in the etching chamber 6a and an exhaust system for maintaining a constant pressure in the etching chamber 6a. A semiconductor wafer (semiconductor integrated circuit substrate) 7 is disposed on the lower electrode 6b. The above-described atmospheric gas is fed on the lower surface side of the upper electrode 6d through the gas introducing system 6f and is then fed uniformly in the etching chamber 6a through a shower plate 6g. Plasma is formed between the lower electrode 6b and upper electrode 6d, which are disposed opposite to each other. Active radicals, atoms or ions are incident along the electric field vertical to the lower electrode 6b and the main surface of the semiconductor wafer 7, and, in this direction, reactive etching proceeds. The etching apparatus is not limited to the above-described parallel-plate narrow-electrode RIE apparatus, but various ones, such as an ICP (inductively coupled plasma) type or an ECR (electron cyclotron resonance) type etching apparatus can also be employed.

Figure 12:
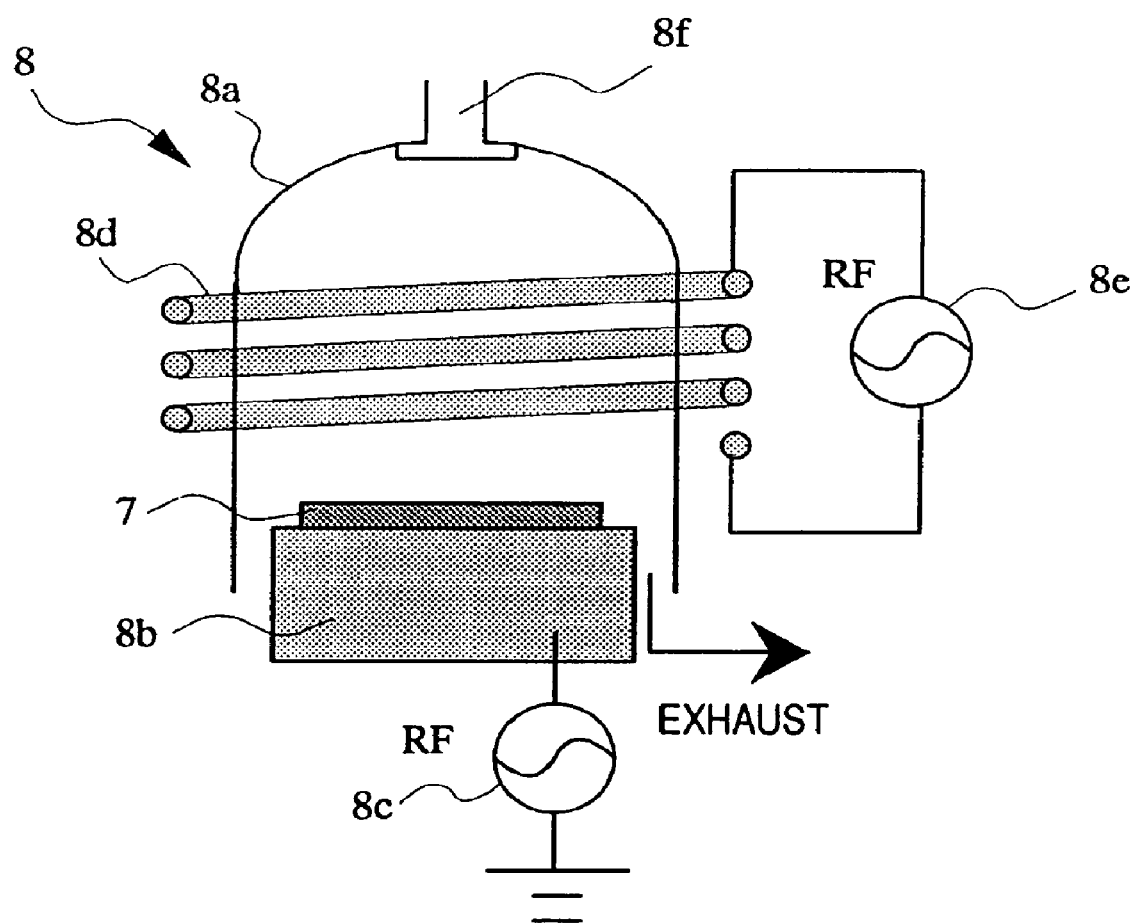
FIG. 12 is a diagram which illustrates an etching apparatus.

FIG. 12 illustrates an ICP type etching apparatus 8. This etching apparatus 8 has an etching chamber 8a, a lower electrode 8b disposed therein, a first high-frequency power source 8c electrically connected thereto, an ICP coil 8d disposed at the outer periphery of the upper portion of the etching chamber 8a, a second high-frequency power source 8e electrically connected thereto, a gas introducing system 8f for introducing a gas in the etching chamber 8a and an exhaust system for maintaining a constant pressure in the etching chamber 8a. A semiconductor wafer (semiconductor integrated circuit substrate) 7 is disposed on the lower electrode 8b. An etching gas is fed into the etching chamber 8a from the upper part of the etching chamber 8a. Under such a state, plasma is formed in the etching chamber 8a by the application of a high-frequency power to the ICP coil 8d from the second high-frequency power source 8e. The first high-frequency power source 8d is an electric source for feeding the lower electrode 8b with a bias high-frequency power for controlling ion energy.

Figure 13:
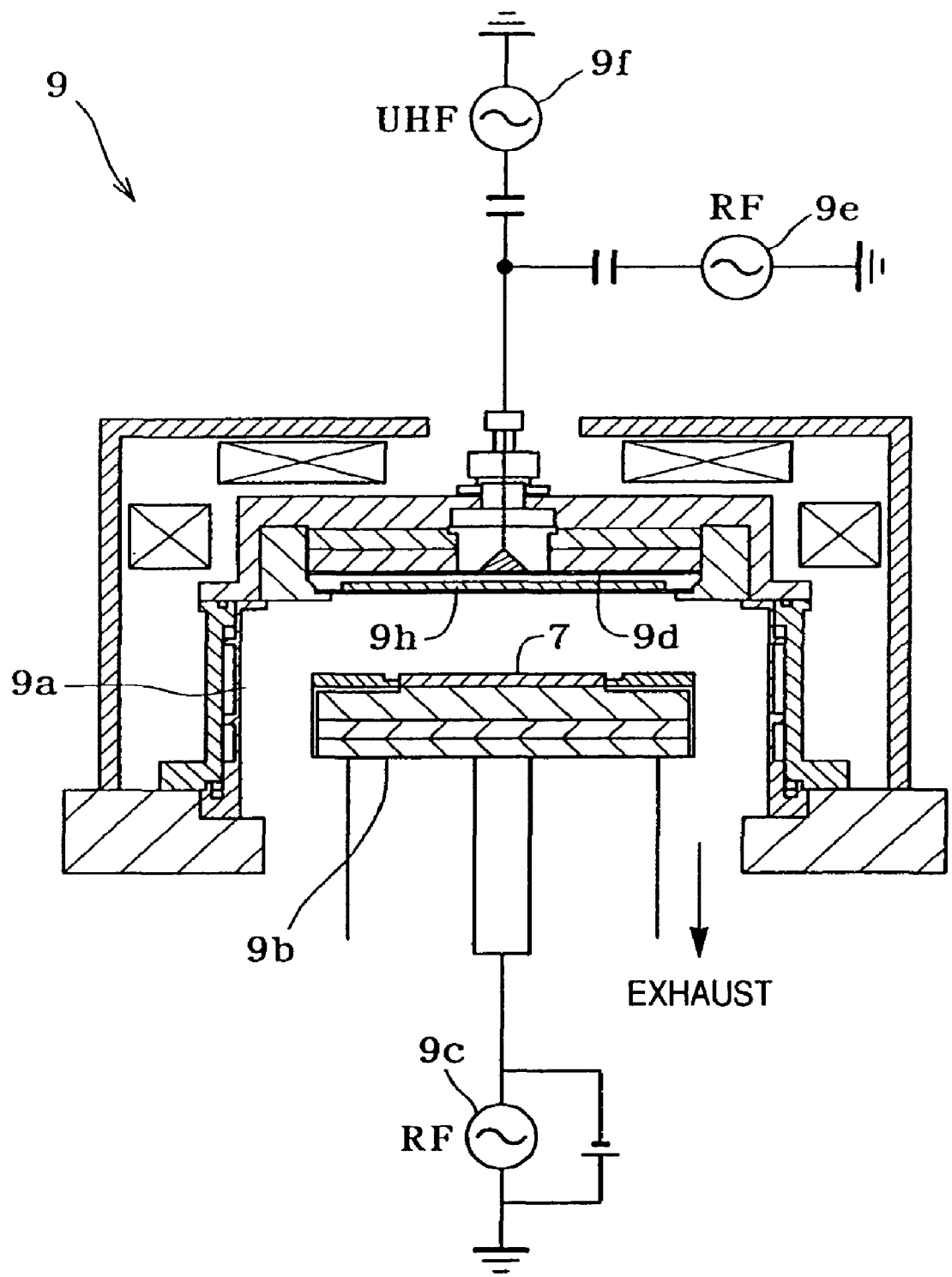
FIG. 13 is a cross-sectional diagram which illustrates another etching apparatus.

FIG. 13 illustrates a plate-antenna UHF-ECR type etching apparatus 9. This etching apparatus 9 has an etching chamber 9a, a lower electrode 9b disposed therein, a first high-frequency electric source 9c electrically connected thereto, a plate antenna 9d disposed at the upper portion of the etching chamber 9a, a second high-frequency power source 9e and a UHF power source 9d electrically connected thereto, an electromagnet 9g and a gas introducing system for introducing a gas into the etching chamber 9a, and an exhaust system for constantly maintaining the pressure in the etching chamber 9a. ECR is generated from a magnetic field formed by an UHF wave of, for example, 450 MHz incident from this antenna 9d and the electromagnet 9g, whereby an etching gas is converted into plasma. On the surface of the antenna 9d, a shower plate 9h made of, for example, silicon is disposed for the introduction of a gas and control of active ions, radicals or atoms. The ion energy incident on the shower plate 9h can be controlled by separately applying a high-frequency power of, for example, 13.56 MHz, to the antenna 9d. The energy incident on the semiconductor wafer 7 can also be controlled by application of a high-frequency bias, for example, 800 kHz to the lower electrode 9b. The distance between the antenna 9d and the lower electrode 9b can be changed, whereby dissociation of the gas in the plasma can controlled. The above-described frequency is only one example. The combination of the frequencies can be changed variously.

The nature of the gas employed for the treatment is limited in the above description. In the embodiment, according to the technical concept of the present invention, however, the gas is not limited as above-described, but can be changed variously.

For example, in the above description, $C_4F_8$ from which a desired etching selectivity relative to SIN is easily available is employed as a CF gas for the etching of an organic insulating film. However, not only $C_4F_8$, but also a gas such as $CHF_3CF_4$, $CH_2F_2$ or $C_5F_8$ can be employed. In addition, a saturated cyclic fluorocarbon, such as $C_3F_6$, a non-saturated cyclic fluorocarbon, such as $C_5F_9$, a non-cyclic fluorocarbon, such as $CF_4$, $CHF_3$ or $CH_2F_2$, or fluorocarbon iodide, such as $CF_3I$ developed as a countermeasure against fleon, can be used as a CF gas. Instead of a CF gas, $SF_6$ can be employed, for example.

It is possible to add, instead of the N of the above-described $CF/N_2/Ar$ gas, oxygen having a smaller flow rate than the CF gas, more specifically, oxygen in an amount small enough not to form the above-described sub-trench or in an amount permitting the formation of the sub-trench within a permissible range. Upon etching, two procedures, that is, etching and deposition, proceed simultaneously. When oxygen is not added, deposition happens to proceed more briskly. The addition of a small amount of oxygen improves the pulling property (removing state by etching) while suppressing deposition.

Instead of the $N_2$ Of the $CF/N_2/Ar$ gas, NO, $NO_2$ or $NH_3$ can be used for example. In this case, NO or $NO_2$ cannot be introduced freely and the amount of oxygen must be controlled in consideration of the above-described problem of a sub-trench.

The Ar gas in the $CF/N_2/Ar$ gas is not always necessary. When an ICP type etching apparatus is employed, for example, high plasma stability is brought about so that the addition of Ar can sometimes be omitted. Instead of Ar, helium (He) can be added.

Figure 14:
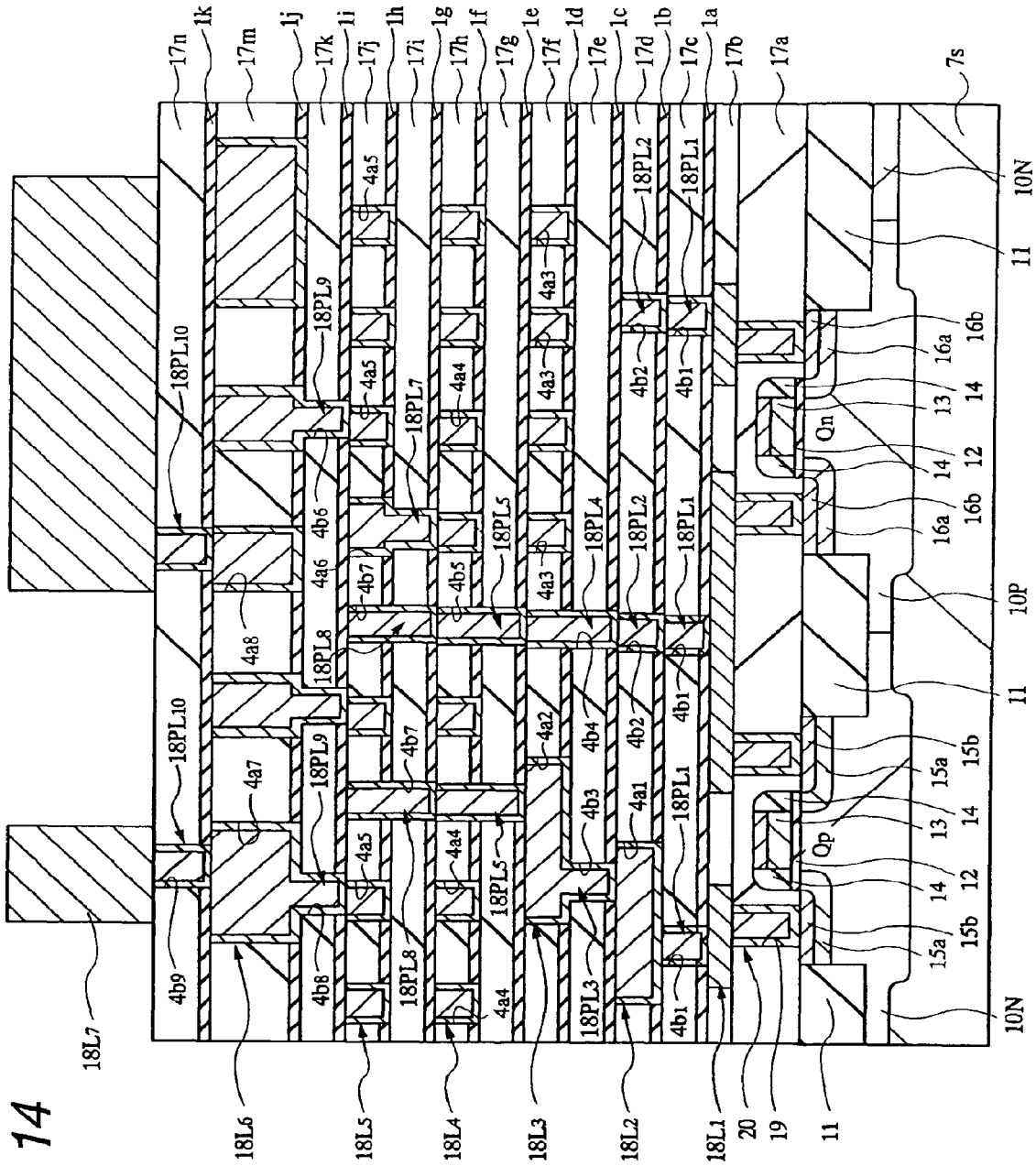
FIG. 14 is a fragmentary cross-sectional view illustrating the semiconductor integrated circuit substrate of a semiconductor integrated circuit device according to one embodiment of the present invention.
Figure 15:
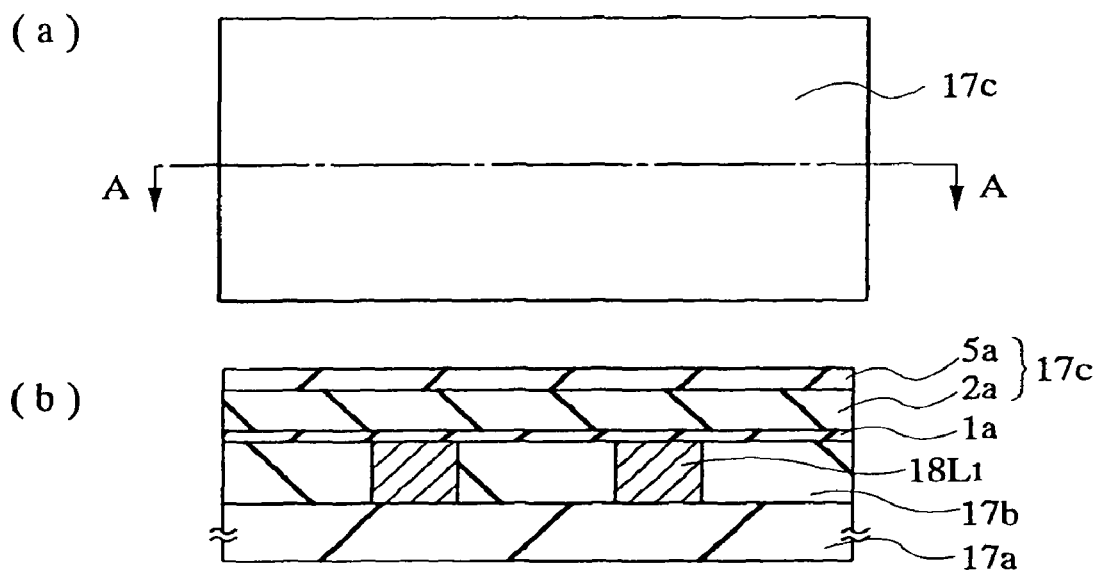
FIG. 15(*a*) is a plan view and FIG. 15(*b*) is a fragmentary cross-sectional view taken along line A-A in FIG. 15(*a*) illustrating the semiconductor integrated circuit device of FIG. 14 during its manufacturing step.
Figure 16:
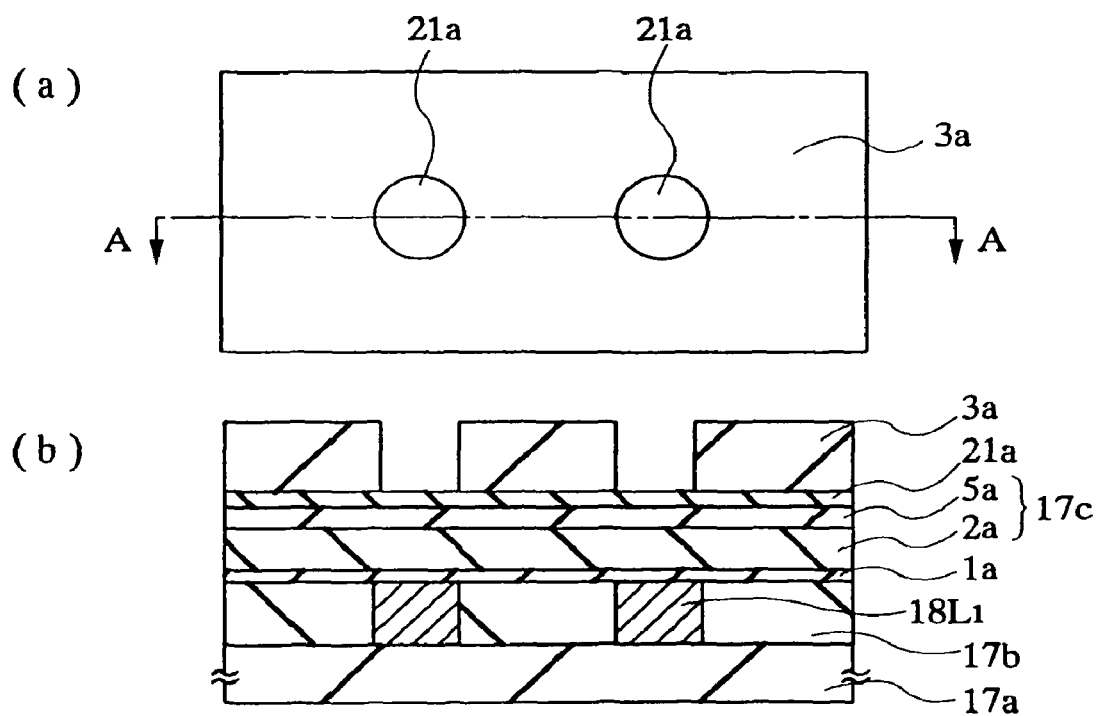
FIG. 16(*a*) is a plan view and FIG. 16(*b*) is a fragmentary cross-sectional view taken along line A-A in FIG. 16(*a*) illustrating the semiconductor integrated circuit device during a manufacturing step subsequent to that illustrated in FIG. 15(*b*)
Figure 17:
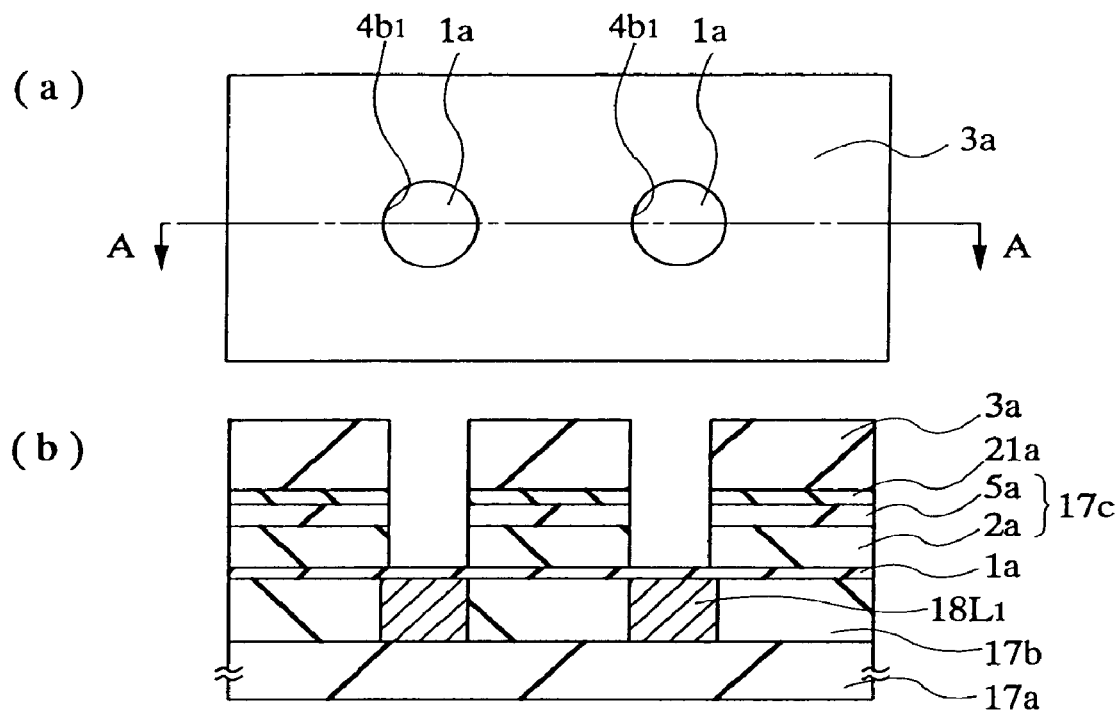
FIG. 17(*a*) is a plan view and FIG. 17(*b*) is a fragmentary cross-sectional view taken along line A-A in FIG. 17(*a*) illustrating the semiconductor integrated circuit device during a manufacturing step subsequent to that illustrated in FIG. 16(*b*)
Figure 18:
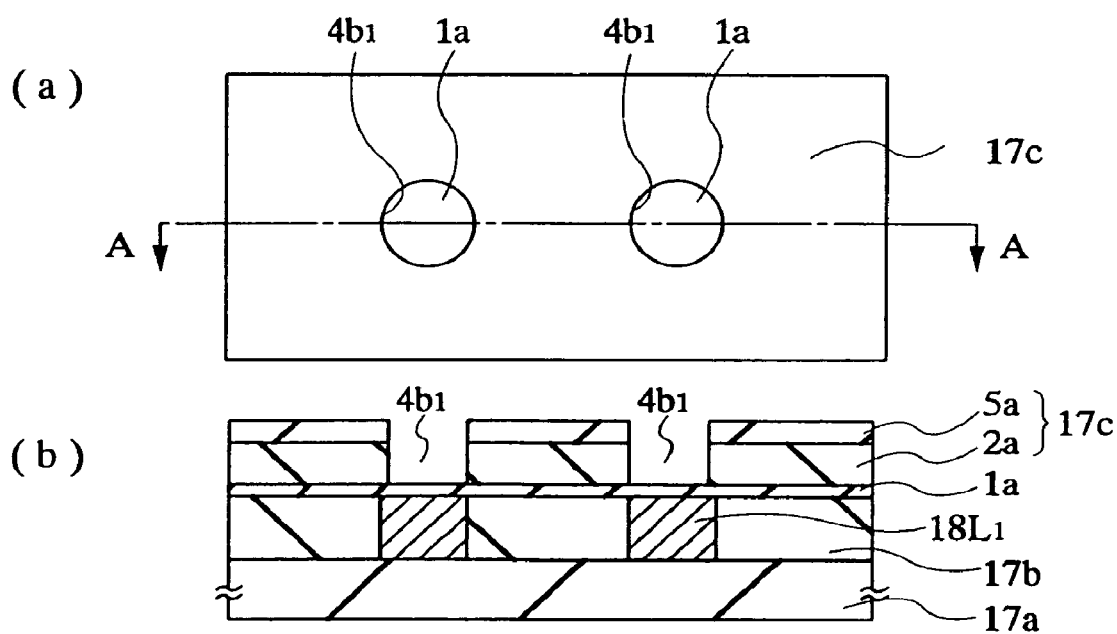
FIG. 18(*a*) is a plan view and FIG. 18(*b*) is a fragmentary cross-sectional view taken along line A-A in FIG. 18(*a*) illustrating the semiconductor integrated circuit device during a manufacturing step subsequent to that illustrated in FIG. 17(b)
Figure 20:
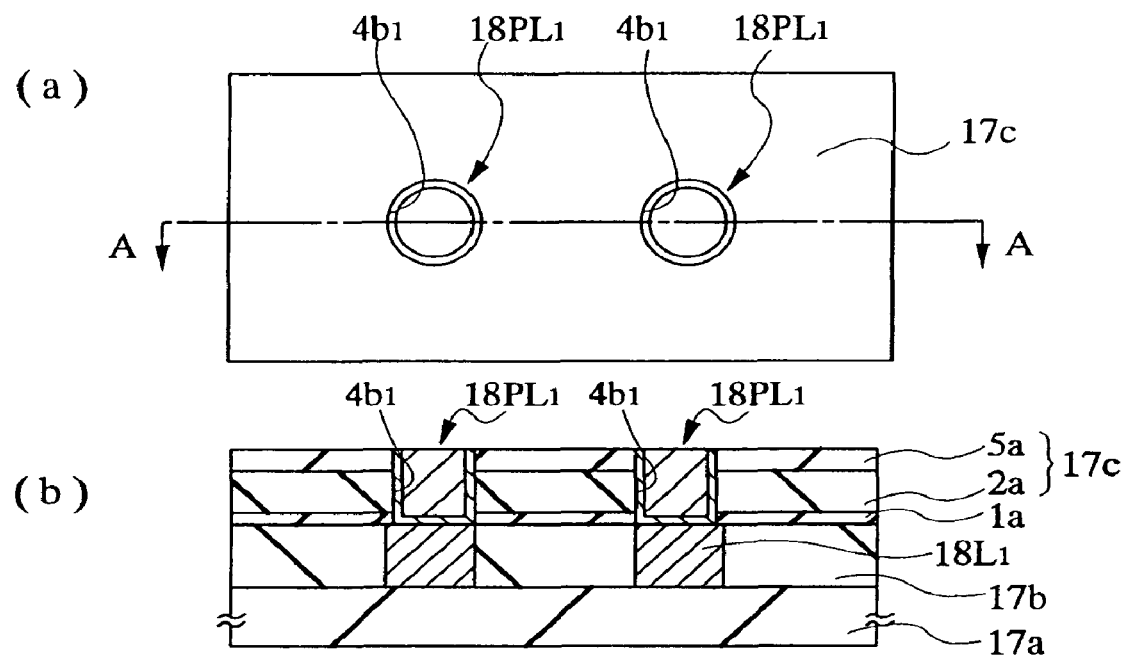
FIG. 20(a) is a plan view and FIG. 20(b) is a fragmentary cross-sectional view taken along line A-A in FIG. 20(a) illustrating the semiconductor integrated circuit device during a manufacturing step subsequent to that illustrated in FIG. 19(b)
Figure 21:
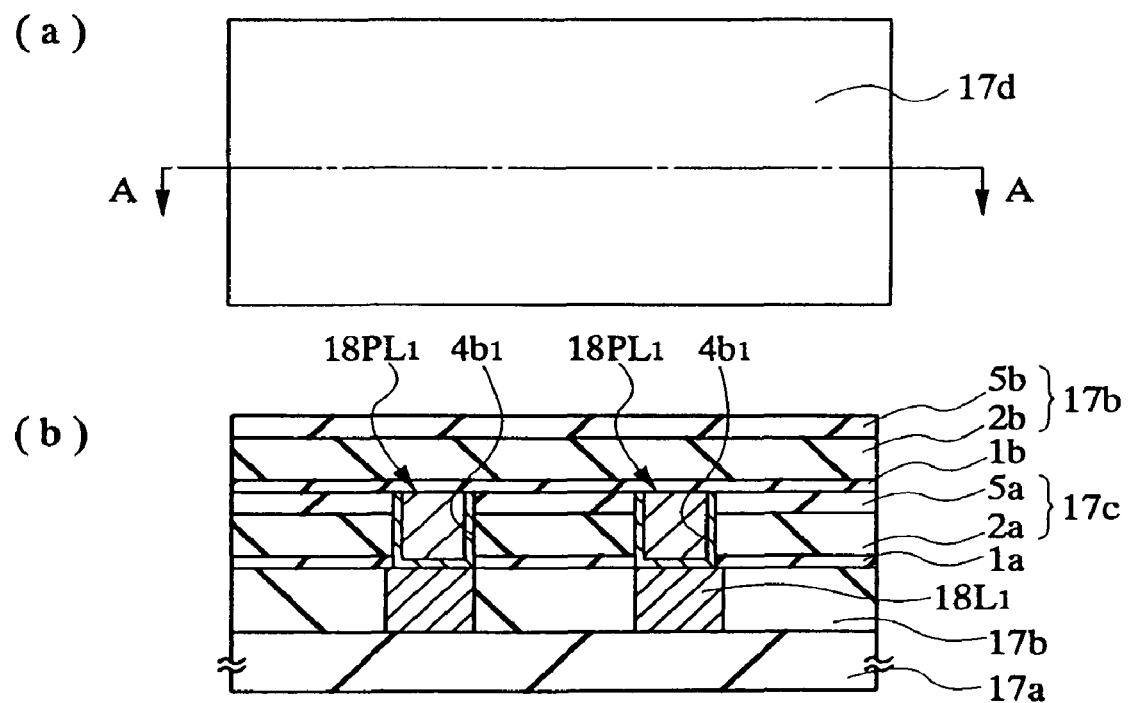
FIG. 21(a) is plan view and FIG. 21(b) is a fragmentary cross-sectional view taken along line A-A in FIG. 21(a) illustrating the semiconductor integrated circuit device during a manufacturing step subsequent to that illustrated in FIG. 20(b)
Figure 22:
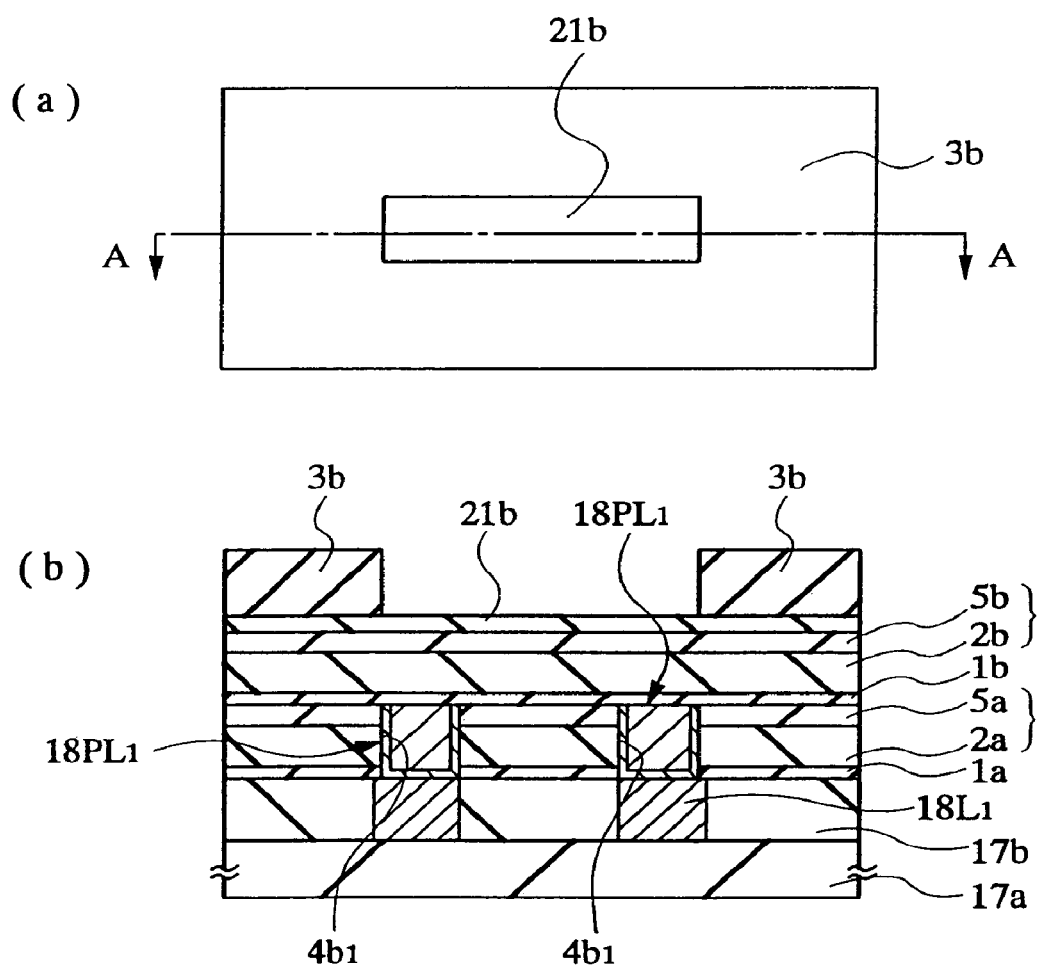
FIG. 22(a) is a plan view and FIG. 22(b) is a fragmentary cross-sectional view taken along line A-A in FIG. 22(a) illustrating the semiconductor integrated circuit device during a manufacturing step subsequent to that illustrated in FIG. 21(b)
Figure 26:
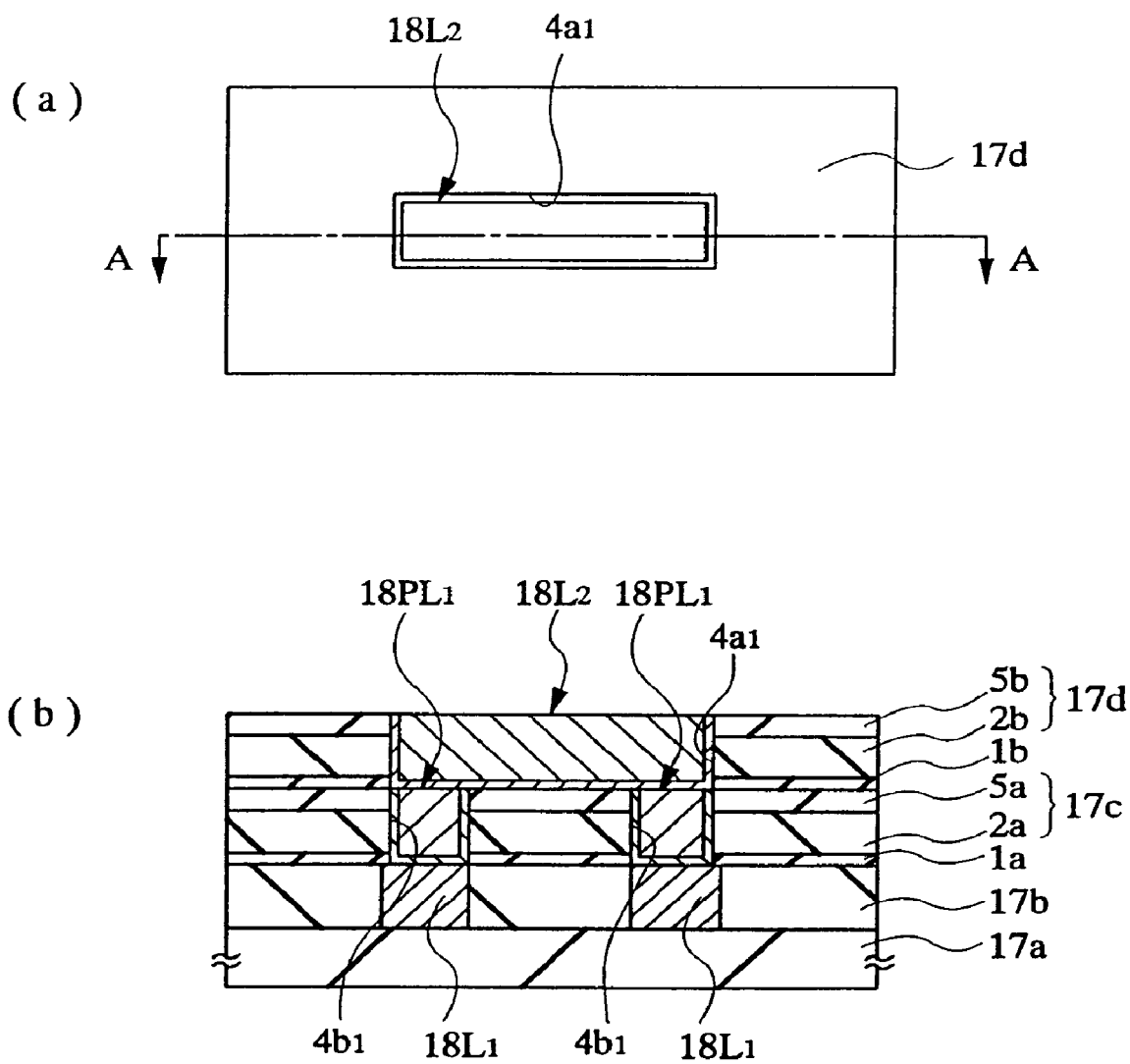
FIG. 26(a) is a plan view and FIG. 26(b) is a fragmentary cross-sectional view taken along line A-A in FIG. 26(a) illustrating the semiconductor integrated circuit device during a manufacturing step subsequent to that illustrated in FIG. 25(b)
Figure 27:
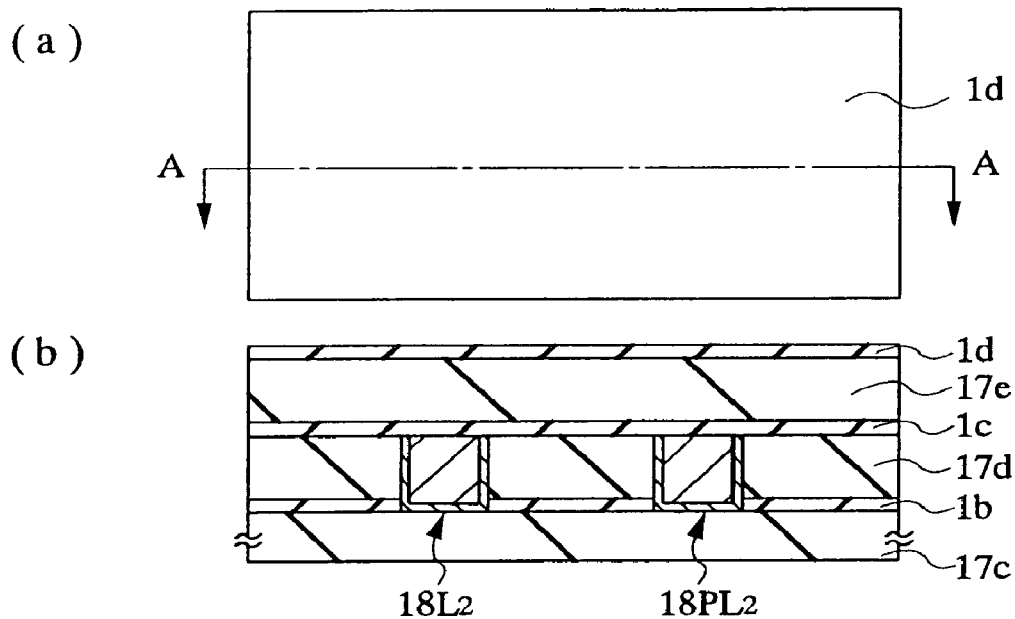
FIG. 27(a) is a plan view and FIG. 27(b) is a fragmentary cross-sectional view taken along line A-A in FIG. 27(a) illustrating the semiconductor integrated circuit device of FIG. 14 during a manufacturing step according to another embodiment of the present invention.
Figure 28:
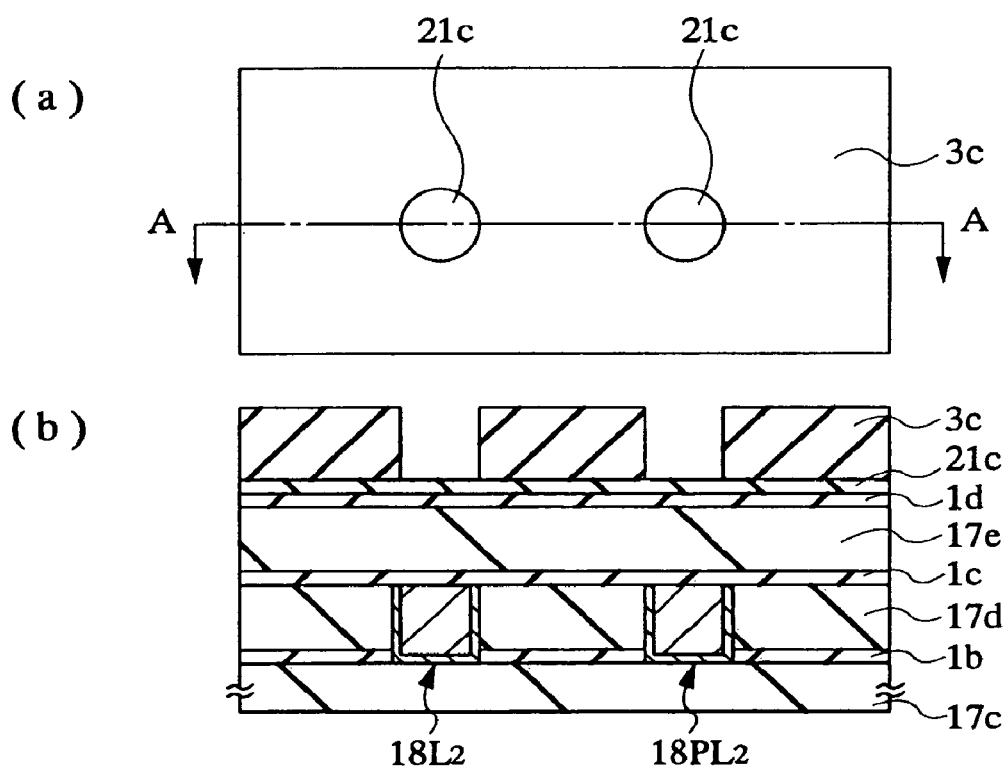
FIG. 28(a) is a plan view and FIG. 28(b) is a fragmentary cross-sectional view taken along line A-A in FIG. 28(a) illustrating the semiconductor integrated circuit device during a manufacturing step subsequent to that illustrated in FIG. 27(b)
Figure 29:
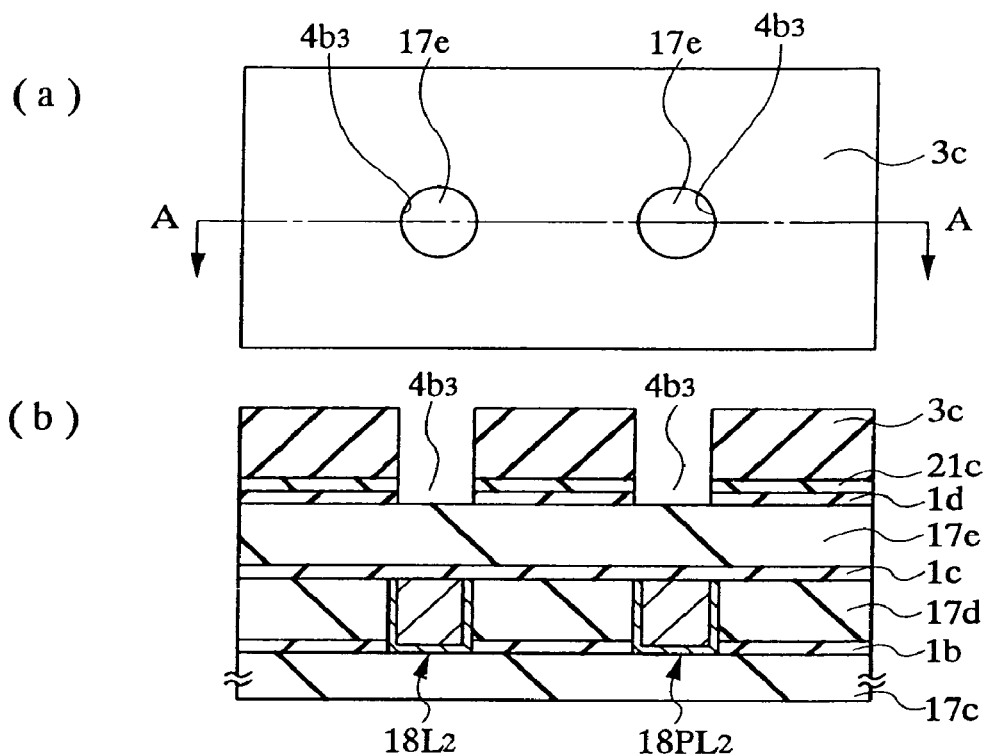
FIG. 29(a) is a plan view and FIG. 29(b) is a fragmentary cross-sectional view taken alone line A-A in FIG. 29(a) illustrating the semiconductor integrated circuit device during a manufacturing step subsequent to that illustrated in FIG. 28(b)
Figure 30:
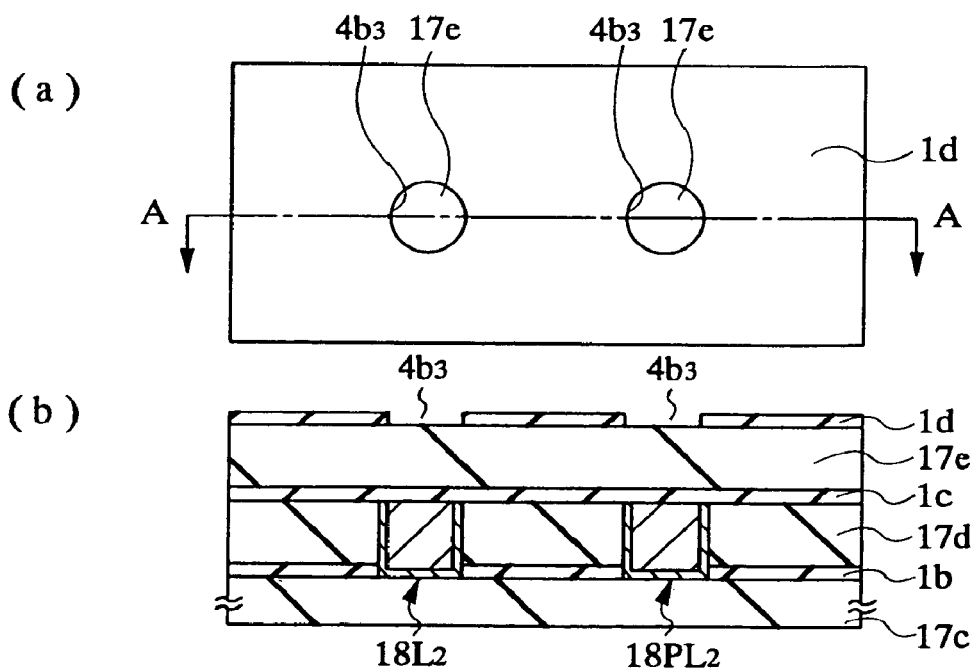
FIG. 30(a) is a plan view and FIG. 30(b) is a fragmentary cross-sectional view taken alone line A-A in FIG. 30(a) illustrating the semiconductor integrated circuit device during a manufacturing step subsequent to that illustrated in FIG. 29(b)
Figure 31:
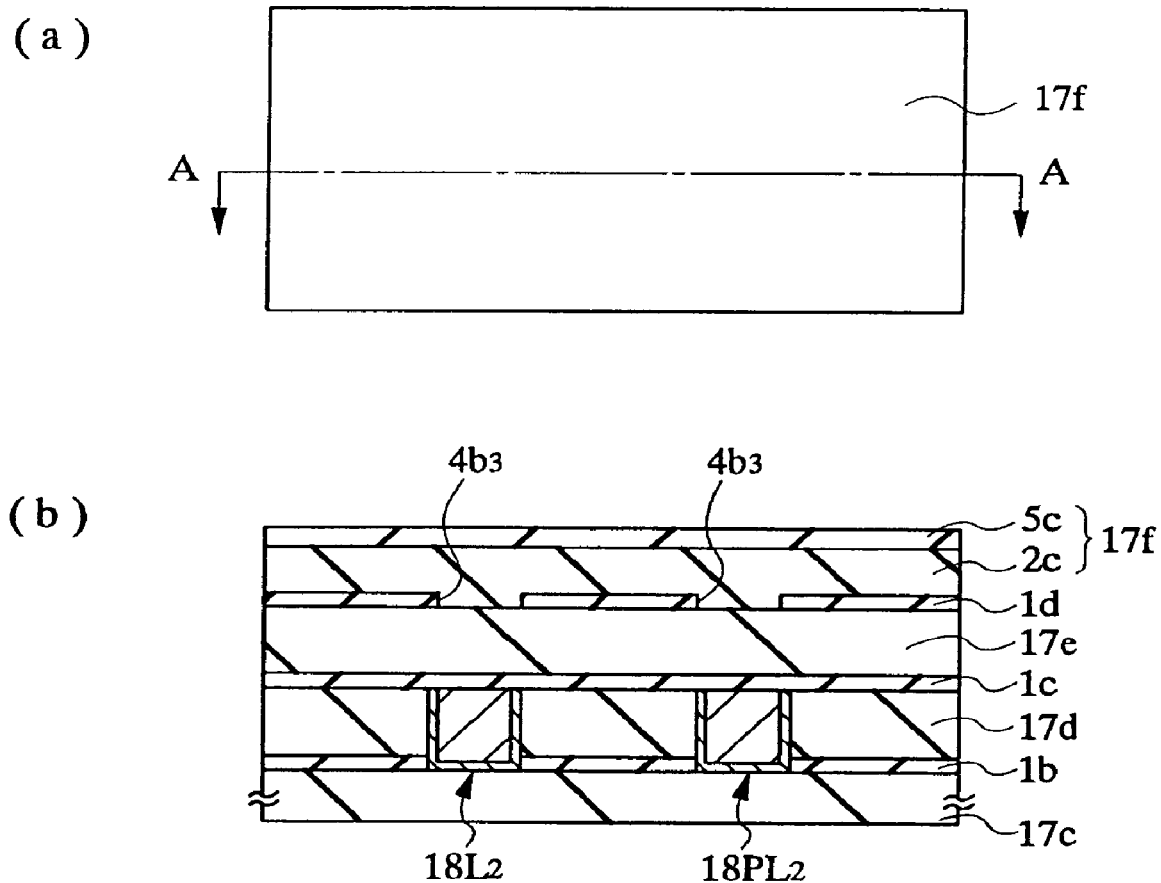
FIG. 31(a) is a plan view and FIG. 31(b) is a fragmentary cross-sectional view taken alone line A-A in FIG. 31(a) illustrating the semiconductor integrated circuit device during a manufacturing step subsequent to that illustrated in FIG. 30(b)
Figure 32:
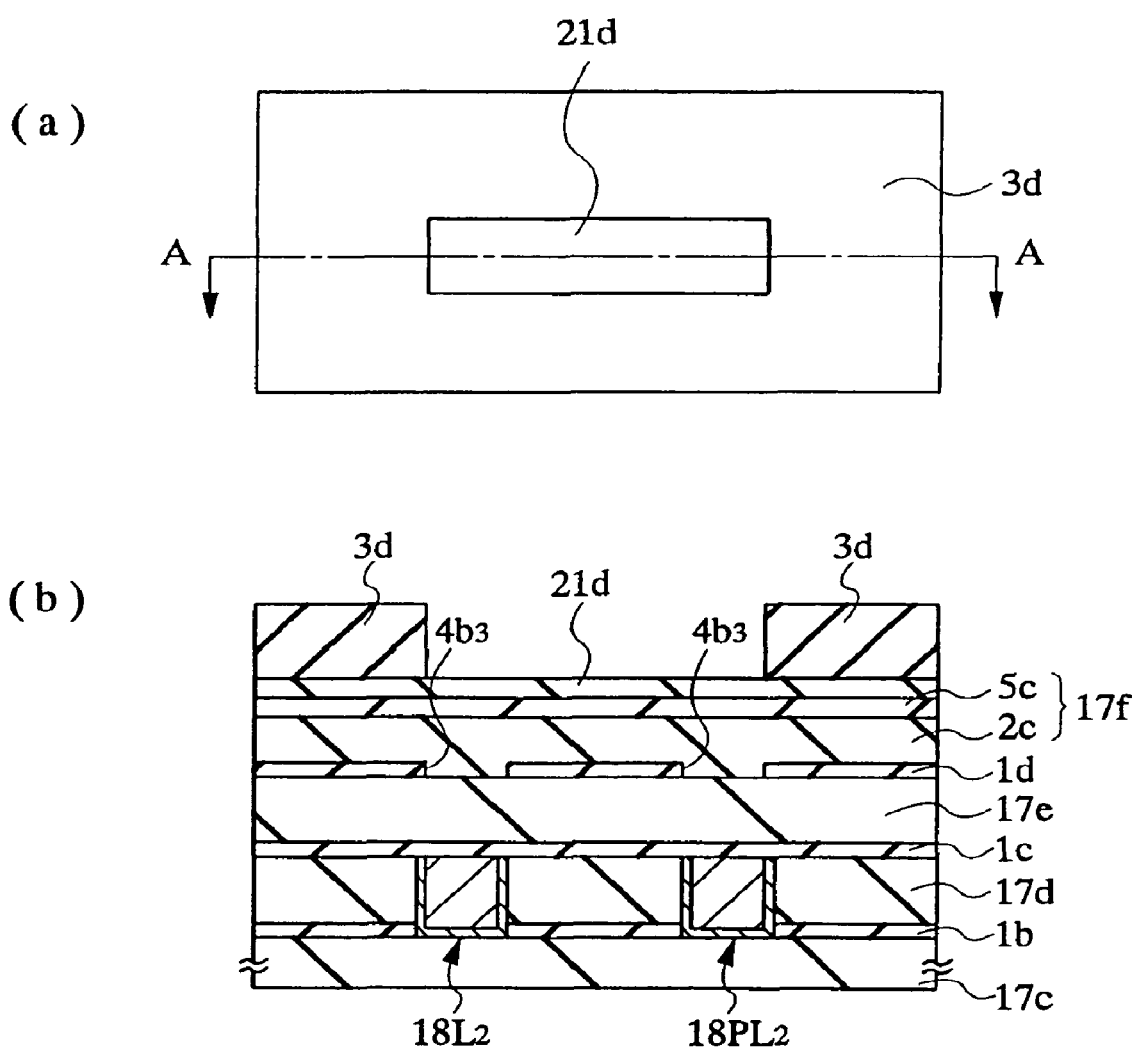
FIG. 32(a) is a plan view and FIG. 32(b) is a fragmentary cross-sectional view taken alone line A-A in FIG. 32(a) illustrating the semiconductor integrated circuit device during a manufacturing step subsequent to that illustrated in FIG. 31(b)
Figure 33:
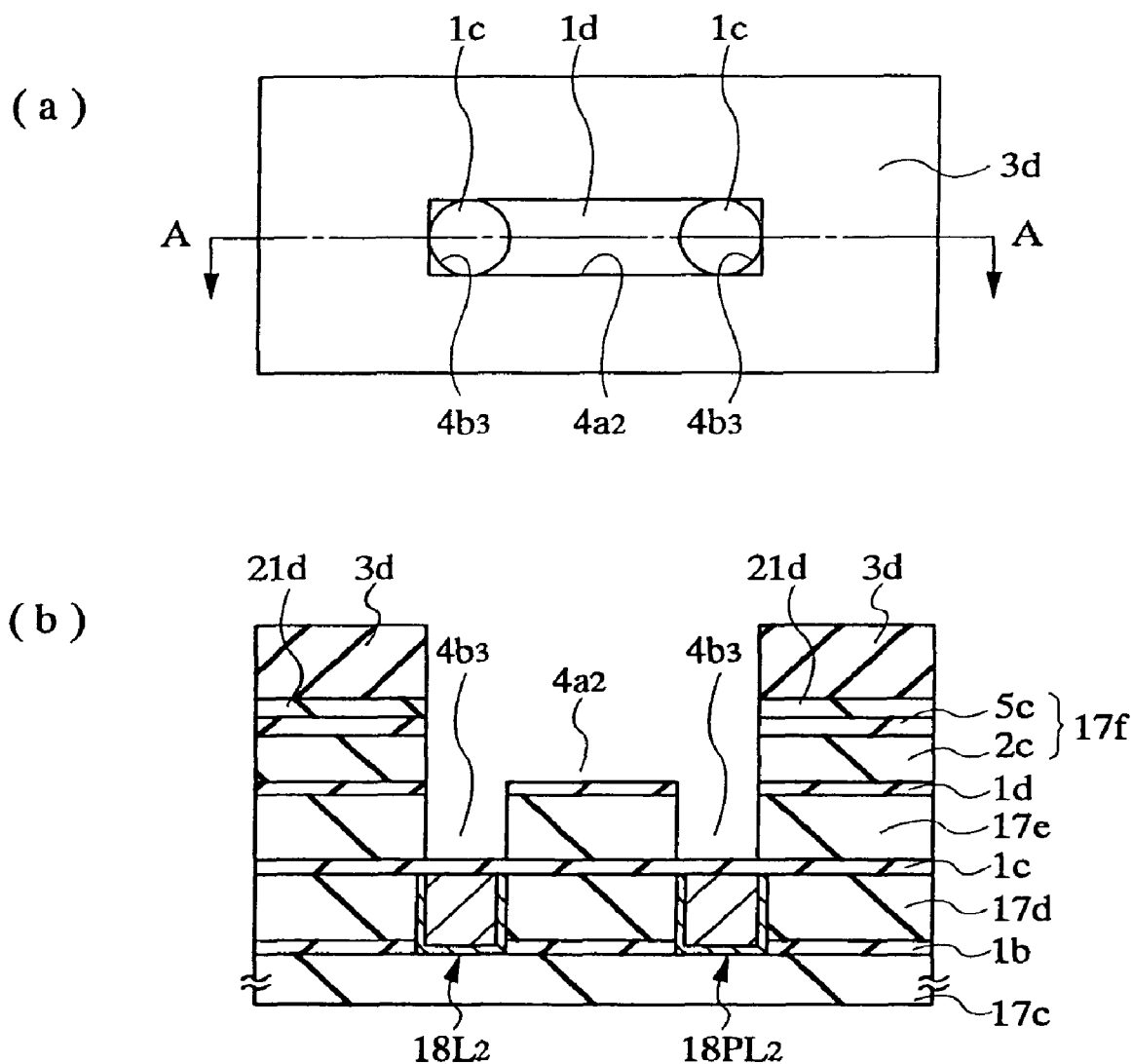
FIG. 33(a) is a plan view and FIG. 33(b) is a fragmentary cross-sectional view taken alone line A-A in FIG. 33(a) illustrating the semiconductor integrated circuit device during a manufacturing step subsequent to that illustrated in FIG. 32(b)
Figure 34:
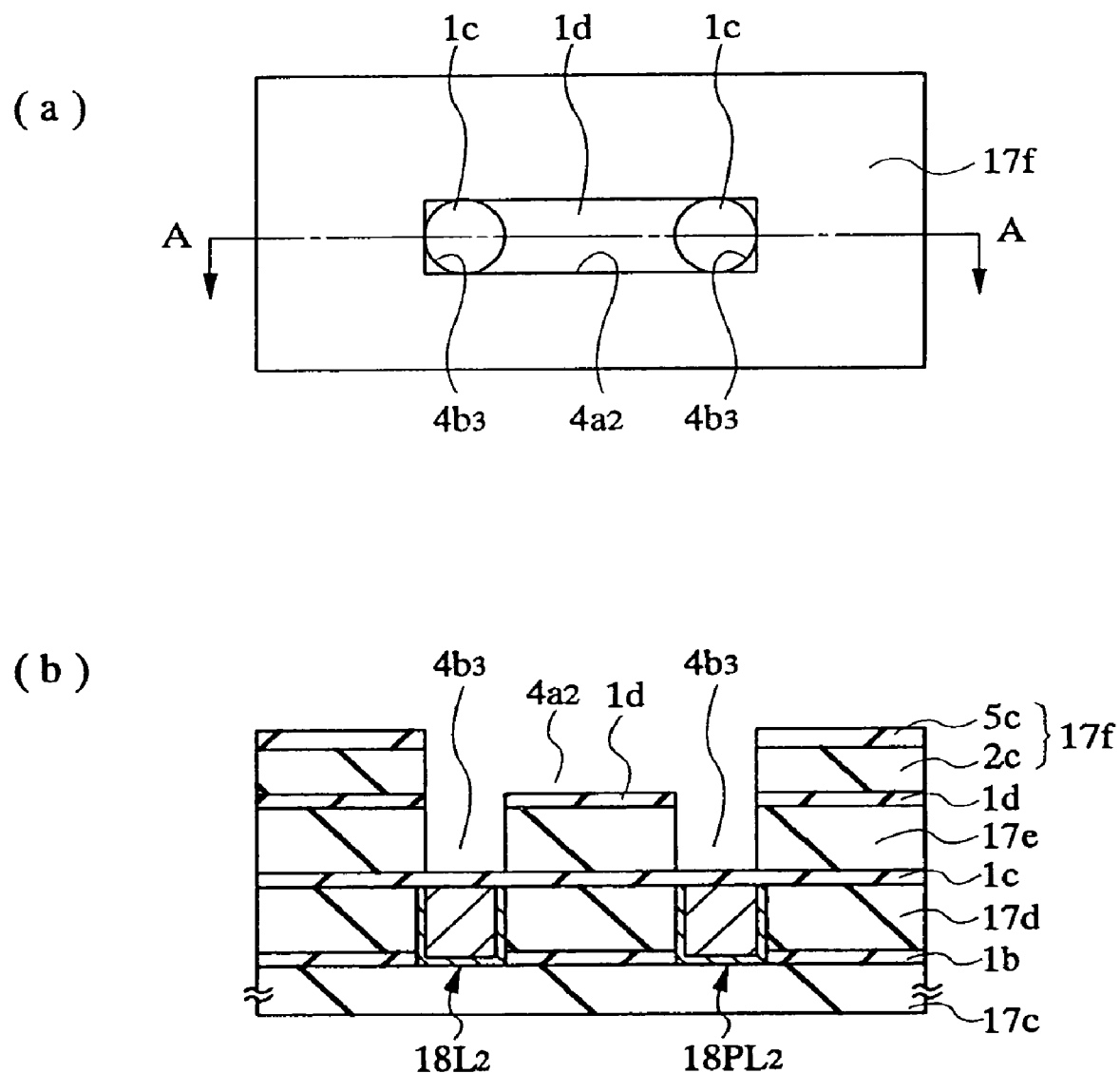
FIG. 34(a) is a plan view and FIG. 34(b) is a fragmentary cross-sectional view taken alone line A-A in FIG. 34(a) illustrating the semiconductor integrated circuit device during a manufacturing step subsequent to that illustrated in FIG. 33(b)
Figure 39:
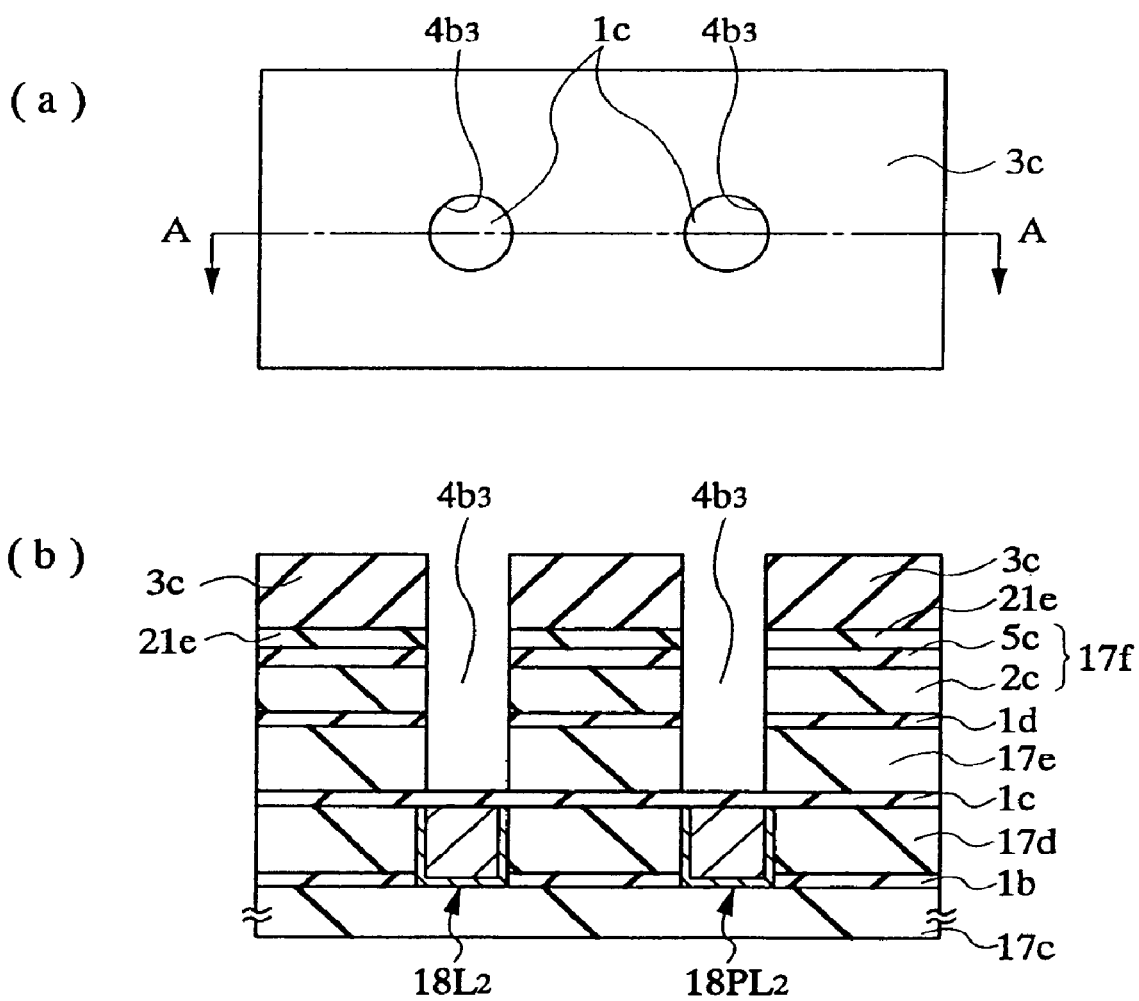
FIG. 39(a) is a plan view and FIG. 39(b) is a fragmentary cross-sectional view taken alone line A-A in FIG. 39(a) illustrating the semiconductor integrated circuit device during a manufacturing step subsequent to that illustrated in FIG. 38(b)
Figure 41:
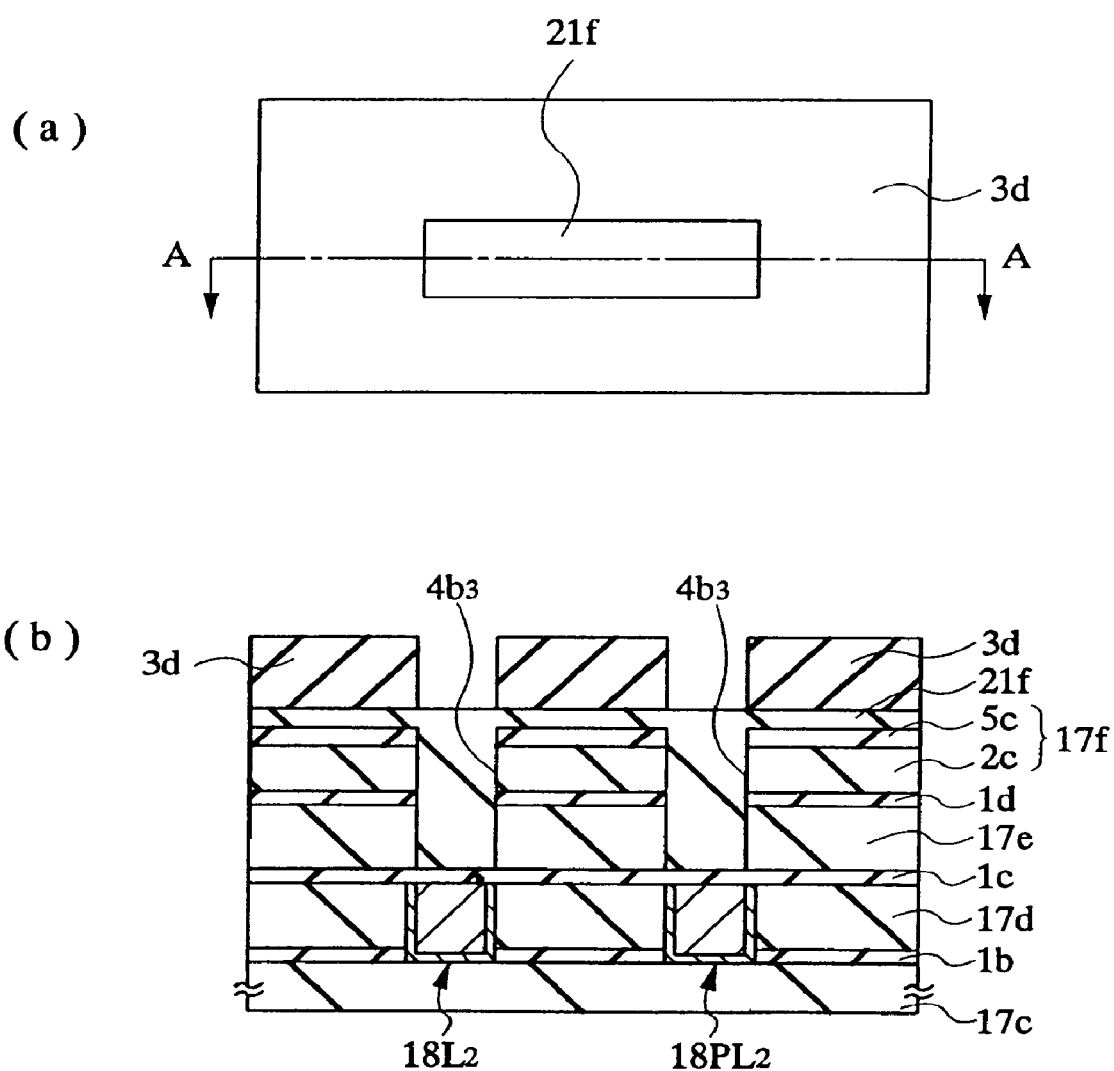
FIG. 41(a) is a plan view and FIG. 41(b) is a fragmentary cross-sectional view taken alone line A-A in FIG. 41(a) illustrating the semiconductor integrated circuit device during a manufacturing step subsequent to that illustrated in FIG. 40(b)
Figure 42:
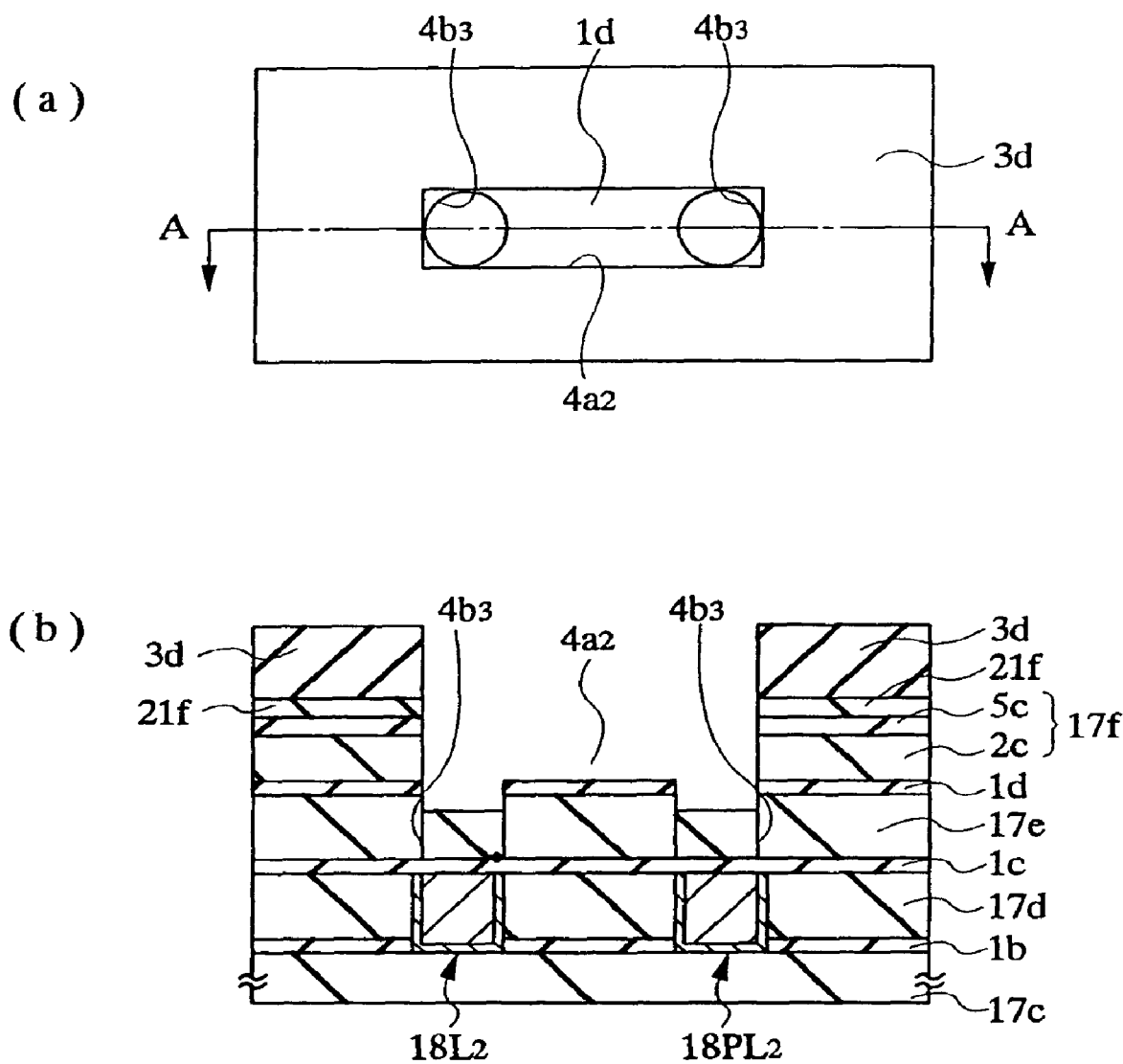
FIG. 42(a) is a plan view and FIG. 42(b) is a fragmentary cross-sectional view taken alone line A-A in FIG. 42(a) illustrating the semiconductor integrated circuit device during a manufacturing step subsequent to that illustrated in FIG. 41(b)

FIG. 14 shows one example of a semiconductor integrated circuit device manufactured on the basis of the technical concept of the present invention. FIG. 14 is a fragmentary cross-sectional view illustrating a semiconductor substrate (semiconductor integrated circuit substrate) 7s which results when the technical concept of the present invention is applied to a semiconductor integrated circuit device having, for example, a CMIS (complementary MIS) circuit. This semiconductor substrate 7s constitutes a planar square semiconductor chip cut from the above-described semiconductor wafer and is made of, for example, p⁻ type silicon single crystals. From the main surface to a predetermined depth of the semiconductor substrate 7s, an n-well 10N and a p-well 10P are formed. In the n-well 10N, phosphorus or arsenic is incorporated, while in the p-well 10P, boron or the like is incorporated. On the main surface side of the semiconductor substrate 7s, a trench-shaped isolating portion 11 is formed. This isolating portion 11 is formed by embedding an isolating insulating film made of, for example, silicon oxide, in a trench formed from the main surface of the semiconductor substrate 7s to the thickness direction of the semiconductor substrate 7s.

In an active region surrounded by this isolating portion 11, pMISQp and nMISQn are formed. A gate insulating film 12 of each of pMISQp and nMISQn is made of, for example, a silicon oxide film. Nitrogen may be segregated on the interface between the gate insulating film 12 and the semiconductor substrate 7s by nitriding treatment of the gate insulating film 12. This makes it possible to suppress hot carrier effects in the pMISQp and nMISQn, thereby improving the device properties without impairing miniaturization. A gate electrode 13 of each of pMISQp and nMISQn has a so-called polycide structure having a silicide film such as cobalt silicide or tungsten suicide disposed on a low-resistance polysilicon. The gate electrode 13 may be formed singly from low-resistance polysilicon, or it may be formed to have a polymetal structure wherein a metal film, such as tungsten, is disposed on a low-resistance polysilicon film via a barrier layer, such as titanium nitride or tungsten nitride. The gate length is, for example, about 0.14 µm. On the side surface of this gate electrode 13, a side wall 14 made of a silicon oxide film or silicon nitride film is formed. A semiconductor region 15a constituting source and drain regions of pMISQp contains, for example, boron. Over the semiconductor region 15a, a silicide layer 15b such as cobalt silicide or tungsten silicide is formed. A semiconductor region 16a constituting source and drain regions of nMISQn contains, for example, phosphorus or arsenic. Over the semiconductor region 16a, a silicide layer 16b, such as cobalt silicide or tungsten silicide, is formed. The silicide layer of the gate electrode 13 and the silicide layers 15b,16b over the semiconductor regions 15a,16a are formed in the same step.

Over the main surface (including the upper surface of the isolating portion 11) of the semiconductor substrate 7s, an interlevel dielectric film 17a is deposited and pMISQp and mMISQn are covered therewith. The upper surface of the interlevel dielectric film 17a is planarized by CMP (chemical mechanical polishing) or the like. Over the interlevel dielectric film 17a, a first-layer interconnect 18L1 is formed. The first-layer interconnect 18L1 is made of, for example, tungsten and is electrically connected with the semiconductor regions 15a, 16a of the above-described pMISQp or nMISQn through a conductor film 20 in a planar and substantially disc-shaped contact hole (recess) 19 perforated in the interlevel dielectric film 17a. The conductor film 20 has a first conductor film made of titanium, titanium nitride, or a laminate thereof adhered to the side surface and bottom surface of the contact hole 19; and a second conductor film made of tungsten or the like embedded inside of the contact hole 19 to which the first conductor film has been adhered.

Over the interlevel dielectric film 17a, an interlevel dielectric film 17b is deposited. An insulating film 1a is deposited over the interlevel dielectric film 17b and first-layer interconnect 18L1. Over the insulating film 1a, interlevel dielectric films 17c to 17k, 17m and 17n are deposited with insulating films 1b to 1k interposed therebetween, respectively.

The interlevel dielectric films 17a to 17k, 17m and 17n each constitutes a metallization structure and is made of a single organic insulating film or a laminate of the organic insulating film with another insulating film. The dielectric constant of the organic insulating film of the interlevel dielectric films 17a to 17k, 17m and 17n ranges from about 2.7 to 2.8 so that the total dielectric constant of the interconnects of the semiconductor integrated circuit device can be reduced, making it possible to improve the operation velocity of the semiconductor integrated circuit device. The following is one example of the fundamental chemical structure of the organic insulating film (corresponding to the above-described organic insulating film 2) used as the interlevel dielectric films 17a to 17k, 17m and 17n.

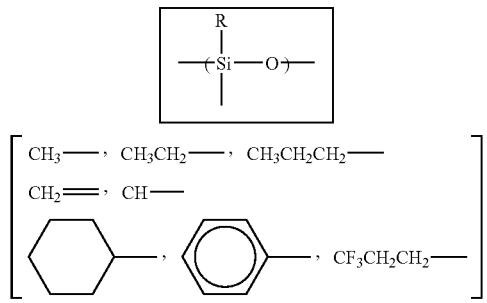

R: alkyl, alkenyl, phenyl, fluoroalkyl, etc.

A specific constitution example of the interlevel dielectric films 17a to 17k, 17m and 17n will be described in detail with reference to the steps employed in the manufacture of the semiconductor integrated circuit device. The interlevel dielectric film is an insulating film disposed between metallization layers or between an interconnect and the semiconductor substrate and examples of it include an organic interlevel dielectric film, a coating type interlevel dielectric film, an organic coating type insulating film and an organosiloxane type interlevel dielectric film.

The insulating films 1a to 1k are each made of, for example, a silicon nitride film, and its dielectric constant is about 7. Among the insulating films 1a to 1k, the insulating films 1a, 1b, 1d, 1f, 1h and 1j mainly function as an etching stopper, while the insulating films 1c, 1e, 1g, 1i and 1k mainly function as a copper diffusion suppressor.

In the insulating film 1a and interlevel dielectric film 17c, a through-hole (recess) 4b1 is formed. The through-hole 4b1 has, for example, a plane and substantially disc shape and a portion of the first-layer interconnect 18L1 is exposed from it. Inside of the through-hole 4b1, a connecting portion (inlaid interconnect) 18PL1 is formed. The connecting portion 18PL1 has a conductor film made of titanium nitride or the like adhered to the inside surface and bottom surface of the through-hole 4b1, and a relatively thick conductor film made of copper or the like embedded in the through-hole 4b1 to which the former conductor film has been adhered; and this is electrically connected with the first-layer interconnect 18L1.

In the insulating film 1b and interlevel dielectric film 17d, the trench (recess) 4a1 and through-hole (recess) 4b2 are formed. The trench 4a1 has, for example, a plane and rectangular shape, and it has a second-layer interconnect (inlaid interconnect) 18L2 formed therein. The second-layer interconnect 18L2 has a conductor film made of, for example, titanium nitride adhered to the inside surface and bottom surface of the trench 4a1, and a relatively thick conductor film made of, for example, copper, embedded inside of the trench 4a1 to which the former conductor film has been adhered; and this is electrically connected with the connecting portion 18PL1. The through-hole 4b2 has, for example, a plane and substantially-disc shape, and inside of it, a connecting portion (inlaid interconnect) 18PL2 is formed. The connecting portion 18PL2 has the same structure and is made of the same material as that of the connecting portion 18PL1, and it is electrically connected with the connecting portion 18PL1.

In the insulating films 1c and 1d, and interlevel dielectric films 17e and 17f, trenches (recesses) 4a2 and 4a3 and through-holes (recesses) 4b3 and 4b4 are formed. The trenches 4a2 and 4a3 each has, for example, a plane rectangular shape, and it has a third-layer interconnect (inlaid interconnect) 18L3 formed inside thereof. This drawing illustrates the electrically connected state of a third-layer interconnect 18L3 in the trench 4a2 with the second-layer interconnect 18L2 through the connecting portion (inlaid interconnect) 18PL3 in the through-hole 4b3. The through-hole 4b3 has, for example, a plane and substantially-disc shape and extends, from the bottom surface of the trench 4a2, to substantially reach the upper surface of the second-layer interconnect 18L2. Accordingly, the third-layer interconnect 18L3 in the trench 4a2 and the connecting portion 18PL3 in the through-hole 4b3 are formed integrally, and they have a conductor film, such as titanium nitride, adhered on the inside surfaces and bottom surfaces of the trench 4a2 and through-hole 4b3, and a relatively thick conductor film made of copper or the like embedded in the trench 4a2 and through-hole 4b3 to which the former conductor film has been adhered. The third-layer interconnect 18L3 in the trench 4a3 has the same structure and is made of the same material as that of the third-layer interconnect 18L3 in the trench 4a2. The through-hole 4b4 has, for example, a plane and substantially disc shape, and it extends from the upper surface of the interlevel dielectric film 17f to substantially reach the connecting portion 18PL2. Inside of the through-hole 4b4, a connecting portion (inlaid interconnect) 18PL4 is formed. This connecting portion 18PL4 is made of the same material as that of the connecting portion 18PL1 and is electrically connected with the connecting portion 18PL2.

In the insulating films 1e and 1f, and interlevel dielectric films 17g and 17h, a trench (recess) 4a4 and a through-hole (recess) 4b5 are formed. The trench 4a4 has, for example, a plane rectangular shape, and inside of it, a fourth-layer interconnect (inlaid interconnect) 18L4 is formed. The structure and constituting material of the fourth-layer interconnect 18L4 are similar to those of the third-layer interconnect 18L3. The through-hole 4b5 has, for example, a plane and substantially-disc shape and extends, from the upper surface of the interlevel dielectric film 17 to substantially reach the third-layer interconnect 18L3 and connecting portion 18PL4. Inside of the through-hole 4b5, a connecting portion (inlaid interconnect) 18PL5 is formed. The material and constitution of these connecting portions 18PL5, 18L5 are similar to those of the connecting portion 18PL4, and this drawing illustrates the case where one of them is electrically connected with the third-layer interconnect 18L3, while the other one is electrically connected with the connecting portion 18PL4.

In each of the insulating films 1g, 1h and interlevel dielectric films 17i, 17j, trenches (recesses) 4a5, 4a6 and through-holes (recesses) 4b6, 4b7 are formed. The trenches 4a5, 4a6 have, for example, a plane rectangular shape and inside of each of them, a fifth-layer interconnect (inlaid interconnect) 18L5 is formed. This drawing illustrates the case where the fifth-layer interconnect 18L5 in the trench 4a6 is electrically connected with the fourth-layer interconnect 18L4 through the connecting portion (inlaid interconnect) 18PL7 in the through-hole 4b6. This through-hole 4b6 has, for example, a plane and substantially-disc shape, and it substantially reaches the upper surface of the fourth-layer interconnect 18L4, extending from the bottom surface of the trench 4a6. The fifth-layer interconnect 18L5 in the trench 4a6 and the connecting portion 18PL7 in the through-hole 4b6 are therefore integrally formed. The structure and composition of the fifth-layer interconnect 18L5 and connecting portion 18PL7 are similar to those of the third-layer interconnect 18L3 and connecting portion 18PL3, respectively. The fifth-layer interconnect 18L5 in the trench 4a5 has also a similar structure and composition to those of the fifth-layer interconnect 18L5 in the trench 4a6. A through-hole 4b7 has, for example, a plane and substantially-disc shape, and it substantially reaches to the connecting portion 18PL5, extending from the upper surface of the interlevel dielectric film 17j. Inside of the through-hole 4b7, a connecting portion (inlaid interconnect) 18PL8 is formed. This connecting portion 18PL8 has a similar composition to the connecting portion 18PL5 and is electrically connected with the connecting portion 18PL5.

In each of the insulating films 1i, 1j and interlevel dielectric films 17k, 17m, a trench (recess) 4a7, 4a8 and a through-hole (recess) 4b8 are formed. The trench 4a7 has, for example, a plane rectangular shape, and it has a sixth-layer interconnect (inlaid interconnect) 18L6 formed therein. This drawing illustrates the case where the sixth-layer interconnect 18L6 in the trench 4a7 is electrically connected with the fifth-layer interconnect 18L5 through a connecting portion (inlaid interconnect) 18PL9 in the through-hole 4b8. This through-hole 4b8 has, for example, a plane and substantially-disc shape, and it substantially reaches the upper surface of the fifth-layer interconnect 18L5, extending from the bottom surface of the trench 4a7. The sixth-layer interconnect 18L6 in the trench 4a7 is therefore formed integral with the connecting portion 18PL9 in the through-hole 4b8, and they have a similar structure and composition to the third-layer interconnect 18L3 and connecting portion 18PL3, respectively. The sixth-layer interconnect 18L6 in the trench 4a8 has also a similar structure and composition to the sixth-layer interconnect 18L6 in the trench 4a7.

In the insulating film 1k and interlevel dielectric film 17n, a through-hole (recess) 4b9 is formed. The through-hole 4b9 has, for example, a plane and substantially-disc shape and from the bottom surface thereof, a portion of the sixth-layer interconnect 18L6 is exposed. Inside of the through-hole 4b9, a connecting portion (inlaid interconnect) 18PL10 is formed. The structure and composition of the connecting portion 18PL10 are similar to those of the connecting portion 18PL1 or the like, and it is electrically connected with the sixth-layer interconnect 18L6. Over the interlevel dielectric film 17n, a seventh-layer interconnect 18L7 is formed. The seventh-layer interconnect 18L7 is formed by successively stacking, for example, titanium nitride, aluminum and titanium nitride, and it is electrically connected with the connecting portion 18PL10.

The second-layer interconnect 18PL2 is formed by a single damascene process, while the third-layer interconnects 18L3 to 18L6 are formed by a dual damascene process. The first-layer interconnects 18L1 and the seventh-layer interconnects 18L7 are formed by an ordinary metallization method (deposition and patterning of a conductor film). The first-layer interconnect 18L1 to the fifth-layer interconnect 18L5 each has a thickness of about 400 nm and an interconnect width and minimum interconnect distance of about 0.25 μm. The sixth-layer interconnect 18L6 has a thickness of about 1200 nm and an interconnect width and minimum interconnect distance of about 0.75 μm. The seventh-layer interconnect 18L7 has a thickness of about 2000 nm and an interconnect width and minimum interconnect distance of about 1.5 μm. The connecting portions 18PL3 to 18PL9 each has a height of about 500 nm and a diameter of about 0.25 μm. The connecting portion 18PL10 has a height of about 1200 nm and a diameter of about 0.75 μm.

Application of the technical concept of the present invention to the manufacturing process of the above-described semiconductor integrated circuit device will hereinafter be described based on FIGS. 15(a) to 36(b) which illustrates the semiconductor integrated circuit device of FIG. 14 during successive steps in the manufacture thereof. In the description of the manufacturing process of the semiconductor integrated circuit device, only a selected drawing from FIG. 14 will hereinafter be illustrated for the purpose of providing a brief explanation.

First, one example of the application of the technical concept of the present invention to a single damascene process will be described. The interlevel dielectric film 17c of FIG. 15(a) has an organic insulating film 2a deposited over the insulating film 1a and an insulating film 5a deposited over the organic insulating film 2a, as seen in FIG. 15(b). The insulating-film 1a has a thickness of, for example, about 50 nm. The organic insulating film 2a is formed, for example, from an organic SOG film and its thickness is about 250 nm. The insulating film 5a is formed, for example, of silicon oxide or the like formed by the plasma CVD method by using a TEOS gas, and its thickness is about 100 nm. This insulating film 5a serves to ensure the mechanical strength of the organic insulating film 2a so that if the organic insulating film 2a has a sufficient mechanical strength, the insulating film 5a can be omitted.

Over the interlevel dielectric film 17c, an antireflection film 2a is applied to a thickness of about 120 nm as illustrated in FIG. 16(b), followed by the formation of a photoresist film (masking layer) 3a thereover. This photoresist film 3a is a mask pattern for the formation of a through-hole, and it is patterned to expose a through-hole forming region and cover the other region, as seen in FIG. 16(a). Then, with this photoresist film 3a as an etching mask, the antireflection film 21a exposed therefrom and the interlevel dielectric film 17c are removed by plasma dry etching treatment successively, whereby a through-hole 4bl is formed, as illustrated in FIG. 17(b). This through-hole 4bl has the insulating film 1a made of silicon nitride or the like left on its bottom surface. The through-hole 4bl has a diameter of, for example, about 0.25 µm.

The antireflection film 21a is etched under the following conditions: use of $CHF_3/CH_4/Ar$ as an etching gas, its flow rate of about 10/90/950/sccm, pressure in the etching chamber of about 750 mTorr, high-frequency power of about 900 W, lower electrode temperature of about 10° C., and use of a parallel-plate narrow-electrode RIE apparatus as an etching apparatus.

Upon etching of the interlevel dielectric film 17c, the above-described concept of the present invention is applied so that etching can be conducted at an increased etching selectivity relative to a silicon nitride film without forming a sub-trench on the bottom of the through-hole 4bl. The interlevel dielectric film 17c is etched under the following conditions: use of $C_4F_8/N_2/Ar$ as an etching gas, its flow rate of about 12/200/300 sccm, pressure in the etching chamber of about 20 mTorr, high-frequency power of about 1000/600 W, lower electrode temperature of about 20° C. and use of a parallel-plate narrow-electrode type RIE apparatus as an etching apparatus.

After removal of the photoresist film 3a and antireflection film 21a by ashing, as illustrated in FIG. 18(a), the insulating film 1a exposed from the bottom surface of the through-hole 4bl is removed, as illustrated in FIG. 19(b) by plasma dry etching. By this etching, a silicon nitride film is selectively removed by etching, whereby the upper surface of the first-layer interconnect 18L1 is exposed from the bottom surface of the through-hole 4bl. This etching is conducted under the following conditions: use of $CHF_3/O_2/Ar$ as an etching gas, its flow rate of about 20/20/400 sccm, pressure in the etching chamber of about 50 mTorr, high-frequency power of about 1000/200 W, lower electrode temperature of about 0° C. and use of a parallel-plate narrow-electrode type RIE apparatus as an etching apparatus.

A barrier conductor film made of, for example, titanium nitride (TiN), tantalum (Ta) or tantalum nitride (TaN) is deposited over the interlevel dielectric film 17c and inside of the through-hole 4bl by sputtering. This barrier conductor film serves to suppress the diffusion of copper atoms or to improve the adhesion between an interconnect and an interlevel dielectric film. Then, after deposition of a thin seed conductor film made of, for example, copper over the barrier conductor film by sputtering, a main conductor film made of, for example, copper is deposited over the seed conductor film by plating. Then, by removing the unnecessary portions of the main conductor film, the seed conductor film and the barrier conductor film by CMP or the like polishing method, a connecting-portion 18PL1 is formed inside of the through-hole 4bl as illustrated in FIG. 20(a) and FIG. 20(b).

After deposition of the insulating film 1b over the interlevel dielectric film 17c and connecting portion 18PL1 by plasma CVD, an interlevel dielectric film 17d is deposited over the insulating film 1b, as illustrated in FIG. 21(a) and FIG. 21(b). The interlevel dielectric film 17d has an organic insulating film 2b and an insulating film 5b deposited thereover. The organic insulating film 2b and insulating film 5b are similar in structure (forming method, material, thickness, function and the like) to the organic insulating film 2a and insulating film 5a, respectively.

Over the interlevel dielectric film 17d, an antireflection film 21b having, for example, the same thickness as that of the antireflection film 21a is applied as illustrated in FIG. 22(b), followed by the formation thereover a photoresist film 3b, as seen in FIG. 27(a). This photoresist film (masking layer) 3b is a mask pattern for the formation of an interconnect trench and is patterned so as to expose the interconnect forming region and cover the other region. With this photoresist film 3b as an etching mask, the antireflection film 21b exposed therefrom and the interlevel dielectric film 17d are removed successively by plasma dry etching, whereby a trench 4al is formed, as illustrated in FIG. 23(a). The insulating film 1b made of a silicon nitride film is left on the bottom surface of the trench 4al, as seen in FIG. 23(b).

The antireflection film 21b is etched under similar conditions to those of the antireflection film 21a. Upon etching of the interlevel dielectric film 17d, the above-described technical concept of the present invention is applied. It is therefore possible to etch it at an increased etching selectivity relative to a silicon nitride film without forming a sub-trench at the bottom of the trench 4al. The interlevel dielectric film 17d can be etched under similar conditions to those of the interlevel dielectric film 17c.

After removal of the photoresist film 3b and the remaining antireflection film 21b by ashing, as illustrated in FIG. 24(b), the insulating film 1b exposed from the bottom surface of the trench 4al is removed, as illustrated in FIG. 25(b), by plasma dry etching, whereby the upper surface of the connecting portion 18PL1 is exposed from the bottom surface of the trench 4al. This etching is conducted under similar conditions to those of the insulating film 1a except that the flow rate ratio of $CHF_3/O_2/Ar$ employed as an etching gas is about 20/20/200 sccm. Then, a barrier conductor film made of, for example, titanium nitride (TiN) is deposited over the interlevel dielectric film 17d and inside of the trench 4al by sputtering. This barrier conductor film serves to suppress diffusion of copper atoms and to improve adhesion between an interlevel dielectric film and an interconnect. Then, after deposition of a thin seed conductor film made of, for example, copper over the barrier conductor film by sputtering, a main conductor film made of, for example, copper is deposited by plating over the seed conductor film by plating. Unnecessary portions are removed from the main conductor film, seed conductor film and barrier conductor film by CMP or the like polishing method, whereby a second-layer interconnect 18L2 is formed inside of the trench 4al, as illustrated in FIG. 26(a) and FIG. 26(b).

Next, one example of the application of the technical concept of the present invention to a dual damascene process will be described. Although in this description of the dual damascene process, the process of formation of the second-layer interconnect and third-layer interconnect portions of FIG. 14 will be selectively described, the same process can be applied to the formation of the fourth- to sixth-layer interconnects. The structures of the interlevel dielectric films 17g to 17k, 17m and 17n are typified by those of the interlevel dielectric films 17c, 17d, 17e and 17f.

The insulating film 1c of FIG. 27(b) has a function of suppressing diffusion of copper and its thickness is, for example, of about 50 nm. Over the insulating film 1c, the interlevel-dielectric film 17e is formed. This interlevel dielectric film 17e is formed, for example, from the same material and by the same method as those of the organic insulating film 2a and its thickness is about 400 nm. Over the interlevel dielectric film 17e, the insulating film 1d is deposited, as seen in FIG. 27(a). The insulating film 1d mainly serves as an etching stopper and its thickness is, for example, about 100 nm.

Over the insulating film 1d, an antireflection film 21c is applied to have the same thickness as that of the antireflection film 21a or the like, followed by the formation of a photoresist film (masking layer) 3c over the antireflection film 21c. The photoresist film 3c is a mask pattern for the formation of a through-hole, and it is patterned so as to expose a through-hole forming region and cover the other portion, as seen in FIG. 28(a) and FIG. 28(b). Using the photoresist film 3c as an etching mask, the antireflection film 21c exposed therefrom and the insulating film 1d are removed successively by plasma dry etching, whereby a through-hole 4b3 is formed in the insulating film 1d, as illustrated in FIG. 29(b). From the bottom surface of the through-hole 4b3, the interlevel dielectric film 17e is exposed. The through-hole 4b3 has a diameter of, for example, about 0.25 µm. The remaining insulating film 1d functions as an etching mask as will be described later. The antireflection film 21c is etched under the conditions similar to those for the antireflection film 21a. The insulating film 1d is etched under the conditions similar to those for the insulating film 1a except that the flow rate ratio of $CHF_3/O_2/Ar$ as an etching gas is about 20/20/200 sccm.

Then, after removal of the photoresist film 3c and antireflection film 21c by ashing as illustrated in FIG. 30(a) and FIG. 30(b), an organic insulating film 2c and an insulating film 5c are successively deposited over the insulating film 1d and the interlevel dielectric film 17e exposed from the through-hole 4b3 to form the interlevel dielectric film 17f, as seen in FIG. 31(a) and FIG. 31(b). The organic insulating film 2c and insulating film 5c are similar in structure (formation method, material, thickness, function and the like) to the organic insulating film 2a and insulating film 5a, respectively.

Over the interlevel dielectric film 17f, an antireflection film 21d is applied, as illustrated in FIG. 32(a) and FIG. 32(b). The antireflection film 21d is as thick as the antireflection film 21a. Then, a photoresist film (masking layer) 3d is formed over the antireflection film 21d, as seen in FIG. 33(a) and FIG. 33(b). This photoresist film 3d is a mask pattern for the formation of an interconnect trench and is patterned so as to expose an interconnect-forming region and to cover the other region. Using the photoresist film 3d as the etching mask, the antireflection film 21d exposed therefrom and the interlevel dielectric films 17f, 17e are removed successively by plasma dry etching, whereby a trench 4a2 is formed in the interlevel dielectric film 17f and a through-hole 4b3 is formed in the interlevel dielectric film 17e as illustrated in FIG. 33(b). In short, both the trench 4a2 and through-hole 4b3 can be formed by one etching step. On the bottom surfaces of the trench 4a2 and through-hole 4b3, the insulating films 1d, 1c are left, respectively. The anti reflection film 21d is etched under similar conditions to those for the antireflection film 21a. Upon etching of the interlevel dielectric films 17f, 17e, the insulating films 1c, 1d function as an etching stopper. Etching conditions for these interlevel dielectric films are similar to those for the interlevel dielectric film 17c.

Then, after removal of the photoresist film 3d and antireflection film 21d by ashing, as illustrated in FIG. 34(b), the insulating films 1d, 1c, which are respectively exposed from the bottom surfaces of the trench 4a2 and through-hole 4b3, are removed by plasma dry etching, as illustrated in FIG. 35(b). By this etching for selectively removing a silicon nitride film, the upper surface of the interlevel dielectric film 17e is exposed from the bottom surface of the trench 4a2, and the upper surfaces of the second-layer interconnect 18L2 and connecting portion 18PL2 are exposed from the through-holes 4b3. This etching is conducted under similar conditions to those for the insulating film 1a.

After deposition of a barrier conductor film—which has both a function of suppressing t@e diffusion of copper and a function of improving adhesion with an insulating film and is made of titanium nitride (TiN), tantalum (Ta), tantalum nitride (TaN) or the like—over the interlevel dielectric film 17f and inside of the trench 4a2 and through-hole 4b3 by sputtering, a thin seed conductor film made of, for example, copper, is deposited over the barrier conductor film by sputtering, followed by deposition of a main conductor film made of, for example, copper by plating. By removing the unnecessary portions of the main conductor film, the seed conductor film and the barrier conductor film by CMP or the like polishing method, a third-layer interconnect 18L3 is formed in the trench 4a2, and, at the same time, a connecting portion 18PL3 integrally formed with the third-interconnect 18L3 is formed in the through-holes 4b3, as illustrated in FIG. 36(a) and FIG. 36(b). This third-layer interconnect 18L3 is electrically connected with the second-layer interconnect 18L2 and connecting portion 18PL2 via the connecting portion 18PL3 in each of the through-holes 4b3. In short, the third-layer interconnect 18L3 is electrically connected with the second interconnect 18L2 and connecting portion 18PL2. In the semiconductor integrated circuit device as illustrated in FIG. 14, metallization layers are formed by repeating the above-described metallization process until the formation of the sixth-layer interconnect 18L6. The seventh-layer interconnect 18L7 is formed by depositing an interconnect-forming conductor film over the interlevel dielectric film 17n and then patterning the conductor film by ordinarily-employed photolithography and dry etching techniques.

This Embodiment 1 as described above brings about the following advantages:

(1) It is possible to suppress the inevitable formation of a sub-trench 55 at the outer periphery of the bottom surface of the recess 4 upon formation of the recess 4, such as a trench or a hole in the organic insulating films 2, 2a, 2c.

(2) The advantage as described in (1) makes it possible to reduce the percent defective in a metallization layer constituting a semiconductor integrated circuit device, leading to an improvement in the reliability and yield of the semiconductor integrated circuit device.

(3) The advantage as described in (1) makes it possible to form, in the organic insulating films 2 and 2a to 2c, a recess 4, such as a trench or a hole having a high aspect ratio.

(4) The advantage as described in (3) makes it possible to miniaturize each of the interconnects constituting the semiconductor integrated circuit device, thereby bringing about high integration.

(5) Upon formation of the recess 4, such as a trench or a hole in each of the organic insulating films 2 and 2a to 2c, it is possible to increase the etching selectivity to it relative to insulating films 1 and 1a to 1k each made of a silicon nitride film, thereby suppressing the inconvenience of etching-through of the insulating films 1 and 1a to 1k upon formation of the recess 4, for example.

(6) The advantage as described in (5) makes it possible to decrease the thickness of the insulating films 1 and 1a to 1k, thereby reducing the total dielectric contact of the interconnects of the semiconductor integrated circuit device and moreover, to improve the operation velocity of the semiconductor integrated circuit device.

Embodiment 2

In this Embodiment 2, a modified example of the Embodiment 1 will be described, and, more specifically, application of the technical concept of the present invention to a dual damascene process different from that described in Embodiment 1 will be described. The manufacturing process of a semiconductor integrated circuit device according to Embodiment 2 will be described based on FIGS. 37(a) to 42(b), which show the semiconductor integrated circuit device of FIG. 14 during successive steps in the manufacture thereof.

Over the insulating film 1d as illustrated in FIG. 27(b), an interlevel dielectric film 17f is formed, as illustrated in FIG. 37(a) and FIG. 37(b). In this Embodiment 2, a silicon nitride film is used as a material of the insulating film 1d, as in Embodiment 1, but instead of it, a silicon oxide film formed, for example, by plasma CVD by using a TEOS gas to have a thickness of about 100 nm can be used. This interlevel dielectric film 17f has an organic insulating film 2c and an insulating film 5c deposited thereover.

As illustrated in FIG. 38(b), an antireflection film 21e is applied over the interlevel dielectric film 17f to have a similar thickness to that of the antireflection film 21a. After formation of the photoresist film (masking layer) 3c over the antireflection film 21e, as seen in FIG. 38(a), the antireflection film 2le exposed from the photoresist film and interlevel dielectric film 17f are removed successively by plasma dry etching using the photoresist film 3c as an etching mask, whereby a through-hole 4b3 is formed through the interlevel dielectric film 17f, insulating film 1d and interlevel dielectric film 17e, as illustrated in FIG. 39(b). From the bottom surface of this through-hole 4b3, the insulating film 1c is exposed. The through-hole 4b3 has a diameter of, for example, about 0.25 μm. The antireflection film 21e is etched under similar conditions to those for the antireflection film 21a. The interlevel dielectric film 17f, insulating film 1d and interlevel dielectric film 17e are etched, for example, in three stages. More specifically, the interlevel dielectric film 17f is removed by the first etching, with the insulating film 1d as an etching stopper, under the conditions which facilitate the removal of a silicon oxide film rather than a silicon nitride film by etching. Then, the insulating film 1d is removed by the second etching under the conditions which facilitate the removal of a silicon nitride film rather than a silicon oxide film by etching. The interlevel dielectric film 17e is then removed by the third etching, with the insulating film 1c as an etching stopper, under similar conditions to those of the first etching. To the etching of the interlevel dielectric films 17e, 17f, the technical concept of the present invention is applied and etching is conducted under similar conditions to those for the interlevel dielectric film 17c. Etching conditions of the insulating film 1d made of a silicon nitride film or the like are similar to those of the insulating films 1a to 1d.

After removal of the photoresist film 3c and antireflection film 2le by ashing, as illustrated in FIG. 40(b), an antireflection film 21f is applied over the interlevel dielectric film 17f and inside of the through-hole 4b3, as illustrated in FIG. 41(b). Since the through-hole 4b3 is filled with the antireflection film 21f, the antireflection film 21f is formed thicker than the antireflection film 21a, for example, about 240 nm. After formation of the photoresist film 3d over the antireflection film 21f, the antireflection film 21f exposed from the photoresist film 3d and the interlevel dielectric film 17f are removed successively by plasma dry etching using the photoresist film 3d as an etching mask, whereby a trench 4a2 is formed in the interlevel dielectric film 17f, as illustrated in FIG. 42(a) and FIG. 42(b). After etching, the antireflection film 21f is left at the bottom of the through-hole 4b3, while the insulating film 1d made of a silicon nitride film is left on the bottom surface of the trench 4a2.

The antireflection film 21f is etched under the following conditions: use of $N_2/O_2$ as an etching gas, its flow rate of about 35/50 sccm, pressure in the etching chamber of about 10 mTorr, high-frequency power of about 500/140 W, lower electrode temperature of −20| C and use of a parallel-plate narrow-electrode type RIE apparatus as an etching apparatus. The technical concept of the present invention is applied to the etching of the interlevel dielectric film 17f conducted with the insulating film 1d as an etching stopper. Etching conditions are similar to those for the interlevel dielectric film 17c.

The photoresist film 3d and antireflection film 21f are removed by ashing, whereby a similar structure to that illustrated in FIG. 34(b) in Embodiment 1 is formed. Subsequent manufacturing steps are similar to those described with reference to FIGS. 35(b) and 36(b) in Embodiment 1, so that description of them is omitted.

In this Embodiment 2, advantages similar to those obtained in Embodiment 1 are available. In particular, it is possible to form the through-hole 4b3 having a high aspect ratio without causing an inconvenience in the cross-sectional shape, and while maintaining a high etching selectivity relative to a silicon nitride film.

Embodiment 3

In this Embodiment 3, a modified example of Embodiment 1 or 2 will be described, and, more specifically, application of the technical concept of the present invention to a dual damascene process different from that described in Embodiment 1 or 2 will be described. The manufacturing process of the semiconductor integrated circuit device according to Embodiment 3 will be described based on FIGS. 43(a) to 50(b), which show the semiconductor integrated circuit device of FIG. 14 during successive steps in the manufacture thereof.

Over the insulating film 17f illustrated in FIG. 37(b), an insulating film 22 made of, for example, a silicon nitride film is formed, as illustrated in FIG. 43(a) and FIG. 43(b). This insulating film 22 is an etching mask member for formation of a trench or hole, and its thickness is about 150 nm. The insulating film 22 is not limited to a silicon nitride film, but can be changed variously. A film made of titanium nitride, tantalum, tantalum nitride or polysilicon or a film containing at least one of these materials may be used as the insulating film 22.

As illustrated in FIG. 44(*b*), an antireflection film 21*e* is then applied over the insulating film 22. After formation of the photoresist film (masking layer) 3*d* over the antireflection film 21*e*, as seen in FIG. 44(*a*), the antireflection film 21*e* exposed from the photoresist film and insulating film 22 are removed successively by plasma dry etching using the photoresist film 3*d* as an etching mask, whereby an opening portion 23 to expose the upper surface of the interlevel dielectric film 17*f* is formed in the insulating film 22, as seen in FIG. 45(*a*) and FIG. 45(*b*). The antireflection film 21*e* is etched under similar conditions to those for the antireflection film 21*a*. The insulating film 22 is, on the other hand, etched under conditions similar to those for the insulating film 1*d*.

Figure 48:
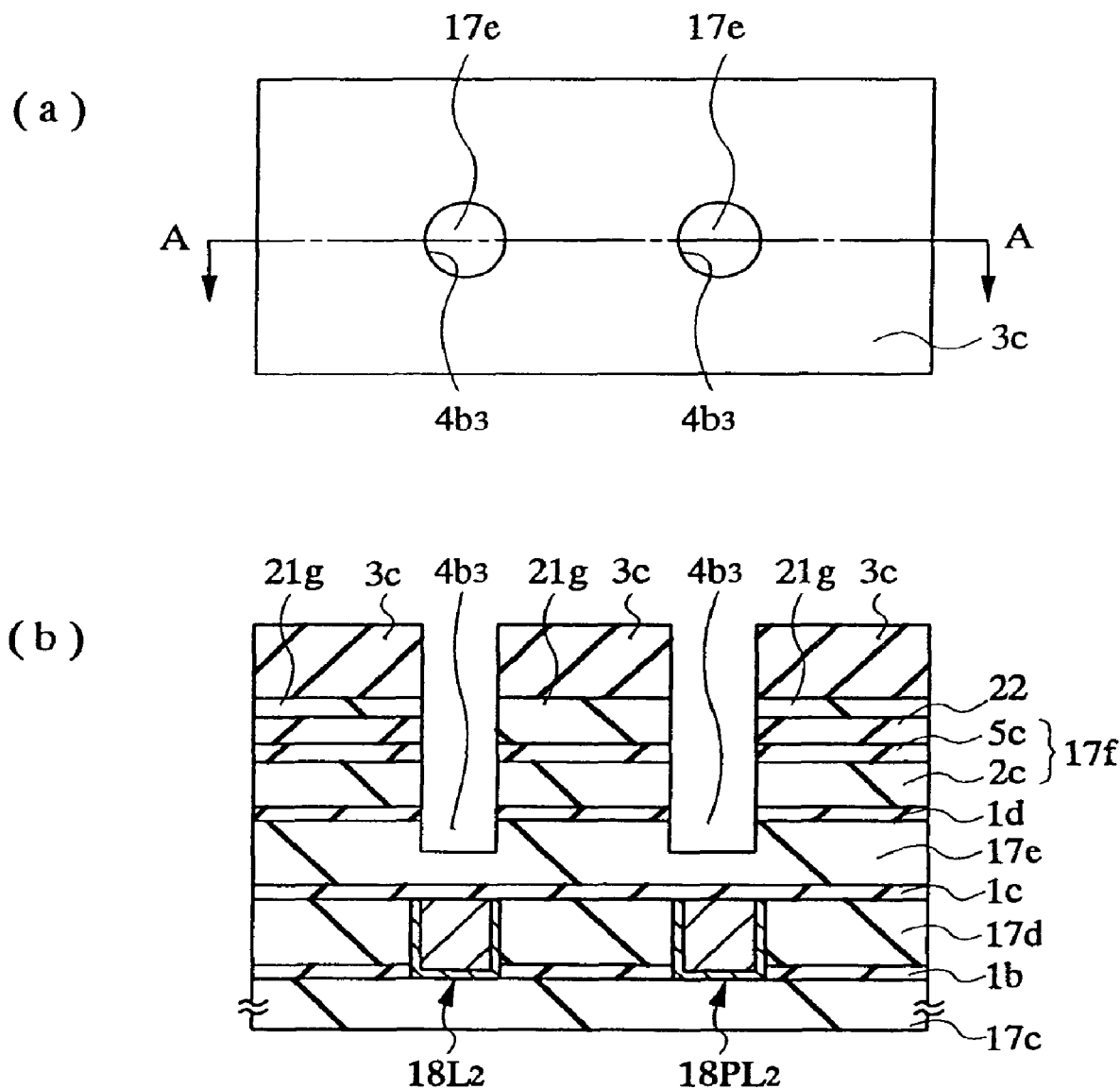
FIG. 48(a) is a plan view and FIG. 48(b) is a fragmentary cross-sectional view taken alone line A-A in FIG. 48(a) illustrating the semiconductor integrated circuit device during a manufacturing step subsequent to that illustrated in FIG. 47(b)

After the removal of the photoresist film 3*d* by ashing as illustrated in FIG. 46(*b*), an antireflection film 21*g* is applied, as illustrated in FIG. 47(*b*), over the insulating film 22 and inside of the opening portion 23 to the same thickness as that of the antireflection film 21*a*. Over the antireflection film 21*g*, the photoresist film 3*c* is formed, as seen in FIG. 47(*a*), followed by successive removal, using the photoresist film 3*c* as an etching mask, of the antireflection film 21*g* exposed therefrom, interlevel dielectric film 17*f*, insulating film 1*d* and interlevel dielectric film 17*e* by plasma dry etching, whereby a through-hole 4*b*3 is formed in the interlevel dielectric film 17*f*, insulating film 1*d* and interlevel dielectric film 17*e*, as illustrated in FIG. 48(*b*). The interlevel dielectric film 17*e* is left on the bottom surface of the through-hole 4*b*3.

The antireflection film 21*g* is etched under similar conditions to those for the antireflection film 21*a*, while the interlevel dielectric film 17*f*, insulating film 1*d* and interlevel dielectric film 17*e* are etched, for example, under the following conditions: use of $CHF_3/O_2/Ar$ as an etching gas, its flow rate of about 5/10/500 sccm, pressure in the etching chamber of about 50 mTorr, high-frequency power of about 2200/1400 W, lower electrode temperature of about −20° C. and use of a parallel-plate narrow-electrode type RIE apparatus as an etching apparatus. According to the etching time, the etching is terminated.

Figure 49:
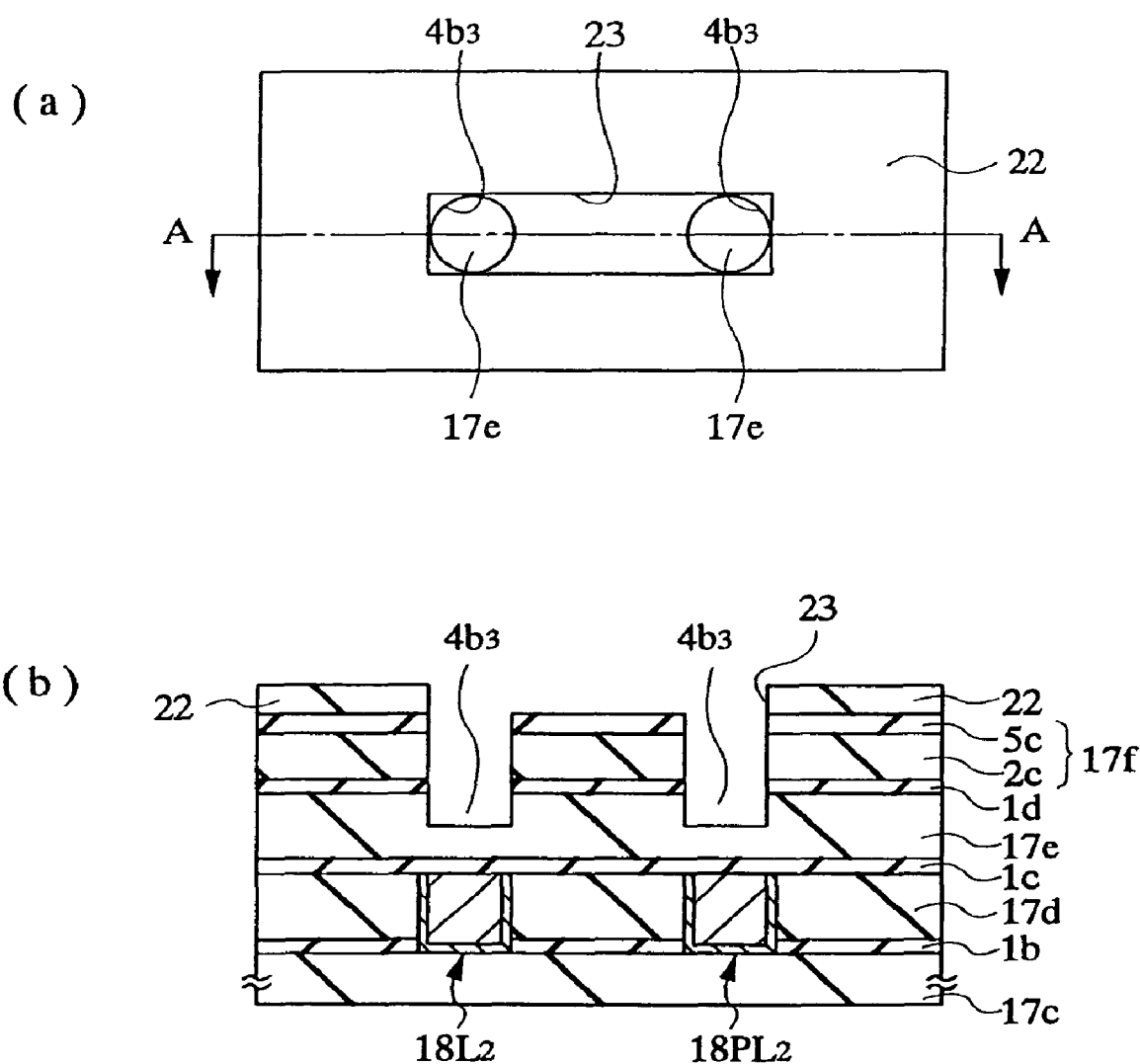
FIG. 49(a) is a plan view and FIG. 49(b) is a fragmentary cross-sectional view taken alone line A-A in FIG. 49(a) illustrating the semiconductor integrated circuit device during a manufacturing step subsequent to that illustrated in FIG. 48(b)
Figure 50:
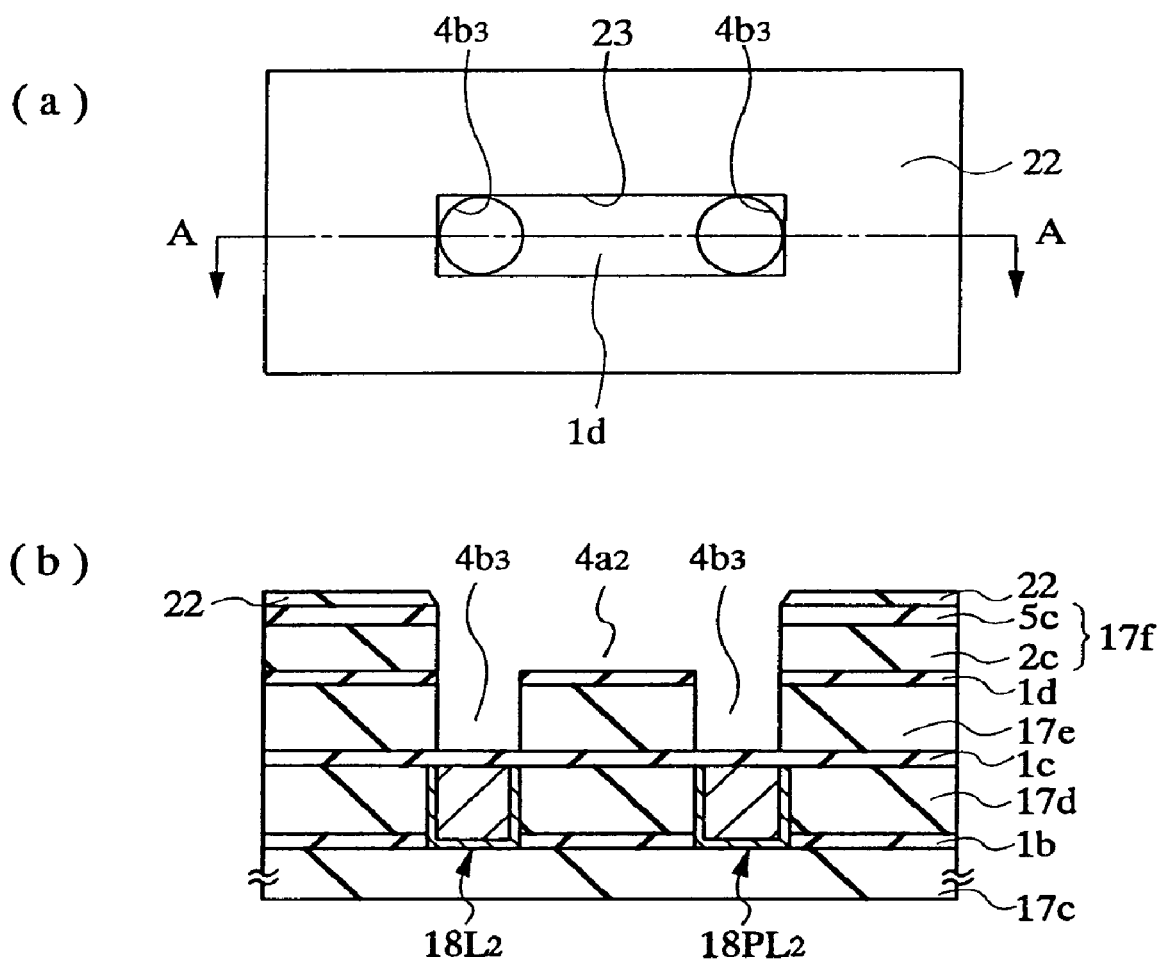
FIG. 50(a) is a plan view and FIG. 50(b) is a fragmentary cross-sectional view taken alone line A-A in FIG. 50(a) illustrating the semiconductor integrated circuit device during a manufacturing step subsequent to that illustrated in FIG. 49(b)

After removal of the photoresist film 3*c* and antireflection film 21*f* by ashing, as illustrated in FIG. 49(*b*), the interlevel dielectric film 17*f* exposed from the bottom surfaces of the opening portion 23 and the interlevel dielectric film 17*e* exposed from the through-hole 4*b*3 are each removed by plasma dry etching, as illustrated in FIG. 50(*b*), using the remaining insulating film 22 as an etching mask and the insulating films 1*c*, 1*d* as an etching stopper, whereby the trench 4*a*2 and through-hole 4*b*3 are formed. The upper surface of the insulating film 1*d* is exposed from the bottom surface of this trench 4*a*2, as seen in FIG. 50(*a*), while the upper surface of the insulating film 1*c* is exposed from the bottom surface of the through-hole 4*b*3. To this etching, the technical concept of the present invention is applied and it is conducted under the conditions similar to those for the interlevel dielectric film 17*c*.

The insulating films 1*c*, 1*d*, 22 are then removed by plasma dry etching. Upon this etching, a silicon nitride film is selectively removed under conditions similar to those for the insulating film 1*a*. In this manner, a structure similar to that of FIG. 34(*b*) in Embodiment 1 is formed. Manufacturing steps subsequent thereto are similar to those described with reference to FIGS. 35(*b*) and 36(*b*) of Embodiment 1 so that their description is omitted.

In this Embodiment 3, an effect similar to the effect obtained in the Embodiment 1 can be obtained.

Embodiment 4

In this Embodiment 4, a modified example of Embodiment 1 will be described, and, more specifically, application of the technical concept of the present invention to a dual damascene process wherein an inlaid interconnect is formed without disposing, as an intermediate layer of an interlevel dielectric film, an insulating film which is made of a silicon nitride film and which functions as an etching stopper will be described. The manufacturing process of the semiconductor integrated circuit device according to Embodiment 4 will be described based on FIGS. 51(*a*) to 59(*b*), which show the semiconductor integrated circuit device during successive manufacturing steps.

Figure 51:
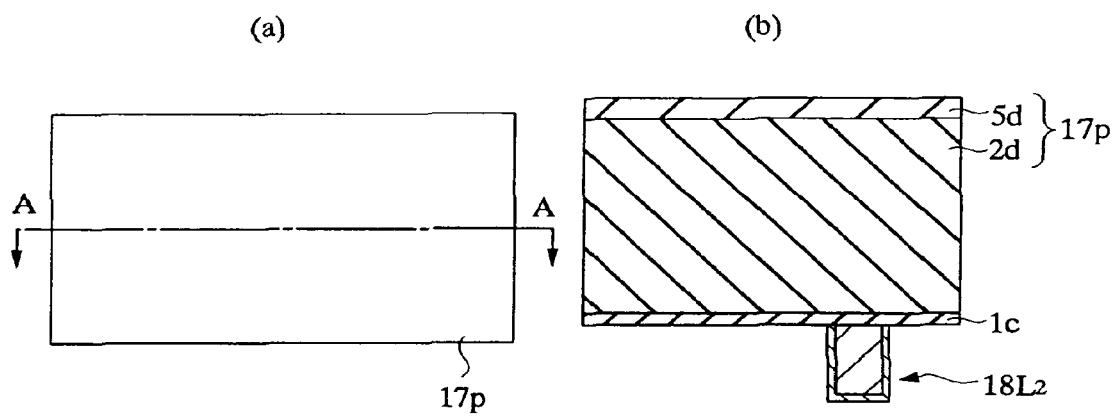
FIG. 51(a) is a plan view and FIG. 51(b) is a fragmentary cross-sectional view taken along line A-A in FIG. 51(a) illustrating the semiconductor integrated circuit device of FIG. 14 during a manufacturing step according to a still further embodiment of the present invention.

As illustrated in FIG. 51(*a*) and FIG. 51(*b*), an interlevel dielectric film 17*p* is deposited over the insulating film 1*c*. The interlevel dielectric film 17*p* is formed by successively depositing an organic insulating film 2*d* and an insulating film 5*d*. The organic insulating film 2*d* is formed from the same material and by the same method as those employed for the organic insulating films 2*a* to 2*c*, but is thicker than them and is, for example, about 650 nm to 800 nm. The insulating film 5*d* is similar in materials thickness, manufacturing process and function to the insulating films 5*a* to 5*c*.

Figure 52:
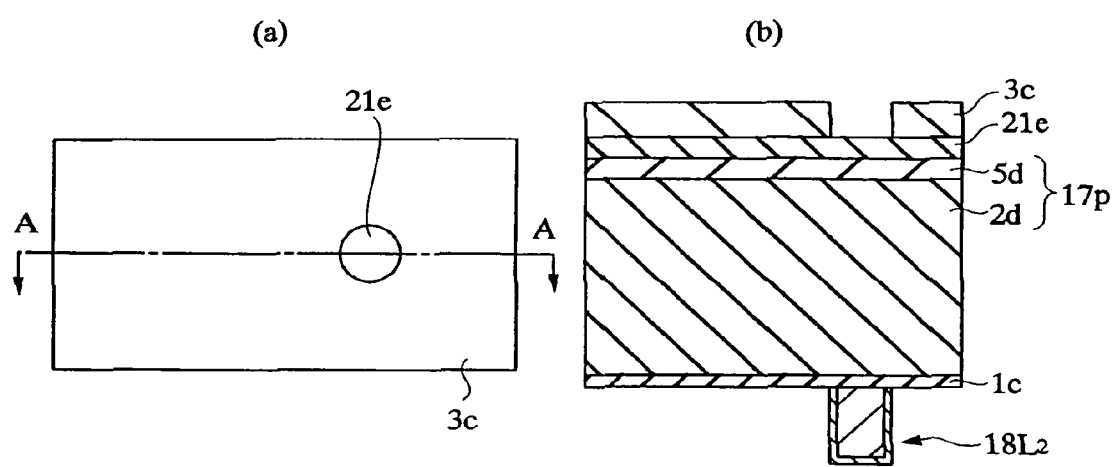
FIG. 52(a) is a plan view and FIG. 52(b) is a fragmentary cross-sectional view taken alone line A-A in FIG. 52(a) illustrating the semiconductor integrated circuit device during a manufacturing step subsequent to that illustrated in FIG. 51(b)
Figure 53:
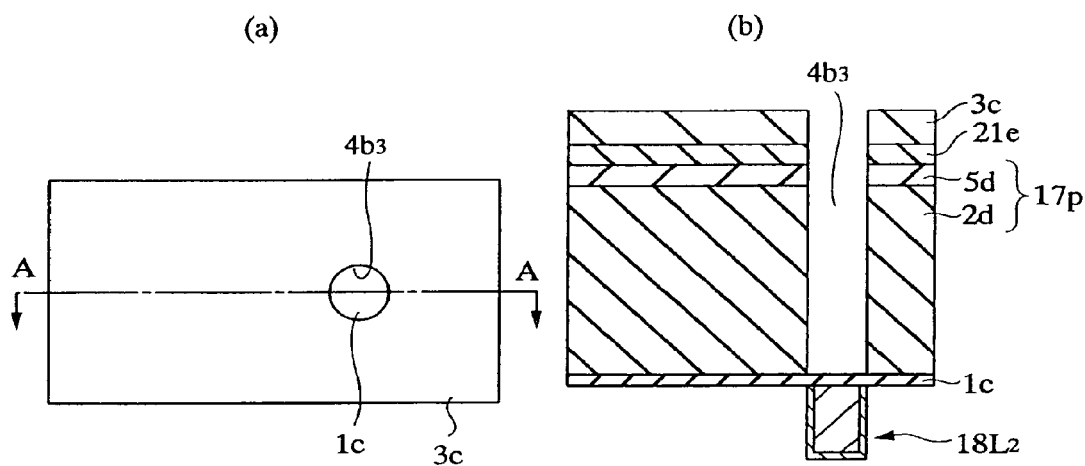
FIG. 53(a) is a plan view and FIG. 53(b) is a fragmentary cross-sectional view taken alone line A-A in FIG. 53(a) illustrating the semiconductor integrated circuit device during a manufacturing step subsequent to that illustrated in FIG. 52(b)

After application, as illustrated in FIG. 52(*b*), of the antireflection film 21*e* over the interlevel dielectric film 17*p*, as illustrated in FIG. 51(*b*), the photoresist film (masking layer) 3*c* is formed. With this photoresist film 3*c* as an etching mask, the antireflection film 21*e* exposed therefrom and the interlevel dielectric film 17*p* are removed by plasma dry etching, whereby a through-hole 4*b*3 is formed in the interlevel dielectric film 17*p*, as illustrated in FIG. 53(*b*). From the bottom surface of the through-hole 4*b*3, the insulating film 1*c* is exposed. This antireflection film 21*e* is etched under similar conditions to those of the antireflection film 21*a*. The etching of the interlevel dielectric film 17*p* is carried out on basis of the technical concept of the present invention by using the insulating film 1*c* as an etching stopper under conditions similar to those for the interlevel dielectric film 17*c*.

Figure 54:
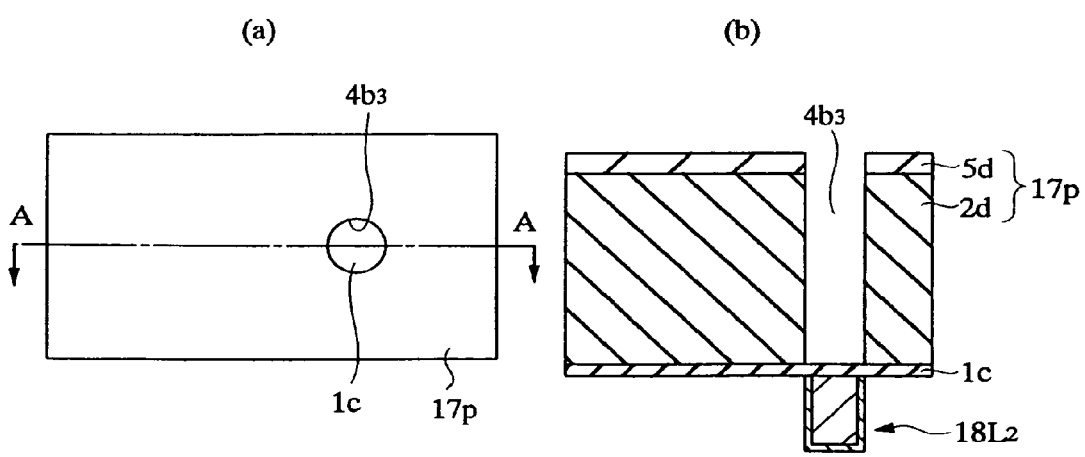
FIG. 54(a) is a plan view and FIG. 54(b) is a fragmentary cross-sectional view taken alone line A-A in FIG. 54(a) illustrating the semiconductor integrated circuit device during a manufacturing step subsequent to that illustrated in FIG. 53(b)
Figure 55:
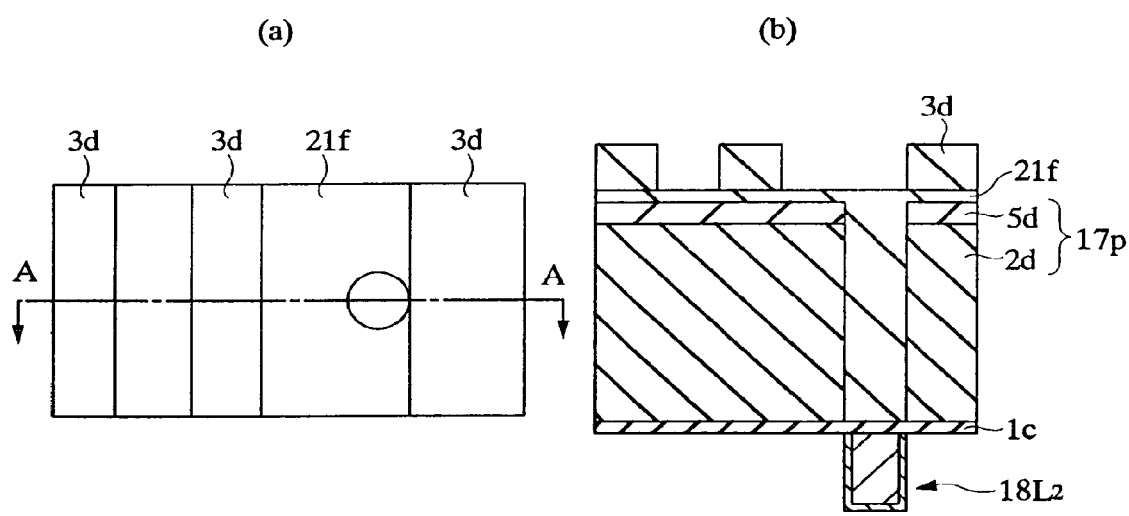
FIG. 55(a) is a plan view and FIG. 55(b) is a fragmentary cross-sectional view taken alone line A-A in FIG. 55(a) illustrating the semiconductor integrated circuit device during a manufacturing step subsequent to that illustrated in FIG. 54(b)
Figure 56:
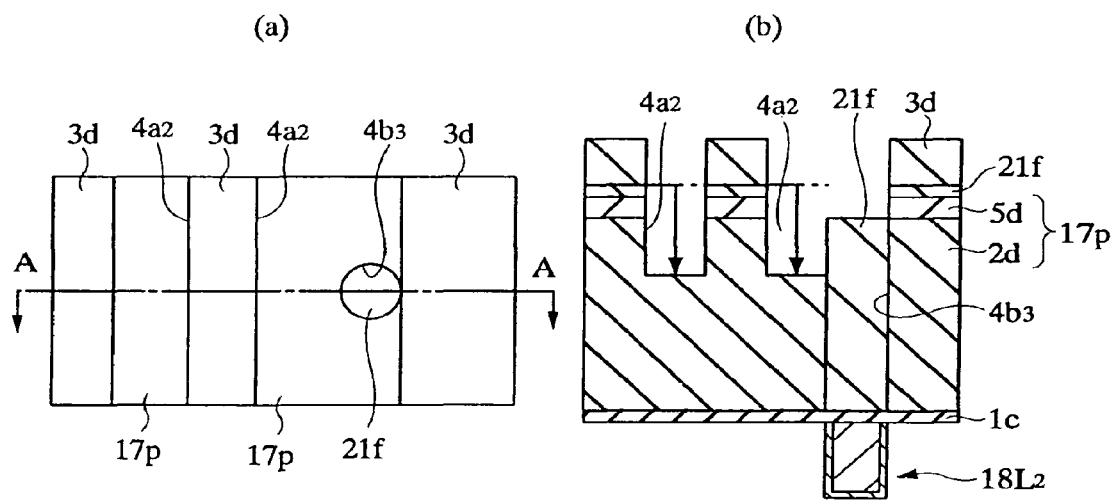
FIG. 56(a) is a plan view and FIG. 56(b) is a fragmentary cross-sectional view taken alone line A-A in FIG. 56(a) illustrating the semiconductor integrated circuit device during a manufacturing step subsequent to that illustrated in FIG. 55(b)

After removal of the photoresist film 3*c*, by ashing as illustrated in FIG. 54(*b*), an antireflection film 21*f* is applied over the interlevel dielectric film 17*p* and inside of the through-hole 4*b*3, as illustrated in FIG. 55(*b*). Over the antireflection film 21*f*, the photoresist film 3*d* is formed, followed by removal, using the photoresist film 3*d* as an etching mask, of the antireflection film 21*f* exposed therefrom and the interlevel dielectric film 17*p* by plasma dry etching, whereby a trench 4*a*2 is formed in the interlevel dielectric film 17*p*, as illustrated in FIG. 56(*b*).

The antireflection film 21*f* is etched, for example, under the following conditions: use of $N_2/O_2$ as an etching gas, a flow rate of about 35/50 sccm, pressure in the etching chamber of about 10 mTorr, high-frequency power of about 500/140 W, lower electrode temperature of about −20° C. and use of a parallel-plate narrow-electrode type RIE apparatus as an etching stopper. After this etching, the antireflection film 21*f* is left in the trench 4*a*2 and through-hole 4*b*3.

The etching conditions of the interlevel dielectric film 17*p* are similar to those for the interlevel dielectric film 17*c*. In this Embodiment 4, however, the end of etching upon etching of the interlevel dielectric film 17*p* depends on the etching time, because an etching stopper layer made of silicon nitride or the like is not disposed at a position of a certain depth of the interlevel dielectric film 17*p*. In short, the depth of the trench 4*a*2 is determined by the etching time.

Figure 57:
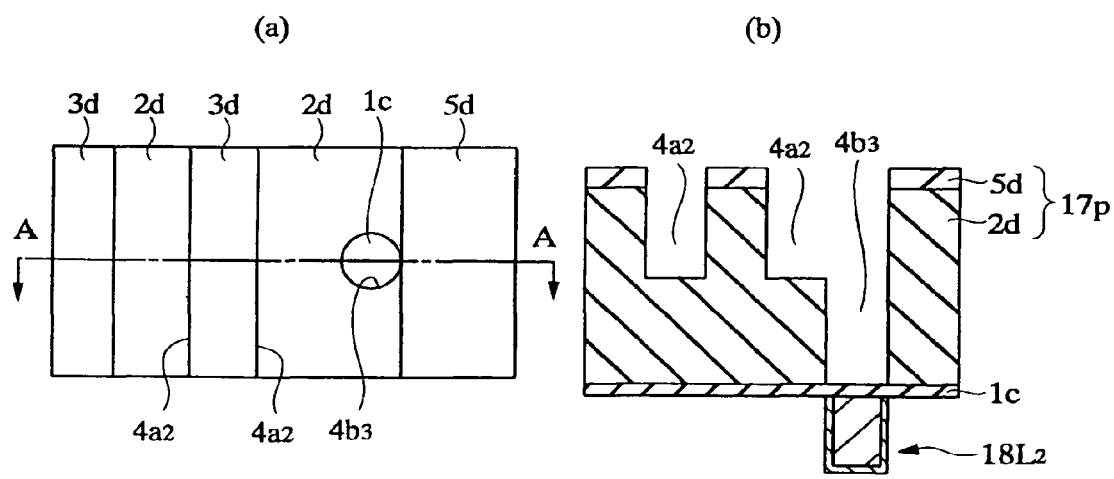
FIG. 57(a) is a plan view and FIG. 57(b) is a fragmentary cross-sectional view taken alone line A-A in FIG. 57(a) illustrating the semiconductor integrated circuit device during a manufacturing step subsequent to that illustrated in FIG. 56(b)
Figure 58:
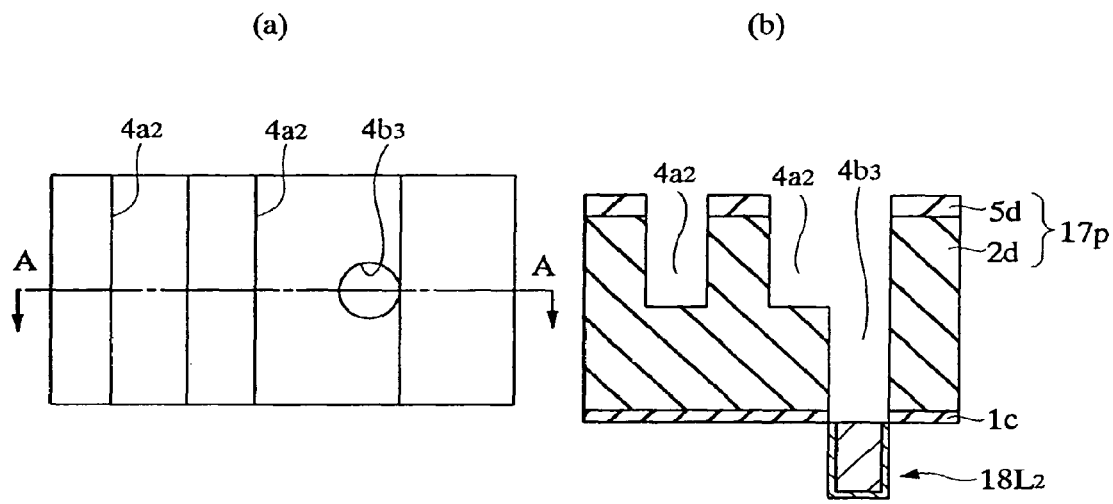
FIG. 58(a) is a plan view and FIG. 58(b) is a fragmentary cross-sectional view taken alone line A-A in FIG. 58(a) illustrating the semiconductor integrated circuit device during a manufacturing step subsequent to that illustrated in FIG. 57(b)
Figure 59:
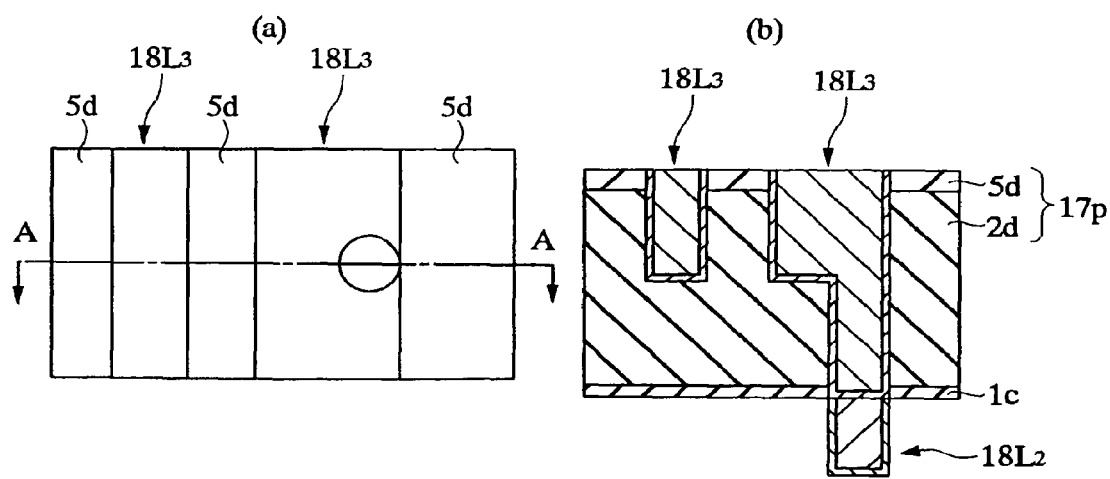
FIG. 59(a) is a plan view and FIG. 59(b) is a fragmentary cross-sectional view taken alone line A-A in FIG. 59(a) illustrating the semiconductor integrated circuit device during a manufacturing step subsequent to that illustrated in FIG. 58(b)
Figure 63:
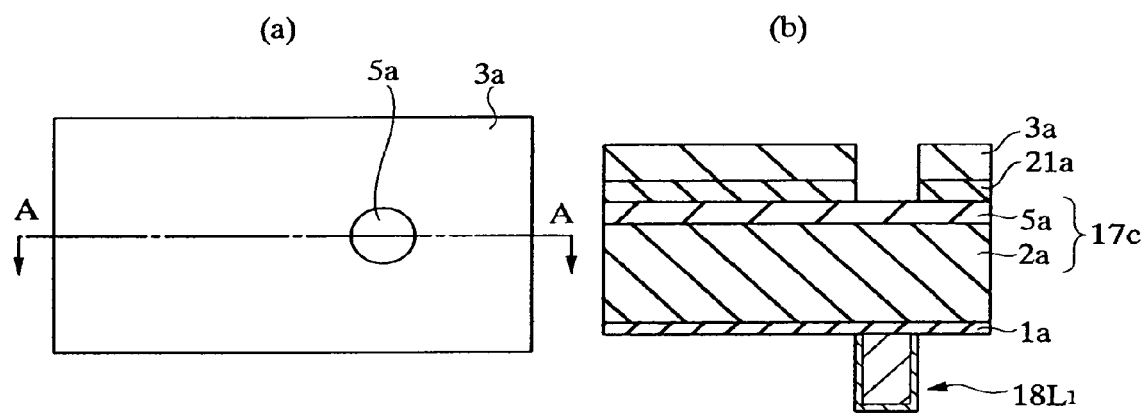
FIG. 63(a) is a plan view and FIG. 63(b) is a fragmentary cross-sectional view taken along line A-A in FIG. 63(a) illustrating the semiconductor integrated circuit device of FIG. 14 during a manufacturing step according to another embodiment of the present invention.
Figure 64:
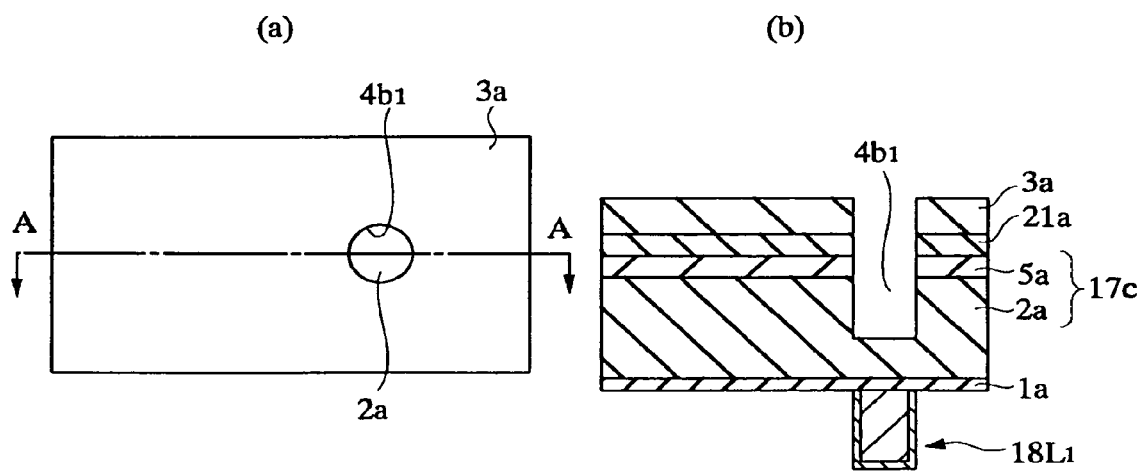
FIG. 64(a) is a plan view and FIG. 64(b) is a fragmentary cross-sectional view taken along line A-A in FIG. 64(a) illustrating the semiconductor integrated circuit device during a manufacturing step subsequent to that illustrated in FIG. 63(b)
Figure 65:
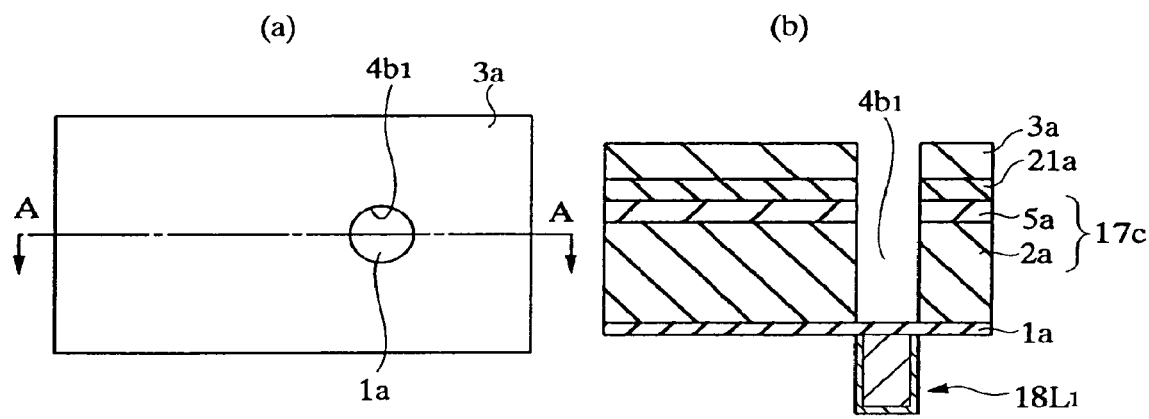
FIG. 65(a) is a plan view and FIG. 65(b) is a fragmentary cross-sectional view taken along line A-A in FIG. 65(a) illustrating the semiconductor integrated circuit device during a manufacturing step subsequent to that illustrated in FIG. 64(a)
Figure 66:
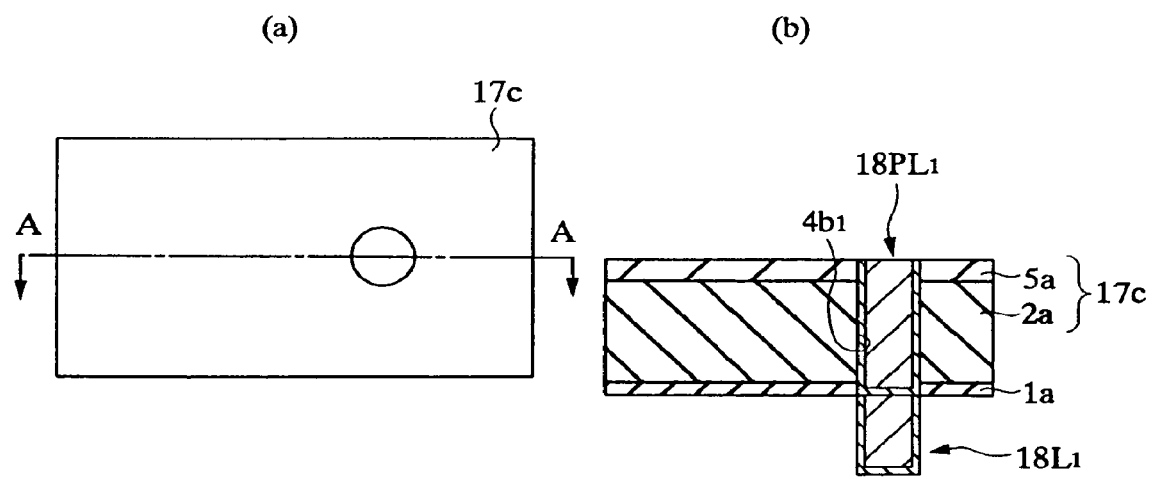
FIG. 66(a) is a plan view and FIG. 66(b) is a fragmentary cross-sectional view taken along line A-A in FIG. 66(a) illustrating the semiconductor integrated circuit device during a manufacturing step subsequent to that illustrated in FIG. 65(b)

After removal of the photoresist film 3*d* and antireflection film 21*f* by ashing, as illustrated in FIG. 57(*b*), the insulating film 1c at the bottom of the through-hole 4b3 is selectively removed, as illustrated in FIG. 58(b) by etching, as described with reference to Embodiments 1 to 3, whereby a portion of the second-layer interconnect 18L2 is exposed from the bottom surface of the through-hole 4b3. A third-layer interconnect 18L3 is then formed, as illustrated in FIG. 59(b), by filling a conductor film inside of the through-hole 4b3 and trench 4a2 as in Embodiments 1 to 3.

According to this Embodiment 4, the following advantage is available in addition to those obtained in Embodiments 1 to 3. More specifically, formation of the interlevel dielectric film 17p without disposing, as an intermediate layer thereof, an insulating film (the above-described insulating film 1d, etc.) made of silicon nitride makes it possible to reduce the total dielectric constant of the interconnects of the semiconductor integrated circuit, leading to a further improvement in the operation velocity of the semiconductor integrated circuit device.

Embodiment 5

In this Embodiment 5, another technical concept of the present invention will be described. According to this Embodiment, an organic insulating film is etched in plural stages under conditions varied during etching, upon formation of an interconnect-forming recess, such as a trench or hole, in the organic insulating film, by subjecting it to plasma etching treatment in a gas atmosphere containing a fluorocarbon gas and an oxygen gas.

The present inventors investigated the relation, upon etching of the organic insulating film to form a recess, such as a trench or hole, among the oxygen amount in an etching gas, a sub-trench and the etching selectivity to the organic insulating film relative to a silicon nitride film. FIG. 60 illustrates the investigation results. In either of the etchings which will be described later, the parallel plate type RIE apparatus described in Embodiment 1 is employed as an etching apparatus, high-frequency power is set at about 3 to 0.2 kW and a semiconductor wafer having a diameter of about 8 inches is used as a semiconductor integrated circuit substrate to be treated.

FIG. 60 includes, on the left side thereof, etching conditions set in preference to the shape of the recess 4 (shape preferential conditions). As an etching gas, a $C_4F_8/O_2/Ar$ gas is employed and its flow rate ranges from about 100 to 5/90 to 0/1000 to 0 sccm. Here, the flow rate Of $C_4F_8$ is set at greater than that of $O_2$. Under the above-described etching conditions, the shape of the recess 4 is good, but the etching selectivity becomes as low as 2 or less.

FIG. 60 includes, on the right side thereof, etching conditions set in preference to an etching selectivity relative to the upper silicon nitride film (selectivity heightening conditions). As an etching gas, a $C_4F_8/O_2/Ar$ gas is employed and its flow rate ranges from about 100 to 5/90 to 0/1000 to 0 sccm. Here, the flow rate Of $C_4F_8$ is set at not greater than that Of $O_2$. Under such etching conditions, a sub-trench 55 is formed on the bottom of the recess 4, but an etching selectivity can be maintained at 5 at the maximum.

Formation of the recess 4 in the organic insulating film 2 under either one of the above-described etching conditions thus involves a problem. In accordance with this technical concept of the present invention, therefore, a recess, such as a trench or hole, is formed in the organic insulating film not by etching in one stage, but by etching in two stages; more specifically, etching is performed to a predetermined depth of the organic insulating film under the shape-preferential-conditions, followed by etching of the remaining portion of the organic insulating film under the above-described selectivity heightening conditions.

Application of this technical concept of the present invention to the above-described single damascene process will next be described with reference to FIG. 61(a) and FIG. 61(b). After formation of a photoresist film 3 over an insulating film 5, the insulating film 5 and organic insulating film 2 are subjected to first etching with the photoresist film 3 as an etching mask, whereby the recess 4, such as a trench or hole, is formed in the insulating film 5 and organic insulating film 2, as illustrated in FIG. 61(a). This first etching is conducted down to the position right above the insulating film 1 made of silicon nitride or the like under shape preferential conditions (ex. the flow rate Of $C_4F_8$ >that Of $O_2$). After this etching, the organic insulating film 2 is left on the bottom surface of the recess 4, and the insulating film 1 is not exposed. The thickness of the organic insulating film 2 left at the bottom of the recess 4 is 30% or less, 20% or less, or preferably 15% or less of the thickness of the organic insulating film 2 before etching.

Then, by the second etching using the photoresist film 3 as an etching mask, the remaining organic insulating film 2 exposed from the photoresist film 3 is removed, whereby the formation of the recess 4 is completed, as illustrated in FIG. 61(b). The second etching is conducted under the above-described selectivity heightening conditions (the flow rate of $C_4F_8°$ that Of $O_2$). Etching can therefore be conducted at a heightened etching selectivity of the organic insulating film relative to a silicon nitride film. A small sub-trench 55 is formed at the bottom of the recess 4, but only a part of the upper portion of the insulating film 1 is etched, and, therefore, such a small sub-trench is within a permissible range. After this treatment, the insulating film 1 is exposed from the bottom surface of the recess 4.

Application of the technical concept of the present invention to a dual damascene process will hereinafter be described with reference to FIGS. 62(a) to 62(c). In FIG. 62(a), insulating films 1A, 1B correspond to the insulating film 1 made of, for example, silicon nitride, while organic insulating films 2A, 2B correspond to the organic insulating film 2. An insulating film 1B is formed between the organic insulating films 2A and 2B and it has a hole-forming opening portion 23 formed therein.

After formation of a photoresist film 3 over the insulating film 5, as illustrated in FIG. 62(a), a first etching is conducted using this photoresist film 3 as an etching mask, whereby a recess 4A, such as a trench or hole, is formed in the insulating film 5 and organic insulating film 2B, as illustrated in FIG. 62(b). The first etching is conducted down to the position right above the insulating film 1B under the above-described shape preferential conditions (ex. the flow rate Of $C_4F_8$>that Of $O_2$). After this etching, the organic insulating film 2B is left on the bottom surface of the recess 4A and the insulating film 1B is not exposed therefrom. The thickness of the organic insulating film 2B left at the bottom of the recess 4A is 30% or less, 20% or less or preferably 15% or less of the thickness of the organic insulating film 2B before etching.

Then, by a second etching using the photoresist film 3 as an etching mask, the remaining organic insulating film 2B exposed from the photoresist film 3 is removed, as illustrated in FIG. 62(c). Etching is not stopped here, but is conducted continuously. Using the insulating film 1B as an etching mask, the organic insulating film 2A exposed therefrom is also removed, whereby both the recesses 4A and 4B are completed. The second etching is conducted under the above-described selectivity heightening conditions (the flow rate Of $C_4F_8°$ that of $O_2$). Etching can therefore be conducted at a heightened etching selectivity relative to a silicon nitride film. A small sub-trench 55 is formed at the outer periphery of the bottom of the recess 4A, but it is within a permissible range. After the treatment, the insulating film 1A is exposed from the bottom surface of the recess 4B.

Application of the technical concept of the present invention to a manufacturing process of a semiconductor integrated circuit device will hereinafter be described based on FIGS. 63(a) to 70(b), which show the semiconductor integrated circuit device of FIG. 14 during successive manufacturing steps.

First, the application of the technical concept of the present invention to a single damascene process will be described. As illustrated in FIG. 63(b), an insulating film 5a, is exposed by removing, using a photoresist film 3a as an etching mask, an antireflection film 21a exposed therefrom by plasma dry etching, in a similar manner to Embodiment 1. The organic insulating film 2a here has a thickness of about 400 nm, while the photoresist film 3a has a thickness of about 0.78 μm.

Using the photoresist film 3a as an etching mask, the insulating film 5a exposed therefrom and the organic insulating film 2a are removed by plasma dry etching using, for example, a $C_4F_8/O_2$/Ar gas, whereby a through-hole 4b1 is formed, as illustrated in FIG. 64(b). This etching is conducted under the above-described shape preferential conditions and etching is terminated at a certain depth of the inorganic insulating film 2a (right above the insulating film 1a) so that no sub-trench is formed on the bottom surface of the through-hole 4b1 after etching. From the bottom surface of the through-hole 4b1 after etching, the organic insulating film 2a is exposed, while the insulating film 1a is not exposed. Specific etching conditions are, for example, as follows: a flow rate of a $C_4F_8/O_2$/Ar gas at about 35/20/400 sccm, pressure in the etching chamber of about 25 mTorr, high-frequency power of about 500/200 W, lower electrode temperature of about −20° C. and use of a parallel-plate narrow-electrode type RIE apparatus as an etching apparatus.

The organic insulating film 2a on the bottom of the through-hole 4b1 is then removed by plasma dry etching using, for example, a $C_4F_8/O_2$/Ar gas, as illustrated in FIG. 65(b). This etching is conducted under the above-described selectivity heightening conditions. Etching is conducted until the upper surface of the insulating film 1a is exposed while using the insulating film 1a as an etching stopper. This etching is conducted, for example, under the following conditions: a flow rate of the $C_4F_8/O_2$/Ar gas at about 13/15/420 sccm, pressure in the etching chamber of about 30 mTorr, high-frequency power of about 2200/1400 W, lower electrode temperature of about −20° C. and use of a parallel-plate narrow-electrode type RIE apparatus as an etching apparatus.

After removal of the photoresist film 3a and antireflection film 21a by ashing as in Embodiment 1, the insulating-film 1a exposed from the bottom surface of the through-hole 4b1 is removed, as illustrated in FIG. 66(b), by plasma dry etching using, for example, $CHF_3/O_2$, whereby a portion of the upper surface of the first-layer interconnect 18L1 is exposed and through-hole 4b1 is completed. By this etching, a silicon nitride film is removed selectively. This etching is conducted, for example, under the following conditions: a flow rate of the $CHF_3/O_2$ gas at about 20/20 sccm, pressure in the etching chamber of about 50 mTorr, high-frequency power of about 1000/200 W, lower electrode temperature of about −1° C. and use of a parallel-plate narrow-electrode type RIE apparatus as an etching apparatus. A conductor film is then filled in the through-hole 4b1 as in Embodiment 1, whereby a connecting portion 18PL1 is formed.

Application of the technical concept of the present invention to a dual damascene process will next be described. FIG. 67(b) illustrates a fragmentary portion of the semiconductor integrated circuit device according to this Embodiment 5 during a manufacturing step subsequent to the steps illustrated in FIGS. 27(b) to 32(b) of Embodiment 1. In this case, the organic insulating film 2c has a thickness of about 300 nm, while the photoresist film 3d has a thickness of about 0.78 μm. Under such a state, the insulating film 5c is exposed as in Embodiment 1, by removing, using the photoresist film 3d as an etching mask, the antireflection film 21d exposed therefrom by plasma dry etching.

A trench 4a2 is then formed, as illustrated in FIG. 68(b), by removing, using the photoresist film 3d as an etching mask, the insulating film 5c exposed therefrom and the organic insulating film 2c by plasma dry etching using, for example, a $C_4F_8/O_2$/Ar gas. This etching is conducted under the above-described shape preferential conditions and the etching is terminated at a certain depth of the organic insulating film 2c (right above the insulating film 1d). No sub-trench is therefore formed on the bottom surface of the trench 4a2 after etching. From the bottom surface of the trench 4a2, the organic insulating film 2c is exposed, but the insulating film 1c is not exposed. Etching conditions are similar to those for the formation of the through-hole 4b1 of FIG. 64(b) in this Embodiment 5.

The organic insulating film 2c at the bottom of the trench 4a2 and the interlevel dielectric film 17e exposed from the insulating film 1d are removed, as illustrated in FIG. 69(b) by plasma dry etching using, for example, a $C_4F_8/O_2$/Ar gas. This etching is conducted under the above-described selectivity heightening conditions. Using the insulating films 1d, 1c as an etching stopper, the etching is conducted until the upper surface of the insulating film 1c is exposed, whereby the trench 4a2 and the through-hole 4b3 extending downward from the bottom surface thereof are formed. The insulating film 1d is left on the bottom surface of the trench 4a2, while the insulating film 1d is left on the bottom surface of the through-hole 4b3. Etching conditions here are similar to those for the formation of the through-hole 4b1 of FIG. 65(b) in this Embodiment 5.

After removal of the photoresist film 3d and the anti-reflection film 21d by ashing as in Embodiment 1, the insulating films 1d, 1c exposed from the bottom surfaces of the trench 4a2 and through-hole 4b3, respectively are removed, as illustrated in FIG. 70(b), by plasma dry etching using, for example, $CHF_3/O_2$, whereby the trench 4a2 and through-hole 4b3 are completed. After etching, a portion of the upper surface of the interlevel dielectric film 17e is exposed from the bottom surface of the trench 4a2, while a portion of the upper surface of the connecting portion 18PL2 is exposed from the bottom surface of the through-hole 4b3. Etching conditions here are similar to those for the insulating film 1a of this Embodiment 5, as described with reference to FIGS. 65(b) and 66(b). A third-layer interconnect 18L3 and connecting portion 18PL3 (refer to FIG. 14, FIG. 36(b) and the like) are formed by filling a conductor film in the trench 4a2 and through-hole 4b3 as in Embodiment 1. Steps subsequent thereto are similar to those of Embodiment 1 so that the description thereof is omitted.

Embodiment 5 as described above brings about the following advantages:

(1) Upon formation of the recess 4, such as a trench or hole, in the organic insulating films 2 and 2a to 2c, it becomes possible to form the recess 4 so as not to form a sub-trench on the bottom surface of the recess 4 or so as not to form a sub-trench having a size exceeding a permissible range even if it is formed.

(2) The advantage as described (1) makes it possible to reduce the percent defective in a metallization layer constituting a semiconductor integrated circuit device, leading to an improvement in the reliability and yield of the semiconductor integrated circuit device.

(3) The advantage as described in (1) makes it possible to form, in the organic insulating films 2 and 2a to 2c, a recess 4, such as a trench or hole, having a high aspect ratio.

(4) The advantage as described in (3) makes it possible to miniaturize each of the interconnects constituting the semiconductor integrated circuit device, thereby heightening the integration degree of the semiconductor integrated circuit device.

(5) Upon forming the recess 4, such as a trench or hole, in the organic insulating films 2 and 2a to 2c, a second etching is conducted under selectivity heightening conditions so that it is possible to conduct etching while maintaining a high etching selectivity relative to the insulating films 1 and 1a to 1k, each made of silicon nitride. Accordingly, an inconvenience, such as etching-through of the insulating films 1 and 1a to 1k, can be suppressed upon formation of the recess 4.

(6) The advantage as described in (5) makes it possible to decrease the thickness of the insulating films 1 and 1a to 1k, thereby reducing the total dielectric contact of the interconnects of the semiconductor integrated circuit device, and, moreover, to improve the operation velocity of the semiconductor integrated circuit device.

The advantages described above in (1) to (6) can be obtained without changing the environment so far employed, for example, the etching apparatus or nature of the gas.

Embodiment 6

In this Embodiment 6, a modified example of Embodiment 5 will be described, and, more specifically, application of the technical concept of the present invention to a dual damascene process different from the dual damascene process of Embodiment 5 will be described.

The manufacturing process of the semiconductor integrated circuit device according to Embodiment 6 will be described with reference FIGS. 71(a) to 78(b), which show the semiconductor integrated circuit device of FIG. 14 during successive manufacturing steps.

FIG. 71(b) illustrates a fragmentary portion of the semiconductor integrated circuit device during a manufacturing step subsequent to the steps illustrated in FIGS. 37(b) and 38(b) in Embodiment 2. The organic insulating film 2c here has a thickness of about 300 nm, while the photoresist film 3c has a thickness of about 0.78 μm. Under such a state, the insulating film 5c is exposed as in Embodiment 2 by removing, using the photoresist film 3c as an etching mask, the antireflection film 2le exposed therefrom by plasma dry etching.

A through-hole 4b3 is then formed, as illustrated in FIG. 72(b), by successively removing, using the photoresist film 3c as an etching mask, the insulating film 5c exposed therefrom, the organic insulating film 2c, the insulating film 1d and the interlevel dielectric film 17e by plasma dry etching treatment using, for example, a $C_4F_8/O_2$/Ar gas. This etching is conducted under the above-described shape preferential conditions and the etching is terminated at a certain depth (right above the insulating film 1c) of the interlevel dielectric film 17e made of an organic insulating film. This etching does not form a sub-trench on the bottom surface of the through-hole 4b3. The interlevel dielectric film 17e is exposed from the bottom surface of the through-hole 4b3 and the insulating film 1c is not exposed. Etching conditions here are similar to those upon formation of the through-hole 41 of FIG. 64(b) in Embodiment 5.

The interlevel dielectric film 17e at the bottom of the through-hole 4b3 is then removed, as illustrated in FIG. 73(b), by plasma dry etching using, for example, a $C_4F_8/O_2$/Ar gas. This etching is conducted under the above-described selectivity heightening conditions and etching is conducted, using the insulating film 1c as an etching stopper, until the upper surface of the insulating film 1c is exposed. Etching conditions here are similar to those for the etching conditions for the formation of the through-hole 4bl of FIG. 65(b) in Embodiment 5.

After removal of the photoresist film 3c and antireflection film 21e by ashing as in Embodiment 2, an antireflection film 21f is applied over the interlevel dielectric film 17f and inside of the through-hole 4b3, as illustrated in FIG. 74(b). After formation of the photoresist film 3d over the antireflection film 21f, removal, using the photoresist film 3d as an etching mask, of the antireflection film 21f exposed therefrom is conducted, as illustrated in FIG. 75(b), under conditions similar to those of Embodiment 2. A trench 4a2 is then formed in the interlevel dielectric film 17f, as illustrated in FIG. 76(b), by removing, using the photoresist film 3d as an etching mask, the interlevel dielectric film 17f exposed therefrom by plasma dry etching. Etching here is conducted under the shape preferential conditions and the etching is terminated at a certain depth (right above the insulating film 1d) of the organic insulating film 2c. No sub-trench is therefore formed on the bottom surface of the trench 4a2 after etching. The organic insulating film 2c is exposed from the a bottom surface of the trench 4a2, but the insulating film 1c is not exposed. In this case, the antireflection film 21f is left inside of the through-hole 4b3. Etching at this time is conducted under the conditions similar to those for the formation of the through-hole 4h1, as illustrated in FIG. 64(b) in Embodiment 5.

The organic insulating film 2c at the bottom of the trench 4a2 is then removed, as illustrated in FIG. 77(b) by plasma dry etching using, for example, a $C_4F_8/O_2$/Ar gas. This etching is conducted under the above-described selectivity heightening conditions. Using the insulating film 1d as an etching stopper, etching is conducted until the exposure of the upper surface of the insulating film 1d, whereby the insulating film 1d is exposed from the bottom surface of the trench 4a2. The antireflection film 21f is left inside of the through-hole 4b3. Etching here is conducted under conditions similar to those for formation of the through-hole 4bl, as illustrated in FIG. 65(b) in Embodiment 5.

After removal of the photoresist film 3d and antireflection film 21f by ashing as in Embodiment 2, the insulating films 1c, 1d exposed from the bottom surfaces of the through-hole 4b3 and trench 4a2, respectively are removed, as illustrated in FIG. 78(b) by plasma dry etching using, for example, a $CHF_3/O_2$ gas, whereby a portion of the upper surface of the first-layer interconnect 18L1 is exposed and the formation of the through-hole 4b3 and trench 4a2 is completed. Etching here is conducted under conditions similar to those for the insulating film 1a, as illustrated in FIGS. 65(b) and 66(b) in Embodiment 5. Steps subsequent thereto are similar to those of Embodiment 1 so that a description thereof is omitted.

Similar advantages to Embodiment 5 are available from this Embodiment 6. Particularly, the through-hole 4b3 having a high aspect ratio can be formed at a highly maintained etching selectivity relative to a silicon nitride film without causing an inconvenience in the cross-sectional shape of the through-hole 4b3 or even if any, within a permissible range.

Embodiment 7

In this Embodiment 7, a modified example of Embodiment 5 will be described, and, more specifically, application of the technical concept of the present invention to a dual damascene process different from that described with reference to Embodiment 5 or 6 will be described.

The manufacturing process of the semiconductor integrated circuit device according to Embodiment 7 will be described with reference to FIGS. 79(a) to 84(b), which show the semiconductor integrated circuit device of FIG. 14 during the manufacturing steps.

FIG. 79(b) illustrates a fragmentary portion of the semiconductor integrated circuit device during the manufacturing step subsequent to the steps illustrated in FIGS. 43(b) and 47(b) in Embodiment 3. The thicknesses of the organic insulating film 2c and photoresist film 3c are similar to those of Embodiment 5 or 6. Under such a state, the insulating film 5c is exposed by removing, using the photoresist film 3c as an etching mask, an antireflection film 21g exposed therefrom by plasma dry etching, as in Embodiment 3.

Using the photoresist film 3c as an etching mask, the insulating film 5c exposed therefrom and organic insulating film 2c are successively removed by plasma dry etching using, for example, a $C_4F_8/O_2/Ar$ gas under shape preferential conditions as in Embodiment 6, whereby a through-hole 4b3 is formed, as illustrated in FIG. 80(b). After etching, the organic insulating film 2c is left on the bottom surface of the through-hole 43b, but the insulating film 1d is not exposed.

The organic insulating film 2c at the bottom of the through-hole 4b3 is then removed, as illustrated in FIG. 81(b), by plasma dry etching using, for example, a $C_4F_8/O_2/Ar$ gas under selectivity heightening conditions set high as in Embodiment 6, whereby the insulating film 1d is exposed from the bottom surface of the through-hole 4b3 after etching.

Using the photoresist film 3c as a mask, the insulating film 1d exposed from the bottom surface of the through-hole 4b3 is then removed, as illustrated in FIG. 82(b), by plasma dry etching using, for example, a $CH_3/O_2$ gas, whereby the upper surface of the interlevel dielectric film 17e is exposed from the bottom surface of the through-hole 4b3. This etching is conducted under conditions similar to those of the insulating film 1a, as described with reference to FIGS. 65(b) and 66(b) in Embodiment 5.

After removal of the photoresist film 3c and antireflection film 21g by ashing, as illustrated in FIG. 83(b), in a similar manner to Embodiment 3, the interlevel dielectric films 17f, 17e exposed from the bottom surface of the opening portion 23 and through-hole 4b3 are removed by plasma dry etching, using the remaining insulating film 22 as an etching mask and the insulating films 1c, 1d as an etching stopper, whereby the trench 4a2 and the through-hole 4b3 extending downward from the bottom surface of the trench are formed, as illustrated in FIG. 84(b). The upper surface of the insulating film 1d is exposed from the bottom surface of the trench 4a2, while the upper surface of the insulating film 1c is exposed from the bottom surface of the through-hole 4b3. Etching is conducted, for example, under the following conditions: use Of $C_4F_8/O_2/Ar$ as an etching gas, a flow rate of about 18/15/420 sccm, pressure in the etching chamber of about 30 mTorr, high-frequency power of about 2200/1400 W, lower electrode temperature of about −2° C. and use of a parallel-plate narrow-electrode type RIE apparatus as an etching apparatus.

Manufacturing steps subsequent thereto are omitted, because they are similar to those illustrated in FIG. 50(b) of Embodiment 3 and FIGS. 35(b) and 36(b) of Embodiment 1.

In addition to the advantages obtained in Embodiment 5, the following advantage is available in this Embodiment 7. More specifically, an etching stopper made of a silicon nitride film is disposed in the interlevel dielectric film upon processing of the through-hole 4b3, which makes it possible to improve the processing accuracy (accuracy of depth) of the through-hole 4b3.

Embodiment 8

In this Embodiment 8, a modified example of Embodiment 5 will be described, and, more specifically, application of the technical concept of the present invention to a dual damascene process different from that described in each of Embodiments 5 to 7 will be described.

The manufacturing process of the semiconductor integrated circuit device according to Embodiment 8 will be described with reference to FIGS. 85(b) to 90(b), which show the semiconductor integrated circuit device of FIG. 14 during successive manufacturing steps.

FIG. 85(b) illustrates a fragmentary portion of the semiconductor integrated circuit device during the manufacturing step subsequent to the steps described with reference to FIGS. 51(b) and 52(b) in Embodiment 4. Here, the thickness of the organic insulating film 2d is about 800 nm, while that of the photoresist film 3c is similar to that of each of Embodiments 5 to 7. Under such a state, the insulating film 5d is exposed, as in Embodiment 4, by removing, using the photoresist film 3 as an etching mask, the antireflection film 2le exposed therefrom by plasma dry etching.

A through-hole 4b3 is then formed, as illustrated in FIG. 86(b), by successively removing, using the photoresist film 3 as an etching mask, the insulating film 5d exposed therefrom and the organic insulating film 2d by plasma dry etching using, for example, a $C_4F_8/O_2/Ar$ gas and under the shape preferential conditions set similar to Embodiment 6 or 7. On the bottom surface of the through-hole 4b3, after etching, the organic insulating film 2c is left so that the insulating film 1c is not exposed.

The organic insulating film 2d at the bottom of the through-hole 4b3 is removed, as illustrated in FIG. 87(b), by plasma dry etching using, for example, a $C_4F_8/O_2/Ar$ gas under selectivity heightening conditions set high similar to those of Embodiment 6 or 7, whereby the insulating film 1c is exposed from the bottom surface of the through-hole 4b3 after etching.

After removal of the photoresist film 3c and antireflection film 2le by ashing as in Embodiment 4, an antireflection film 21f is applied over the interlevel dielectric film 17p and inside of the through-hole 4b3, as illustrated in FIG. 88(b). The photoresist film 3d is then formed over the antireflection film 21f, followed by removal, using the photoresist film 3d as an etching mask, of the antireflection film 21f exposed therefrom, for example, under conditions similar to those of Embodiment 4.

A trench 4a2 is then formed in the interlevel dielectric film 17p, as illustrated in FIG. 89(b), by removing, using the photoresist film 3d as an etching mask, the insulating film 5d exposed therefrom and the organic insulating film 2d by plasma dry etching under the shape preferential conditions set similar to those of Embodiment 6 or 7. Upon this etching, the depth of the trench 4a2 is controlled by the etching time. The organic insulating film 2d is exposed from the bottom surface of the trench 4a2, and the insulating film 1c is not exposed therefrom. In this case, the antireflection film 21f is left inside of the through-hole 4b3.

The photoresist film 3d and antireflection film 21f are removed by ashing, as illustrated in FIG. 90(b). In this manner, the trench 4a2 and the through-hole 4b3 extending downward from the bottom surface of the trench 4a2 are formed in the interlevel dielectric film 17p. Manufacturing steps subsequent thereto are similar to those illustrated in FIG. 58(b) or 59(b) of Embodiment 4, so that they are omitted.

According to this Embodiment 8, the following advantage is available in addition to those described for Embodiment 5 or 6. More specifically, a total dielectric constant of the interconnects of the semiconductor integrated circuit device can be reduced by not disposing an insulating film (insulating film 1d or the like) made of a silicon nitride film as an intermediate layer of the interlevel dielectric film 17p, which makes it possible to improve the operation velocity of the semiconductor integrated circuit device further. (Embodiment 9)

In Embodiment 9, another technical concept of the present invention is employed, and according to this Embodiment, the etching shape (the shape of the recess) of the organic insulating film is controlled by setting a flow rate ratio of oxygen to CF gas in an etching gas at a proper value.

FIG. 91(a) illustrates the relation between a flow rate ratio of oxygen to CF gas (ex. $C_4F_8$) in an etching gas used for the removal of an organic insulating film made of, for example, an organic SOG film and a silicon nitride film by etching by using a parallel-plate narrow-electrode type RIE apparatus and an etching rate of each film. This etching is conducted under the following conditions: use of $C_4F_8/O_2/Ar$ as an etching gas, the flow rate of about 8 to 43/15/40 sccm, pressure in the etching chamber of about 4.0 Pa, and high-frequency power density of about 4.5 W/cm². The etching rate of the organic insulating film shows the maximum value when an oxygen:$C_4F_8$ ratio in an etching gas is around 1.

FIG. 91(b) schematically illustrates the observation results of the shape of the organic insulating film when etched with a trench pattern (recess 4) under the above-described etching conditions. At an oxygen:$C_4F_8$ ratio in an etching gas permitting the maximum etching rate, an abnormal shape called a sub-trench appears, and, with an increase in the ratio of oxygen, the sub-trench becomes deeper. FIG. 91(c) illustrates such a state as a ratio of the depth of the sub-trench to the etching depth. It can be appreciated from FIG. 91(c) that by changing the ratio of oxygen to $C_4F_8$ in an etching gas, the etching shape of the organic insulating film can be controlled.

In the first place, when the oxygen ratio in an etching gas falls within a range from 0.3 to 0.5, the recess 4 of the organic insulating film is able to have a rectangular cross-section. This ratio corresponds to a ratio of oxygen to carbon ranging from 0.15 to 0.25. In the second place, the recess 4 inevitably has, at the side surfaces thereof, a taper angle, as illustrated in FIG. 91(b), when the oxygen ratio in an etching gas ranges from 0 to 0.5 so that the recess has wedge shape after etching, which depends on the width and depth of the pattern to be etched. Such an etching gas does not form a sub-trench (abnormal shape) so that it can be used for the etching of the organic insulating film, if the width and depth of the pattern to be etched are taken into consideration. This ratio corresponds to a ratio of oxygen to carbon ranging from 0 to 0.25. In the third place, within a range of the oxygen ratio in an etching gas which is not less than 0.3, but not greater than 0.7, the side surface of the recess is free from a taper angle, but a sub-trench having a depth of 0.3 or less relative to the etching depth is formed. Since this sub-trench is not so deep, the recess can be used as an interconnect forming trench. This ratio corresponds to a ratio of oxygen to carbon ranging from 0.15 to 0.35.

As is apparent from FIG. 91(a), etching can be terminated on the silicon nitride film, because an etching selectivity to an organic insulating film relative to a silicon nitride film which is used as an etching stopper or as a suppressor film of copper diffusion, when copper is employed as an interconnect material, in a metallization structure formed by a damascene process—is about 3 when the flow rate ratio of oxygen to CF gas (ex. $C_4F_8$) in an etching gas ranges from 0 to 0.7.

Such an effect is also available in the above-described hole pattern, such as a through-hole or contact hole. The above-described etching is conducted under the conditions of a high-frequency power density of 4.5 W/cm², but a similar advantage is available within its range of 6 W/cm² or less. The etching conditions are not limited to those stated above, but a similar advantage can be obtained when the high-frequency power density falls within the above-described range and the flow rate ratio of oxygen to CF gas falls within a range from 0 to 0.7, in other words, a ratio of oxygen to carbon falls within a range from 0 to 0.35.

Embodiment 10

In Embodiment 10, a modified example of Embodiment 9 is described and the range of a high-frequency power density is set narrower than that of Embodiment 9.

FIG. 92(a) illustrates the relation between a flow rate ratio of oxygen to CF gas (ex. $C_4F_8$) in an etching gas and an etching rate of the above-described organic insulating film and silicon nitride film when the range of a high-frequency power density of a parallel-plate narrow-electrode type RIE apparatus is set narrower than that of Embodiment 9. This etching is conducted under the following conditions: use of a $C_4F_8/O_2/Ar$ gas as an etching gas, a flow rate of about 25/0 to 50/400 sccm, pressure in the etching chamber of about 4.0 Pa, and high-frequency power density of about 0.6 W/cm². Also in this case, the etching rate of the organic insulating film shows the maximum value when a ratio of oxygen to $C_4F_8$ in an etching gas is around 1.

FIG. 92(b) schematically illustrates the observation results of the shape of an organic insulating film when etched through a trench pattern (recess 4) under the above-described etching conditions. At a ratio of oxygen to $C_4F_8$ in an etching gas, which increases the etching rate to the maximum value, a sub-trench (abnormal shape) is formed, and the greater the oxygen ratio, the deeper the sub-trench. FIG. 92(c) illustrates such a state as a ratio of the depth of a sub-trench to an etching depth. In this case, it can also be appreciated that the etching shape of the organic insulating film can be controlled by changing the ratio of oxygen to $C_4F_8$ in an etching gas.

In the first place, the cross-section of the recess 4 in the organic insulating film can be formed into a rectangular shape when the oxygen ratio in an etching gas falls within a range from 0.3 to 0.5. This range corresponds to a range from 0.15 to 0.25 in terms of a ratio of oxygen to carbon. In the next place, since the side surface of the recess 4 inevitably has a taper angle, as illustrated in FIG. 92(b), when the oxygen ratio in an etching gas ranges from 0 to 0.5, the recess has a wedge shape, though depending on the width and depth of the etching pattern. If the width or depth of the etching pattern is taken into consideration, such a gas can be used for the etching of an organic insulating film, because no sub-trench (abnormal shape) appears. The above-described range corresponds to a range of from 0 to 0.25 in terms of a ratio of oxygen to carbon. In the third place, when a ratio of oxygen in an etching gas ranges from 0.3 to 0.9, the recess is free from a taper angle, but a sub-trench not greater than 0.3 relative to the etching depth appears, as illustrated in FIG. 91(b). Since this sub-trench is not so deep, such a recess can be used as an interconnect forming a trench or hole. This range corresponds to a range from 0.15 to 0.45 in terms of a ratio of oxygen to carbon. In the fourth place, when the ratio of oxygen in an etching gas ranges from 0 to 0.9, the recess has a taper angle and a sub-trench having a depth not greater than 0.3 relative to the etching depth appears. Since this sub-trench is not so deep, such a recess can be used as an interconnect forming trench or hole if the width and depth of the etching pattern is taken in consideration. This range corresponds to a range from 0 to 0.45 in terms of the ratio of oxygen to carbon.

Also in this Embodiment 10, etching can be terminated on the silicon nitride film, because an etching selectivity to an organic insulating film relative to a silicon nitride film—which is used as an etching stopper or as a suppressor film of copper diffusion when copper is employed as an interconnect material, in a metallization structure by a damascene process—is about 3, as is apparent from FIG. 92(a) when the flow rate ratio of oxygen to CF gas (ex. $C_4F_8$) in an etching gas ranges from 0 to 0.9 (a range from 0 to 0.45 in terms of a ratio of oxygen to carbon).

A similar advantage is available in the above-described hole pattern, such as a through-hole or contact hole. The above-described etching is conducted at a high-frequency power density of 0.6 W/cm$^2$, but a similar advantage is available at a high-frequency power density ranging from 0.3 W/cm$^2$ to 3 W/cm$^2$. The above-described etching conditions are one example and a similar advantage is available under conditions varied in an absolute flow rate of each Of $C_4F_8$ and oxygen if a high-frequency power density falls within the above-described range and a flow rate of oxygen to CF ranges from 0 to 0.9, that is, a ratio of oxygen to carbon ranges from 0 to 0.45.

Embodiment 11

Application of the invention described in Embodiment 9 or 10 to the metallization process of a semiconductor device will be described in this Embodiment 11. This Embodiment 11 is similar to Embodiment 1 (single damascene process) except for the etching conditions so that points different from Embodiment 1 will be selectively described hereinafter.

Etching conditions for the formation of the through-hole 4bl of FIG. 17(b) and the interconnect-forming trench 4a1 of FIG. 23(b) are as follows: use of a parallel-plate narrow-electrode type RIE apparatus as an etching apparatus as in Embodiment 1, pressure in the etching chamber of about 4.0 Pa, use Of $C_4F_8/O_2$/Ar as an etching gas, its flow rate of about 25/10/400 sccm and high-frequency power density of about 0.6 W/cm$^2$.

The etching conditions of the organic insulating film are not limited to the above-described ones, but can be changed within a range as described above for Embodiment 9 or 10.

In this Embodiment 11, similar advantages to Embodiment 5 are available.

Embodiment 12

In this Embodiment 12, application of the invention described for Embodiment 9 or 10 to a metallization process (dual damascene process) of a semiconductor integrated circuit device will be described. FIGS. 93(a) to 96(b) show the semiconductor integrated circuit device of FIG. 14 during successive manufacturing steps.

FIG. 93(b) illustrates a fragmentary portion of the semiconductor integrated circuit device during the manufacturing step of Embodiment 12 after the steps described with reference to FIGS. 27(b) and 32(b) in Embodiment 1. The insulating film 5c is exposed, as in Embodiment 1, by etching away, using the photoresist film 3d as an etching mask, the antireflection film 21d exposed therefrom. Then, as illustrated in FIG. 94(b), a trench 4a2 is formed by successively removing, using the photoresist film 3d as an etching mask, the insulating film 5c exposed therefrom and the organic insulating film 2c by plasma dry etching until the upper surface of the insulating film 1d is exposed. This etching is conducted under the following conditions: use of a parallel-plate narrow-electrode type RIE apparatus as an etching apparatus, pressure in the etching chamber of about 4.0 Pa, use Of $C_4F_8/O_2$/Ar as an etching gas, its flow rate of about 43/15/400 sccm, and high-frequency power density of about 4.0 W/cm$^2$. No sub-trench is formed on the bottom surface of the trench 4a2 after this etching. Even if any is found, it is small and within a permissible range. The insulating film 1d can be made to function as an etching stopper.

A through-hole 4b3 extending downward from the bottom of the trench 4a2 is then formed by successively removing, using the photoresist film 3d as an etching mask and the insulating films 1d, 1c as an etching stopper, the organic insulating film 2c exposed from the insulating film 1d and the interlevel dielectric film 17e exposed from the through-hole 4b3, as illustrated in FIG. 95(b), by plasma dry etching. This etching is conducted under the following conditions: use of a parallel-plate narrow-electrode type RIE apparatus as an etching apparatus as in Embodiment 1, pressure in the etching chamber of about 4.0 Pa, use of $C_4F_8/O_2$/Ar as an etching gas, the flow rate of about 25/10/400 sccm, and high-frequency power density of about 0.6 W/cm$^2$. No sub-trench is formed on the bottom surface of each of the trench 4a2 and through-hole 4b3 after this etching, and, even if it is formed, it is very small and within a permissible range. The insulating films 1c, 1d can be used as an etching stopper. When the etching selectivity is set at about 3, however, it is necessary to form, in advance, the interlevel dielectric film 17e made of an organic insulating film to have a thickness of 3 times or less of the insulating film 1d serving as an etching stopper. If this requirement is not satisfied, the insulating film 1d will disappear upon formation of the through-hole 4b3 in the interlevel dielectric film 17e. After etching, the insulating films 1d, 1c are left on the bottom surface of each of the trench 4a2 and through-hole 4b3.

The formation of the trench 4a2 and through-hole 4b3 is completed by removing the photoresist film 3d and antireflection film 21d by ashing as in Embodiment 1 and then removing the insulating films 1d, 1c exposed respectively from the bottom surfaces of the trench 4a2 and through-hole 4b3 by etching, as illustrated in FIG. 96(b). After this etching, the upper surface of the interlevel dielectric film 17e is exposed from the bottom surface of the trench 4a2, while a portion of the upper surface of the connecting portion 18PL2 is exposed from the bottom surface of the through-hole 4b3. This etching may be conducted under similar conditions to Embodiment 1.

Steps subsequent thereto are omitted, because they are similar to those of Embodiment 1. The etching conditions of the organic insulating film are not limited to the above-described ones, but can be changed variously within a range as described for Embodiment 9 or 10.

Similar advantages to those of Embodiment 5 are available from this Embodiment 12.

Embodiment 13

In this Embodiment 13, application of the features of the invention described in Embodiment 9 or 10 to a metallization process of a semiconductor integrated circuit device will be described and a metallization process using a dual damascene process different from that of Embodiment 12 will be described. Embodiment 13 may be similar to Embodiment 2 (dual damascene process) except for etching conditions so that in this Embodiment 13, points different from Embodiment 2 will be selectively described.

In this Embodiment 13, a through-hole 4b3 of FIG. 39(b) is first formed by successively removing, using the photoresist film 3c as an etching mask, the insulating film 5c exposed therefrom and the organic insulating film 2c by plasma dry etching. This etching is conducted under the following conditions: use of a parallel-plate narrow-electrode type RIE apparatus as an etching apparatus as in Embodiment 1, pressure in the etching chamber of about 4.0 Pa, use Of $C_4F_8/O_2/Ar$ as an etching gas, a flow rate of about 25/10/400 sccm, and high-frequency power density of about 0.6 W/cm$^2$.

Then, the insulating film 1d, such as a silicon nitride film is removed by plasma dry etching using the photoresist film 3c as an etching mask. This etching is conducted, for example, under the following conditions: use of an ordinarily employed RIE apparatus as an etching apparatus, pressure in the etching chamber of about 6.5 Pa, use of $CHF_3/O_2/Ar$ as an etching gas, a flow rate of about 20/20/400 sccm, and high-frequency power density of about 0.6 W/cm$^2$.

Then, the interlevel dielectric film 17e made of an organic insulating material is removed by plasma dry etching using the photoresist film 3c as an etching mask and with the insulating film 1c as an etching stopper, whereby a through-hole 4b3 having, from the bottom surface thereof, the insulating film 1c exposed is formed. This etching is conducted, for example, under the following conditions: use of a parallel-plate narrow-electrode type RIE apparatus as an etching apparatus as in Embodiment 1, pressure in the etching chamber of about 4.0 Pa, use Of $C_4F_8/O_2/Ar$ as an etching gas, a flow rate of about 43/18/400 sccm, and high frequency power density of about 4.5 W/cm$^2$.

In this Embodiment 13, etching conditions for the formation of the trench 4a2 of FIG. 42(b) are as follows: use of a parallel-plate narrow-electrode type RIE apparatus as an etching apparatus as in Embodiment 1, pressure in the etching chamber of about 4.0 Pa, use Of $C_4F_8/O_2/Ar$ as an etching gas, its flow rate of about 4/15/400 sccm, and high-frequency power density of about 4.0 W/cm$^2$.

The conditions for the etching of the above-described organic insulating film are not limited to the above-described ones, but can be changed variously within a range as described in Embodiment 9 or 10.

Similar advantages to those of Embodiment 5 or 6 are available in this Embodiment 13.

Embodiment 14

In this Embodiment 14, application of the features of the invention described for Embodiment 9 or 10 to a metallization process of a semiconductor integrated circuit device will be described and a dual damascene process different from that of Embodiment 12 or 13 will be described. FIGS. 97(a) to 101(b) show the semiconductor integrated circuit device of FIG. 14 during successive manufacturing steps.

FIG. 97(b) illustrates a fragmentary portion of a semiconductor integrated circuit device during the manufacturing step subsequent to the steps as illustrated in FIGS. 43(b) to 47(b) of Embodiment 3. Etching conditions upon formation of the opening portion 23 of the insulating film 22 are similar to those described in Embodiment 3.

After the step as illustrated in FIG. 47(b), a thorough-hole 4b3 is formed, as illustrated in FIG. 98(b), in a similar manner to Embodiment 3 by removing, using the photoresist film 3c as an etching mask, the antireflection film 21g exposed therefrom by plasma dry etching to expose the insulating film 5c, and then successively removing the insulating film 5c and organic insulating film 2c by plasma dry etching using the photoresist film 3c as an etching mask and the insulating film 1d as an etching stopper. This etching is conducted under the following conditions: use of a parallel-plate narrow-electrode type RIE apparatus as an etching apparatus as in Embodiment 1, pressure in the etching chamber of about 4.0 Pa, use Of $C_4F_8/O_2/Ar$ as an etching gas, a flow rate of about 43/15/400 sccm, and high-frequency power density of about 4.0 W/cm$^2$. The insulating film 1d is exposed from the bottom surface of the through-hole 4b3 after etching.

The upper surface of the interlevel dielectric film 17e is then exposed from the bottom surface of the through-hole 4b3 by removing the insulating film 1d, which is exposed from the bottom of the through-hole 4b3, by plasma dry etching using the photoresist film 3c as a mask. This etching is conducted under the following conditions: use of an ordinarily employed RIE apparatus as an etching apparatus, pressure in the etching chamber of about 6.5 Pa, use of $CHF_3/O_2/Ar$ as an etching gas, its flow rate of about 20/20/400 sccm, and high-frequency power density of about 0.6 W/cm$^2$.

After removal of the photoresist film 3c and the antireflection film 21g, as illustrated in FIG. 100(b), by ashing in a similar manner to Embodiment 3, the interlevel dielectric films 17f, 17e exposed from the bottom surfaces of the opening portion 23 and through-hole 4b3, respectively, are removed by plasma dry etching using the remaining insulating film 22 as an etching mask and the insulating films 1c, 1d as an etching stopper. This etching is conducted under similar conditions to those for the formation of the through-hole 4b3, as illustrated, for example, in FIG. 98(b). By this etching, the trench 4a2 and through-hole 4b3 are formed as illustrated in FIG. 101(b). The upper surface of the insulating film 1d is exposed from the bottom surface of the trench 4a2, while the upper surface of the insulating film 1c is exposed from the bottom surface of the through-hole 4b3.

When an etching selectivity to the insulating film 2c made of an organic insulating film relative to the insulating film 22 serving as an etching mask is set at about 3, however, it is necessary to form, in advance, the insulating film 2c to have a thickness 3 times or less of that of the insulating film 22. In addition, it is necessary to form the insulating film 17e to have a thickness 3 times or less of the thickness of the insulating film 22, because the through-hole 4b3 is formed by etching of the insulating film 17e upon formation of the trench 4a2. If these requirements are not satisfied, the insulating film 22 will disappear upon formation of the trench 4a2 and through-hole 4b3.

The thicknesses of the insulating films 2c, 17e are limited also by the thicknesses of the insulating films 1d, 1c. If the insulating film 2c is thicker than the insulating film 17e, the difference in thickness must be 3 times or less of the thickness of the insulating film 1c. If the insulating film 17e is thicker than the insulating film 2c, on the other hand, the difference in thickness must be 3 times or less of the thickness of the insulating film 1d. If these conditions are not satisfied, either one of the insulating film 1d or 1c will disappear upon processing of the trench 4a2 and through-hole 4b3.

The insulating films 1d, 1c exposed from the bottom surfaces of the trench 4a2 and through-hole 4b3 are then removed by etching. This etching is conducted under conditions similar to Embodiment 3.

Manufacturing steps subsequent thereto are similar to those illustrated in FIG. 50(b) of Embodiment 3 and those illustrated in FIGS. 35(b) and 36(b) in Embodiment 1 so that their description will be omitted. The etching conditions of the organic insulating film are not limited to the above-described ones, but can be changed variously within a range described in Embodiment 9 or 10.

The similar advantages to Embodiment 5 or 7 are available by this Embodiment 14.

Embodiment 15

In this Embodiment 15, application of the features of the invention described in Embodiment 9 or 10 to the metallization process of a semiconductor integrated circuit device will be described, and in it, a dual damascene process different from that described in Embodiment 14 will be described. Embodiment 15 is similar to Embodiment 4 (dual damascene process) except for etching conditions so that points different from Embodiment 4 will be selectively described herein.

In this Embodiment 15, etching conditions for the formation of the through-hole 4b3, as illustrated in FIG. 53(b), are as follows: use of a parallel-plate narrow-electrode type RIE apparatus as an etching apparatus as in Embodiment 1, pressure in the etching chamber of about 4.0 Pa, use of $C_4F_8/O_2/Ar$ as an etching gas, a flow rate of about 25/10/400 sccm, and high-frequency power density of about 0.6 W/cm$^2$.

The etching conditions for the formation of the trench 4a2, as illustrated in FIG. 56(b), are as follows: use of a parallel-plate narrow-electrode type RIE apparatus as an etching apparatus as in Embodiment 1, pressure in the etching chamber of about 6.5 Pa, use Of $C_4F_8/O_2/Ar$ as an etching gas, a flow rate of about 45/15/400 sccm, and high-frequency power density of about 4.0 W/cm$^2$.

The etching conditions of the organic insulating film are not limited to the above-described ones, but can be changed variously within a range as described in Embodiment 9 or 10.

Similar advantages to Embodiment 5 or 8 are available by this Embodiment 15.

Embodiment 16

In this Embodiment 16, a further technical concept of the present invention will be described, and this embodiment is characterized by the fact that, upon formation of a recess, such as a trench or hole, in an organic insulating film which constitutes an interlevel dielectric film, an inorganic film used as an etching stopper is formed from an organic insulating film having a larger organic content (carbon content) than the above-mentioned organic insulating film which constitutes an interlevel dielectric film.

During investigation of the features described in Embodiments 1 to 15, the present inventors have found that organic insulating films differ in etching rate depending on their organic content.

Figure 102:
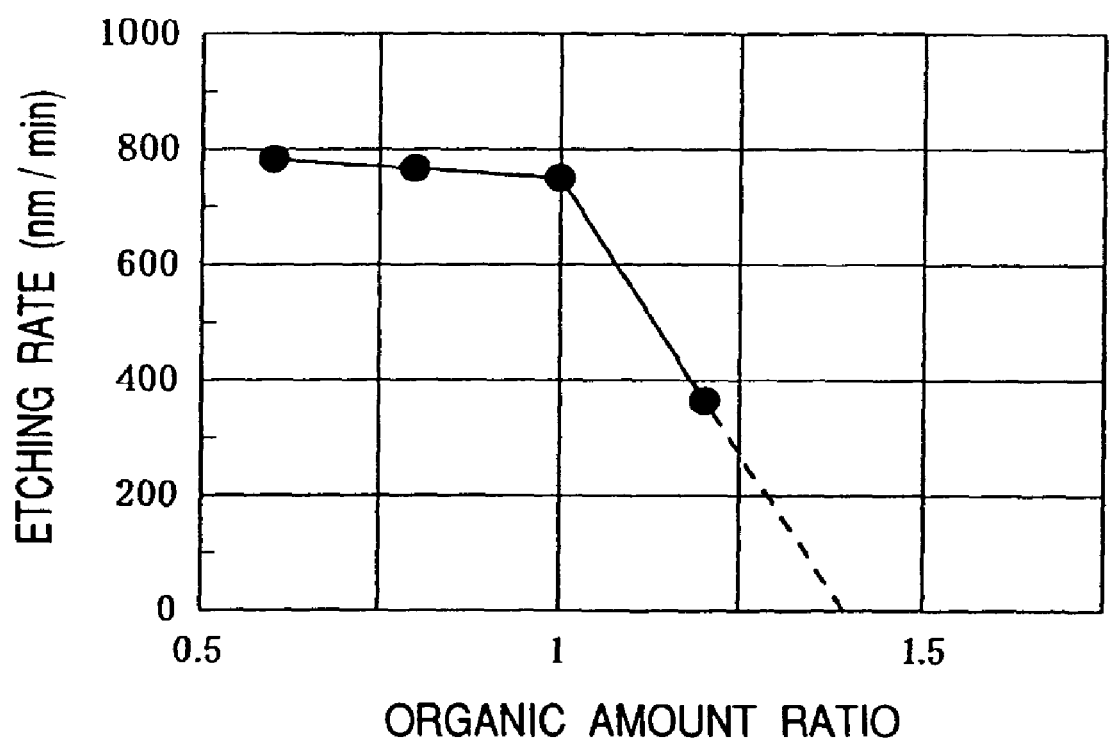
FIG. 102 is a graph illustrating the relation between an organic amount ratio in an organic insulating film and an etching rate.

FIG. 102 illustrates the relation between an organic content ratio and an etching rate, based on the test results made by the present inventors. From FIG. 102, it is appreciated that the etching rate lowers with an increase in the organic content ratio. This etching is conducted, for example, under the following conditions: use of a parallel-plate narrow-electrode type RIE apparatus as an etching apparatus, pressure in the etching chamber of about 30 mTorr, use Of $C_4F_8/O_2/Ar$ as an etching gas, a flow rate of about 13/15/420 sccm, upper/lower electrode of about 2200/1400 W and lower electrode temperature of about −20° C. The organic content ratio can be expressed by the organic content of an organic insulating film having a relatively large organic content/the organic content of an organic insulating film having a relatively small organic content).

In FIGS. 103(a), 103(b) and FIG. 104(b), the etching rate of FIG. 102 is expressed by an etching selectivity to an organic insulating film constituting an interlevel dielectric film. FIG. 103(a) illustrates the measuring results of an etching selectivity to an organic insulating film having a relatively small organic content relative to an organic insulating film having a relatively large organic content, when etching is conducted downwards, after depositing the former organic insulating film over the whole main surface of a semiconductor wafer, and then the latter organic insulating film is deposited over the former organic insulating film. FIG. 103(b) illustrates the measuring results of an etching selectivity to an organic insulating film having a relatively small organic content relative to an organic insulating film having a relatively large organic content when a trench having a plane size of about 1 μm is formed in the latter organic insulating film after the former organic insulating film is deposited over the whole main surface of a semiconductor wafer and then the latter organic insulating film is deposited over the former organic insulating film. The results of both FIGS. 103(a) and 103(b) are illustrated in FIG. 104(a), while examples of the chemical structure of an organic insulating film different in organic content are schematically illustrated in FIG. 104(b).

From these drawings, it will be appreciated that the etching selectivity relative to an etching stopper film increases by a rise in an organic amount ratio. Particularly, in a minute trench processing, as illustrated in FIG. 103(b), an etching selectivity of 5 necessary for the organic insulating film relative to an etching stopper film can be obtained by increasing the organic content of the organic insulating film to be used as an etching stopper by about 2 times that of the organic insulating film (having a relatively small organic amount) used as an interlevel dielectric film. In short, an organic insulating film can be used as an etching stopper when it has an increased organic content. The term "etching selectivity" as used herein can be expressed by an (etching rate of an organic insulating film having a relatively small organic content)/(etching rate of an etching stopper film).

Figure 105:
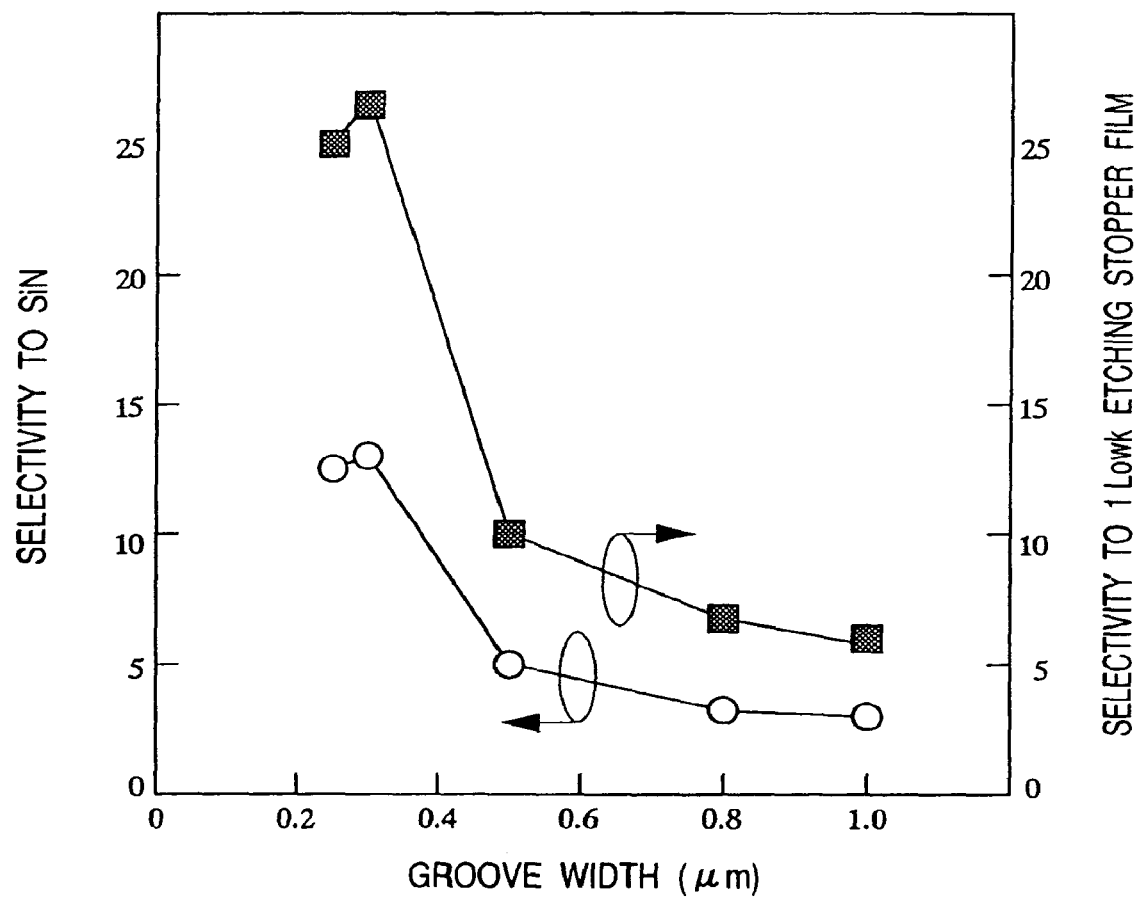
FIG. 105 is a graph illustrating the measuring results of a relation between the size of a trench and an etching selectivity when, upon formation of the trench in an organic insulating film, a silicon nitride film is employed and an organic insulating film having a relatively large organic content is employed as an etching stopper.
Figure 106:
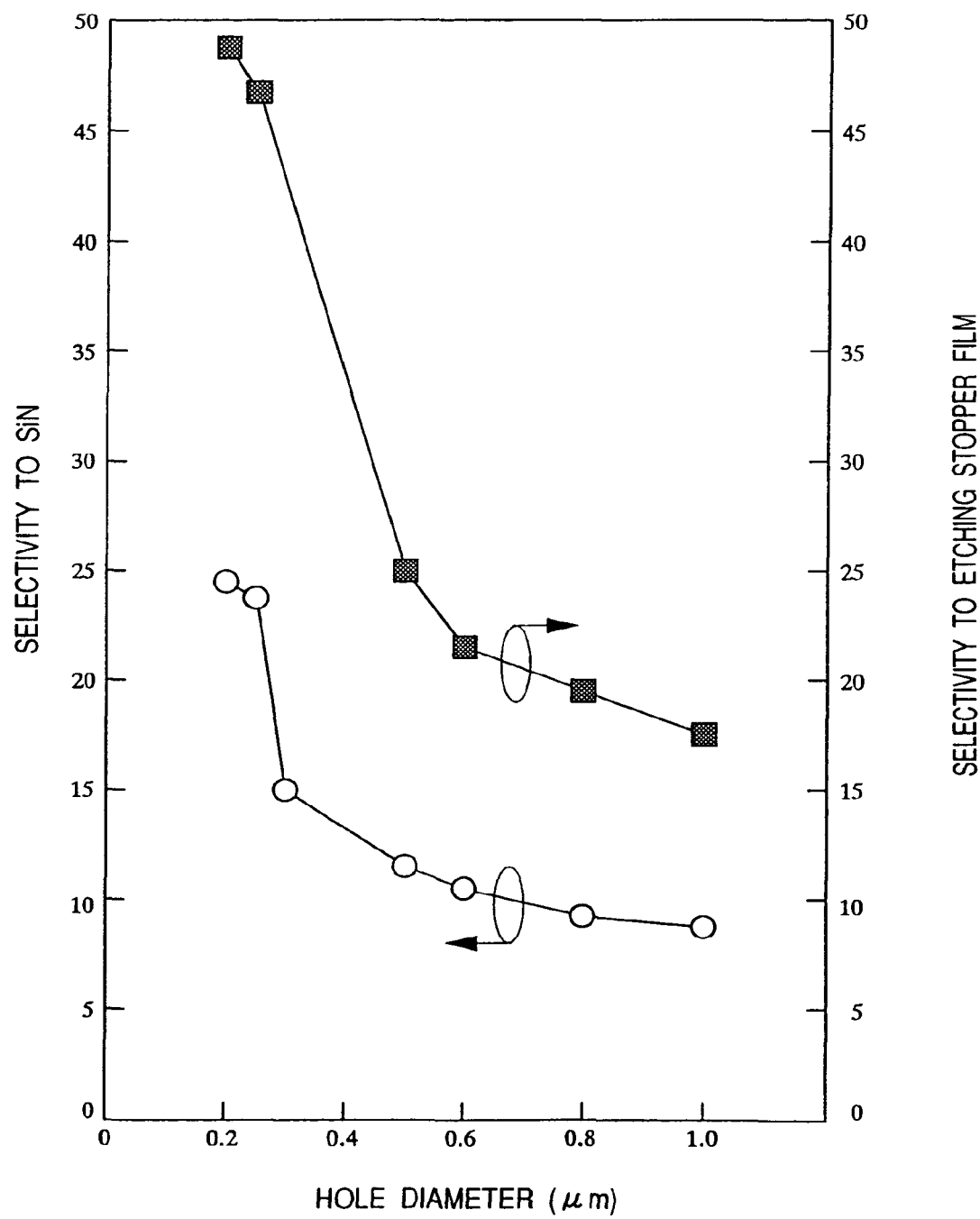
FIG. 106 is a graph illustrating the measuring results of a relation between the size of a hole and an etching selectivity when, upon formation of the hole in an organic insulating film, a silicon nitride film is employed or an organic insulating film having a relatively large organic content is employed as an etching stopper.

FIG. 105 and FIG. 106 are each a graph illustrating measuring results of a relation between the size of a recess, such as a trench or hole, and the etching selectivity when, upon formation of the recess in an organic insulating film, a silicon nitride film and an organic insulating film having a relatively large organic content are employed, respectively, as an etching stopper. Etching conditions are similar to those described for FIG. 103(a) or 104(a). It is appreciated that the smaller the width of the trench or the smaller the diameter of the hole, the etching selectivity of the organic insulating film having a relatively large organic content increases more drastically than that of the silicon nitride film.

FIG. 107 is a table showing the properties (adhesion, etching selectivity, copper diffusion suppressive capacity, dielectric constant) of various insulating films measured by the present inventors. In this table, the etching selectivity means that to an organic insulating film, which has a relatively small organic amount and is used as an interlevel dielectric film, relative to each film. The etching stopper film is an organic insulating film according to the technical concept of the present invention which has a relatively large organic content and its dielectric constant is 2.5 to 4.0. Blok is the trade name of an organic insulating film produced by Applied Materials Co., Ltd. According to the technical concept of the present invention, the novel organic insulating film is able to have a dielectric constant decreased to not greater than half of a silicon nitride film while maintaining an etching selectivity similar to the silicon nitride film.

The test results of the present inventors have revealed that by increasing the organic content of the organic insulating film by twice (such an organic insulating film will be abbreviated as "organic insulating film (twice)"), its etching rate decreases to the one-third of that of the original organic insulating film. When a test is conducted using the film for the formation of a trench or hole, the etching rate lowers further by the micro-loading effects, leading to one-sixth of the etching rate of the original organic insulating film. In other words, the organic insulating film (twice) has an etching selectivity of 6 relative to the original organic insulating film. In addition, this organic insulating film (twice) has a dielectric constant of about 2.7, markedly lower than the dielectric constant of a silicon nitride film, that is, 7. A total dielectric constant of the interconnects can be lowered largely by interposition, between metallization layers, of this organic insulating film (twice) as an etching stopper so that the operation rate of the semiconductor integrated circuit device can be improved largely. Similar effects are of course available by increasing the organic content of the organic insulating film by at least 100%.

Figure 108:
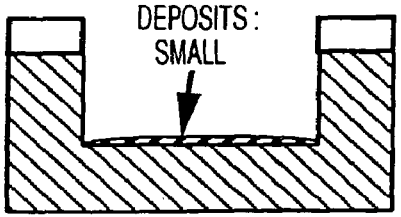
FIGS. 108(a) and 108(b) are tables which illustrate the reason why an etching selectivity to an organic insulating film having a relatively high organic content can be set high relative to an organic insulating film having a relatively low organic content.

The reasons why the etching selectivity to an organic insulating film having a relatively small organic content can be heightened relative to an organic insulating film having a relatively large organic content are presumed to be as follows. More specifically, the organic insulating film having a large organic content contains silicon oxide (SiO) in a small amount so that the consumption amount of CF radicals serving as an etchant of silicon oxide is small. Accordingly, the deposition amount of CF radicals is large, which decreases the etching rate. In addition, as illustrated in FIG. 108(*b*), a high density of carbon (C) to be etched causes a shortage in oxygen (O) radicals of the etchant, leading to a decrease in the etching rate. For the above-described reasons, an etching selectivity to an organic insulating film having a relatively small organic content becomes higher than that to an organic insulating film having a relatively large organic content.

Such an organic insulating film having a relatively large organic amount can be used as an etching stopper when SiLK (trade name, produced by Dow Chemical), Black Diamond (trade name; produced by Applied Materials), Blok (trade name; produced by Applied Materials), BCB (benzocyclobutene), FLARE (trade name of Applied Materials) or the like is employed as an organic insulating film material of an interlevel dielectric film. The organic insulating film having a relatively large organic amount can be used as an etching stopper when an interlevel dielectric film is formed not of an organic insulating film, but of an insulating film, such as a SiOF or a silicon oxide film, formed by plasma CVD using a TEOS gas, other than an organic insulating film. Examples of the organic insulating film used as an etching stopper at this time also include an organosiloxane stopper film and organic stopper film.

Figure 109:
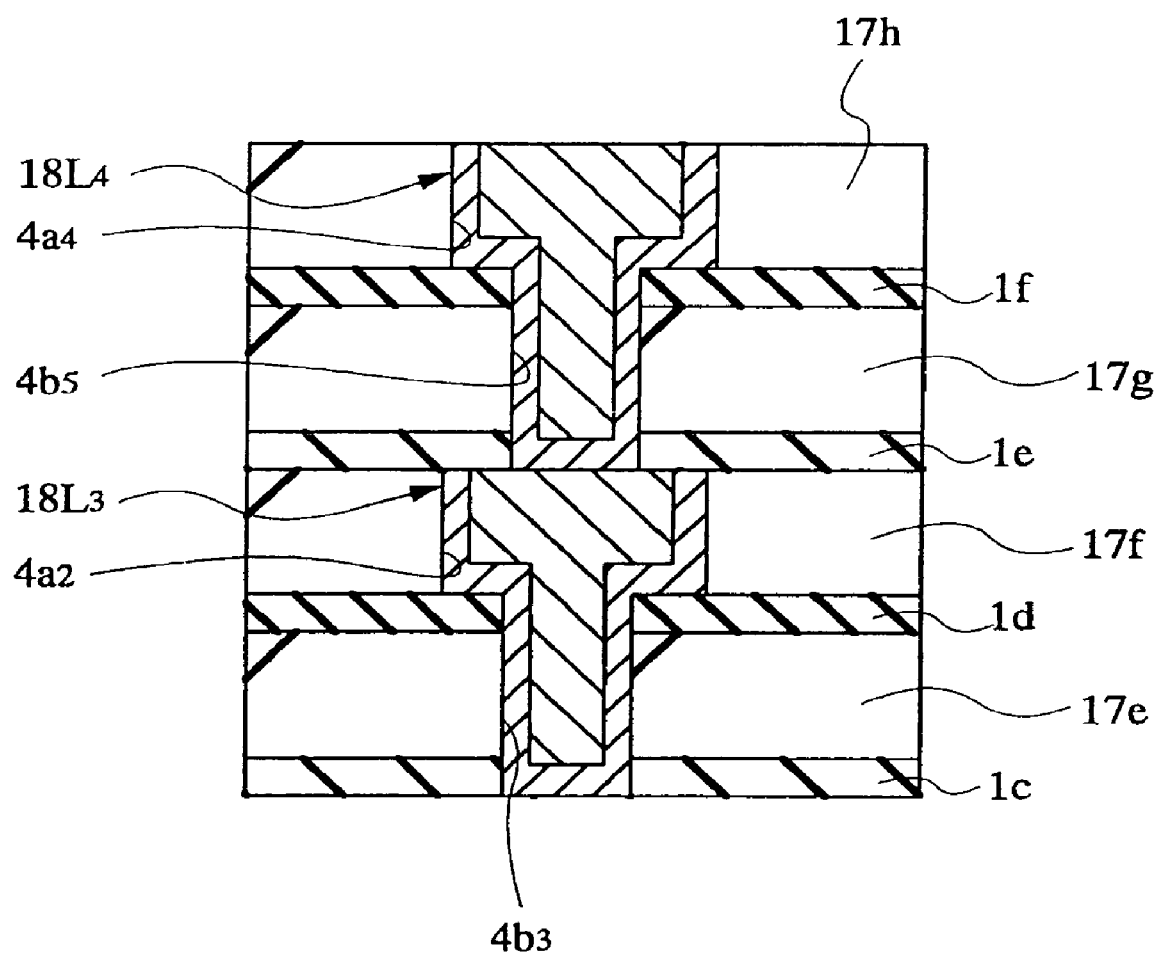
FIG. 109 is a fragmentary cross-sectional view illustrating a semiconductor integrated circuit device according to a still further embodiment of the present invention.
Figure 110:
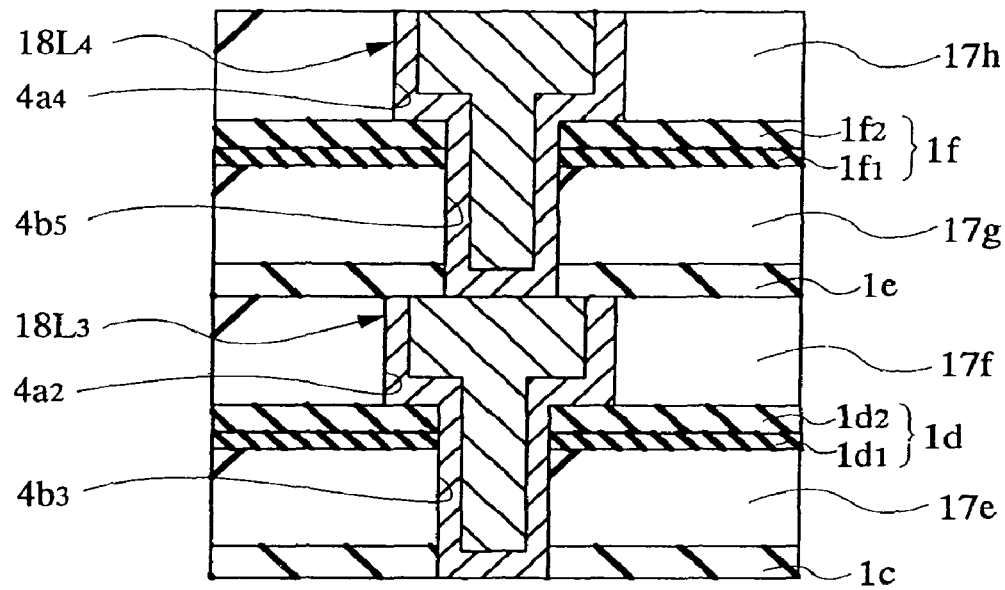
FIG. 110 is a fragmentary cross-sectional view of a semiconductor integrated circuit device according to a still further embodiment of the present invention.
Figure 111:
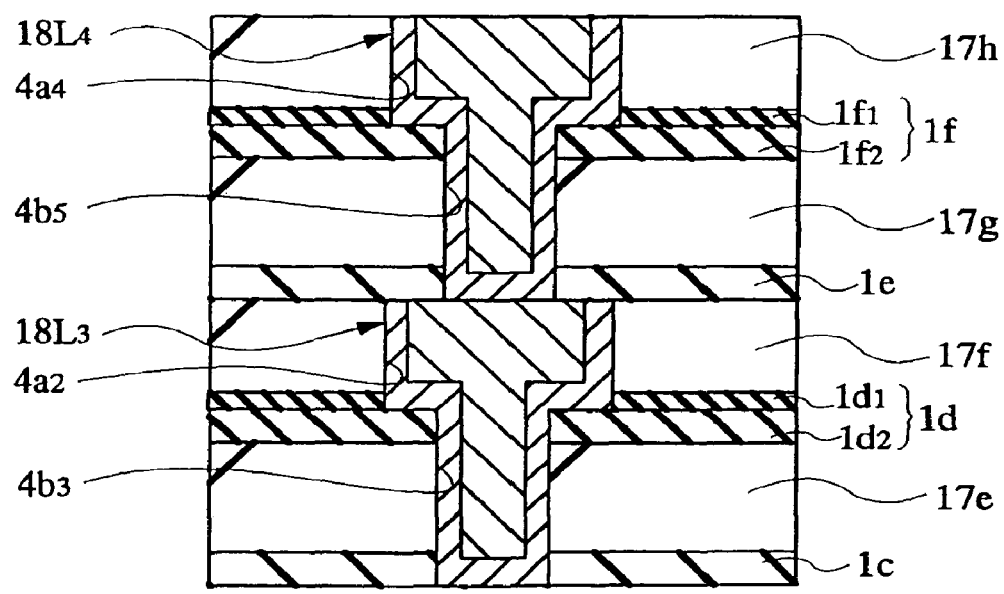
FIG. 111 is a fragmentary cross-sectional view of a semiconductor integrated circuit device according to a still further embodiment of the present invention.

An example of the structure of a semiconductor integrated circuit device to which the above-described technical concept of the present invention is applied is illustrated in FIGS. 109 to 111. FIGS. 109 to 111 each selectively illustrates the third-layer interconnect 18L3 and fourth-layer interconnect 18L4 of FIG. 14.

In this Embodiment 16, which is illustrated in FIG. 109, the insulating films 1*d*, 1*f* are each made of an organic insulating film having a larger organic content than the organic insulating film of the interlevel dielectric films 17*e* to 17*h*. The insulating films 1*e*, 1*c* are made of, for example, a silicon nitride film similar to Embodiments 1 to 15. The interlevel dielectric films 17*e* to 17*h* each is similar in structure (material, thickness, function, formation process and the like) to that described in Embodiments 1 to 15.

FIG. 110 is a modified example of FIG. 109, wherein the insulating films 1*d*, 1*f* are formed, for example, by depositing, over silicon nitride films 1*d*1, 1*f*, organic insulating films 1*d*2, 1*f*2 having a larger organic content than the organic insulating films of the interlevel dielectric films 17*e* to 17*h*, respectively. In this case, a total dielectric constant of the interconnects of the semiconductor device can be lowered by decreasing the thickness of each of the silicon nitride films 1*d*1, 1*f*1 in the insulating films 1*d*, 1*f*.

FIG. 111 is a modified example of FIG. 110, wherein the insulating films 1*d*, 1*f* are formed, for example, by depositing silicon nitride films 1*d*1, 1*f*2 over the organic insulating films 1*d*2, 1*f*2 having a larger organic content than the organic insulating films of the interlevel dielectric films 17*e* to 17*h* and removing the silicon nitride films 1*d*1, 1*f*1 below the third-layer interconnect 18L3 and fourth-layer interconnect 18L4. In this case, the silicon nitride film below the interconnect is removed so that a total dielectric constant of the interconnects of the semiconductor integrated circuit device can be made lower than that of FIG. 110.

Application of the above-described technical concept of the present invention to a manufacturing process of a semiconductor integrated circuit device will next be described. The technical concept of the present invention, that is, the use of the above-described novel organic insulating film as an etching stopper, can be applied to any one of Embodiments 1 to 15. In this case, the insulating films 1*b*, 1*d*, 1*f*, 1*h* of FIG. 14 may be formed from an organic insulating film having a relatively large organic content. A specific example of it will next be described.

Figure 67:
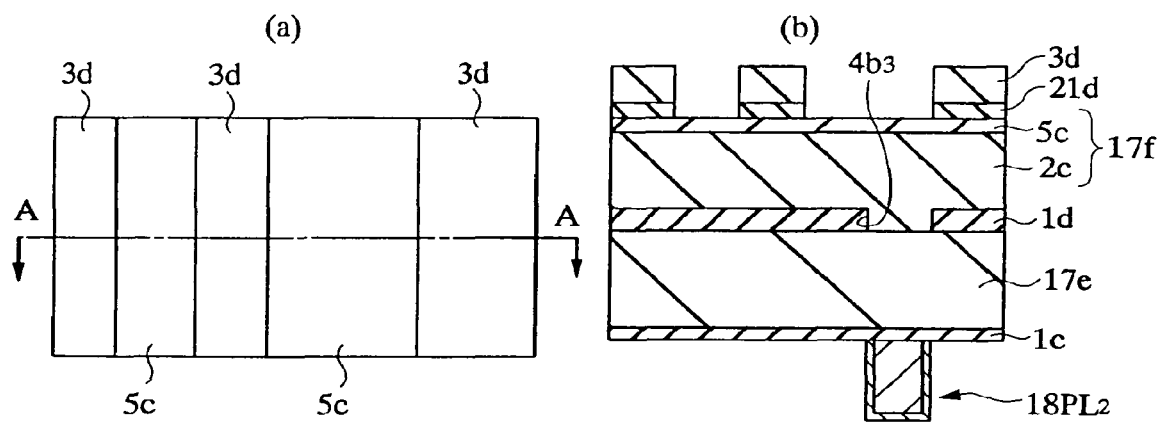
FIG. 67(a) is a plan view and FIG. 67(b) is a fragmentary cross-sectional view taken along line A-A in FIG. 67(a) illustrating the semiconductor integrated circuit device of FIG. 14 during a manufacturing step according to still further embodiment of the present invention.

The above-described technical concept of the present invention is applied to the dual damascene process of Embodiment 5 as described below, but only the points different from those described in Embodiment 5 will be specifically considered. In FIG. 67 or the like, a novel organic insulating film having a relatively large organic content is employed as the insulating film 1*d* and its thickness is about 100 nm. Etching conditions for the formation of the through-hole 4*b*3 by etching of the insulating film 1*d* are as follows: use of a parallel-plate narrow-electrode type RIE apparatus as an etching apparatus, pressure in the etching chamber of about 25 mTorr, use of $C_4F_8/O_2$/Ar as an etching gas, a flow rate of about 35/20/400 sccm, upper/lower electrode high-frequency power of about 500/200 W and lower electrode temperature of about −20° C.

Figure 68:
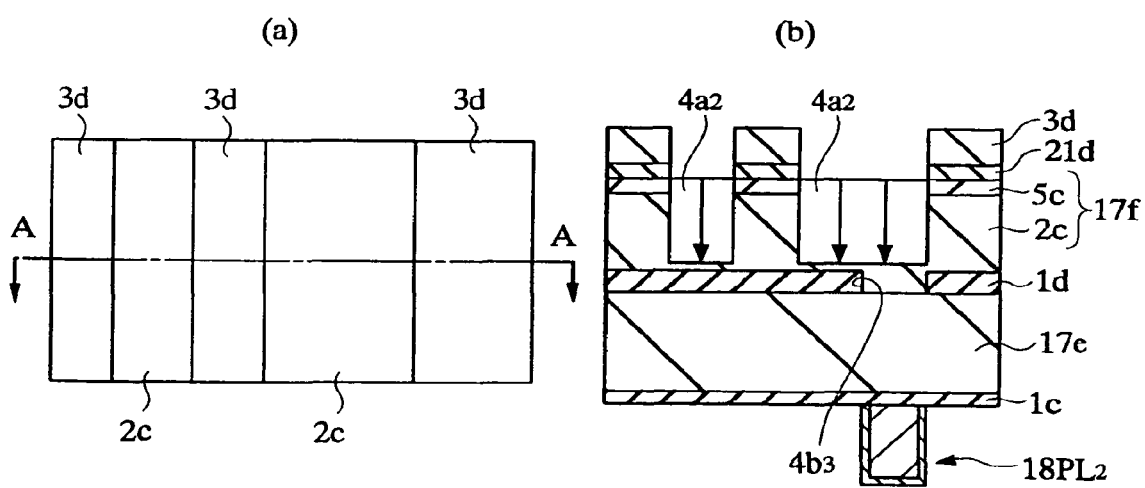
FIG. 68(a) is a plan view and FIG. 68(b) is a fragmentary cross-sectional view taken along line A-A in FIG. 68(a) illustrating the semiconductor integrated circuit device during a manufacturing step subsequent to that illustrated in FIG. 67(b)
Figure 69:
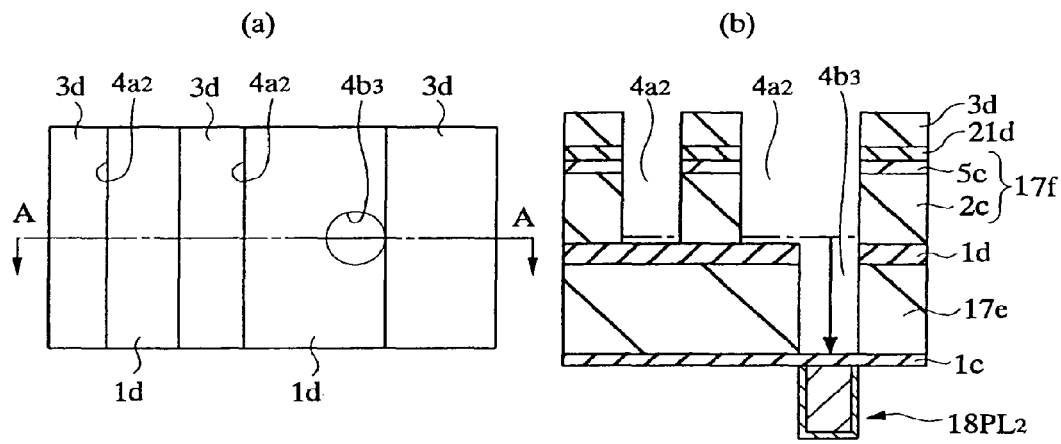
FIG. 69(a) is a plan view and FIG. 69(b) is a fragmentary cross-sectional view taken along line A-A in FIG. 69(a) illustrating the semiconductor integrated circuit device during a manufacturing step subsequent to that illustrated in FIG. 68(b)
Figure 70:
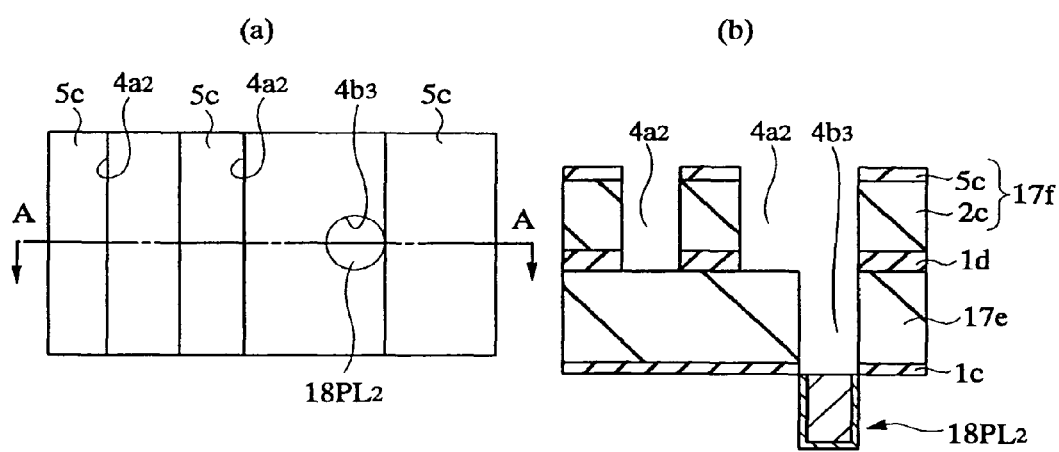
FIG. 70(a) is a plan view and FIG. 70(b) is a fragmentary cross-sectional view taken alone line A-A in FIG. 70(a) illustrating the semiconductor integrated circuit device during a manufacturing step subsequent to that illustrated in FIG. 69(b)
Figure 71:
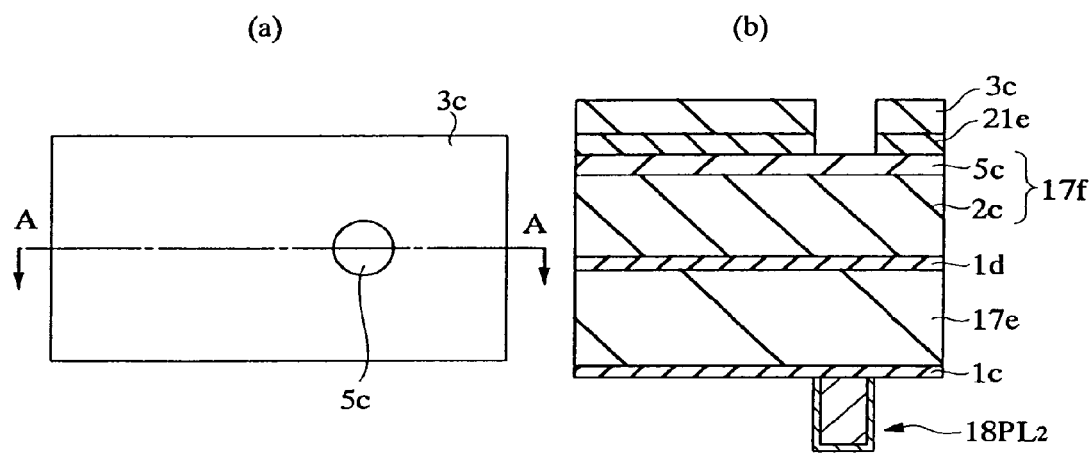
FIG. 71(a) is a plan view and FIG. 71(b) is a fragmentary cross-sectional view taken along line A-A in FIG. 71(a) illustrating the semiconductor integrated circuit device of FIG. 14 during a manufacturing step according to still further embodiment of the present invention.
Figure 72:
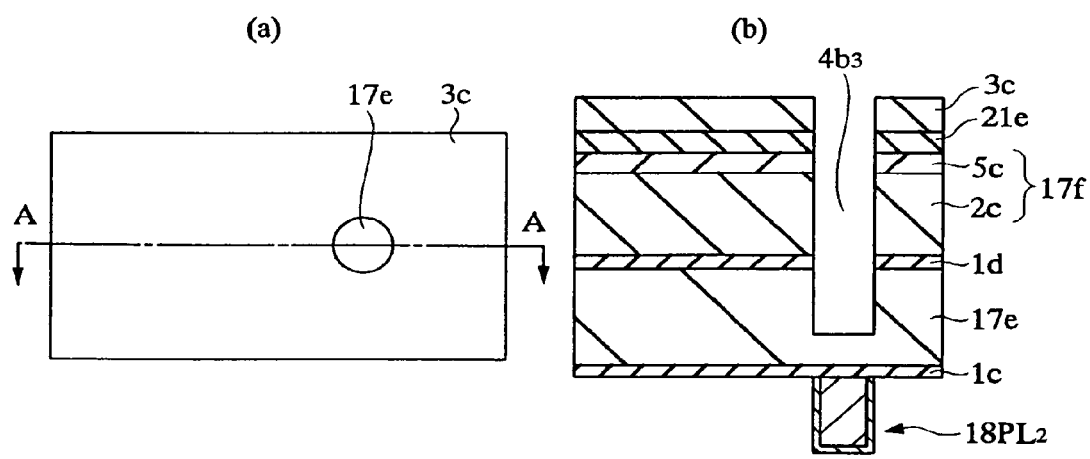
FIG. 72(a) is a plan view and FIG. 72(b) is a fragmentary cross-sectional view taken alone line A-A in FIG. 72(a) illustrating the semiconductor integrated circuit device during a manufacturing step subsequent to that illustrated in FIG. 71(b)
Figure 73:
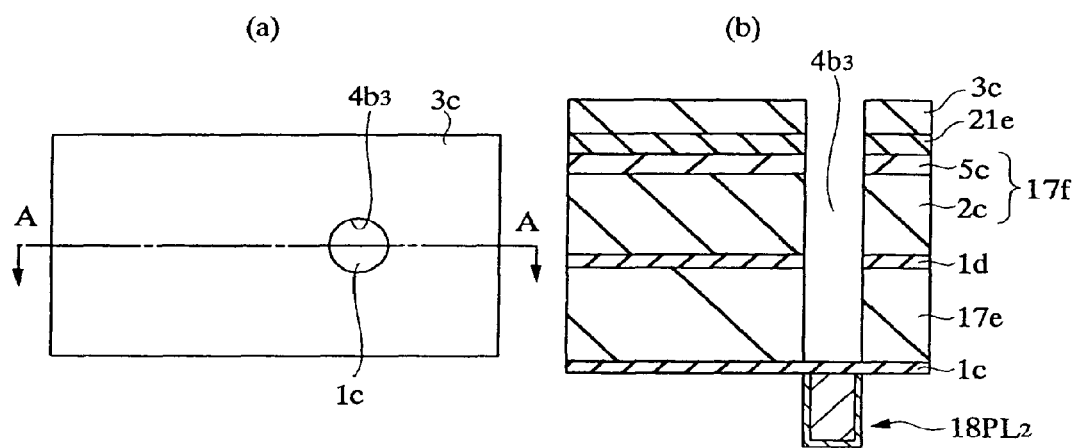
FIG. 73(a) is a plan view and FIG. 73(b) is a fragmentary cross-sectional view taken alone line A-A in FIG. 73(a) illustrating the semiconductor integrated circuit device during a manufacturing step subsequent to that illustrated in FIG. 72(b)
Figure 74:
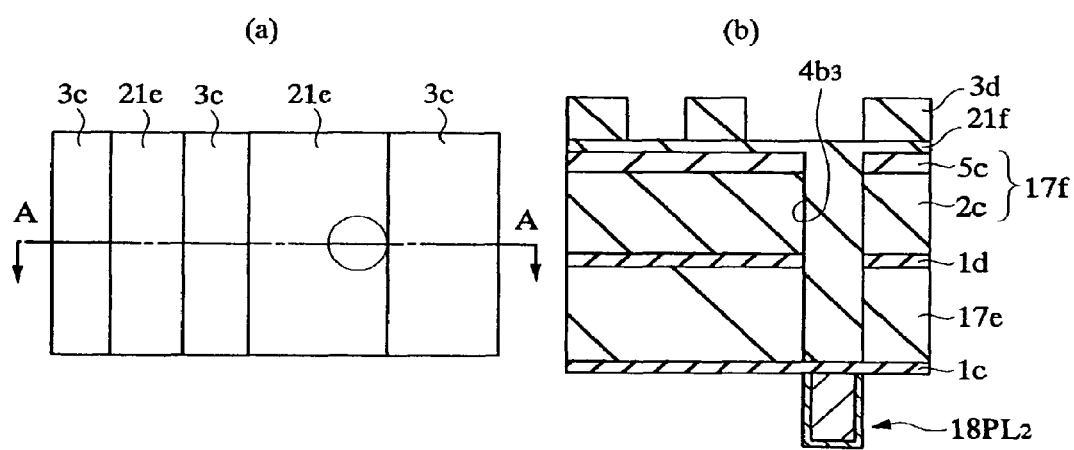
FIG. 74(a) is a plan view and FIG. 74(b) is a fragmentary cross-sectional view taken alone line A-A in FIG. 74(a) illustrating the semiconductor integrated circuit device during a manufacturing step subsequent to that illustrated in FIG. 73(b)
Figure 75:
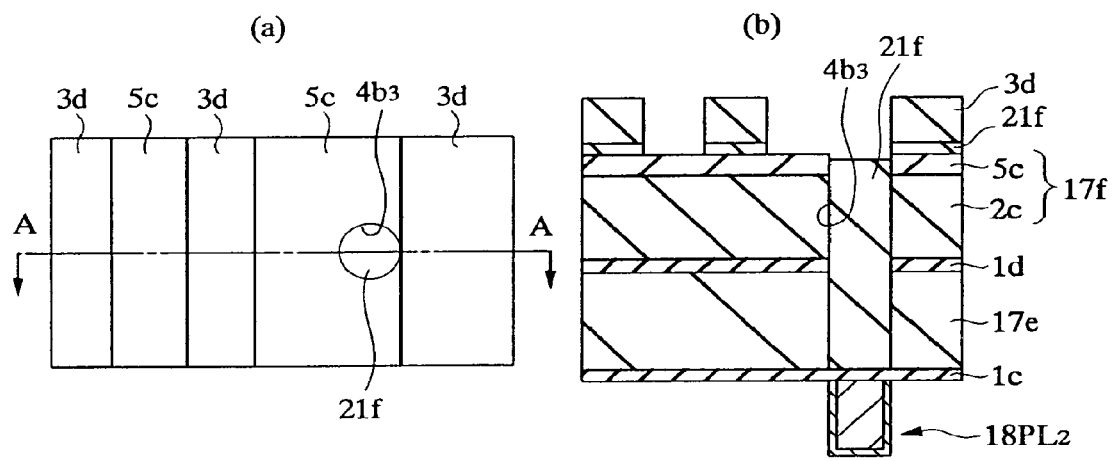
FIG. 75(a) is a plan view and FIG. 75(b) is a fragmentary cross-sectional view taken alone line A-A in FIG. 75(a) illustrating the semiconductor integrated circuit device during a manufacturing step subsequent to that illustrated in FIG. 74(b)
Figure 76:
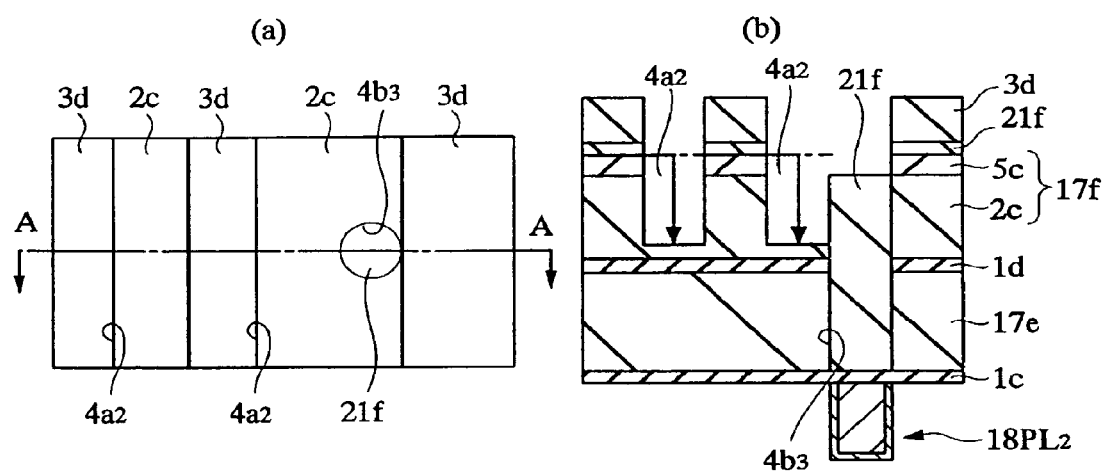
FIG. 76(a) is a plan view and FIG. 76(b) is a fragmentary cross-sectional view taken alone line A-A in FIG. 76(a) illustrating the semiconductor integrated circuit device during a manufacturing step subsequent to that illustrated in FIG. 75(b)
Figure 77:
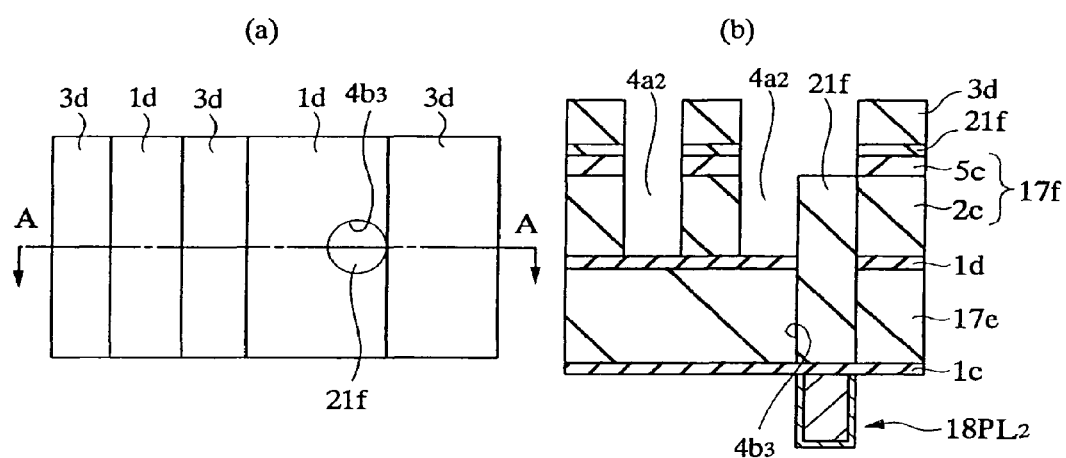
FIG. 77(a) is a plan view and FIG. 77(b) is a fragmentary cross-sectional view taken alone line A-A in FIG. 77(a) illustrating the semiconductor integrated circuit device during a manufacturing step subsequent to that illustrated in FIG. 76(b)
Figure 78:
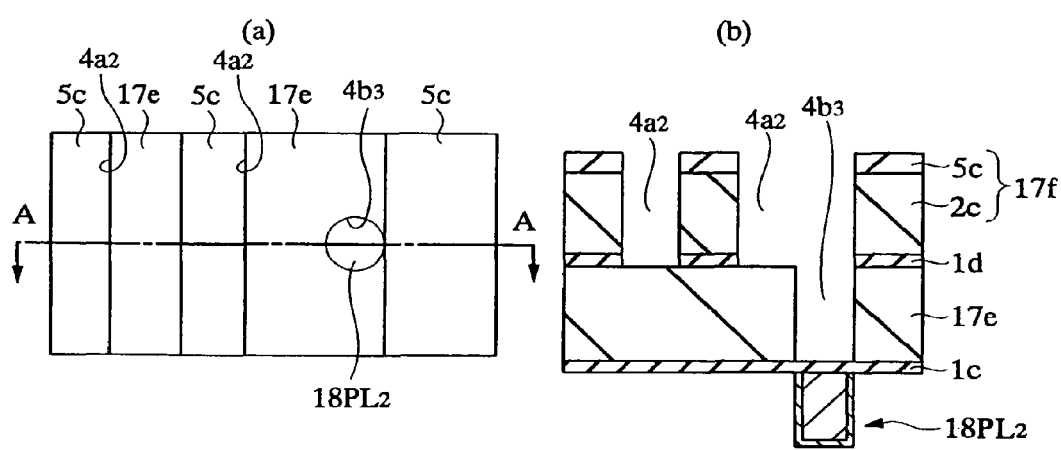
FIG. 78(a) is a plan view and FIG. 78(b) is a fragmentary cross-sectional view taken alone line A-A in FIG. 78(a) illustrating the semiconductor integrated circuit device during a manufacturing step subsequent to that illustrated in FIG. 77(b)
Figure 79:
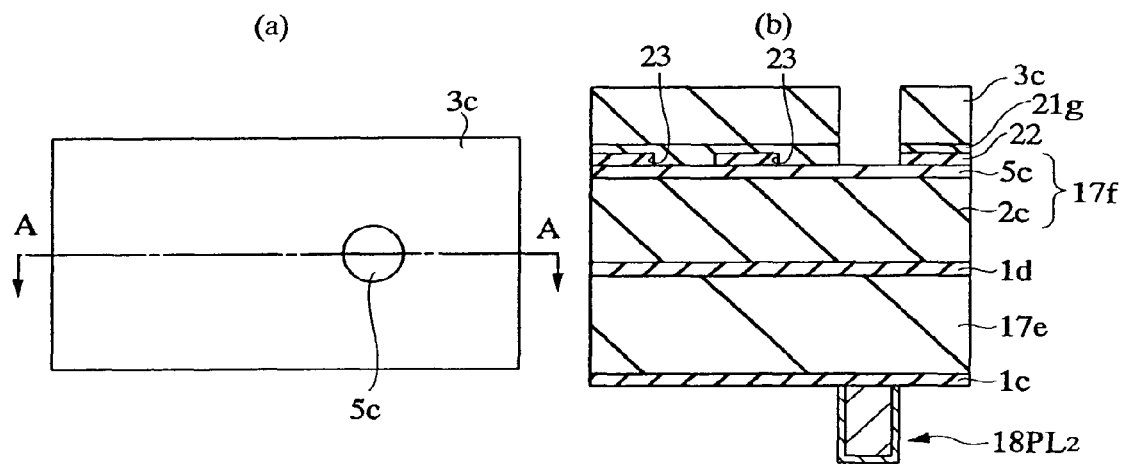
FIG. 79(a) is a plan view and FIG. 79(b) is a fragmentary cross-sectional view taken along line A-A in FIG. 79(b) illustrating the semiconductor integrated circuit device of FIG. 14 during a manufacturing step according to still further embodiment of the present invention.
Figure 80:
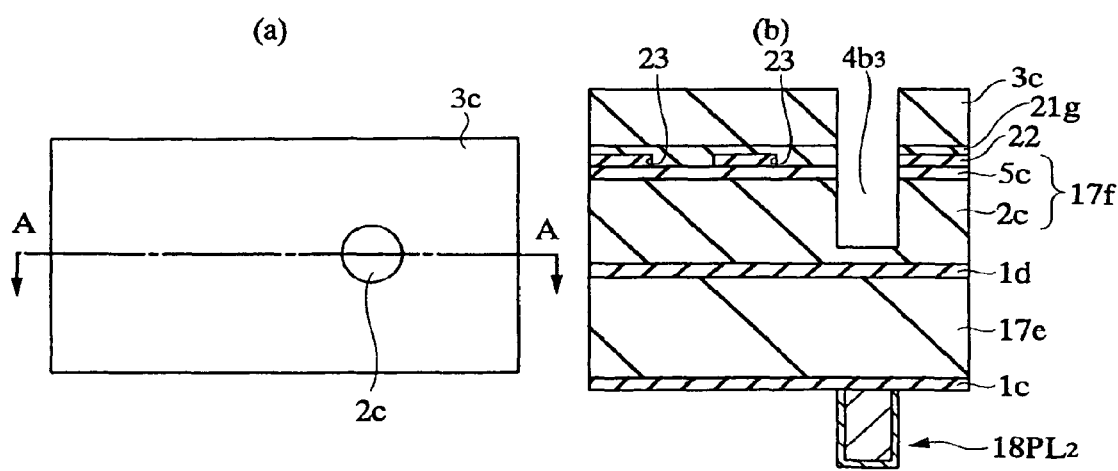
FIG. 80(a) is a plan view and FIG. 80(b) is a fragmentary cross-sectional view taken along line A-A in FIG. 80(a) illustrating the semiconductor integrated circuit device during a manufacturing step subsequent to that illustrated in FIG. 79(b)
Figure 81:
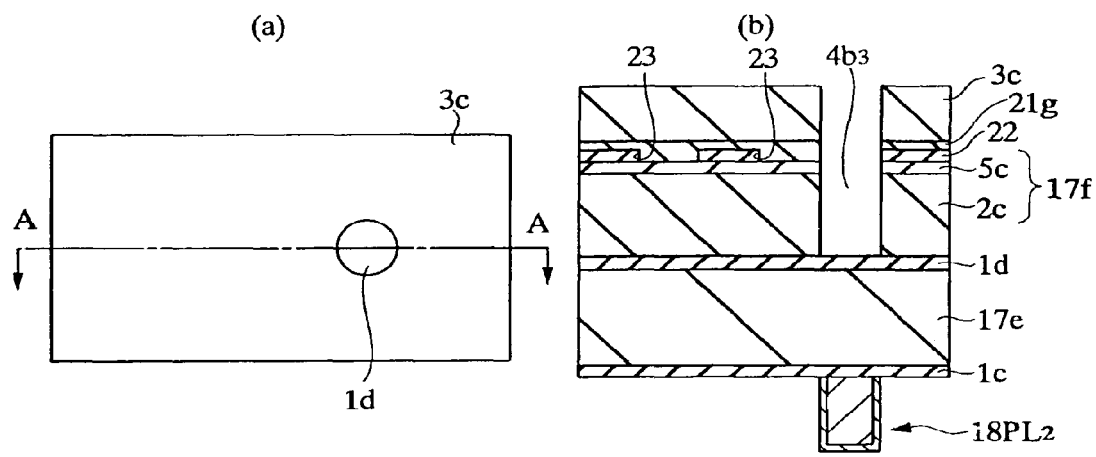
FIG. 81(a) is a plan view and FIG. 81(b) is a fragmentary cross-sectional view taken alone line A-A in FIG. 81(a) illustrating the semiconductor integrated circuit device during a manufacturing step subsequent to that illustrated in FIG. 80(b)
Figure 82:
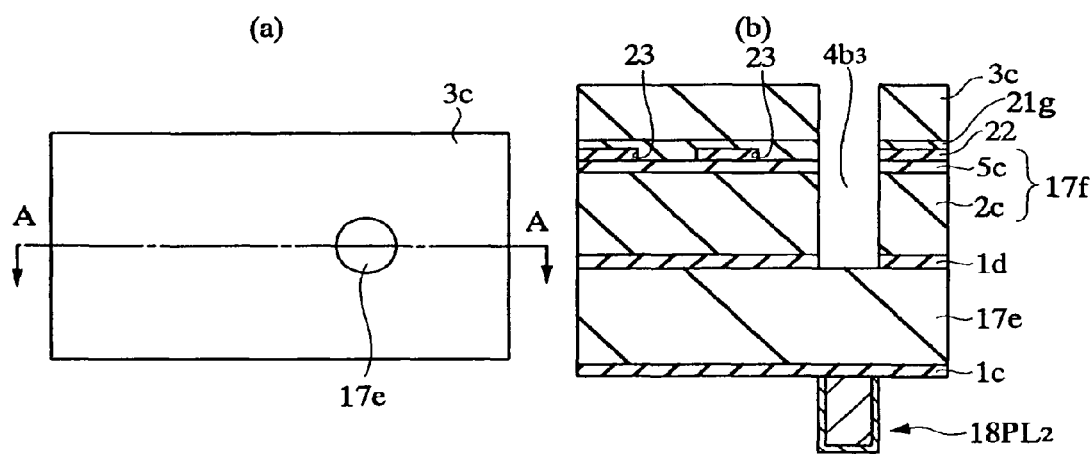
FIG. 82(a) is a plan view and FIG. 82(b) is a fragmentary cross-sectional view taken alone line A-A in FIG. 82(a) illustrating the semiconductor integrated circuit device during a manufacturing step subsequent to that illustrated in FIG. 81(b)
Figure 83:
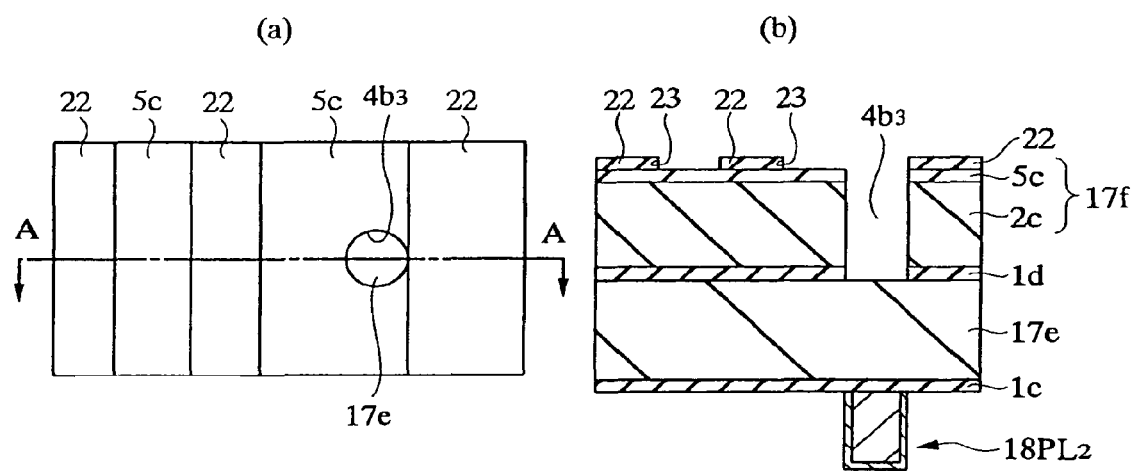
FIG. 83(a) is a plan view and FIG. 83(b) is a fragmentary cross-sectional view taken alone line A-A in FIG. 83(a) illustrating the semiconductor integrated circuit device during a manufacturing step subsequent to that illustrated in FIG. 82(b)
Figure 84:
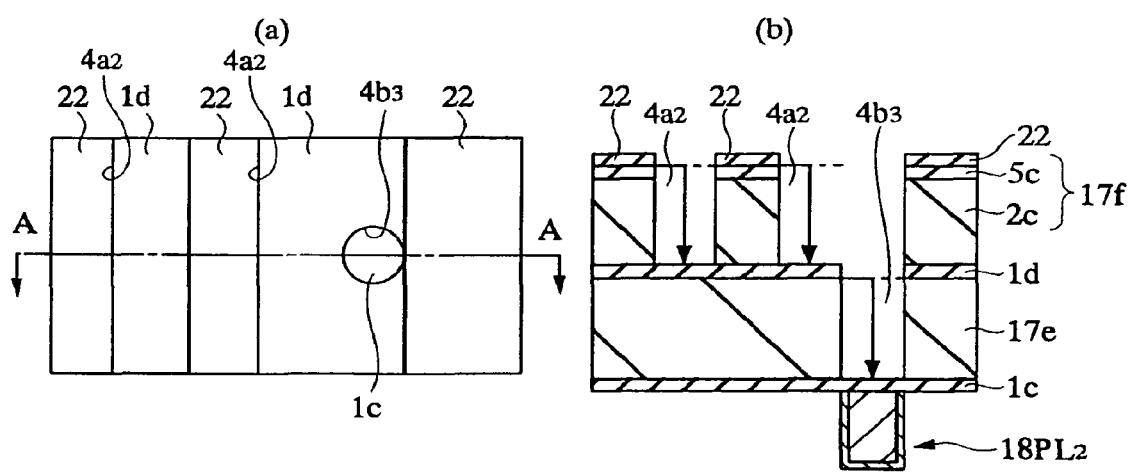
FIG. 84(a) is a plan view and FIG. 84(b) is a fragmentary cross-sectional view taken alone line A-A in FIG. 84(a) illustrating the semiconductor integrated circuit device during a manufacturing step subsequent to that illustrated in FIG. 83(b)
Figure 85:
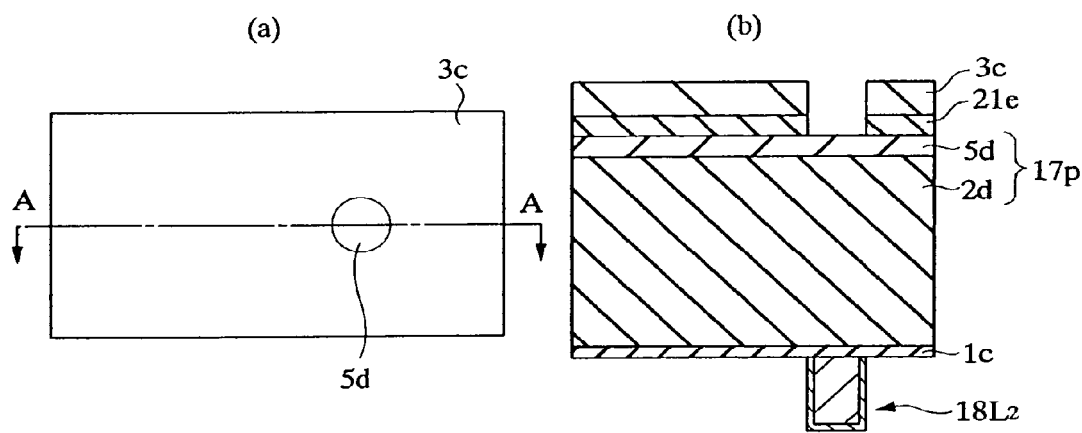
FIG. 85(a) is a plan view and FIG. 85(b) is a fragmentary cross-sectional view taken along line A-A in FIG. 85(a) illustrating the semiconductor integrated circuit device of FIG. 14 during a manufacturing step according to still further embodiment of the present invention.
Figure 86:
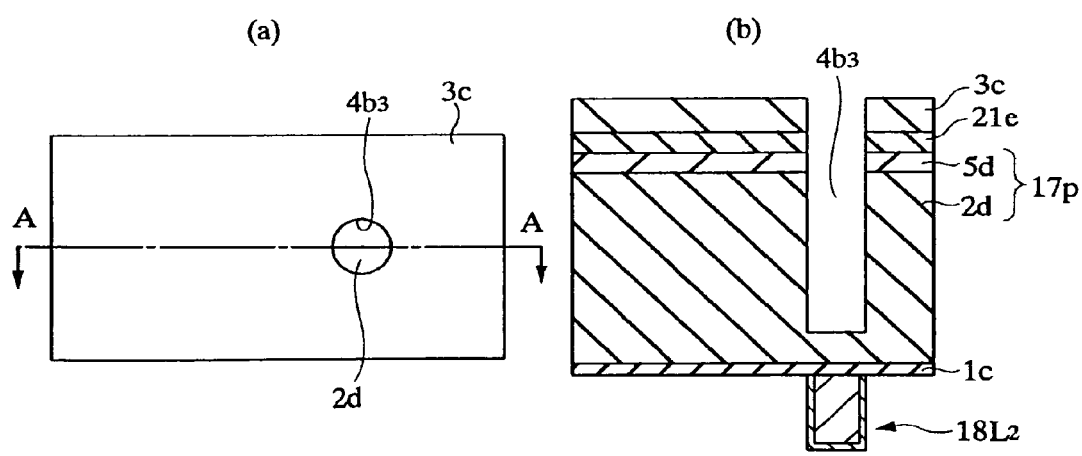
FIG. 86(a) is a plan view and FIG. 86(b) is a fragmentary cross-sectional view taken alone line A-A in FIG. 86(a) illustrating the semiconductor integrated circuit device during a manufacturing step subsequent to that illustrated in FIG. 85(b)
Figure 87:
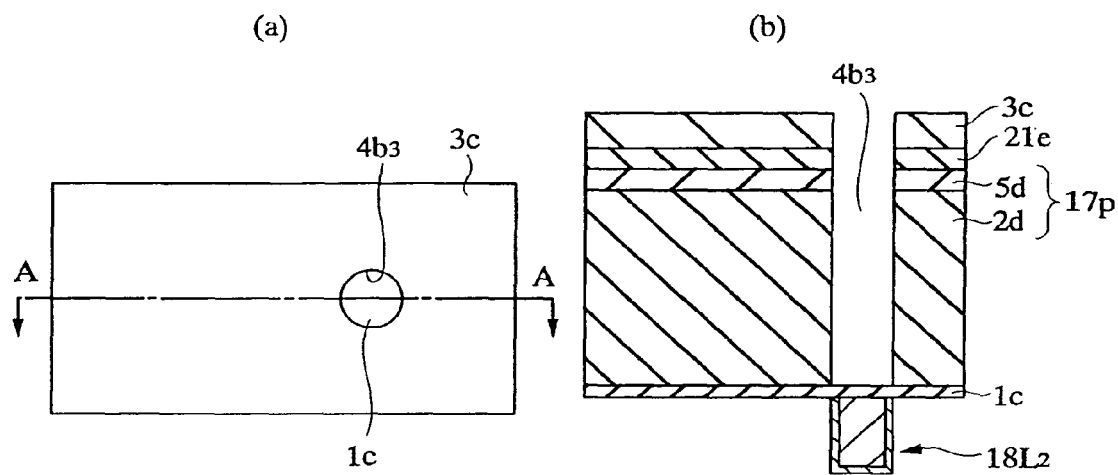
FIG. 87(a) is a plan view and FIG. 87(b) is a fragmentary cross-sectional view taken alone line A-A in FIG. 87(a) illustrating the semiconductor integrated circuit device during a manufacturing step subsequent to that illustrated in FIG. 86(b)
Figure 88:
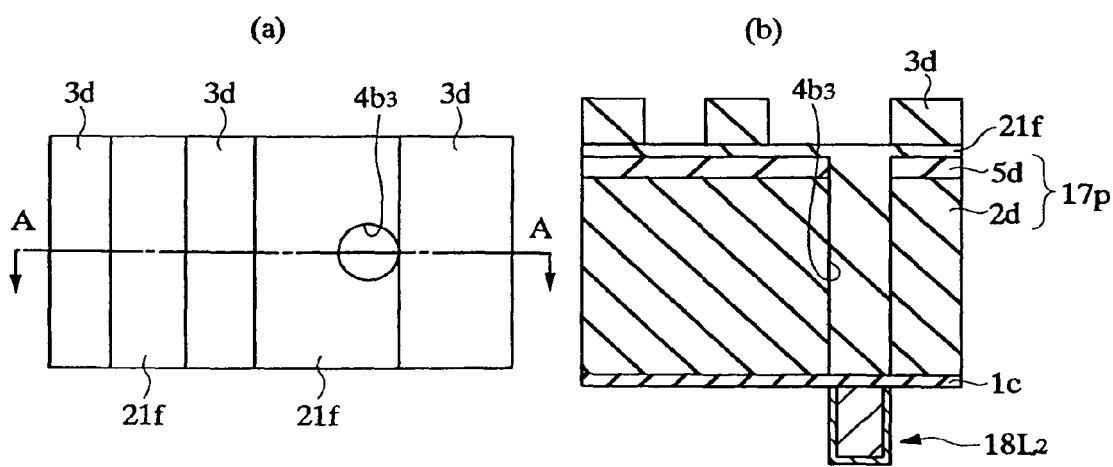
FIG. 88(a) is a plan view and FIG. 88(b) is a fragmentary cross-sectional view taken alone line A-A in FIG. 88(a) illustrating the semiconductor integrated circuit device during a manufacturing step subsequent to that illustrated in FIG. 87(b)
Figure 89:
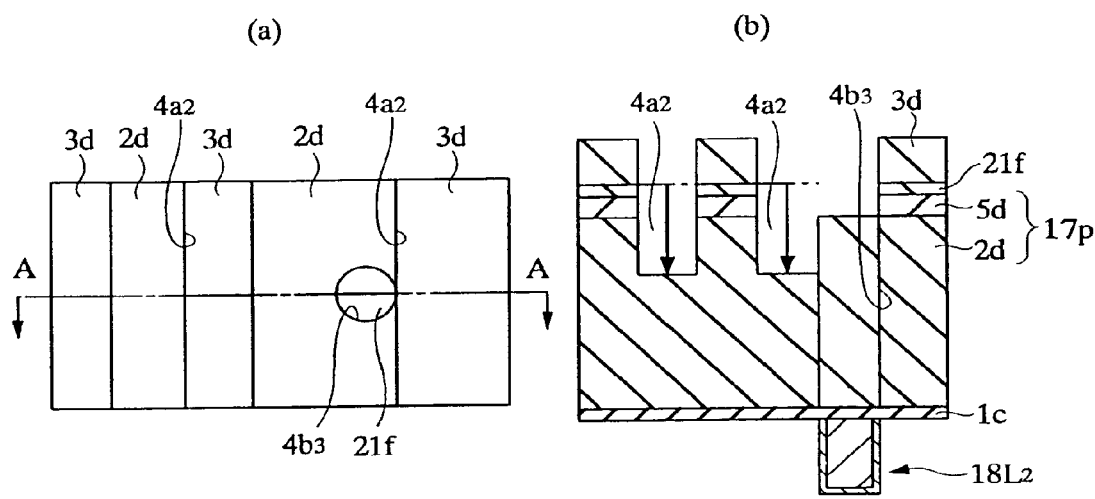
FIG. 89(a) is a plan view and FIG. 89(b) is a fragmentary cross-sectional view taken alone line A-A in FIG. 89(a) illustrating the semiconductor integrated circuit device during a manufacturing step subsequent to that illustrated in FIG. 88(b)
Figure 90:
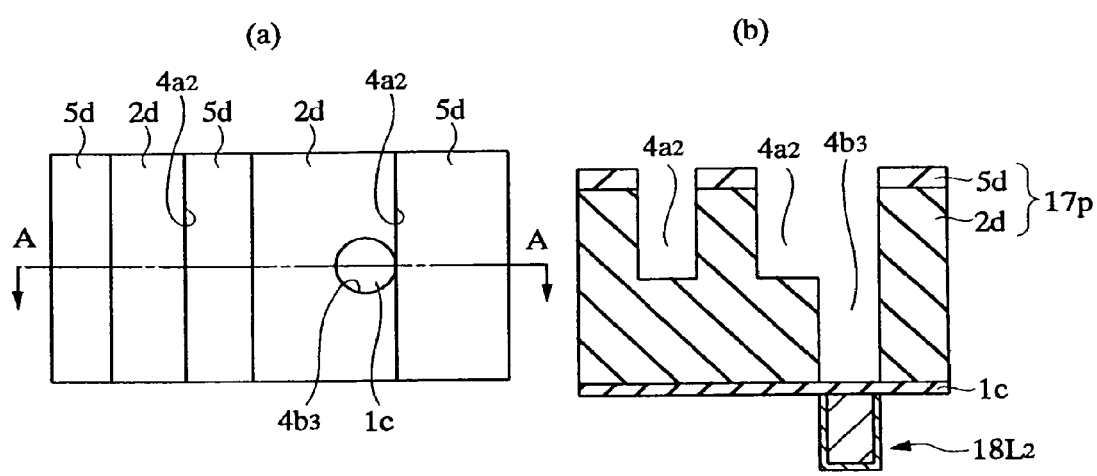
FIG. 90(a) is a plan view and FIG. 90(b) is a fragmentary cross-sectional view taken alone line A-A in FIG. 90(a) illustrating the semiconductor integrated circuit device during a manufacturing step subsequent to that illustrated in FIG. 89(b)
Figure 93:
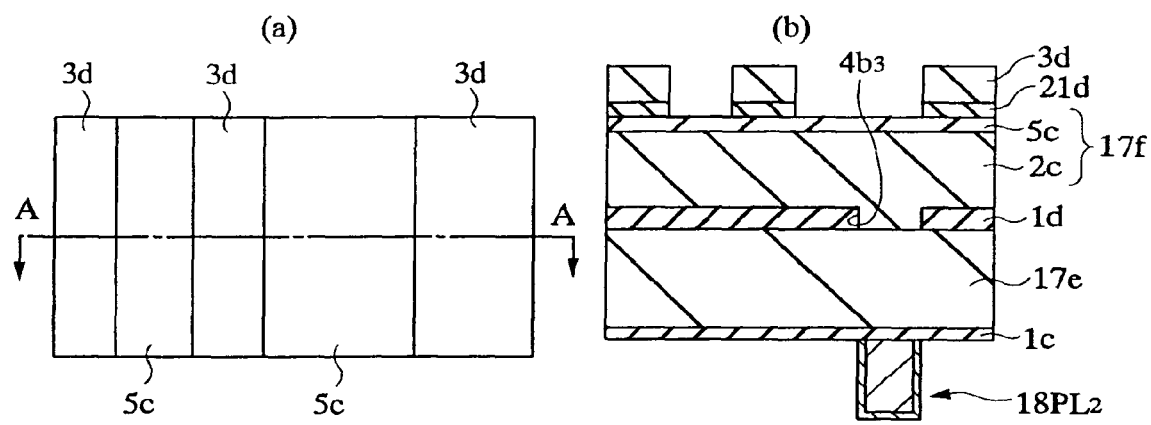
FIG. 93(a) is a plan view and FIG. 93(b) is a fragmentary cross-sectional view taken along line A-A in FIG. 93(a) illustrating the semiconductor integrated circuit device of FIG. 14 during a manufacturing step according to still further embodiment of the present invention.
Figure 94:
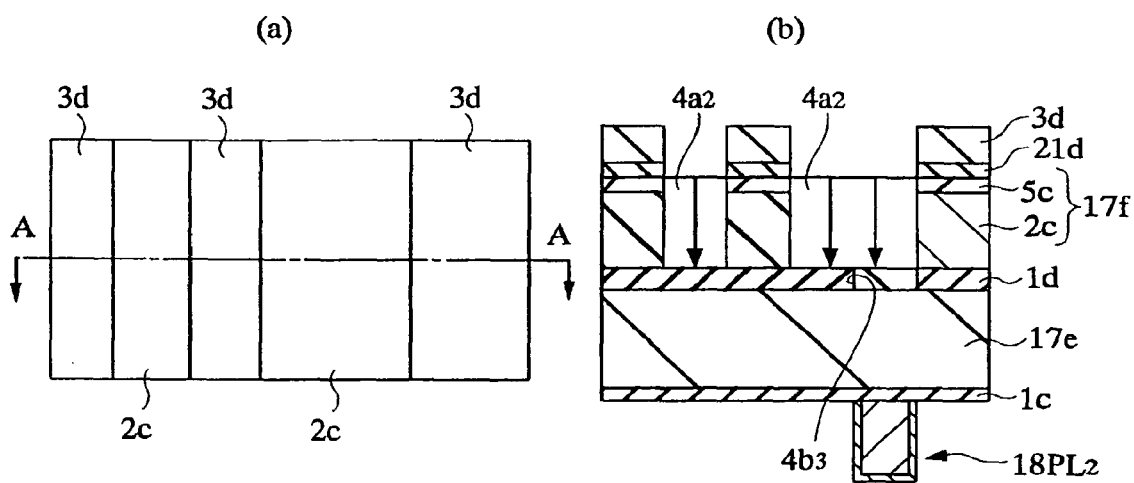
FIG. 94(a) is a plan view and FIG. 94(b) is a fragmentary cross-sectional view taken along line A-A in FIG. 94(a) illustrating the semiconductor integrated circuit device during a manufacturing step subsequent to that illustrated in FIG. 93(B)
Figure 95:
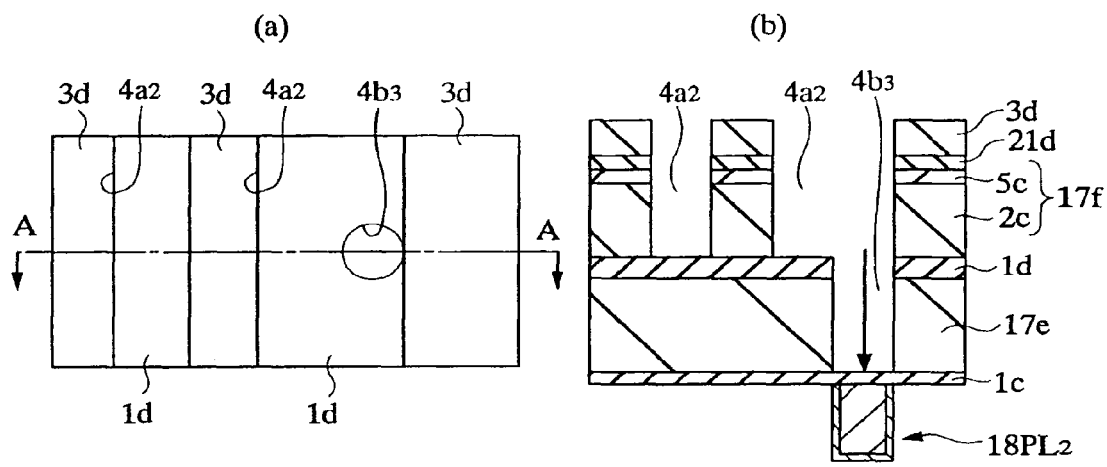
FIG. 95(a) is a plan view and FIG. 95(b) is a fragmentary cross-sectional view taken along line A-A in FIG. 95(a) illustrating the semiconductor integrated circuit device during a manufacturing step subsequent to that illustrated in FIG. 94(b)
Figure 96:
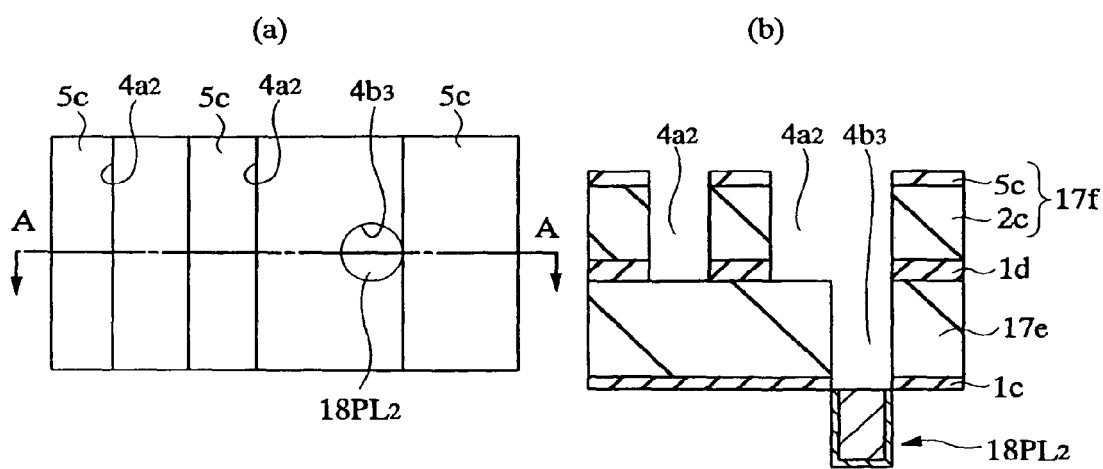
FIG. 96(a) is a plan view and FIG. 96(b) is a fragmentary cross-sectional view taken alone line A-A in FIG. 96(a) illustrating the semiconductor integrated circuit device during a manufacturing step subsequent to that illustrated in FIG. 95(b)
Figure 97:
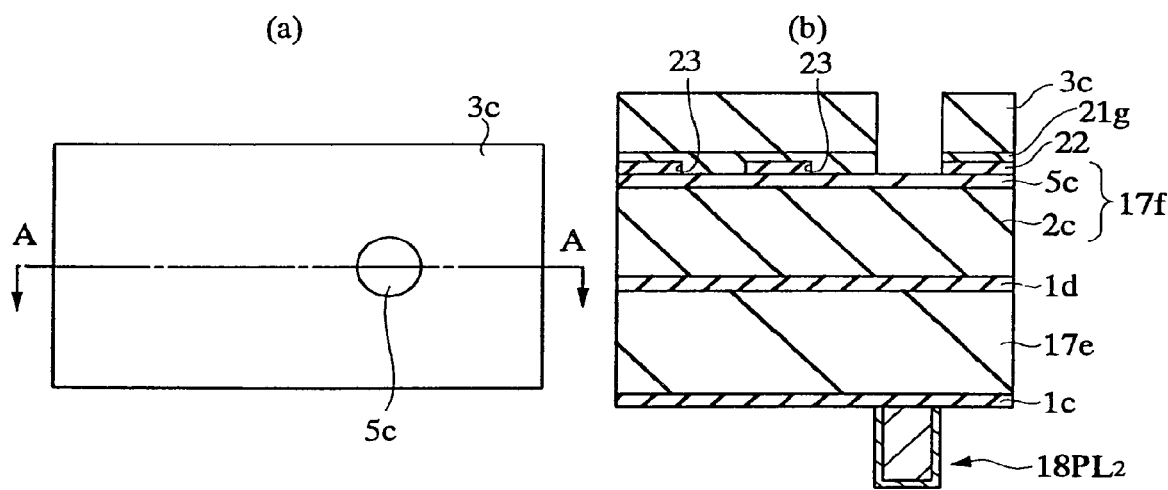
FIG. 97(a) is a plan view and FIG. 97(b) is a fragmentary cross-sectional view taken along line A-A in FIG. 97(a) illustrating the semiconductor integrated circuit device of FIG. 14 during a manufacturing step according to still further embodiment of the present invention.
Figure 98:
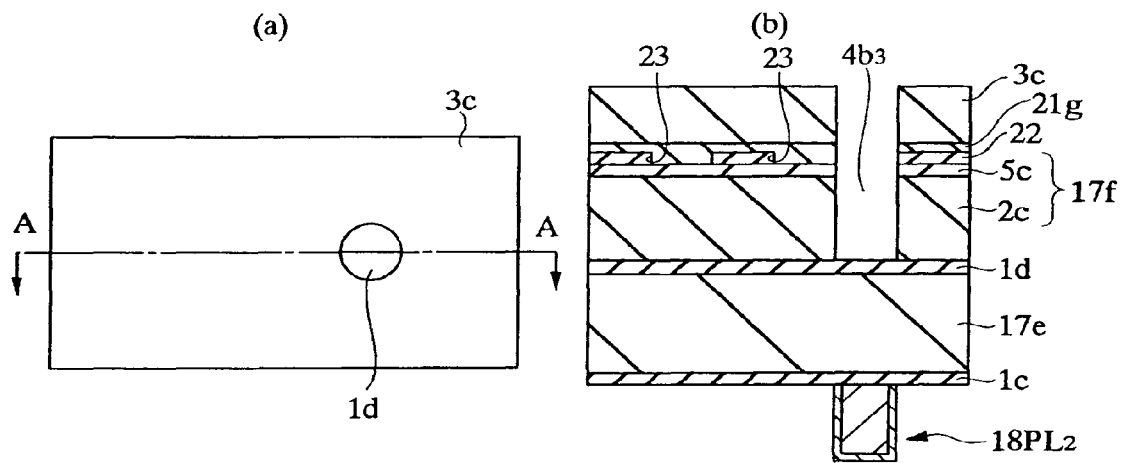
FIG. 98(a) is a plan view and FIG. 98(b) is a fragmentary cross-sectional view taken alone line A-A in FIG. 98(a) illustrating the semiconductor integrated circuit device during a manufacturing step subsequent to that illustrated in FIG. 97(b)
Figure 99:
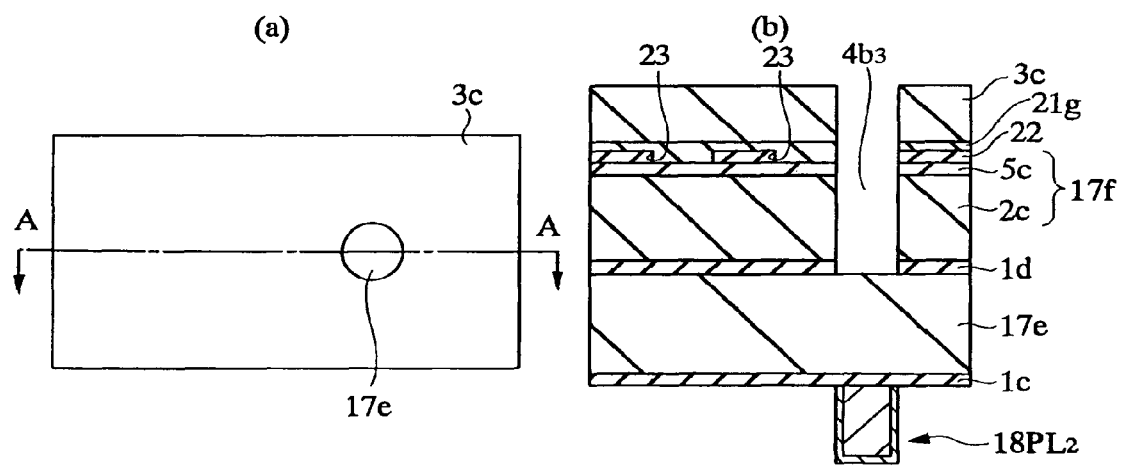
FIG. 99(a) is a plan view and FIG. 99(b) is a fragmentary cross-sectional view taken alone line A-A in FIG. 99(a) illustrating the semiconductor integrated circuit device during a manufacturing step subsequent to that illustrated in FIG. 98(b)
Figure 100:
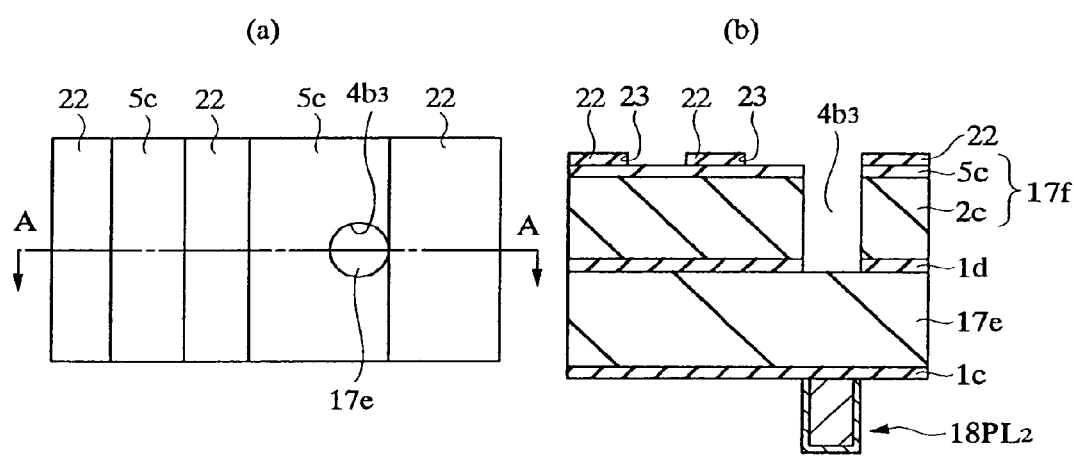
FIG. 100(a) is a plan view and FIG. 100(b) is a fragmentary cross-sectional view taken alone line A-A in FIG. 100(a) illustrating the semiconductor integrated circuit device during a manufacturing step subsequent to that illustrated in FIG. 99(b)
Figure 101:
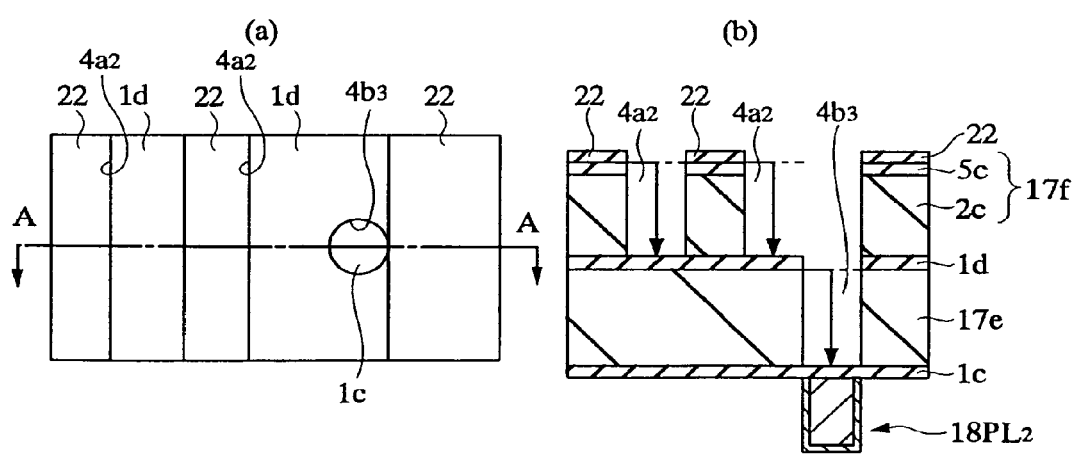
FIG. 101(a) is a plan view and FIG. 101(b) is a fragmentary cross-sectional view taken alone line A-A in FIG. 101(a) illustrating the semiconductor integrated circuit device during a manufacturing step subsequent to that illustrated in FIG. 100(b)

After the steps of FIGS. 68(*b*) and 69(*b*), the insulating film 1*d* made of a silicon nitride film is removed from the bottom of the trench 4*a*2 in Embodiment 5, but in this Embodiment 16, the insulating film 1*d* made of a novel organic insulating film is not removed, but the insulating film 1*c* made of silicon nitride or the like left on the bottom surface of the through-hole 4*b*3 is etched away. Etching is conducted under similar conditions to those of Embodiment 5. Then, a conductor film is filled in both the trench 4*a*3 and through-hole 4*b*3, whereby an interconnect structure as shown in FIG. 109 is formed.

The above-described technical concept of the present invention can be applied to the dual damascene process of Embodiment 6 without changing the etching conditions and the like.

Thus, an advantage as described below is available, in addition to those obtained in Embodiments 1 to 15, according to Embodiment 16.

(1) The total dielectric constant of the interconnects of a semiconductor integrated circuit device can be lowered by the use, as an etching stopper, of a novel organic insulating film having a low dielectric constant.

Embodiment 17

Application of the above-described technical concept of the present invention in Embodiment 16 to the dual damascene process of Embodiment 7 will next be described.

Figure 112:
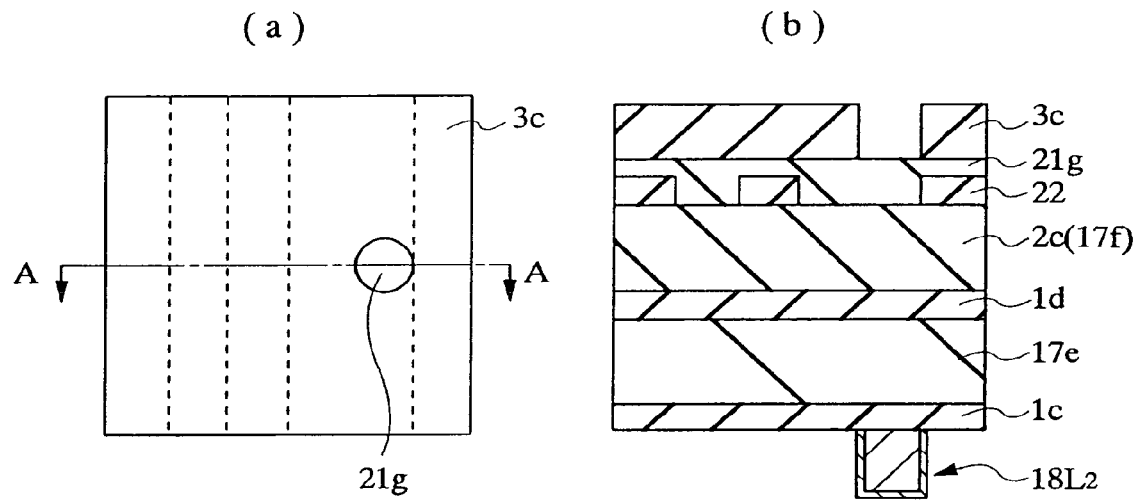
FIG. 112(a) is a plan view and FIG. 112(b) is a fragmentary cross-sectional view taken along line A-A in FIG. 112(a) illustrating the semiconductor integrated circuit device of FIG. 14 during a manufacturing step according to a still further aspect of the present invention.

FIG. 112(b) illustrates the fragmentary portion of the semiconductor integrated circuit device during the manufacturing step after the steps illustrated in FIGS. 43(b) to 47(b) of Embodiment 3. The insulating film 1d is made of an organic insulating film having a larger organic content than the organic insulating film used for the interlevel dielectric films 17e, 17f and its thickness is about 100 nm.

Figure 113:
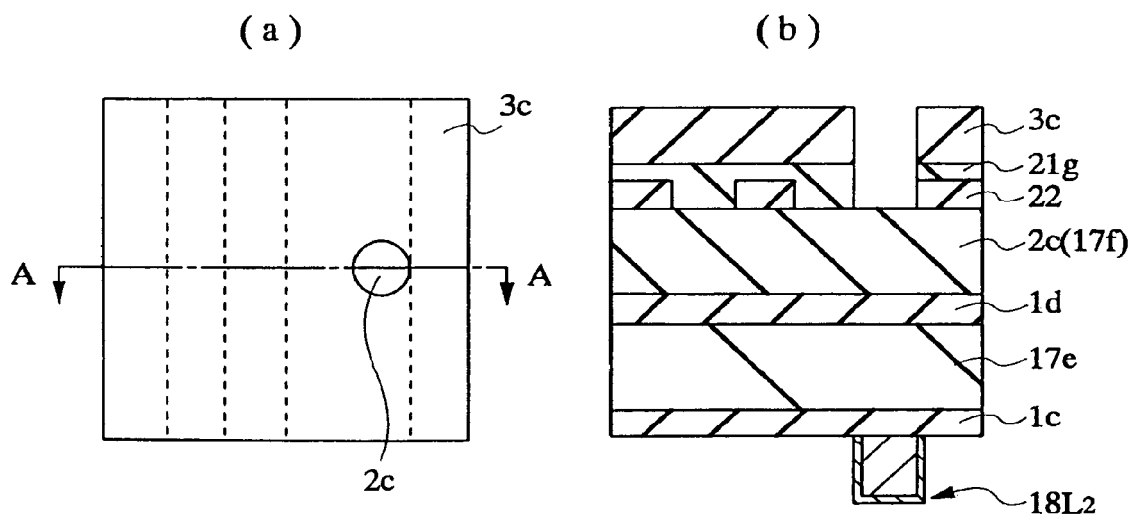
FIG. 113(a) is a plan view and FIG. 113(b) is a fragmentary cross-sectional view taken alone line A-A in FIG. 113(a) illustrating the semiconductor integrated circuit device during a manufacturing step subsequent to that illustrated in FIG. 112(b)

Then, in a similar manner to Embodiment 3, the insulating film 5c is exposed by removing, using the photoresist film 3c as an etching mask, the antireflection film 21g exposed therefrom by plasma dry etching, as illustrated in FIG. 113(b). This etching may be conducted either under similar conditions to Embodiment 1 or 3, or under the following conditions: use of an ordinarily employed RIE apparatus as an etching apparatus, pressure in the etching chamber of about 750 mTorr, use of $CHF_3/CH_4/Ar$ as an etching gas, a flow rate of about 10/90/950 sccm, high-frequency power of about 900 W and lower electrode temperature of about 10° C.

Figure 114:
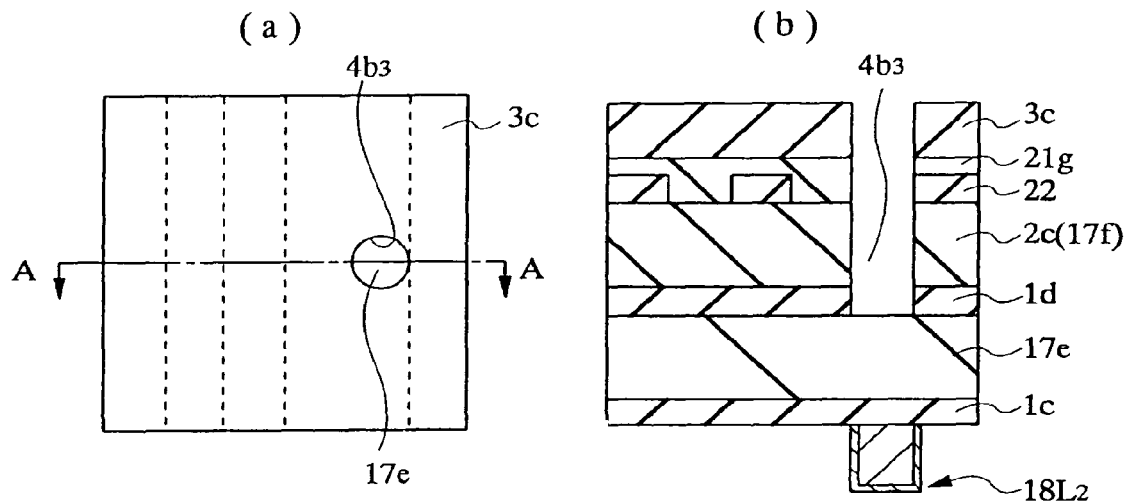
FIG. 114(a) is a plan view and FIG. 114(b) is a fragmentary cross-sectional view taken alone line A-A in FIG. 114(a) illustrating the semiconductor integrated circuit device during a manufacturing step subsequent to that illustrated in FIG. 113(b)

A through-hole 4b3 is then formed, as illustrated in FIG. 114(b), by successively removing the organic insulating film 2c and insulating film 1d by plasma dry etching using the photoresist film 3c as an etching mask. After etching, the interlevel dielectric film 17e is exposed from the bottom surface of the through-hole 4b3. This etching is conducted under the following conditions: use of a parallel-plate narrow-electrode type RIE apparatus as an etching apparatus, pressure in the etching chamber of about 25 mTorr, use of $C_4F_8/O_2/Ar$ as an etching gas, a flow rate of about 35/20/400 sccm, high-frequency power density of about 500/200 W and lower electrode temperature of about −20° C.

Figure 115:
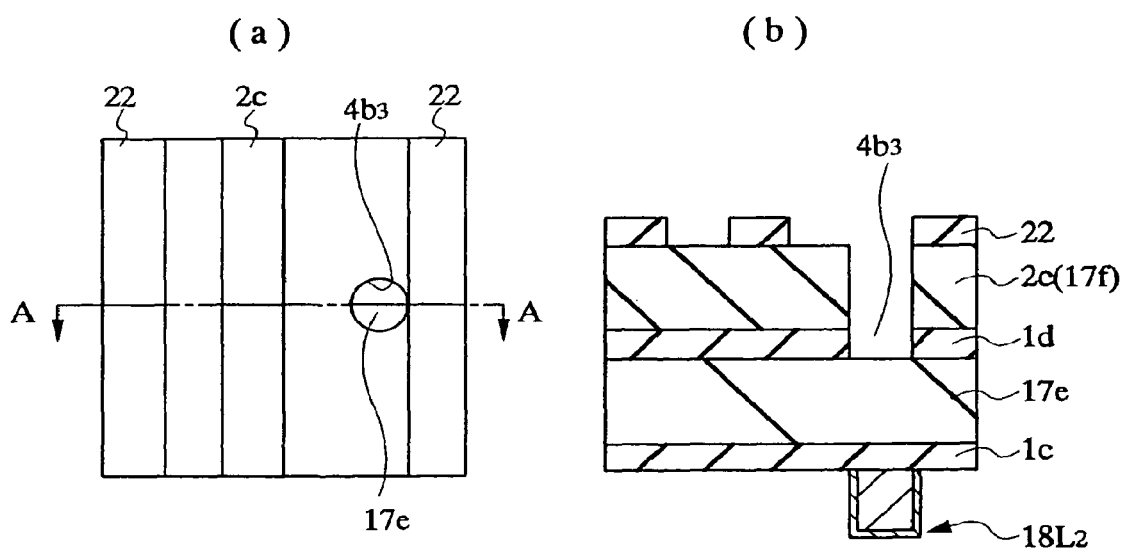
FIG. 115(a) is a plan view and FIG. 115(b) is a fragmentary cross-sectional view taken alone line A-A in FIG. 115(a) illustrating the semiconductor integrated circuit device during a manufacturing step subsequent to that illustrated in FIG. 114(b)

After removal of the photoresist film 3c and antireflection film 21g, as illustrated in FIG. 115(b), by ashing as in Embodiment 3, the interlevel dielectric films 17f, 17e exposed from the bottom surfaces of the opening portion 23 and through-hole 4b3, respectively, are removed by plasma dry etching using the remaining insulating film 22 as an etching mask. By this etching, the trench 4a2 and through-hole 4b3 are formed in a certain depth of the interlevel dielectric films 17e, 17f made of an organic insulating film, whereby the trench 4a2 and through-hole 4b3 are formed, as illustrated in FIG. 116(b). The organic insulating film 2c is left on the bottom surface of the trench 4a2, while the interlevel dielectric film 17e is left on the bottom surface of the through-hole 4b3. The thicknesses of the remaining insulating films (2c, 17e) are 30% or less, 20% or less, preferably 15% or less of the thicknesses of the insulating films (2c, 17e) before etching. This etching is conducted, for example, under conditions similar to those for the formation of the through-hole 4b3 of FIG. 114(b).

The remaining interlevel dielectric films 17e, 17f are then removed by plasma dry etching using the insulating film 22 as an etching mask. Here, etching is conducted while using the insulating film 1c and the insulating film 1d made of an organic insulating film as an etching stopper, whereby the trench 4a2 and through-hole 4b3 are formed, as illustrated in FIG. 117(b). The insulating film 1d is exposed from the bottom surface of the trench 4a2, while the insulating film 1c is exposed from the through-hole 4b3. This etching is conducted under the following conditions: use of a parallel-plate narrow-electrode type RIE apparatus as an etching apparatus, pressure in the etching chamber of about 30 mTorr, use of $C_4F_8/O_2/Ar$ as an etching gas, a flow rate of about 13/15/420 sccm, high-frequency power density of about 2200/1400 W and lower electrode temperature of about −20° C.

The insulating film 1c exposed from the bottom surface of the through-hole 4b3 is then removed as in Embodiment 1 or 3, whereby a portion of the second-layer interconnect 18L2 is exposed from the bottom surface. Manufacturing steps subsequent thereto are similar to those illustrated in FIG. 36(b) of Embodiment 1 so that they are omitted. The etching conditions of the organic insulating film are not limited to the above-described ones, but can be changed variously within a range defined in Embodiment 9 or 10.

Similar advantages to Embodiment 5, 7 or 16 are available in this Embodiment 17.

The technical concepts developed by the present inventors have so far been described specifically on the basis of the above-described embodiments. It should however be noted that the present invention is not limited to the described embodiments, but can be changed variously within an extent not departing from the scope of the present invention.

For example, $C_xF_y$/oxygen/argon is used as a gas for etching of an organic insulating film in each of Embodiments 5 to 8, 16 and 17, but the gas is not limited thereto, and NO, $NO_2$ or CO can be used instead of oxygen.

In each of Embodiments 1 to 17, a main conductor film constituting an interconnect or connecting portion is formed by plating, but the formation method is not limited thereto, but can be changed variously. For example, CVD or sputtering can be adopted. In this case, the seed conductor film is not required to be disposed over the barrier conductor film. The material of the main conductor film is not limited to copper, but can be changed variously. For example, aluminum, gold or silver may be employed. In this case, it is not necessary to dispose an insulating film made of silicon nitride or the like for suppressing diffusion of atoms from the main conductor film.

In each of Embodiments 1 to 17, the first-layer and the seventh-layer interconnects are formed to have an ordinary metallization structure. The structure is not limited thereto, but the first-layer and second-layer interconnects may be formed, for example, by a damascene or dual damascene process.

In each of Embodiments 1 to 17, a semiconductor substrate made only of a semiconductor is used as a semiconductor integrated circuit substrate. The substrate is not limited thereto, but an SOI (silicon on insulator) substrate having a thin semiconductor layer disposed on an insulating layer, or an epitaxial substrate having an epitaxial layer disposed on a semiconductor substrate may be used.

Although a description was so far provided concerning the application of the inventive features developed by the present inventors to a semiconductor integrated circuit device having a CMIS circuit, because the present invention is based on the use in this field, they are not limited thereto, but can be applied to a semiconductor integrated circuit device having a memory circuit, such as a DRAM (dynamic random access memory), SRAM (static random access memory) or flash memory (EEPROM: electric erasable programmable read only memory), a semiconductor integrated circuit device having a logic circuit, such as microprocessor, or a semiconductor integrated circuit device having both a memory circuit and logic circuit disposed on one semiconductor substrate.

Application of the technical concept of the present invention is not limited to a manufacturing process of a semiconductor integrated circuit device, but also applies to that of other electronic equipment (electron circuit equipment), such as a liquid-crystal substrate or magnetic head.

The following is a brief description of the advantages available by the typical features disclosed by the present application.

(1) Upon formation of a recess, such as a trench or hole, in an insulating film including an organosiloxane as a main component by etching, formation of an abnormal shape (subtrench) at the outer periphery of the bottom surface of the recess can be suppressed or prevented.

(2) Upon formation of a recess, such as a trench or hole, in an insulating film including an organosiloxane as a main component by etching, the recess can be formed while maintaining an etching selectivity relative to a silicon nitride film which functions as an etching stopper, but suppressing or preventing the formation of an abnormal shape on the bottom of the recess.

(3) The advantages as described in (1) and (2) make it possible to reduce the percent defective in a metallization layer constituting the semiconductor integrated circuit device, leading to an improvement in the reliability and yield of the semiconductor integrated circuit device.

(4) The advantages as described in (1), (2) and (3) make it possible to form, in an organic insulating film including an organosiloxane as a main component, a recess, such as a trench or hole, having a high aspect ratio.

(5) The advantage as described in (4) makes it possible to miniaturize each of interconnects constituting the semiconductor integrated circuit device, thereby forming a highly integrated device.

(6) Upon forming a recess, such as a trench or hole, in an organic insulating film including an organosiloxane as a main component, an etching selectivity relative to a silicon nitride film which serves as an etching stopper can be heightened. Accordingly, an inconvenience such as etching through of the silicon nitride film can be suppressed upon formation of the recess and the thickness of the silicon nitride film functioning as an etching stopper can be reduced.

(7) Even if an insulating film includes an organosiloxane as a main component, its etching selectivity can be changed by its carbon content. It is therefore possible to use an insulating film including organosiloxane as a main component, as an etching stopper.

(8) The advantages as described in (6) and (7) make it possible to decrease the total dielectric constant of the interconnects of the semiconductor integrated circuit device so that the operation velocity of the semiconductor integrated circuit device can be improved.

As described above, the manufacturing process of the semiconductor integrated circuit device and the semiconductor integrated circuit device technique according to the present invention are particularly effective when adapted to the manufacturing process of a semiconductor integrated circuit device and a semiconductor integrated circuit device using an insulating film including organosiloxane as a main component.

What is claimed is:

1. A method of manufacturing a semiconductor integrated circuit device, comprising steps of:
    (a) forming a first wiring over a semiconductor substrate, wherein the first wiring is formed of a copper-containing material as a main component;
    (b) forming a first insulating film over the first wiring;
    (c) forming a second insulating film over the first insulating film, wherein the second insulating film is formed of an organosiloxane as a main component, and wherein a thickness of the second insulating film is thicker than a thickness of the first insulating film;
    (d) forming a first patterned masking layer over the second insulating film;
    (e) after the step (d), forming a through hole in the second insulating film with the first patterned masking layer thereover, by plasma etching in a first gas atmosphere containing a fluorocarbon gas and a nitrogen gas;
    (f) after the step (e), removing the first patterned masking layer;
    (g) after the step (f), forming a second patterned masking layer over the second insulating film;
    (h) after the step (g), forming a trench in the second insulating film with the second patterned masking layer thereover, by plasma etching in a second gas atmosphere containing a fluorocarbon gas and a nitrogen gas, wherein a depth of the trench is shallower than a depth of the through hole; and
    (i) after the step (h), removing the first insulating film of the bottom of the through hole, thereby a surface of the first wiring is exposed.

2. A method of manufacturing a semiconductor integrated circuit device according to claim 1, wherein the first and second gas atmospheres include an oxygen gas.

3. A method of manufacturing a semiconductor integrated circuit device according to claim 2, wherein, in the first and second gas atmospheres, a flow rate of the oxygen gas is smaller than a flow rate of the fluorocarbon gas, respectively.

4. A method of manufacturing a semiconductor integrated circuit device according to claim 1, wherein the first and second gas atmospheres do not include an oxygen gas.

5. A method of manufacturing a semiconductor integrated circuit device according to claim 1, wherein the first patterned masking layer is a photoresist film.

6. A method of manufacturing a semiconductor integrated circuit device according to claim 1, wherein the second patterned masking layer is a photoresist film.

7. A method of manufacturing a semiconductor integrated circuit device according to the claim 1, wherein the second insulating film is formed by a spin coating method.

8. A method of manufacturing a semiconductor integrated circuit device according to claim 1, wherein the first gas atmosphere includes an argon gas, and
    wherein the argon gas has the maximum flow rate of the first gas atmosphere.

9. A method of manufacturing a semiconductor integrated circuit device according to the claim 1, wherein the first gas atmosphere includes a helium gas.

10. A method of manufacturing a semiconductor integrated circuit device according to claim 1, wherein the second gas atmosphere includes an argon gas, and
    wherein the argon gas has the maximum flow rate of the second gas atmosphere.

11. A method of manufacturing a semiconductor integrated circuit device according to claim 1, wherein the second gas atmosphere includes a helium gas.

12. A method of manufacturing a semiconductor integrated circuit device according to claim 1, wherein the step (h) is performed without an etching stopper film.

13. A method of manufacturing a semiconductor integrated circuit device according to the claim 1, wherein the first insulating film has a function for preventing copper diffusion.

14. A method of manufacturing a semiconductor integrated circuit device, comprising steps of:
(a) forming a first wiring over a semiconductor substrate, wherein the first wiring is formed of a copper-containing material as a main component;
(b) forming a first insulating film over the first wiring;
(c) forming a second insulating film over the first insulating film, wherein the second insulating film is formed of an organosiloxane as a main component, and wherein a thickness of the second insulating film is thicker than a thickness of the first insulating film;
(d) forming a first patterned masking layer over the second insulating film;
(e) after the step (d), forming a through hole in the second insulating film with the first patterned masking layer thereover, by plasma etching in a first gas atmosphere containing fluorocarbon gas and a nitrogen gas;
(f) after the step (e), removing the first patterned masking layer;
(g) after the step (f), forming a second patterned masking layer over the second insulating film;
(h) after the step (g), forming a trench in the second insulating film with the second patterned masking layer thereover, by plasma etching in a second gas atmosphere containing fluorocarbon gas and a nitrogen gas, wherein a depth of the trench is shallower than a depth of the through hole;
(i) after the step (h), removing the second patterned masking layer;
(j) after the step (i), removing the first insulating film at the bottom of the through hole, thereby a surface of the first wiring is exposed; and
(k) embedding a conductive film formed of copper-maintaining material in the through hole and the trench.

15. A method of manufacturing a semiconductor integrated circuit device according to claim 14, further comprising steps of:
forming a barrier metal film in the through hole and the trench between the steps (j) and (k),
wherein, in the step (k), the conductive film is formed over the barrier metal film.

16. A method of manufacturing a semiconductor integrated circuit device according to claim 14, wherein the first and second gas atmospheres include an oxygen gas.

17. A method of manufacturing a semiconductor integrated circuit device according to the claim 16, wherein, in the first and second gas atmospheres, a flow rate of the oxygen gas is smaller than a flow rate of the fluorocarbon gas, respectively.

18. A method of manufacturing a semiconductor integrated circuit device according to the claim 14, wherein the first and second gas atmospheres do not include an oxygen gas.

19. A method of manufacturing a semiconductor integrated circuit device according to claim 14, wherein the first patterned masking layer is a photoresist film.

20. A method of manufacturing a semiconductor integrated circuit device according to the claim 14, wherein the second patterned masking layer is a photoresist film.

21. A method of manufacturing a semiconductor integrated circuit device according to claim 14, wherein the second insulating film is formed by a spin coating method.

22. A method of manufacturing a semiconductor integrated circuit device according to claim 14, wherein the first gas atmosphere includes an argon gas, and
wherein the argon gas has the maximum flow rate of the first gas atmosphere.

23. A method of manufacturing a semiconductor integrated circuit device according to claim 14, wherein the first gas atmosphere includes a helium gas.

24. A method of manufacturing a semiconductor integrated circuit device according to claim 14, wherein the second gas atmosphere includes an argon gas, and
wherein the argon gas has the maximum flow rate of the second gas atmosphere.

25. A method of manufacturing a semiconductor integrated circuit device according to claim 14, wherein the second gas atmosphere includes a helium gas.

26. A method of manufacturing a semiconductor integrated circuit device according to claim 14, wherein the step (h) is performed without an etching stopper film.

27. A method of manufacturing a semiconductor integrated circuit device according to claim 14, wherein the first insulating film has a function for preventing copper diffusion.

* * * * *